United States Patent
Kang et al.

(10) Patent No.: US 8,634,246 B2
(45) Date of Patent: Jan. 21, 2014

(54) NONVOLATILE MEMORY DEVICE, OPERATING METHOD THEREOF AND MEMORY SYSTEM INCLUDING THE SAME

(75) Inventors: Dongku Kang, Yongin-si (KR); Tae-Young Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 218 days.

(21) Appl. No.: 12/961,207

(22) Filed: Dec. 6, 2010

(65) Prior Publication Data

US 2012/0051136 A1    Mar. 1, 2012

(30) Foreign Application Priority Data

Aug. 26, 2010    (KR) .................. 10-2010-0083051

(51) Int. Cl.
*G11C 11/34*    (2006.01)

(52) U.S. Cl.
USPC ............. 365/185.17; 365/185.22; 365/185.29

(58) Field of Classification Search
USPC ............. 365/185.17, 185.22, 185.29, 185.03, 365/185.33, 185.2, 185.11, 185.18, 185.05, 365/185.24, 185.25
See application file for complete search history.

(56) References Cited

U.S. PATENT DOCUMENTS

| | | | |
|---|---|---|---|
| 6,483,752 B2 | 11/2002 | Hirano | |
| 6,816,411 B2 | 11/2004 | Arai et al. | |
| 8,335,109 B2 * | 12/2012 | Seol et al. | 365/185.17 |
| 2004/0111583 A1 * | 6/2004 | Han et al. | 711/203 |
| 2005/0063230 A1 * | 3/2005 | Seitoh | 365/201 |
| 2006/0285387 A1 * | 12/2006 | Micheloni et al. | 365/185.17 |
| 2008/0204023 A1 * | 8/2008 | Du et al. | 324/318 |
| 2009/0010071 A1 * | 1/2009 | Lee | 365/185.22 |
| 2010/0110796 A1 * | 5/2010 | Park et al. | 365/185.19 |
| 2010/0320526 A1 * | 12/2010 | Kidoh et al. | 257/324 |
| 2011/0018036 A1 * | 1/2011 | Hwang et al. | 257/208 |

FOREIGN PATENT DOCUMENTS

| | | |
|---|---|---|
| JP | 3709126 | 10/2005 |
| JP | 3866650 | 1/2007 |
| KR | 1020040047722 | 6/2004 |
| KR | 1020090072140 | 7/2009 |

\* cited by examiner

*Primary Examiner* — Son Dinh
(74) *Attorney, Agent, or Firm* — F. Chau & Associates, LLC

(57) ABSTRACT

A method of operating a non-volatile memory device includes performing an erasing operation to memory cells associated with a string selection line (SSL), the memory cells associated with the SSL constituting a memory block, and verifying the erasing operation to second memory cells associated with a second word line (WL) after verifying the erasing operation to first memory cells associated with a first word line (WL).

23 Claims, 84 Drawing Sheets

Fig. 10

| BL | Vbl1(Vcc) |
|---|---|
| SSL | Vssl2(Vcc) |
| Selected WL | Vvfy1(Vss) |
| Unselected WL | Vuwl1 |
| GSL | Vgsl2(Vcc) |
| CSL | Vcsl1(Vss) |

| SSL | Float / Vssl3 |
| WL | Vwe2(Vss) |
| GSL | Float / Vgsl3 |
| CSL | Float |
| Substrate | Vers2 |

Fig. 29

| BL | Vbl2(Vcc) |
|---|---|
| Selected SSL | Vssl4(Vcc) |
| Unselected SSL | Vssl5(Vss) |
| Selected WL | Vvfy2(Vss) |
| Unselected WL | Vuwl2 |
| GSL | Vgsl4(Vcc) |
| CSL | Vcsl2(Vss) |

Fig. 33

| SSL | Float / Vssl3 |
|---|---|
| WL of selected sub-block | Vwe2(Vss) |
| DWL | Vdwl1 |
| WL of unselected sub-block | Float / Vuwl3 |
| GSL | Float / Vgsl3 |
| CSL | Float |
| Substrate | Vers2 |

Fig. 36

| | |
|---|---|
| BL | Vbl2(Vcc) |
| Selected SSL | Vssl4(Vcc) |
| Unselected SSL | Vssl5(Vss) |
| Selected WL of selected sub-block | Vvfy2(Vss) |
| Unselected WL of selected sub-block | Vuwl2 |
| DWL | Vuwl2 |
| WL of unselected sub-block | Vuwl2 |
| GSL | Vgsl4(Vcc) |
| CSL | Vcsl2(Vss) |

Fig. 40

| BL | Vbl2(Vcc) |
|---|---|
| Selected SSL | Vssl4(Vcc) |
| Unselected SSL | Vssl5(Vss) |
| Selected WL | Vvfy2(Vss) |
| Unselected WL | Vuwl2 |
| Selected GSL | Vgsl4(Vcc) |
| Unselected GSL | Vgsl5(Vss) |
| CSL | Vcsl2(Vss) |

Fig. 55

| SSL | Float |
|---|---|
| WL | Float → Vwe3 |
| GSL | Vss → Float |
| CSL | Float |
| Substrate | Vpr → Vers3 |

Fig. 58

| SSL | Float |
|---|---|
| WL of unselected sub-block | Float |
| DWL | Vdwl2 |
| WL of selected sub-block | Float → Vwe3 |
| GSL | Vss → Float |
| CSL | Float |
| Substrate | Vbr → Vers3 |

NONVOLATILE MEMORY DEVICE, OPERATING METHOD THEREOF AND MEMORY SYSTEM INCLUDING THE SAME

CROSS-REFERENCE TO RELATED APPLICATION

This application claims priority to Korean Patent Application No. 10-2010-0083051, filed on Aug. 26, 2010, the entire contents of which are hereby incorporated by reference.

BACKGROUND

1. Technical Field

The present disclosure relates to a semiconductor memory device, and more particularly, to a nonvolatile semiconductor memory device.

2. Related Art

A semiconductor memory device can be manufactured with semiconductor materials such as silicon (Si), germanium (Ge), gallium arsenide (GaAs) and indium phosphide (InP). Semiconductor memory devices can be divided into volatile memory devices and nonvolatile memory devices.

The volatile memory device is a memory device in which stored data are erased when a power source is shut off. The volatile memory device includes Static Random Access Memory (SRAM), Dynamic Random Access Memory (DRAM) and Synchronous Dynamic Random Access Memory (SDRAM). The nonvolatile memory device is a memory device that retains stored data even when a power source is shut off. The nonvolatile memory device includes Read-Only Memory (ROM), Programmable Read Only Memory (PROM), Erasable Programmable Read Only Memory (EPROM), Electrical Erasable Programmable Read Only Memory (EEPROM), flash memory device, Phase-change Random Access Memory (PRAM), Magnetoresistive Random Access Memory (MRAM), Resistive Random Access Memory (RRAM) and Ferroelectric Random Access Memory (FRAM). The flash memory device is largely categorized into a NOR type and a NAND type.

SUMMARY

According to an embodiment of the inventive concept, a method of operating a non-volatile memory device comprises performing an erasing operation to memory cells associated with a string selection line (SSL), the memory cells associated with the SSL constituting a memory block, and verifying the erasing operation to second memory cells associated with a second word line (WL) after verifying the erasing operation to first memory cells associated with a first word line (WL).

The method may further comprise resetting a WL count and an erase count prior to the erasing operation.

The method may further comprise counting up the WL count when verifying the erasing operation to first memory cells associated with the first WL passes prior to verifying the erasing operation to second memory cells associated with the second WL.

The method may further comprise counting up the erase count when verifying the erasing operation to first memory cells associated with the first WL fails, and adjusting an erase voltage to erase the memory block.

The method may further comprise performing an error report when the erase count reaches a preset value.

The memory block may include a plurality of NAND strings connected to one bit line.

The method may further comprise resetting a WL latch and an erase count prior to the erasing operation.

The method may further comprise storing an address of the first WL into the WL latch when verifying the erasing operation to first memory cells associated with the first WL fails.

The method may further comprise counting up the erase count when the WL latch stores the address of the first WL after verifying the erasing operation to entire memory cells associated with the SSL, and adjusting an erase voltage to erase the memory block.

The method may further comprise verifying the erasing operation to the first memory cells associated with the first WL.

The method may further comprise deleting the address of the first WL from the WL latch when verifying the erasing operation to the first memory cells associated with the first WL passes.

The method may further comprise setting a WL latch and resetting an erase count prior to the erasing operation.

The method may further comprise deleting an address of the first WL from the WL latch when verifying the erasing operation to first memory cells associated with the first WL passes.

The method may further comprise counting up the erase count when the WL latch stores the address of the second WL remaining in the WL latch after verifying the erasing operation to entire memory cells associated with the SSL, and adjusting an erase voltage to erase the memory block.

According to an embodiment of the inventive concept, a non-volatile memory device comprises a memory cell array comprising memory cells associated with a string selection line (SSL), a voltage generating unit configured to generate an erase voltage for performing an erasing operation to the memory cells associated with the string selection line (SSL), the memory cells associated with the SSL constituting a memory block, and a control logic configured to verify the erasing operation to second memory cells associated with a second word line (WL) after verifying the erasing operation to first memory cells associated with a first word line (WL).

The non-volatile memory device may further comprise an address decoder connected to the memory cell array through SSLs, word lines, and at least one ground selection line (GSL).

The non-volatile memory device may further comprise a read/write circuit connected to the memory cell array through bit lines.

The non-volatile memory device may further comprise a pass/fail check unit for determining whether the verification of the erasing operation to memory cells has failed or passed.

The control logic may comprise an erase control unit, a WL counter, and an erase counter, the erase control unit receiving a pass/fail data from the pass/fail check unit.

The control logic may comprise an erase control unit, a WL address latch, and an erase counter, the erase control unit receiving a pass/fail data from the pass/fail check unit.

The non-volatile memory device can be configured to receive a signal from a controller.

The controller may include a RAM, a processing unit, a host interface, and a memory interface.

The non-volatile memory device can be configured to transmit an error signal to an error correction block.

According to an embodiment of the inventive concept, a method of verifying an erasing operation in a non-volatile memory device comprises selecting a first word line (WL) while not selecting a second WL from a plurality of word lines (WLs), memory cells associated with the plurality of word lines constituting a memory block, verifying the erasing operation to first memory cells associated with the selected first WL, selecting the second WL while not selecting the first WL, and verifying the erasing operation to second memory cells associated with the selected second WL.

The method may further comprise pre-charging a bit line disposed in the memory block.

A voltage for pre-charging the bit line may comprise a power source voltage (Vcc).

Selecting the first WL may comprise applying a power ground voltage (Vss) to the first WL.

Unselecting the second WL may comprise applying a read voltage (Vread) or a pass voltage (Vpass) to the second WL.

The method may further comprise applying a power source voltage (Vcc) to a ground selection line (GSL).

The method may further comprise applying a ground voltage (Vss) to a common source line.

According to an embodiment of the inventive concept, a method of operating a non-volatile memory device comprises performing an erasing operation to memory cells associated with a plurality of string selection lines (SSLs), the memory cells associated with the plurality of SSLs constituting a memory block, and verifying the erasing operation to memory cells associated with a second SSL after verifying the erasing operation to memory cells associated with a first SSL, the first SSL comprising a first word line (WL) and a second word line (WL), wherein verifying the erasing operation to memory cells associated with the first SSL comprises verifying the erasing operation to memory cells associated with the second word line (WL) after verifying the erasing operation to memory cells associated with the first word line (WL).

The method may further comprise resetting a WL count, an SSL count and an erase count prior to the erasing operation.

The method may further comprise counting up the WL count when verifying the erasing operation to memory cells associated with the first WL passes prior to verifying the erasing operation to memory cells associated with the second WL.

The method may further comprise counting up the SSL count when verifying the erasing operation to memory cells associated with the first SSL passes prior to verifying the erasing operation to memory cells associated with the second SSL.

The method may further comprise counting up the erase count when verifying the erasing operation to memory cells associated with the first WL fails, and adjusting an erase voltage to erase the memory block.

The method may further comprise performing an error report when the erase count reaches a preset value.

The memory cells of the non-volatile memory device can be stacked in a direction perpendicular with respect to a major axis of a substrate where the memory cells are disposed.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 10 is a table illustrating voltage conditions during an erase-verification of the nonvolatile memory device of FIG. 1;

FIG. 29 is a table illustrating voltage conditions during an erase-verification operation of the nonvolatile memory device of FIG. 16;

FIG. 33 is a table illustrating voltage conditions applied to an equivalent circuit of the memory block of FIG. 18 during an erase operation according to an embodiment of the inventive concept;

FIG. 36 is a table illustrating voltage conditions applied to an equivalent circuit of the memory block of FIG. 18 during an erase-verification according to an embodiment of the inventive concept;

FIG. 40 is a table illustrating voltage conditions applied to an equivalent circuit of the memory block of FIG. 18 during an erase-verification according to an embodiment of the inventive concept;

FIG. 55 is a table illustrating voltage conditions during an erase operation of the memory block of FIGS. 53 and 54 according to an embodiment of the inventive concept;

FIG. 58 is a table illustrating voltage conditions during an erase operation of the memory block of FIGS. 53 and 54 according to an embodiment of the inventive concept;

DETAILED DESCRIPTION OF EXEMPLARY EMBODIMENTS

Hereinafter, exemplary embodiments of the inventive concept will be described below in more detail with reference to the accompanying drawings. The inventive concept may, however, be embodied in different forms and should not be construed as limited to the embodiments set forth herein.

Expressions such as "a word line is erase-verified" and "an erase-verification is performed on a word line" represent that memory cells connected to a corresponding word line are erase-verified. Expressions such as "a selected row is erase-verified" and "an erase-verification is performed on a selected row" represent that memory cells in a selected row are erase-verified.

Hereinafter, it is defined that all memory cells connected to a corresponding word line (or a string selection line) are erase-passed in a word line (or a string selection line) corresponding to erase-passed memory cells (or a memory cell). It is defined that at least one of memory cells connected to a corresponding word line (or string selection line) is erase-failed in a word line (or string selection line) corresponding to erase-failed memory cells (or a memory cell).

Exemplarily, when a nonvolatile memory device or its host has an error correction function, if the number of erase-failed memory cells is less than a specific number, it is processed as being erase-passed. Technical ideas and embodiments of the inventive concept may be applied in the same manner. That is, if the number of erase-failed memory cells among memory cells connected to a specific word line (or a string selection line) is less than a specific number, it may be processed that a corresponding word line is connected to erase-passed memory cells. If the number of erase-failed memory cells among memory cells connected to a specific word line (or string selection line) is more than a specific number, it may be processed that a corresponding word line is connected to erase-failed memory cells.

Figure 1:
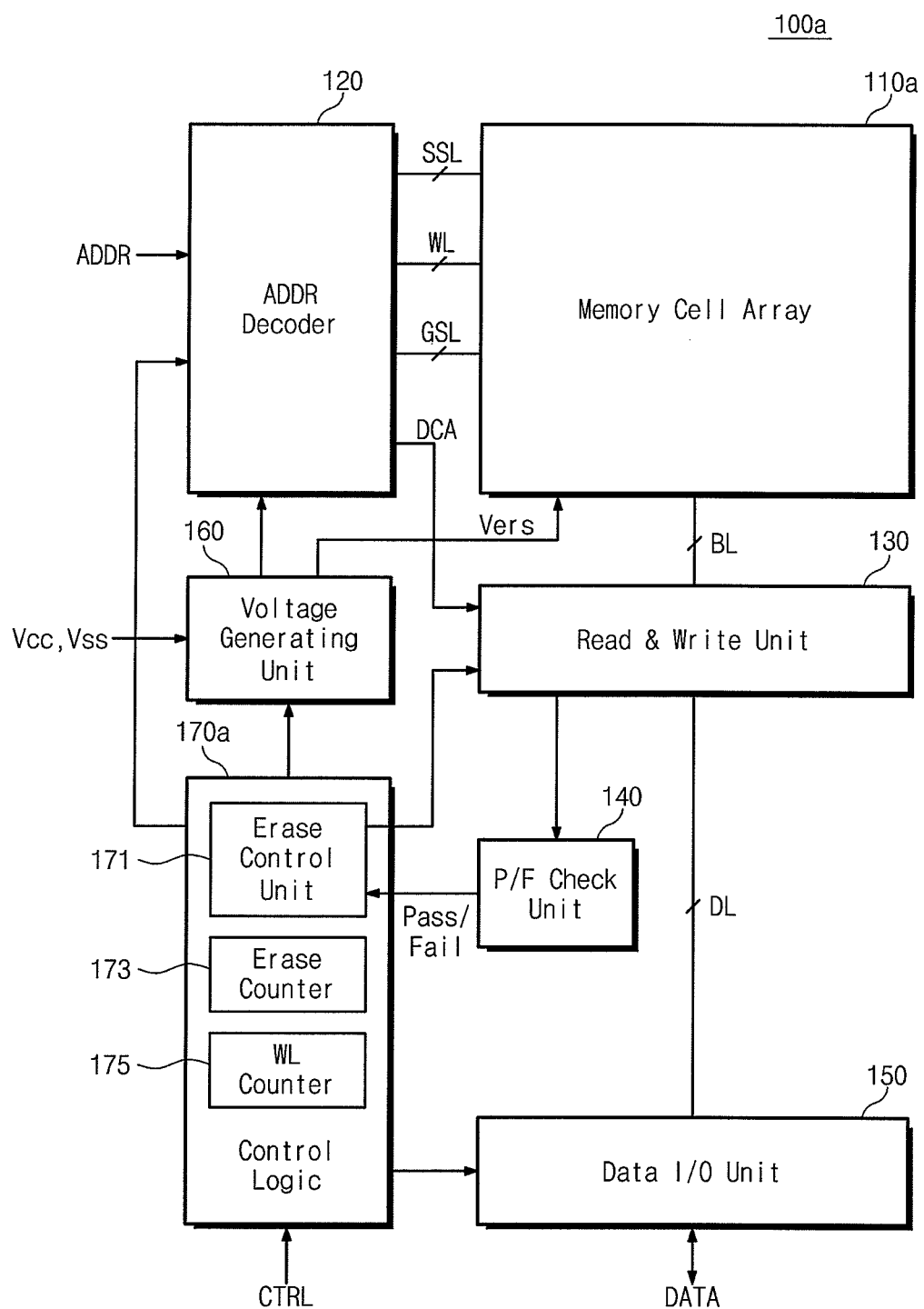
FIG. 1 is a block diagram illustrating a nonvolatile memory device according to an embodiment of the inventive concept.

FIG. 1 is a block diagram illustrating a nonvolatile memory device 100a according to an embodiment of the inventive concept. Referring to FIG. 1, the nonvolatile memory device 100a includes a memory cell array 110a, an address decoder 120, a read & write unit 130, a pass/fail check unit 140, a data input/output (I/O) unit 150, a voltage generating unit 160, and a control logic 170a.

The memory cell array 110a is connected to the address decoder 120 through word lines WL and selection lines. For example, the selection lines may include string selection lines SSL and ground selection lines GSL. The memory cell array 110a is connected to the read & write unit 130 through a bit line BL.

The memory cell array 110a may include a plurality of memory cells. For example, the memory cell array 110a includes memory cells disposed on a substrate along row and column directions. Exemplarily, the memory cell array 110a includes a plurality of memory cells, each cell storing at least one bit.

The address decoder 120 is connected to the memory cell array 110a through word lines WL, string selection lines SSL, and ground selection lines GSL. The address decoder 120 is configured to operate in response to a control of the control logic 170a. The address decoder 120 receives addresses ADDR from the external.

The address decoder 120 is configured to decode a row address among the received addresses ADDR. The address decoder 120 is configured to select a word line corresponding to the decoded row address among the word lines WL. The address decoder 120 is configured to select selection lines corresponding to the decoded row address among the selection lines including string selection lines SSL and ground selection lines GSL.

The address decoder 120 is configured to deliver various voltages received from the voltage generating unit 160 to the selected word line, unselected word line, selected selection line, and unselected selection line.

In an embodiment, when the address decoder 120 is additionally connected to the memory cell array 110a through dummy word lines DWL (not shown), the address decoder 120 is configured to further select a dummy word line corresponding to the decoded row address among the dummy word lines DWL. The address decider 120 may be configured to deliver various voltages received from the voltage generating unit 160 to the selected dummy word line DWL and unselected dummy word line DWL.

The address decoder 120 is configured to decode a column address among the received address ADDR. The address decoder 120 delivers the decoded column address DCA to the read & write unit 130.

In an embodiment, the address decoder 120 may include a row decoder decoding a row address, a column decoder decoding a column address, and an address buffer storing a received address ADDR.

The read & write unit 130 is connected to the memory cell array 110a through bit lines BL, and is connected to the data I/O unit 150 through data lines DL. The read & write unit 130 operates in response to a control of the control logic 170a. The read & write unit 130 receives a decoded column address DCA from the address decoder 120. Using the decoded column address DCA, the read & write unit 130 selects bit lines BL.

In an embodiment, the read & write unit 130 receives data from the data I/O unit 150, and writes received data in the memory cell array 110*a*. The read & write unit 130 reads data from the memory cell array 110*a* and delivers the read data to the data I/O unit 150. The read & write unit 130 reads data from a first storage region of the memory cell array 110*a* and writes the read data in a second storage region of the memory cell array 110*a*. For example, the read & write unit 130 performs a copy-back operation.

In an embodiment, the read & write unit 130 may include components such as a page buffer (or page register) and a column selection circuit. In an embodiment, the read & write unit 130 may include components such as a sense amplifier, a write driver, and a column selection circuit.

The pass/fail check unit 140 is connected to the read & write unit 130 and the control logic 170*a*. During an erase-verification, the pass/fail check unit 140 is configured to receive data sensed by the read & write unit 130. Based on the received data, the pass/fail check unit 140 determines whether it is erase-passed or erase-failed. According to a determination result, the pass/fail check unit 140 is configured to transmit a pass signal Pass or a fail signal Fail to the control logic 170*a*.

The data I/O unit 150 is connected to the read & write unit 130 through data lines DL. The data I/O unit 140 operates in response to a control of the control logic 170*a*. The data I/O unit 150 is configured to exchange data DATA with the external. The data I/O unit 150 is configured to deliver data DATA from the external to the read & write unit 130 through data lines DL. The data I/O unit 150 is configured to output data DATA delivered from the read & write unit 130 through data lines DL to the external. In an embodiment, the data I/O unit 150 may include components such as a data buffer.

The voltage generating unit 160 is connected to the memory cell array 110*a*, the address decoder 120, and the control logic 170*a*. The voltage generating unit 160 receives power from the external. In an embodiment, the voltage generating unit 160 receives a power voltage Vcc and a ground voltage Vss from the external. In response to a control of the control logic 170*a*, the voltage generating unit 160 is configured to generate voltages having various levels from the power voltage Vcc and the ground voltage Vss. In an embodiment, the voltage generating unit 160 is configured to generate various voltages such as a high voltage Vpp, a program voltage Vpgm, a pass voltage Vpass, a read voltage Vread, and an erase voltage Vers.

Voltages generated by the voltage generating unit 160 are supplied to the address decoder 120 and the memory cell array 110*a* under a control of the control logic 170*a*. For example, a program voltage Vpgm and a pass voltage Vpass may be supplied to the address decoder 120 during a program operation. During a read operation, a read voltage Vread may be supplied to the address decoder 120. During erasing the memory cell array 110*a*, an erase voltage Vers may be supplied to the memory cell array 110*a*.

Voltages generated by the voltage generating unit 160 are not limited to the above-mentioned voltages.

The control logic 170*a* is connected to the address decoder 120, the read & write unit 130, the pass/fail check unit 160, and the data I/O unit 150. The control logic 170*a* is configured to control general operations of the nonvolatile memory device 100*a*. The control logic 170*a* operates in response to a control signal CTRL delivered from the external.

The control logic 170*a* includes an erase control unit 171, an erase counter 173 and a word line counter 175. The erase control unit 171 is configured to control an erase operation of the nonvolatile memory device 100*a*. For example, an erase operation of the nonvolatile memory device 100*a* includes an erase and erase-verification. Under a control of the erase control unit 171, a selected memory block of the memory cell array 110*a* may be erased and erase-verified.

The erase control unit 171 may control the address decoder 120, the read & write unit 130, and the voltage generating unit 160 to erase a selected memory block of the memory cell array 110*a*. The erase control unit 171 controls the address decoder 120, the read & write unit 130, and the voltage generating unit 160 to erase-verify a selected memory block of the memory cell 110*a*. In an embodiment, the erase control unit 171 controls an erase operation based on information stored in the erase counter 173. In an embodiment, the erase control unit 171 control an erase-verification based on information stored in the word line counter 175.

The erase control unit 171 recognizes whether it is erase-passed or erase-failed based on an output of the pass/fail check unit 140. According to whether it is erase-passed or erase-failed, the erase control unit 171 controls the following an erase or an erase-verification.

A counter value (hereinafter, referred to as an erase count) of the erase counter 173 represents the erased number of a specific memory block of the memory cell array 110*a* during an erase operation. In an embodiment, an erase count corresponds to the number of applying an erase voltage Vers to a specific memory block during an erase operation. In an embodiment, the erase count represents the number of applying an erase voltage (or an erase pulse) to a specific memory block according to an incremental step pulse erase (ISPE). Hereinafter, a count value of the erase counter 173 is defined as an erase count.

A count value of the word line counter 175 represents an address of a word line of a selected memory block. In an embodiment, a count value of the word line counter 175 represents one address of word lines WL1 to WLm of a selected memory block BLKa. Hereinafter, a count value of the word line counter 175 is defined as a word line count.

Figure 2:
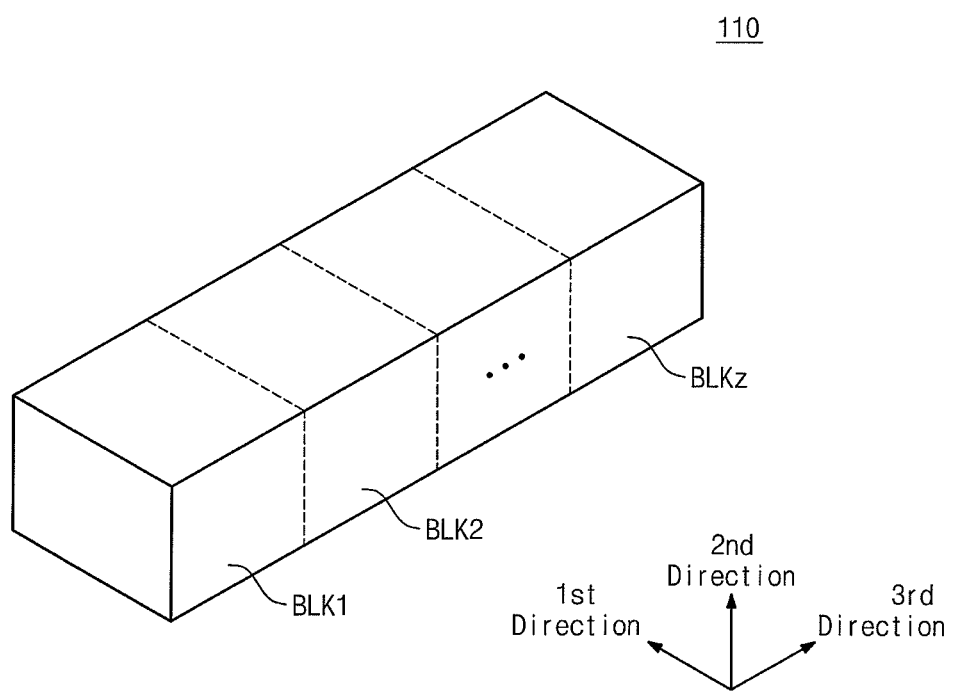
FIG. 2 is a block diagram illustrating a memory cell array according to an embodiment of the inventive concept.

FIG. 2 is a block diagram illustrating the cell array 110*a* of FIG. 1. Referring to FIG. 2, the memory cell array 110*a* includes a plurality of memory blocks BLK1 to BLKz. In an embodiment, the memory blocks BLK1 to BLKz are selected by the address decoder 120 of FIG. 1. In an embodiment, the address decoder 120 is configured to select a memory block BLK corresponding to a block address among the memory blocks BLK1 to BLKz.

Figure 3:
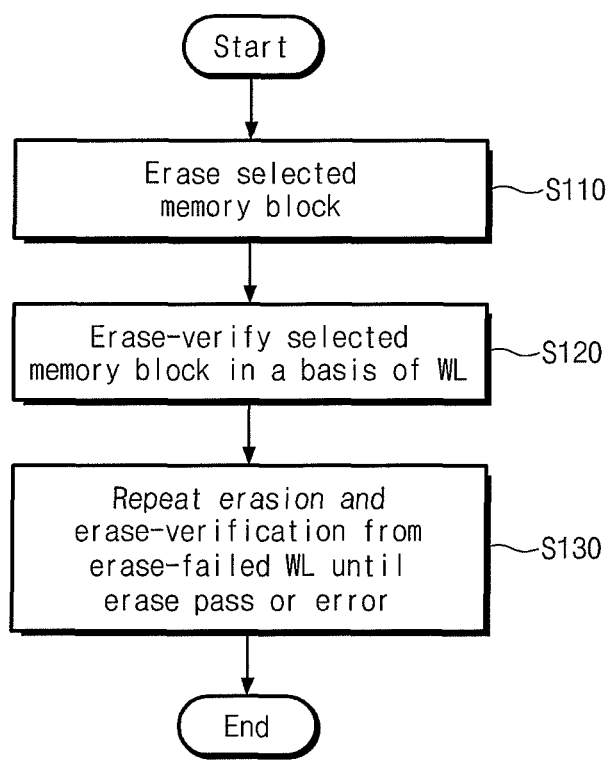
FIG. 3 is a flowchart illustrating a method of operating the nonvolatile memory device of FIG. 1 according to an embodiment of the inventive concept.

FIG. 3 is a flowchart illustrating a method of operating the nonvolatile memory device 100*a* of FIG. 1. A flowchart of an erase operation of the nonvolatile memory device 100*a* is shown in FIG. 3. Referring to FIGS. 1 and 3, a selected memory block is erased in operation S110. In an embodiment, a selected memory block among the memory blocks BLK1 to BLKz of the memory cell array 110*a* may be erased.

In operation S120, the selected memory block is erase-verified by a unit of respective word line.

In operation S130, an erase and erase-verification from erase-failed word line repeat until it is erase-passed or an error occurs.

According to an embodiment of the inventive concept, an erase-verification is performed by a unit of respective word line. Compared to an erase-verification method through which an erase verify voltage is applied to all word lines WL, in an erase-verification method according to an embodiment of the inventive concept, RC loading of a word line WL, i.e., a target to which erase verify voltage is applied, is reduced. Accordingly, when an erase verify voltage is applied to a word line WL, it may be adjusted more accurately to a level of an erase verify voltage of a word line WL. That is, a threshold voltage of a memory cell to be erased may be more accurately adjusted to a target value. Accordingly, reliability of the nonvolatile memory device 100a is improved.

According to an embodiment of the inventive concept, an erase-verification resumes from an erase-failed word line. For example, it is assumed that an erase and erase-verification are performed in a first erase loop. During an erase-verification, it is assumed that an erase-failed word line is detected. For example, it is assumed that first to $i-1^{th}$ word lines are erase-passed and $i^{th}$ to $j^{th}$ word lines are erase-failed. At this point, an erase and erase-verification are performed in a second erase loop. An erase-verification of the second erase loop may be performed from the erase-failed word line WL detected in the first erase loop. For example, an erase-verification on the first to $i-1^{th}$ word lines is omitted and an erase-verification is performed from the $i^{th}$ word line.

Since an erase-verification resumes from an erase-failed word line, an erase-verification time is shortened. Accordingly, an operating speed of the nonvolatile memory device 100a is improved.

Figure 4:
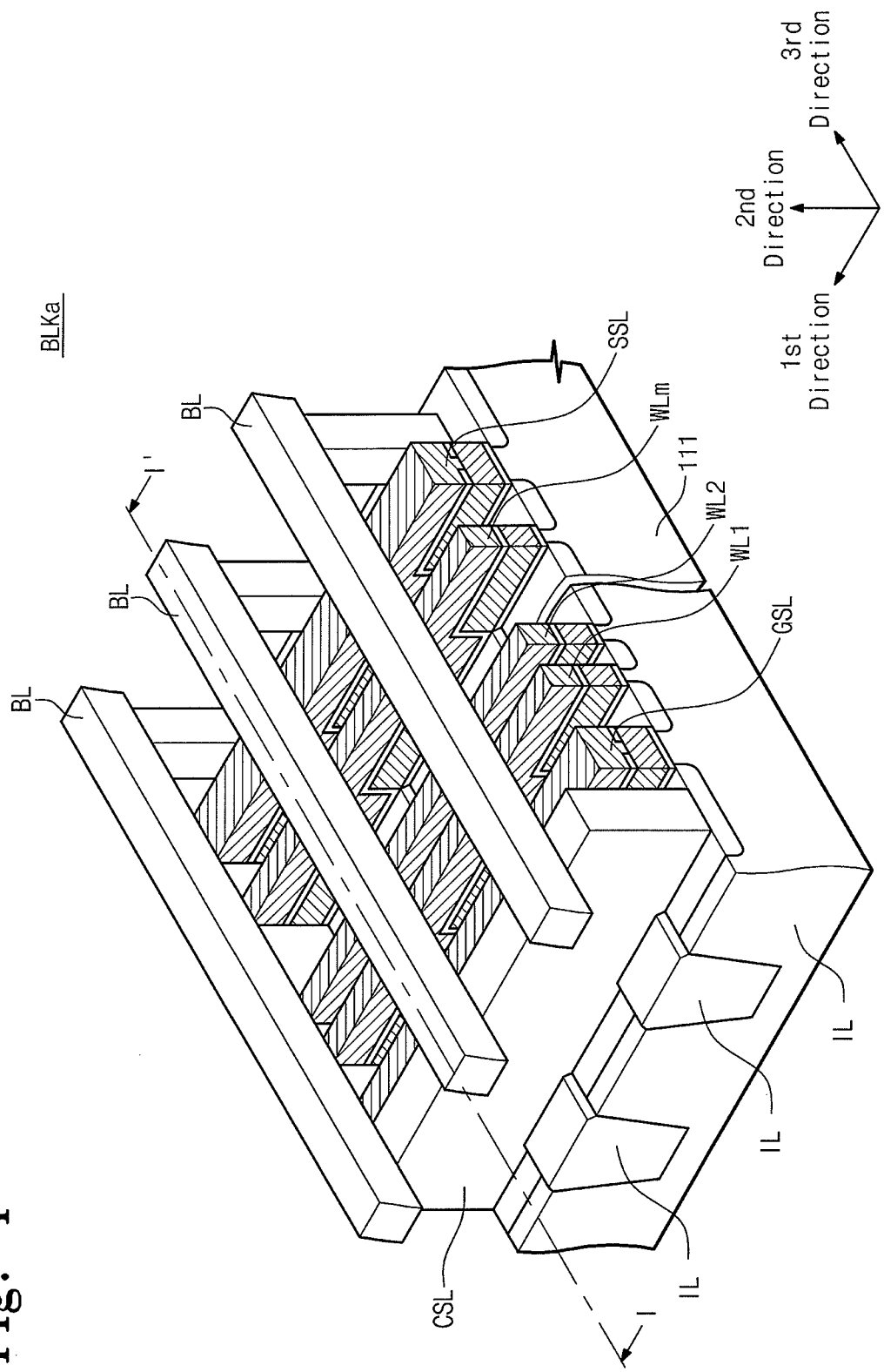
FIG. 4 is a perspective view illustrating one of the memory blocks of FIG. 2 according to an embodiment of the inventive concept.
Figure 5:
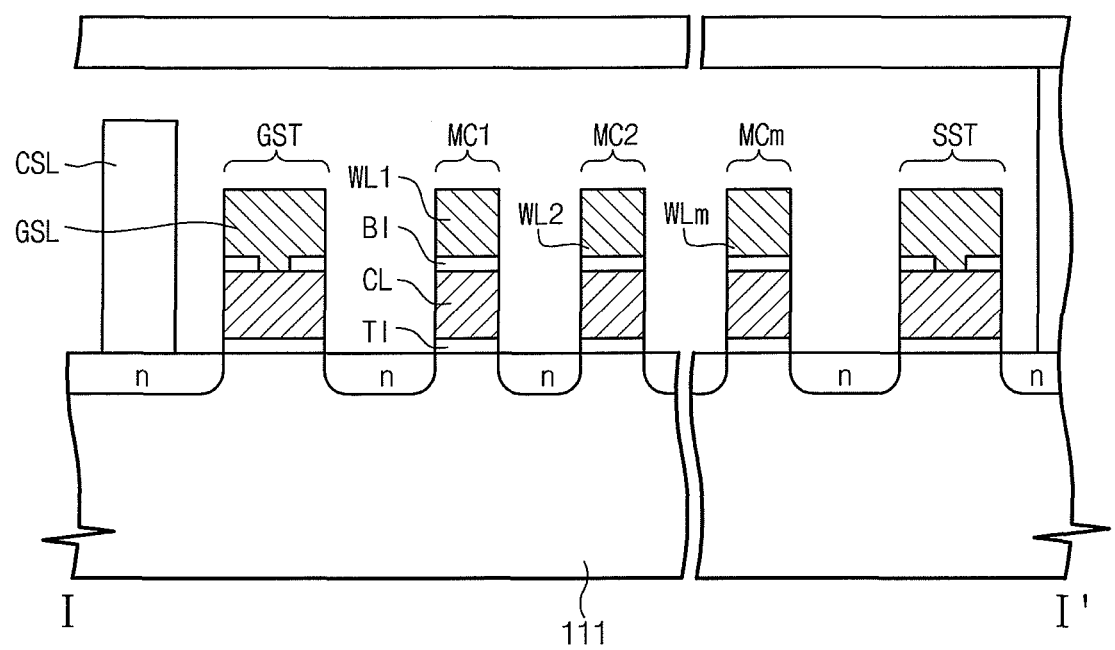
FIG. 5 is a sectional view taken along the line I-I' of the memory block of FIG. 4 according to an embodiment of the inventive concept.

FIG. 4 is a perspective view illustrating one BLKa of the memory blocks BLK1 to BLKz of FIG. 2. FIG. 5 is a sectional view taken along the line I-I' of the memory block BLKa of FIG. 4. Referring to FIGS. 4 and 5, a substrate 111 of the memory block BLKa is provided. For example, the substrate 111 is a well having a p-conductive type.

A device isolation layer IL is provided on the substrate 111 to define an active region. Exemplarily, it is shown that three active regions that extend along a third direction and are spaced along a first direction by a specific distance are defined. However, the number of active regions is not limited.

A tunnel insulation layer TI is provided on each active region. In each active region, the tunnel insulation layers TI are spaced along the third direction by a specific distance. For example, each tunnel insulation layer TI may include a thermal oxide layer. For example, each tunnel insulation layer TI may include an oxide layer.

In each active region, charge storage layers CL are provided on the tunnel insulation layers TI. For example, the charge storage layers CL may include a conductive material such as polysilicon. For example, each charge storage layer CL may include a nitride layer or a metal oxide layer (e.g., an aluminum oxide layer, or a hafnium oxide layer).

If the charge storage layers CL include a conductive material such as polysilicon, the charge storage layers may operate as floating gates. That is, the charge storage layers CL store data by accumulating charges. If the charge storage layers CL include an insulation material, the charge storage layers operate as charge trapping layers. That is, the charge storage layers CL store data by trapping charges.

The tunnel insulation layers TI and charge storage layers CL are provided along the first direction on a plurality of active regions. On an axial line where the tunnel insulation layers TI and the charge storage layers CL are provided along the first direction, block insulation layers BI are provided along the first direction. Each block insulation layer BI may include a nitride layer. Each blocking insulation layer BI may include a high dielectric layer (e.g., an aluminum oxide layer, or a hafnium oxide layer) having a higher dielectric constant than that of the tunneling insulation layers TI.

A polysilicon layer is provided on the tunnel insulation layers TI. The polysilicon layer extends along the first direction on a plurality of active regions. The polysilicon layer is spaced along the third direction by a specific distance.

Each of the tunneling insulation layer TI, the charge storage layer CL, the blocking insulation layer BI, and the polysilicon layer constitutes a gate structure. In an embodiment, each of the tunneling insulation layer TI, the charge storage layer CL, the blocking insulation layer BI, and the polysilicon layer may constitute a memory cell MC. In an embodiment, in a specific gate structure, perforation is formed in the blocking insulation layer BI such that the polysilicon layer and the charge storage layer CL may be connected. This gate structure may form a selection transistor SST or GST.

If the charge storage layer CL includes an insulation material, perforations may not be provided at a blocking insulation layer BI of a gate structure. That is, a charge storage layer CL and a control polysilicon layer of a gate structure of a selection transistor SST or GST may not be separated by a blocking insulation layer BI.

In an embodiment, a polysilicon layer forming a gate structure of a memory cell may extend along the first direction to form a word line WL. In an embodiment, the polysilicon layer forming a gate structure of the selection transistor SST or GST extend along the first direction to form a selection line SSL or GSL.

Junction regions having an n conductive type are formed between gate structures. At this point, a source and a drain of a selection transistor SST or GST can be formed simultaneously. A conductive material extending along the first direction is provided on a source of a ground selection transistor GST. This conductive material forms a common source line CSL. The common source line CSL may include, for example, polysilicon. The common source line CSL may include, for example, metal.

A bit line contact BP connected to a bit line BL is provided on a drain of the string selection transistor SST. That is, a drain of the string selection transistor SST is connected to a corresponding bit line BL through the bit line contact BP. Bit lines are provided on the same axial line as the active regions. Exemplarily, three bit lines are shown.

Figure 6:
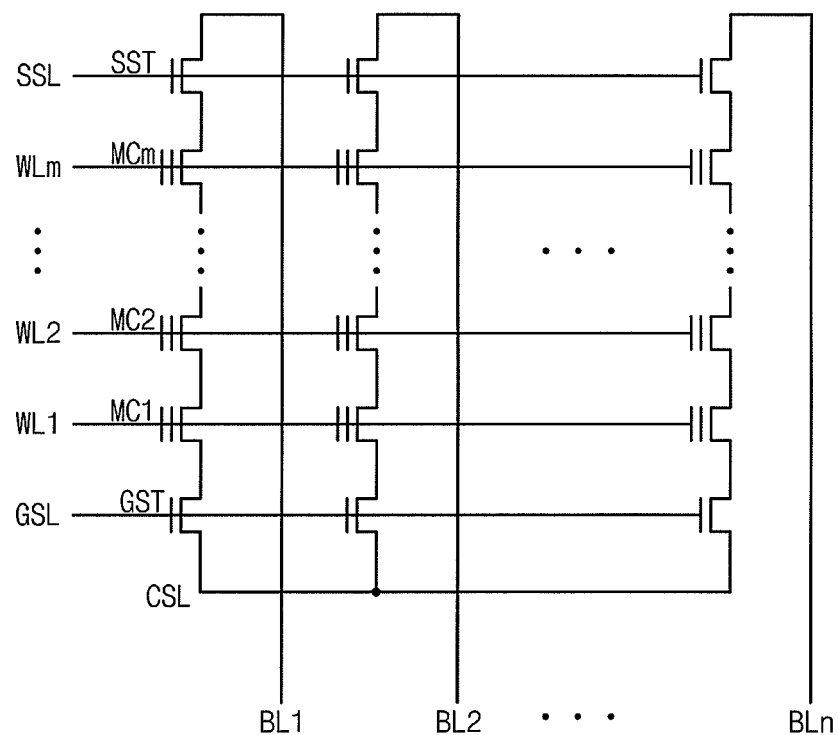
FIG. 6 is a circuit diagram illustrating an equivalent circuit of the memory block described with reference to FIGS. 4 and 5 according to an embodiment of the inventive concept.

FIG. 6 is a circuit diagram illustrating an equivalent circuit BLKa_1 of the memory block BLKa described with reference to FIGS. 4 and 5. Referring to FIG. 6, memory cells provided along a row direction are connected to the word lines WL1 to WLm. The memory cell MC of the same row is connected to the same word line WL.

The memory cells MC provided along a column direction correspond to bit lines BL1 to BLn. The memory cells MC of the same column correspond to the same bit lines BL.

String selection transistors SST are provided between the memory cells MC and the bit lines BL1 to BLn. The string selection transistors SST are commonly connected to one string selection line SSL.

Ground selection transistors GST are connected between the memory cells MC and the common source line CSL. The ground selection transistors GST are commonly connected to one ground selection line GSL.

Figure 7:
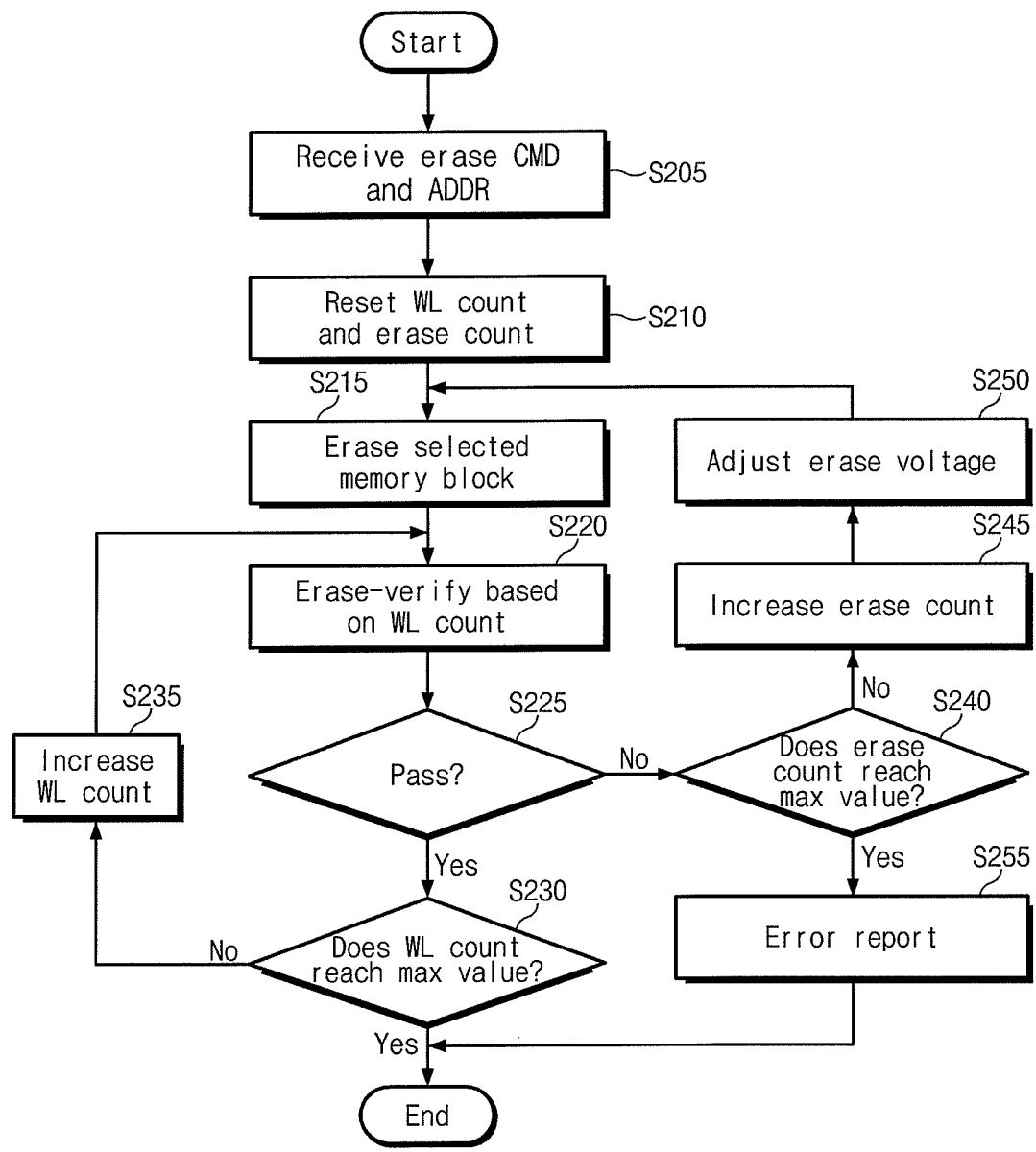
FIG. 7 is a flowchart illustrating a method of operating a nonvolatile memory device according to an embodiment of the inventive concept.

FIG. 7 is a flowchart illustrating a method of operating a nonvolatile memory device according to an embodiment of the inventive concept. Referring to FIGS. 1 through 7, in operation S205, an erase command and an address are received. For example, the received address corresponds to one of a plurality of memory blocks BLK1 to BLKz of the nonvolatile memory device 100a. Among the plurality of memory blocks BLK1 to BLKz, a memory block (e.g., BLKa) corresponding to the received address is selected. Exemplarily, the received address corresponds to at least one string selection line SSL.

In operation S210, a word line count and an erase count are reset. The word line count may correspond to one of addresses of the word lines corresponding to the received address. The reset word line count is reset to represent an address of the first word line WL1 of the selected memory block. The erase count is reset to 1.

In operation S215, memory cells MC corresponding to the received address are erased. The selected memory block BLKa is erased. The control logic 170a controls the address decoder 120, the read & write unit 130, and the voltage generating unit 160 to erase the selected memory block BLKa.

In operation S220, an erase-verification is performed based on a word line count. The word line count may be converted into a word line address. A word line corresponding to the converted word line address among the plurality of word lines of the selected memory block BLKa is selected. Subsequently, the plurality of memory cells corresponding to the selected word line may be erase-verified. The control logic 170a controls the address decoder 120, the read & write unit 130, and the voltage generating unit 160 to erase-verify the plurality of memory cells corresponding to the selected word line.

In operation S225, it is determined whether an erase-verification result is passed. According to whether a pass signal or a fail signal is received from the pass/fail check unit 140, it is determined as being erase-passed or erase-failed. If the erase-verification result is pass, operation S230 is performed.

In operation S230, it is determined whether a word line counter reaches the maximum value. That is, it is determined whether the word line count represents the last word line of the selected memory block BLKa. If the word line count is not the maximum value, the word line count is increased in operation S235. Subsequently, an erase-verification is performed again in operations S220 to S225.

As shown in operations S225 to 235, when the word line corresponding to the word line count is erase-passed, the word line count is increased. That is, if the word line count is the maximum value, it is in a state that all the word lines from the first word line of the selected memory block to the last word line are erase-passed. Accordingly, an erase operation of the selected memory block BLKa is terminated.

In operation S225, if the erase-verification result is failed, it proceeds to operation S240. In operation S240, it is determined whether the erase count reaches the maximum value. The maximum value of the erase count is the maximum number that an erase voltage (or an erase pulse) is applied to the selected block during an erase operation. If the erase count does not reach the maximum value, operation S245 is performed.

In operation S245, the erase count is increased. Later, in operation S250, the erase voltage is adjusted. For example, a level of the erase voltage is increased. Next, the erase (in operation S215) and the erase-verification (in operations S220 to 5225) of the selected memory block BLKa are performed again.

In operation S240, if the erase count reaches the maximum value, operation S255 is performed. In operation S255, an error report is generated. For example, the control logic 170a generates an error report representing that an error occurs during an erase operation. The generated error report is provided to a host of the nonvolatile memory device 100a.

As mentioned above, a word line corresponding to a word line count among word lines of the selected memory block BLKa is erase-verified. That is, the selected memory block BLKa is erase-verified by a unit of respective word line. Accordingly, reliability of the nonvolatile memory device 100a is improved.

If the erase-verification result is erase-failed, the erase and erase-verification are performed with the word line count maintained. That is, the erase-verification resumes from the erase-failed word line. Accordingly, an operating speed of the nonvolatile memory device 100a is improved.

In an embodiment, determining of the erase-pass or erase-fail may vary according to electronic devices used with the nonvolatile memory device 100a. For example, if a device with an n-bit error correction function is used with the nonvolatile memory device 100a, fail bits of less than (or below) an n-bit occurring during an erase-verification may be ignored. That is, even when fail bits of less than (or below) an n-bit during an erase-verification are detected, it may be determined as being erase-passed.

Figures 8, 9:
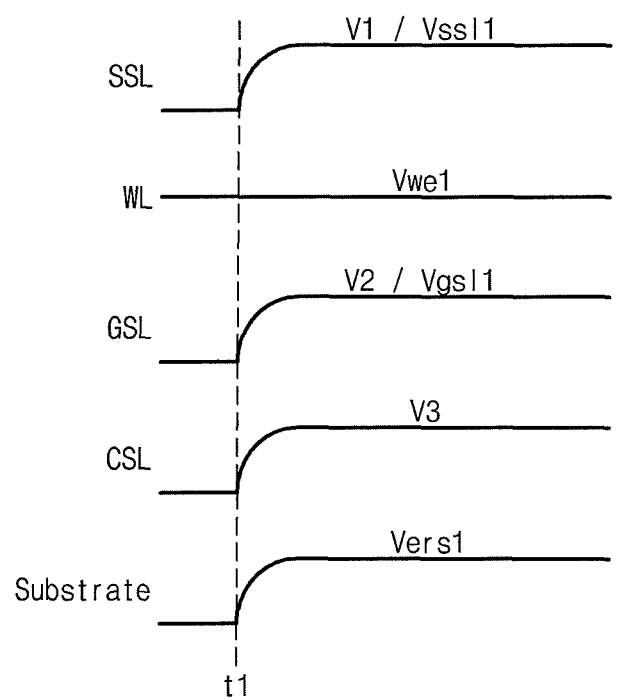
FIG. 8 is a table illustrating voltage conditions during an erase operation of the nonvolatile memory device of FIG. 1 according to an embodiment of the inventive concept.
FIG. 9 is a timing diagram illustrating a voltage change according to voltage conditions of FIG. 8.

FIG. 8 is a table illustrating voltage conditions during an erase operation of the nonvolatile memory device 100a of FIG. 1. Referring to FIGS. 1 through 8, the string selection line SSL of the selected memory block BLKa may float or may be driven using a first string selection line voltage Vssl1.

A first word line erase voltage Vwe1 is applied to word lines WL of the selected memory block BLKa. For example, the first word line erase voltage Vwe1 may be a low voltage. For example, the first word line erase voltage Vwe1 may be a ground voltage Vss.

The ground selection line GSL of the selected memory block BLKa may float or may be driven by a first ground selection line voltage Vgsl1. A common source line CSL may float. A first erase voltage Vers1 may be applied to the substrate 111.

FIG. 9 is a timing diagram illustrating a voltage change according to voltage conditions of FIG. 8. Referring to FIGS. 1 through 9, at the first timing t1, the first word line erase voltage Vwe1 is applied to word lines of the selected memory block BLKa and the first erase voltage Vers is applied to the substrate 111. Exemplarily, in order for Fowler-Nordheim (F-N) tunneling to occur by a voltage difference between the first word line erase voltage Vwe1 and the first erase voltage Vers1, levels of the first word line erase voltage Vwe1 and the first erase voltage Vers1 are set. Accordingly, memory cells MC are erased.

If the string selection line SSL of the selected memory block BLKa floats, the string selection line SSL may be affected by coupling from the substrate 111. As a voltage of the substrate 111 is increased to the first erase voltage Vers1, a voltage of the string selection line SSL may be increased to a first voltage V1. If the first string selection line voltage Vssl1 is applied to the string selection line SSL, a voltage of the string selection line SSL may be controlled by the first string selection line voltage Vssl1. In an embodiment, levels of the first voltage V1 and the first string selection line voltage Vssl1 may be different.

If the ground selection line GSL of the selected memory block BLKa floats, the ground selection line GSL may be affected by coupling from the substrate 111. As a voltage of the substrate 111 is increased to the first erase voltage Vers1, a voltage of the ground selection line GSL may be increased to a second voltage V2. If the first ground selection line voltage Vgsl1 is applied to the ground selection line GSL, a voltage of the ground selection line GSL may be controlled by the first ground selection line voltage Vgsl1. In an embodiment, levels of the second voltage V2 and the first string selection line voltage Vssl1 may be different.

A source of the ground selection transistor GST forms a p-n forward junction with the substrate 111. Accordingly, the first erase voltage Vers1 is delivered to the common source line CSL through a source of the ground selection transistor GST. For example, a voltage of the common source line CSL may be increased to a third voltage V3.

FIG. 10 is a table illustrating voltage conditions during an erase-verification of the nonvolatile memory device 100a of FIG. 1. Referring to FIGS. 1 through 7 and 10, a first bit line voltage Vbl1 is applied to bit lines BL. For example, the first bit line voltage Vbl1 is a power voltage Vcc.

A second string selection line voltage Vssl2 is applied to the string selection line SSL of the selected memory block BLKa. For example, the second string selection line voltage Vssl2 may be a voltage for turning on the string selection transistors SST. For example, the second string selection line voltage Vssl2 may be a power voltage Vcc.

An erase-verification according to an embodiment of the inventive concept is performed by a unit of respective word line. Accordingly, a voltage of the selected word line and voltages of the word lines are controlled differently. A first verify voltage Vvfy1 is applied to a selected word line of the selected memory block BLKa. For example, the first erase verify voltage Vvfy1 is set as the upper limit of a threshold voltage required for memory cells in an erase state. For example, the first erase verify voltage Vvfy1 may be a ground voltage Vss.

A first non-selection word line voltage Vuwl1 is applied to unselected word lines of the selected memory block BLKa. In an embodiment, the first non-selection word line voltage Vuwl1 is a voltage for turning on memory cells MC regardless of a logic state of the memory cells MC. In an embodiment, the first non-selection word line voltage Vuwl1 may be a non-selection read voltage Vread applied to the unselected word lines during a read operation or a pass voltage Vpass applied to the unselected word lines during a program operation.

A second ground selection line voltage Vgsl2 is applied to the ground selection line GSL of the selected memory block BLKa. For example, the second ground selection line voltage Vgsl2 is a voltage for turning on the ground selection transistors. For example, the second ground selection line voltage Vgsl2 may be a power voltage Vcc.

A common source line voltage Vcsl1 is applied to the common source line CSL. For example, the first common source line voltage Vcsl1 may be a ground voltage Vss.

Figure 11:
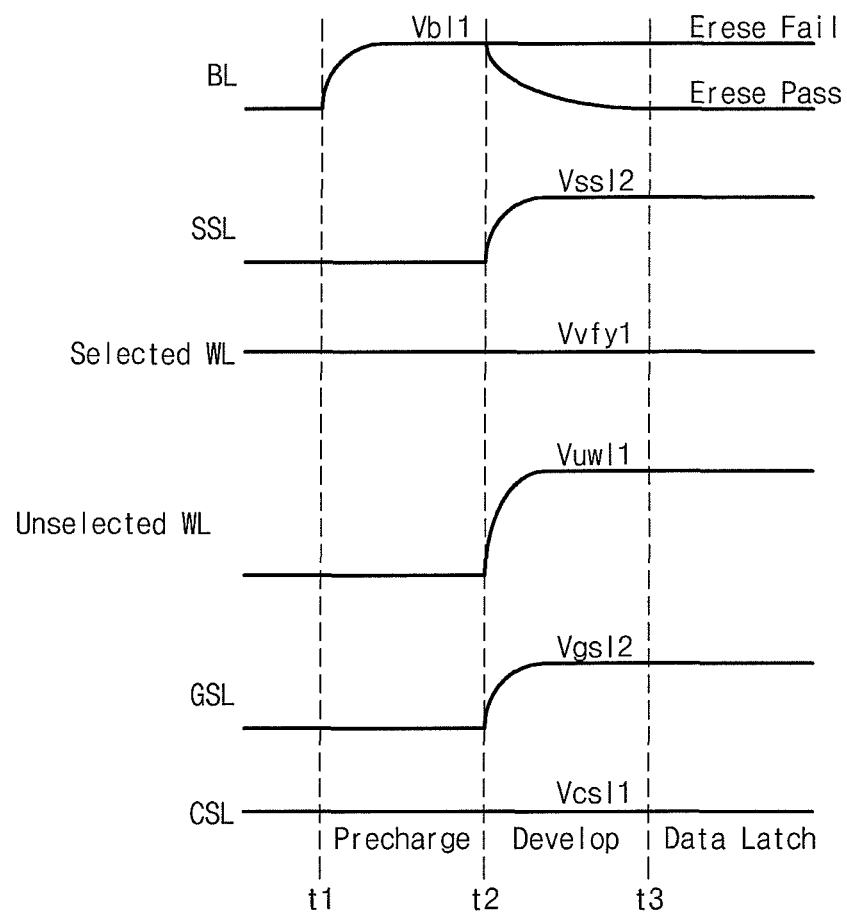
FIG. 11 is a timing diagram illustrating a voltage change according to voltage conditions of FIG. 10.

FIG. 11 is a timing diagram illustrating a voltage change according to voltage conditions of FIG. 10. Referring to FIGS. 1 through 7, 10, and 11, precharge is performed at the first timing t1. A first bit line voltage Vbl1 is applied to bit lines BL. The bit lines BL is precharged with the first bit line voltage Vbl1. After the precharging of the bit lines BL, the bit lines BL may float.

Develop is performed at the second timing t2. A second string selection line voltage Vssl2 is applied to a string selection line SSL of the selected memory block BLKa. That is, string selection transistors SST of the selected memory block BLKa are turned on.

A second ground selection line voltage Vgsl2 is applied to the ground selection line GSL of the selected memory block BLKa. That is, ground selection transistors GST of the selected memory block BLKa are turned on.

A first non-selection word line voltage Vuwl1 is applied to the unselected word lines of the selected memory block BLKa. That is, memory cells MC connected to the unselected word lines of the selected memory block BLKa are turned on.

A first erase verify voltage Vvfy1 is applied to a selected word line of the selected memory block BLKa. If a threshold voltage of the memory cell MC connected to the selected word line is higher than the first erase verify voltage Vvfy1, the corresponding memory cell MC may be turned off. That is, since no channel is formed between the bit line BL and the common source line CSL, a voltage of the bit line BL maintains the first bit line voltage Vbl1.

If a threshold voltage of the memory cell MC connected to a selected word line is lower than a first erase verify voltage Vvfy1, a corresponding memory cell MC may be turned on. That is, a channel is formed between the bit line BL and the common source line CSL. The first bit line voltage Vbl1 precharged to the bit line BL is discharged to the common source line CSL. That is, a voltage of the bit line BL becomes lower than the first bit line voltage Vbl1.

Data latch is performed at the third timing t3. For example, according to voltage levels of the bit lines BL, erase-pass and erase-fail are determined. For example, if voltages of the bit lines BL are lower than the first bit line voltage Vbl1, the selected word line may be determined as being erase-passed. When at least one voltage of the bit lines BL maintains the first bit line voltage Vbl1, the selected word line may be determined as being erase-failed.

According to error correction ability of the nonvolatile memory device 100a or a host of the nonvolatile memory device 100a, a determination criterion of the erase-pass and erase-fail about the selected word line may vary. For example, if the error correction ability of the nonvolatile memory device 100a or a host of the nonvolatile memory device 100a is improved, the selected word line may be determined as being erase-passed even if at least one voltage of the bit lines BL maintains the first bit line voltage Vbl1.

Figure 12:
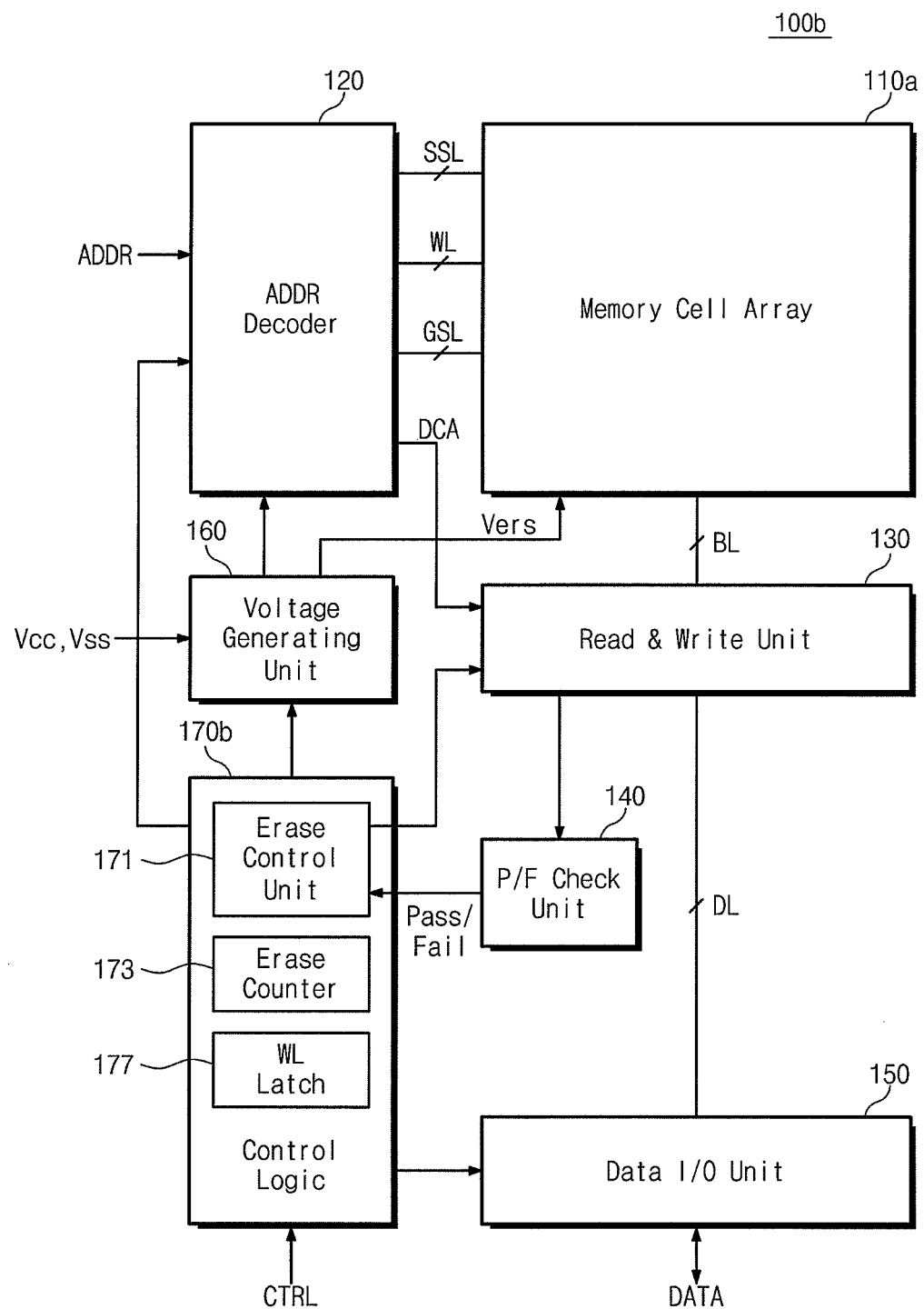
FIG. 12 is a block diagram illustrating a nonvolatile memory device according to an embodiment of the inventive concept.

FIG. 12 is a block diagram illustrating the nonvolatile memory device 100b according to an embodiment of the inventive concept. Referring to FIG. 12, the nonvolatile memory device 100b includes a memory cell array 110a, an address decoder 120, a read & write unit 130, a pass/fail check unit 140, a data I/O unit 150, a voltage generating unit 160, and a control logic 170b. Except for the control logic 170b, the nonvolatile memory device 100b has substantially the same structure as the nonvolatile memory device 100a of FIG. 1. In the same manner, memory blocks BLK1 to BLKz of the memory cell array 110a have the same structures as those described with reference to FIGS. 2 and 4 through 6.

The control logic 170b includes an erase control unit 171, an erase counter 173, and a word line address latch 177. The erase control unit 171 is configured to control an erase operation of the nonvolatile memory device 100b. The erase control unit 171 may control an erase and erase-verification. The erase control unit 171 controls an erase and erase-verification based on information stored in the erase counter 173, information stored in the word line address latch 177, and information transmitted from the pass/fail check unit 140.

An erase count of the erase counter 173 represents the number that how many times a specific memory block of the memory cell array 110a is erased during an erase operation.

The word line address latch 177 is configured to store an address of at least one word line WL of the selected memory block BLKa.

The nonvolatile memory device 100b may operate according to the operating method described with reference to FIG. 3. That is, during an erase operation, after the selected memory of the nonvolatile memory device 100b is erased (operation S110), an erase-verification (operation S120) may be performed by a unit of respective word line. Then, until the selected memory block is erase-passed or an error occurs, an erase-verification repeats (operation S130) from the erase and erase-failed word line.

Figure 13:
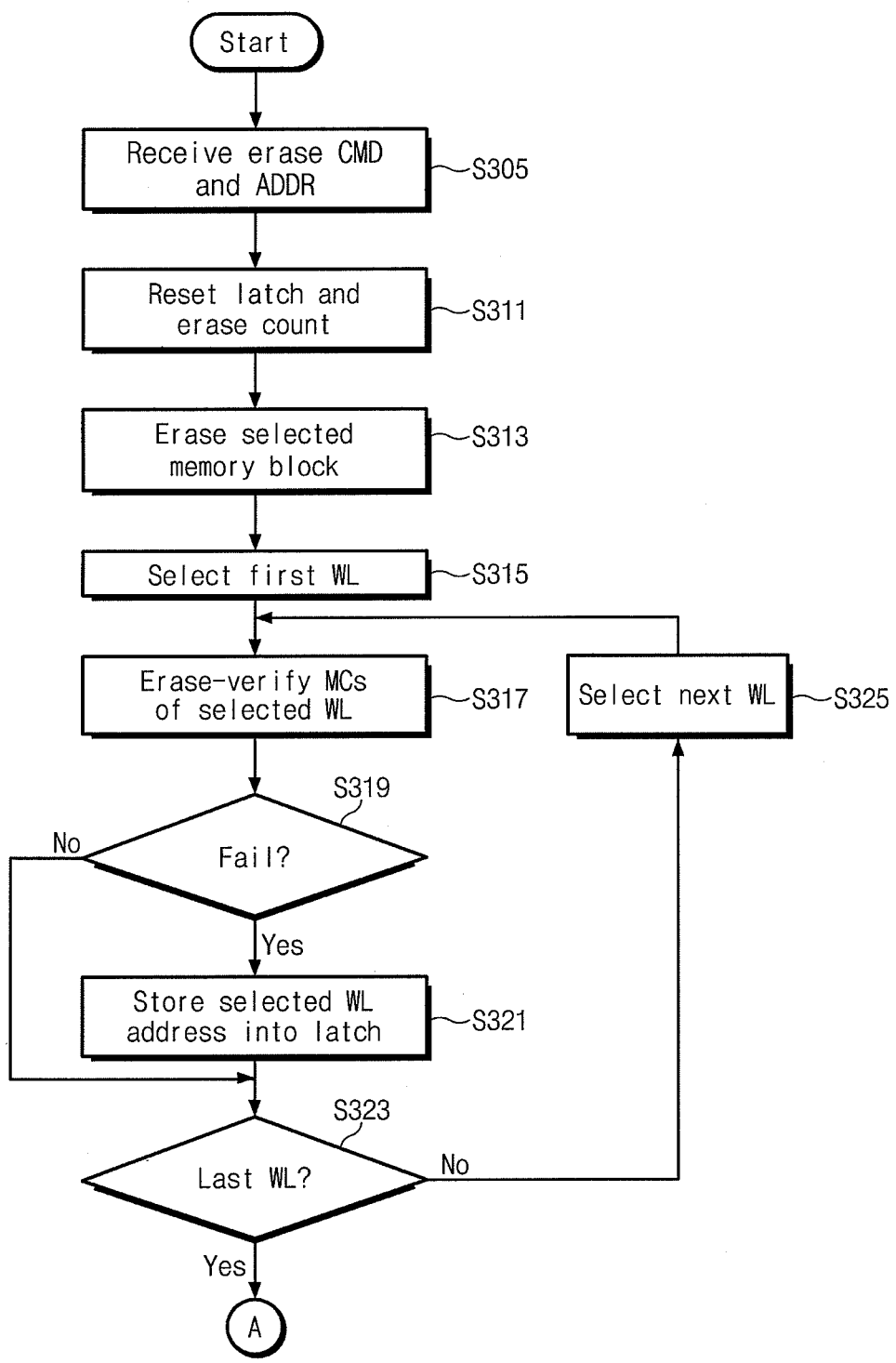
FIGS. 13 and 14 are flowcharts illustrating a method of operating the nonvolatile memory device of FIG. 12 according to an embodiment of the inventive concept.
Figure 14:
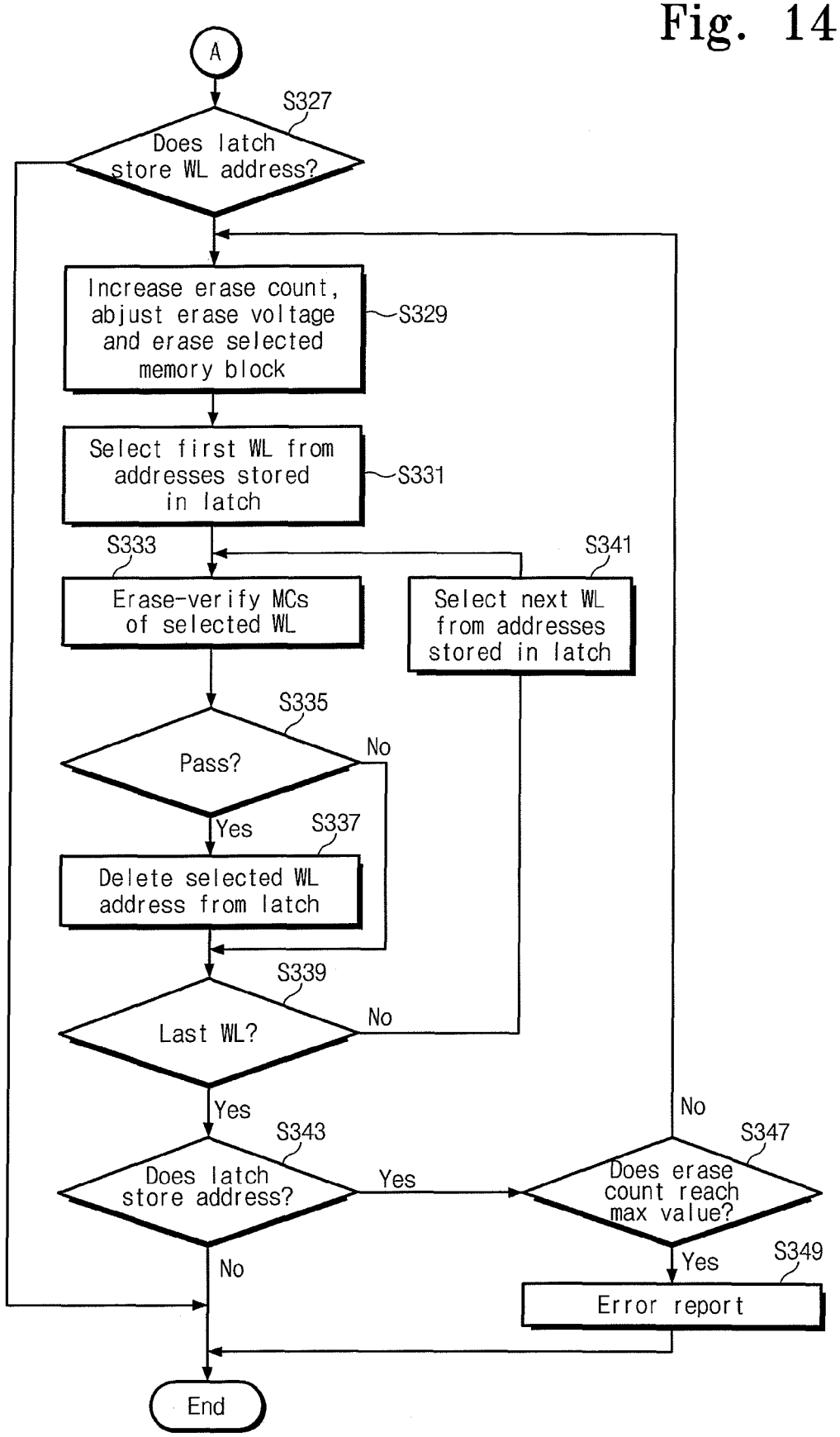

FIGS. 13 and 14 are flowcharts illustrating a method of operating the nonvolatile memory device 100b of FIG. 12 according to an embodiment of the inventive concept. Referring to FIGS. 12 through 14, an erase command and an address are received in operation S305. For example, the received address corresponds to one of the plurality of memory blocks BLK1 to BLKz in the nonvolatile memory device 100b. A memory block (e.g., BLKa) corresponding to the received address among the plurality of memory blocks BLK1 to BLKz is selected. The received address may correspond to at least one string selection line SSL.

In operation S311, the word line address latch 177 and the erase count are reset. The word line address latch 177 may be initialized not to store an address of a word line. For example, the erase count is reset to 1.

In operation S313, the memory cells MC corresponding to the received address are erased. The selected memory block BLKa may be erased. The selected memory block BLKa may be erased according to the voltage conditions and voltage changes shown in FIGS. 8 and 9.

In operation S315, a first word line is selected. For example, the first word line among the word lines corresponding to the received address is selected. For example, the first word line WL1 among the word lines WL1 to WLm of the selected memory block BLKa is selected.

In operation S317, the selected word line is erase-verified. That is, the plurality of memory cells corresponding to the selected word line are erase-verified.

In operation S319, it is determined whether the erase-verification result is erase-failed. If the erase-verification result is determined as being erase-failed, operation S321 is performed. In operation S321, an address of the selected word line is stored in the word line address latch 177. Then, operation S323 is performed. If the selected word line is determined as being erase-pass, operation S321 is omitted and operation S323 is performed.

In operation S323, it is determined whether a selected word line is the last word line. For example, it is determined whether the selected word line is the last word line among the word lines WL1 to WLn of the selected memory block BLKa. If the selected word line is the last word line, operation S327 is performed. If the selected word line is not the last word line, the next word line is selected I operation S325. Then, operations S317 to S323 are performed again.

That is, after the selected memory block BLKa is erased in operation S313, the word lines WL1 to WLm of the selected memory block BLKa are sequentially erase-verified by a unit of respective word line in operations S317 through S325. At this point, an address of the erase-failed word line is stored in the word line address latch 177. That is, when operation S327 is performed, the word line address latch 177 stores addresses of the erase-failed word lines among the word lines WL1 to WLm of the selected memory block BLKa.

In operation S327, it is determined whether the word line address latch 177 stores a word line address. If the word lines WL1 to WLm of the selected memory block BLKa are all erase-passed, the word line address latch 177 does not store a word line address.

If there is an erase-failed word line among the word lines WL1 to WLm of the selected memory block BLKa, the word line address latch 177 stores at least one word line address. At this point, operation S329 is performed.

In operation S329, an erase count is increased, an erase voltage Vers is adjusted, and the selected memory block BLKa is erased. For example, a level of the erase voltage Vers is increased and the selected memory block BLKa is erased.

In operation S331, a first word line is selected from the addresses stored in the word line address latch 177. For example, a first word line is selected from the word lines corresponding to the addresses stored in the word line address latch 177.

In operation S333, the selected word line is erase-verified. That is, a plurality of memory cells corresponding to the selected word line are erase-verified.

In operations S331 and S333, a first word line is selected from the erase-failed word lines and then the selected word line is erase-verified. That is, an erase-verification resumes from the erase-failed word line.

In operation S335, it is determined whether an erase-verification determination is erase-pass. If the selected word line is determined as being erase-passed, an address of the selected word line is erased from the word line address latch 177 in operation S337. Next, operation S339 is performed. If the selected word line is determined as being erase-failed, operation S337 is omitted and operation S339 is performed.

In operation S339, it is determined whether the selected word line is the last word line. For example, it is determined whether the selected word line is the last word line among word lines corresponding to addresses stored in the word line address latch 177. If the selected word line is the last word line, operation S343 is performed. If the selected word line is not the last word line, the next word line is selected from the addresses stored in the word line address latch 177 in operation S341.

That is, after the selected memory block BLKa is erased again in operation S329, word lines corresponding to addresses stored in the word line address latch 177 among the word lines WL1 to WLm of the selected memory block BLKa are erase-verified by a unit of respective word line in operations S333 through S341. An address of the erase-passed word line is erased from the word line address latch 177. That is, the word line address latch 177 is updated to store addresses of the erase-failed word lines.

In operation S343, it is determined whether the word line address latch 177 stores an address. If the word line address latch 177 does not store an address, it means that the word lines WL1 to WLm of the selected memory block BLKa are erase-passed. Accordingly, an erase operation is terminated.

If the word line address latch 177 stores at least one address, it means that at least one word line among the word lines WL1 to WLm of the selected memory block BLKa is erase-failed. At this point, operation S347 is performed.

In operation S347, it is determined whether an erase count reaches the maximum value. If the erase count does not reach the maximum value, operation S329 is performed again. That is, an erase-verification is performed again from an erase and erase-failed word line. If the erase counter reaches the maximum value, an error report is generated in operation S349. For example, the control logic 170b generates an error report representing that an error occurs during an erase operation. The generated error report may be provided to a host of the nonvolatile memory device 100b.

In an embodiment, a criterion of the erase-pass and erase-fail may vary according to electronic devices used with the nonvolatile memory device 100b. When a device with an n-bit error correction function is used with the nonvolatile memory device 100b, fail bits of less than (or below) an n-bit occurring during an erase-verification may be ignored. That is, even if fail bits of less than (or below) an n-bit are detected during an erase-verification, it may be determined as being erase-passed.

Figure 15:
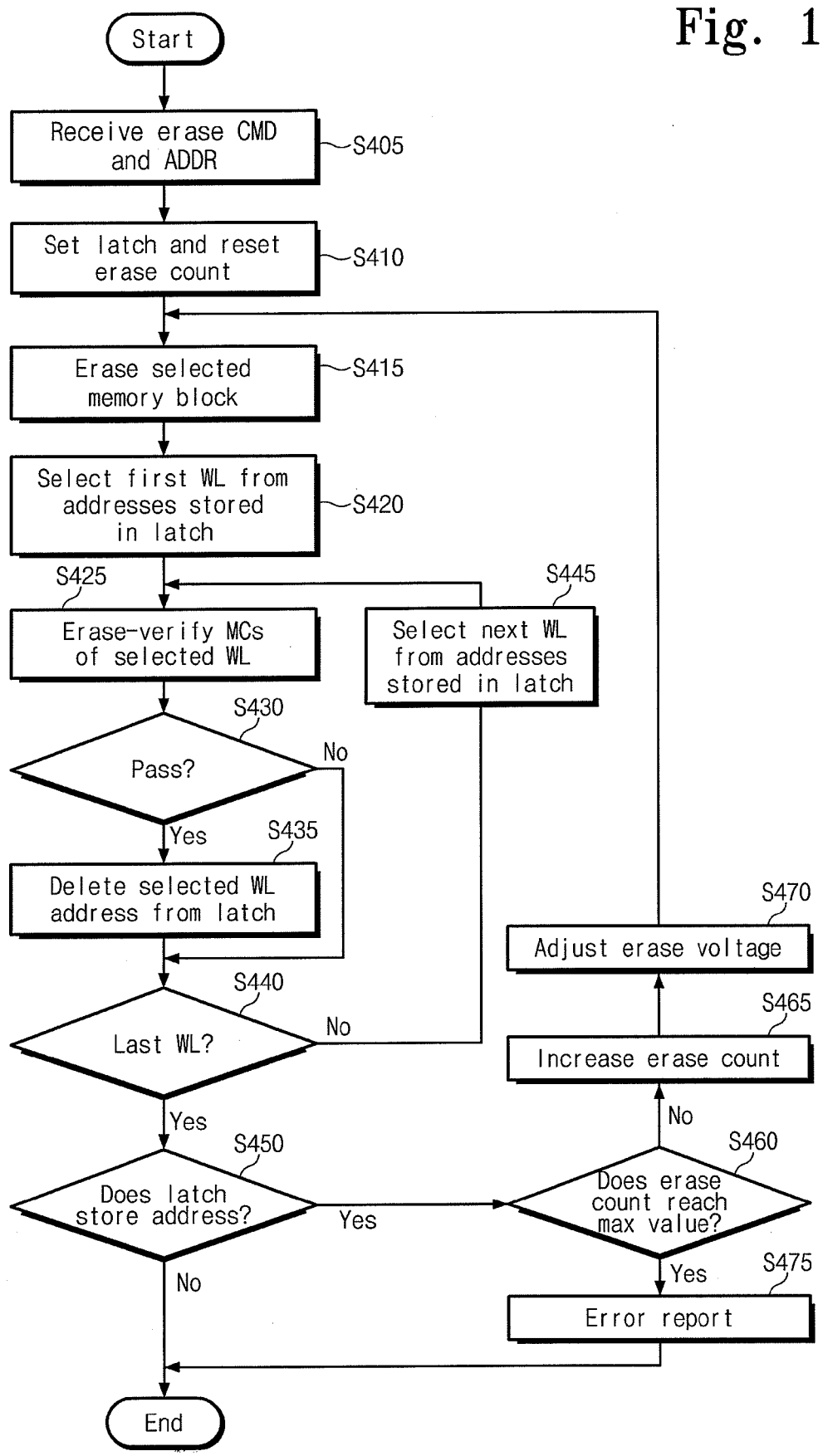
FIG. 15 is a flowchart illustrating a method of operating the nonvolatile memory device of FIG. 12 according to an embodiment of the inventive concept.

FIG. 15 is a flowchart illustrating a method of operating the nonvolatile memory device 100b of FIG. 12 according to an embodiment of the inventive concept. Referring to FIGS. 12 and 15, an erase command and an address are received in operation S405.

Exemplarily, the received address corresponds to at least one string selection line SSL. For example, the received address corresponds to one of the plurality of memory blocks BLK1 to BLKz of the nonvolatile memory device 100b. A memory block (e.g., BLKa) corresponding to the received address among the plurality of memory blocks BLK1 to BLKz is selected. In operation S410, the word line address latch 177 is set and an erase count is reset. For example, the word line address latch 177 is set to store addresses of the word lines WL corresponding to the received address. For example, the erase count is reset to 1.

In operation S415, memory cells MC corresponding to the received address are erased. For example, the selected memory block BLKa may be erased.

In operation S420, a first word line is selected from the addresses stored in the word line address latch 177. For example, a first word line is selected from the word lines corresponding to the addresses stored in the word line address latch 177.

In operation S425, a selected word line is erase-verified. Memory cells corresponding to the selected word line among the plurality of memory cells MC of the selected memory block BLKa are erase-verified.

In operation S430, it is determined whether an erase-verification result is passed. If the selected word line is determined as being erase-passed, an address of the selected word line is erased from the word line address latch 177 during operation S435. Next, operation S440 is performed. If the selected word line is determined as being erase-failed, operation S435 is omitted and operation S440 is performed.

In operation S440, it is determined whether the selected word line is the last word line. For example, it is determined whether the selected word line is the last word line among word lines corresponding to addresses stored in the word line address latch 177. If the selected word line is not the last word line, the next word line is selected from the word line addresses stored in the word line address latch 177 in operation S445. Next, operations S425 through S440 are performed again. If the selected word line is the last word line, operation S450 is performed.

In operations S425 through S445, word lines corresponding to the addresses stored in the word line address latch 177 among the word lines of the selected memory block BLKa are erase-verified by a unit of respective word line. At this point, an address of the erase-passed word line is erased from the word line address latch 177.

In operation S450, it is determined whether the word line address latch 177 stores an address. If the word line address latch 177 does not store an address, it means that the word lines WL1 to WLm of the selected memory block BLKa are erase-passed. Accordingly, an erase operation is terminated. If the word line address latch 177 stores at least one address, it means that at least one word line among the word lines WL1 to WLm of the selected memory block BLKa is erase-failed. At this point, operation S460 is performed.

In operation S460, it is determined whether an erase count reaches the maximum value. If the erase count does not reach the maximum value, the erase count is increased in operation S465. An erase voltage Vers is adjusted in operation S470. For example, a level of the erase voltage Vers may be increased. Later, operation S415 is performed again. That is, an erase-verification is performed again from an erase and erase-failed word line.

If the erase count reaches the maximum value, an error report is generated in operation S475. For example, the control logic 170b generates an error report representing that an error occurs during an erase operation. The generated error report may be provided to a host of the nonvolatile memory device 100b.

Exemplarily, a criterion of the erase-pass and erase-fail may vary according to electronic devices used with the nonvolatile memory device 100b. For example, when a device with an n-bit error correction function is used with the nonvolatile memory device 100b, fail bits of less than (or below) an n-bit occurring during an erase-verification may be ignored. That is, even if fail bits of less than (or below) an n-bit are detected during an erase-verification, it may be determined as being erase-passed.

Figure 16:
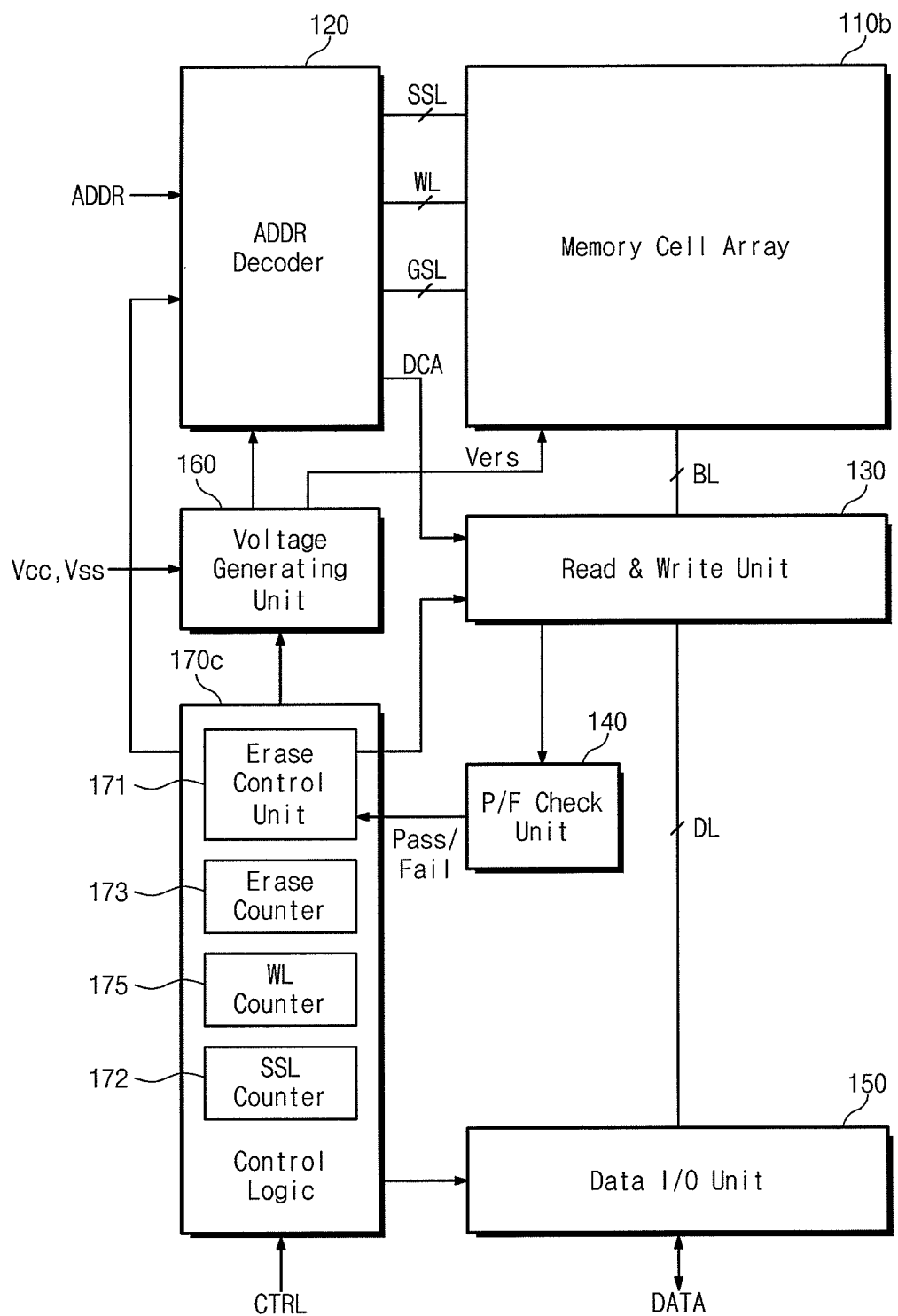
FIG. 16 is a block diagram of a nonvolatile memory device according to an embodiment of the inventive concept.

FIG. 16 is a block diagram of a nonvolatile memory device 100c according to an embodiment of the inventive concept. Referring to FIG. 16, the nonvolatile memory device 100c includes a memory cell array 110b, an address decoder 120, a read & write unit 130, a pass/fail check unit 140, a data I/O unit 150, a voltage generating unit 160, and a control logic 170c. Except for the memory cell array 110b and the control logic 170c, the nonvolatile memory device 100c has substantially the same structure of the nonvolatile memory device 100a described with reference to FIG. 1.

The memory cell array 110b is connected to the address decoder 120 through word lines WL, string selection lines SSL, and ground selection lines GSL. Additionally, the memory cell array 110b is connected to the read & write unit 130 through the bit lines BL. As shown in FIG. 2, the memory cell array 110b includes a plurality of memory blocks BLK1 to BLKz. A plurality of string selection lines SSL, a plurality of word lines WL, and at least one ground selection line GSL are provided in each memory block.

The memory cell array 110b includes a plurality of memory cell groups. For example, the memory cell array 110b includes memory cell groups disposed on a substrate along the row and column directions. Each memory cell group includes a plurality of memory cells stacked along a direction intersecting the substrate. That is, the memory cells are provided on the substrate along the row and column, and are stacked in a direction intersecting the substrate to form a three-dimensional structure. Exemplarily, the memory cell array 110b includes a plurality of memory cells storing at least one bit in each cell.

The control logic 170c includes an erase control unit 171, an erase counter 173, a word line counter 175, and a string selection line counter (hereinafter, referred to as a SSL counter) 172. The erase control unit 171 is configured to control an erase operation of the nonvolatile memory device 100c. For example, the erase control unit 171 controls an erase and erase-verification. For example, the erase control unit 171 controls an erase and erase-verification based on information stored in the erase counter 173, information stored in the word line counter 175, information stored in the SSL counter 172, and information transmitted from the pass/fail check unit 140.

An erase count of the erase counter 173 represents the number that how many times a specific memory block of the memory cell array 110a is erased during an erase operation.

A word line count of the word line counter 175 represents an address of a word line of the selected memory block. For example, the word line count represents one address of the word lines WL1 to WLm of the selected memory block.

A count value of the SSL counter 172 represents an address of the string selection line SSL of the selected memory block. For example, the count value of the SSL counter 172 represents one address of the string selection lines SSL of the selected memory block. Hereinafter, the count value of the SSL counter 172 is defined as a SSL count.

Figure 17:
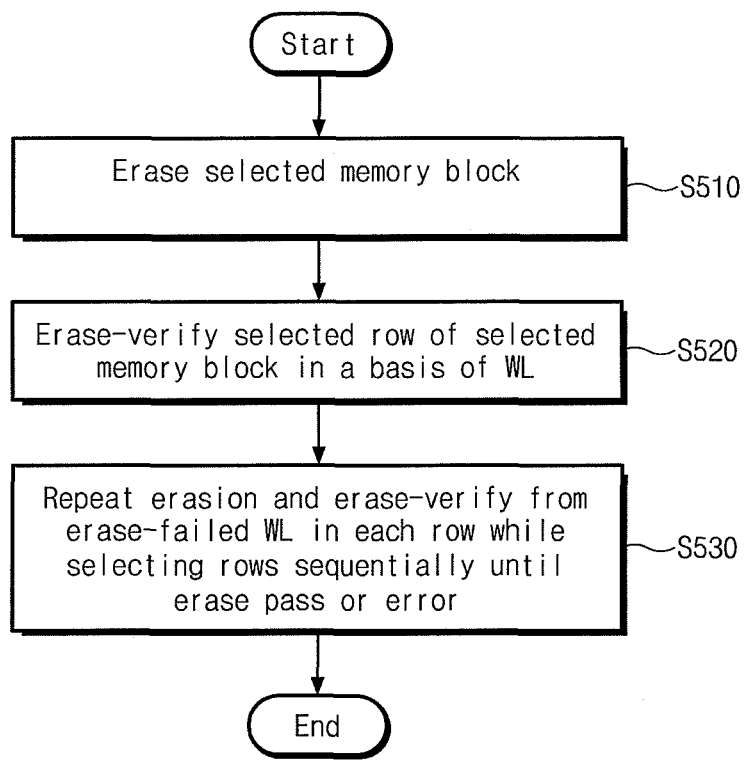
FIG. 17 is a flowchart illustrating an operating method of the nonvolatile memory device of FIG. 16 according to an embodiment of the inventive concept.

FIG. 17 is a flowchart illustrating an operating method of the nonvolatile memory device 100c of FIG. 16 according to an embodiment of the inventive concept. Referring to FIGS.

16 and 17, the selected memory block is erased in operation S510. For example, a memory block selected from the memory blocks BLK1 to BLKz of the memory cell array 110b may be erased.

In operation 520, a selected row of the selected memory block is erase-verified by a unit of respective word line. For example, a first row of the selected memory block is selected, it may be erase-verified by an unit of respective word line. If an $i^{th}$ row of the selected block is selected, it may be erase-verified by a unit of respective word line.

In operation S530, until it is erase-passed or an error occurs, rows are sequentially selected and an erase-verification is repeated from the erased and erase-failed word line in each row.

That is, as mentioned with reference to FIG. 3, a selected memory block is erase-verified by a unit of respective word line. An erase-verification resumes from the erase-failed word line.

Figure 18:
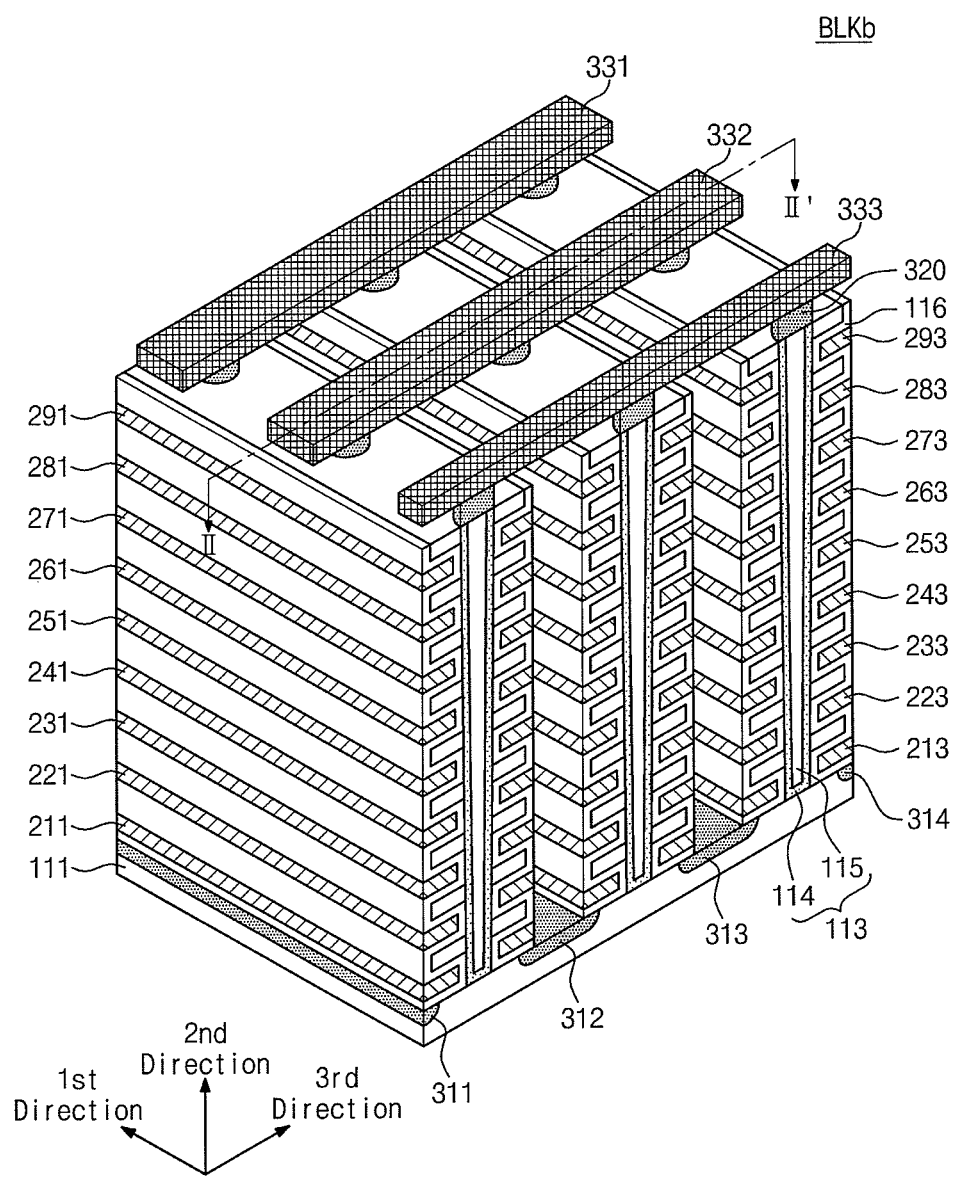
FIG. 18 is a perspective view illustrating one of memory blocks of the nonvolatile memory device of FIG. 16 according to an embodiment of the inventive concept.
Figure 19:
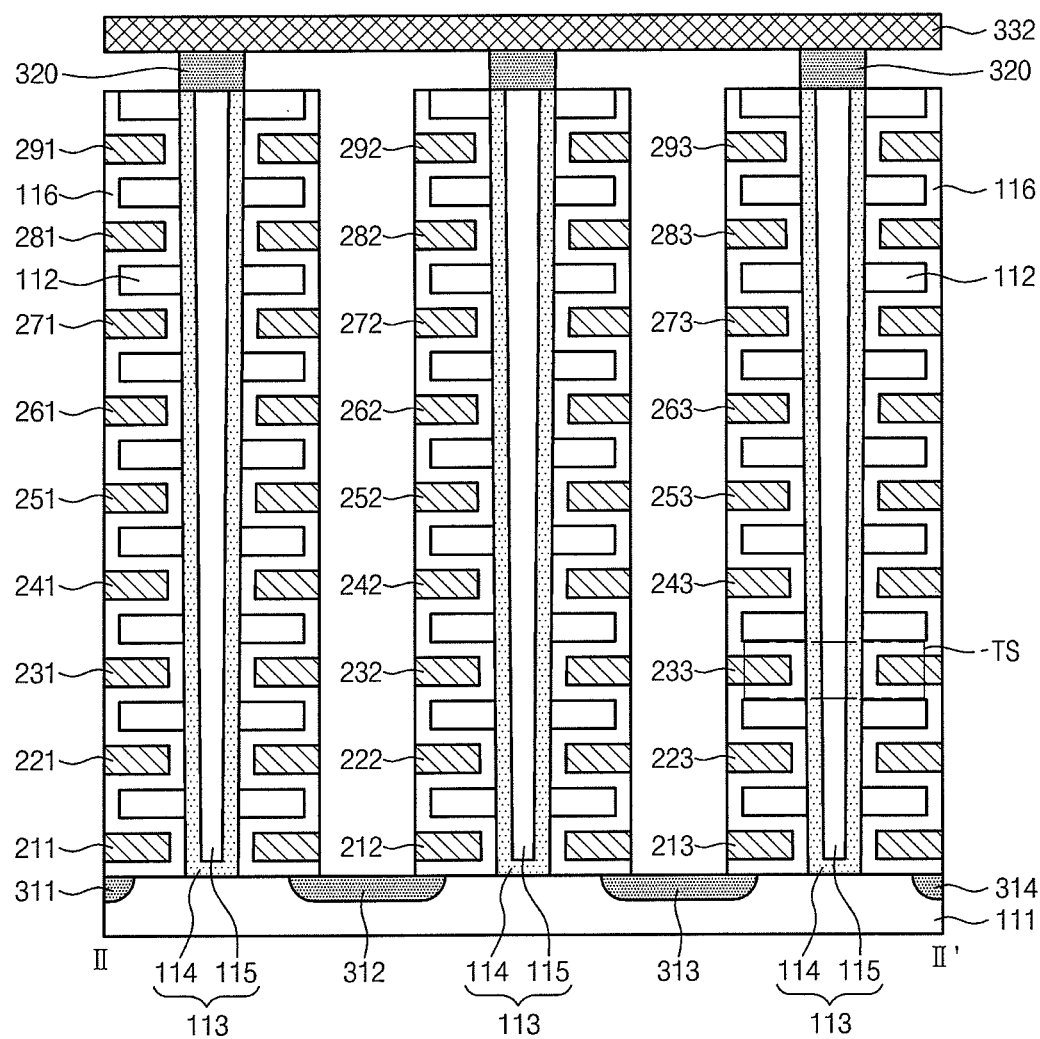
FIG. 19 is a sectional view taken along the line II-IF of the memory block of FIG. 18 according to an embodiment of the inventive concept.

FIG. 18 is a perspective view illustrating one BLKb of memory blocks BLK1 to BLKz of the nonvolatile memory device 100c of FIG. 16 according to an embodiment of the inventive concept. FIG. 19 is a sectional view taken along the line II-II' of the memory block BLKb of FIG. 18. Referring to FIGS. 18 and 19, the memory block BLKb includes structures extending along the first to third directions.

A substrate 111 is provided. Exemplarily, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type packet well). However, the conductive type of the substrate 111 is not limited to the p-type.

A plurality of doping regions 311 to 314 extending along the first direction are provided on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the first direction are sequentially provided along the second direction on a region of the substrate 111 between the first and second doping regions 311 and 312. For example, the plurality of insulation materials are provided along the second direction, being spaced by a specific distance. Exemplarily, the insulation materials 112 may include an insulation material such as an oxide layer.

A plurality of pillars 113 penetrating the insulation materials along the second direction are sequentially disposed along the first direction on a region of the substrate 111 between the first and second doping regions 311 and 312. Exemplarily, the plurality of pillars 113 penetrate the insulation materials 112 to contact the substrate 111.

Exemplarily, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. Exemplarily, the insulation layer 116 provided on the exposed surface in the second direction of the last insulation material 112 may be removed.

Exemplarily, the thickness of the insulation layer 116 may be less than the half of the distance between the insulation materials 112. That is, a region where a material besides the insulation materials 112 and the insulation layer 116 may be disposed is provided between the insulation layer 116 provided on the bottom of a first insulation material among the insulation materials 112 and the insulation layer 116 provided on the top of a second insulation material 116 at the bottom of the first insulation material.

First conductive materials 211 to 291 are provided on the exposed surface of the insulation layer 116, in a region between the first and second doping regions 311 and 312. For example, the first conductive material 211 extending along the first direction is provided between the insulation material 112 adjacent to the substrate 111 and the substrate 111. In more detail, the first conductive material 211 extending along the first direction is provided between the insulation layer 116 at the bottom of the insulation material 112 adjacent to the substrate 111 and the substrate 111.

A first conductive material extending along the first direction is provided between the insulation layer 116 at the top of the specific insulation material among the insulation materials 112 and the insulation layer at the bottom of the insulation material disposed on the top of the specific insulation material. That is, a plurality of first conductive materials 221 to 281 extending along the first direction are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction, a plurality of pillars 113 disposed sequentially along the first direction and penetrating the plurality of insulation materials 112 along the third direction, an insulation layer 116 provided on the exposed surfaces of the plurality of insulation materials 112 and the plurality of pillars 113, and a plurality of conductive materials 212 to 292 extending along the first direction.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the first direction, a plurality of pillars 113 disposed sequentially along the first direction and penetrating the plurality of insulation materials 112 along the third direction, an insulation layer 116 provided on the exposed surfaces of the plurality of insulation materials 112 and the plurality of pillars 113, and a plurality of first conductive materials 213 to 293 extending along the first direction.

Drains 320 are provided on the plurality of pillars 113, respectively. The drains 320 may include silicon materials doped with a second type. For example, the drains 320 may include silicon materials doped with an n-type. In an embodiment, the drains 320 include n-type silicon materials. However, the drains 320 are not limited to the n-type silicon materials.

The width of each drain 320 may be greater than that of the pillar 113. For example, each drain 320 may be provided in a pad form on the top of the corresponding pillar 113. Each drain 320 may extend to a portion of the channel layer 114 of the corresponding pillar 113.

On the drains, the second conductive materials 331 to 333 extending along the third direction are provided. The second conductive materials 331 to 333 are disposed along the first direction, being spaced by a specific distance. The second conductive materials 331 to 333 are respectively connected to the drains 320 in a corresponding region. The drains 320 and the second conductive material 333 extending along the third direction may be connected through each contact plug. The second conductive materials 331 to 333 may include metal materials. The second conductive materials 331 to 333 may include conductive materials such as a polysilicon.

Hereinafter, the heights of the first conductive materials 211 to 291, 212 to 292, and 213 to 293 are defined. It is defined that the first conductive materials 211 to 291, 212 to 292, and 213 to 293 sequentially have the first to ninth heights from the substrate 111. That is, the first conductive materials 211 to 213 adjacent to the substrate 111 have the first height. The first conductive materials 291 to 293 adjacent to the second conductive materials 331 to 333 have the ninth height. As an order from the substrate 111 of a specific conductive material among the first conductive materials 211 to 291, 212 to 292, and 213 to 293 is increased, the height of the first conductive material is increased.

Referring to FIGS. 18 and 19, the pillars 113, the insulation layer 116, and the plurality of first conductive materials 211 to 291, 212 to 292, and 213 to 293 form a string. For example, each pillar 113, an adjacent region of the insulation layer 116, and an adjacent region of the first conductive materials 211 to 291, 212 to 292, and 213 to 293 form a NAND string NS. The NAND string NS includes a plurality of transistor structures TS. The transistor structure TS will be described in more detail with reference to FIGS. 20 through 23.

Figure 20:
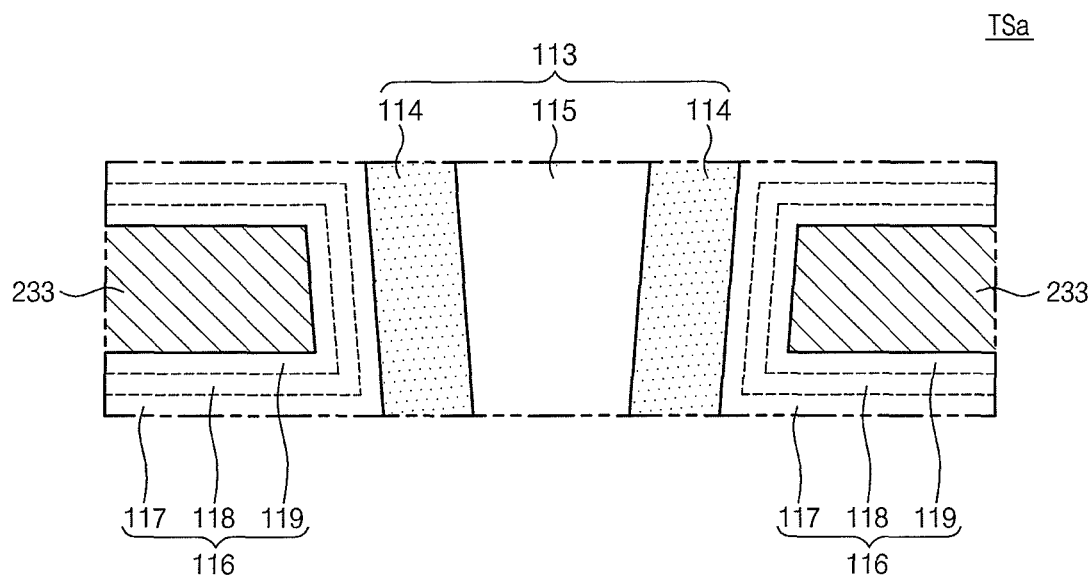
FIG. 20 is a sectional view illustrating a transistor structure according to an embodiment of the inventive concept.

FIG. 20 is a sectional view illustrating a transistor structure TSa according to an embodiment of the inventive concept. Referring to FIGS. 18 through 20, the insulation layer 116 includes first to third sub insulation layers 117, 118, and 119.

The channel layer 114 including the p-type silicon of the pillar 113 may operate as a body. Hereinafter, it is defined that the channel layer 114 including the p-type silicon of the pillar 113 operates as a body of the second direction.

The first sub insulation layer 117 adjacent to the pillar 113 may operate as a tunneling insulation layer. For example, the first sub insulation layer 117 adjacent to the pillar 113 may include a thermal oxide layer.

A second sub insulation layer 118 may operate as a charge storage layer. For example, the second sub insulation layer 118 may operate as charge trapping layer. For example, the second sub insulation layer 118 may include a nitride layer or a metal oxide layer (e.g., an aluminum oxide layer, a hafnium oxide layer, and so on).

A third sub insulation layer 119 adjacent to the first conductive material 233 may operate as a blocking insulation layer. The third sub insulation layer 119 adjacent to the first conductive material 233 extending along the first direction may be formed of a single layer or a multi layer. The third sub insulation layer 119 may be a high dielectric layer (e.g., an aluminum oxide layer, a hafnium oxide layer, and so on) having a higher dielectric constant than the first and second sub insulation layers 117 and 118.

The first conductive material 233 may operate as a gate (or a control gate). That is, the first conductive material 233 operating as a gate (or a control gate), the third sub insulation layer 119 operating as a blocking insulation layer, the second sub insulation layer 118 operating as a charge storage layer, the first sub insulation layer 117 operating as a tunnel insulation layer, and the channel layer 114 of a p-type silicon operating as a body may operate as a transistor (or, a memory cell transistor).

The first to third sub insulation layers 117 to 119 may constitute an oxide-nitride-oxide (ONO).

In the memory block BLKb, one pillar 113 corresponds to one NAND string NS. For example, one pillar 113, the adjacent insulation layer 116, and the adjacent first conductive material form one NAND string NS.

The memory block BLKb includes a plurality of pillars 113. That is, the memory block BLKb includes a plurality of NAND strings NS. The memory block BLKb extends along the second direction (or a direction perpendicular to the substrate) and includes a plurality of NAND strings NS provided along the first and third directions, being spaced by a specific distance.

Each NAND sting NS includes a plurality of transistor structures TS stacked along the second direction. The plurality of transistor structures TS in each NAND string NS operate as a memory cell MC or a selection transistor. In each NAND string NS, at least one transistor structure TS may operate as a dummy memory cell DMC.

For example, in each NAND string NS, at least one transistor structure TS between the transistor structures TS operating as a memory cell MC and the substrate 111 operate as a ground selection transistor GST. In each NAND string, at least one transistor structure TS between the transistor structures TS operating as a memory cell MC and the second conductive materials 331 to 333 operates as a string selection transistor SST.

That is, the memory block BLKb is provided along a row (e.g., the first direction) and a column (e.g., the second direction) on the substrate 111, and includes a plurality of memory cells MC stacked in a direction (e.g., the third direction) intersecting the substrate 111. At least one selection transistor is provided between the memory cells MC and the substrate 111 and on the memory cells 111, respectively.

Gates (or control gates) correspond to the first conductive materials 211 to 291, 212 to 292, and 213 to 293 extending along the first direction. That is, it may be understood that the gates (or, control gates) form the word lines WL extending along the first direction and at least two selection lines SL (e.g., at least one string selection line SSL and at least one ground selection line GSL). The transistor structures TS provided at a specific height may operate as dummy memory cells. That is, it is understood that the gates provided at the specific height extend along the first direction to form a dummy word line DWL.

The second conductive materials 331 to 333 extending along the third direction are connected to one ends of the NAND strings NS. In an embodiment, the second conductive materials 331 to 333 extending along the third direction operate as bit lines BL. That is, in one memory block BLKb, a plurality of NAND strings are connected to one bit linen BL.

The second type doping regions 311 to 314 extending along the first direction are provided at the other ends of the NAND strings NS. The second type doping regions 311 to 314 extending along the first direction operate as a common source line CSL.

The memory block BLKb includes a plurality of NAND strings NS extending along a direction (i.e., the second direction) intersecting the substrate 111 and operates as a NAND flash memory block (e.g., a charge trapping type) where a plurality of NAND strings are connected to one bit line BL in one memory block.

Figure 21:
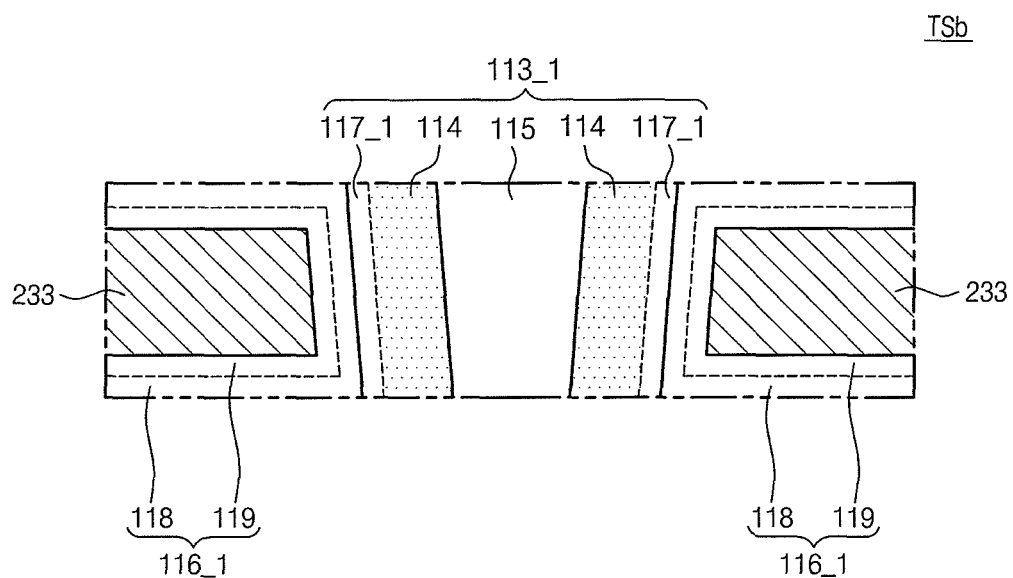
FIG. 21 is a sectional view illustrating a transistor structure according to an embodiment of the inventive concept.

FIG. 21 is a sectional view illustrating a transistor structure TSb according to an embodiment of the inventive concept. Referring to FIGS. 18, 19, and 21, a pillar 113_1 includes a channel layer 114, an internal material 115, and a first sub insulation layer 117_1.

The channel layer 114 may operate as a body of the second direction. The internal material 115 may include an insulation material. The first sub insulation layer 117_1 may operate as a tunneling insulation layer. The first sub insulation layer 117_1 as a component of a pillar 113_1 may extend along a direction intersecting the substrate 111 between the substrate 111 and the drain 116. The first sub insulation layer 117_1 may include the same material as the first sub insulation layer 117 described with reference to FIG. 20.

The insulation layer 116_1 includes a second sub insulation layer 118 and a third sub insulation layer 119. The second sub insulation layer 118 may operate as a charge trapping layer. The second insulation layer 118 may include the same material as the second sub insulation layer 118 described with reference to FIG. 20.

The third sub insulation layer 119 may operate as a blocking insulation layer. The third sub insulation layer 119 may include the same material as the third sub insulation layer 119 described with reference to FIG. 20.

Configurations of the pillar 113_1 and insulation layers 116_1 are different from the structure TSa of FIG. 20. However, between the first conductive material 233 and the channel layer 114, the first to third sub insulation layers 117a, 118, and 119 are provided. That is, as mentioned with reference to FIG. 20, the first conductive material 233, the first to third sub insulation layers 117_1, 118, and 119, and the channel layer 114 may operate as a transistor (or, a memory cell transistor).

Figure 22:
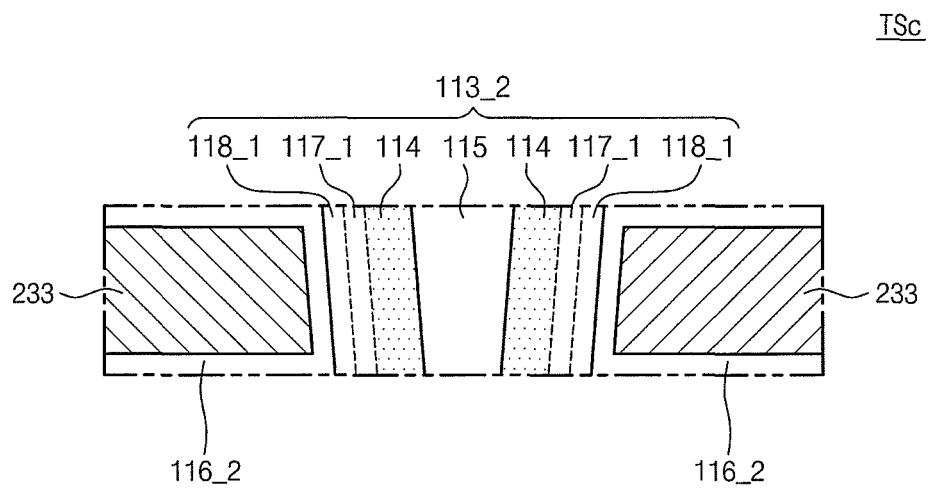
FIG. 22 is a sectional view illustrating a transistor structure according to an embodiment of the inventive concept.

FIG. 22 is a sectional view illustrating a transistor structure TSc according to an embodiment of the inventive concept. Referring to FIGS. 18, 19, and 22, a pillar 1132 includes a channel layer 114, an internal material 115, a first sub insulation layer 117_1, and a second sub insulation layer 118_1.

The channel layer 114 may operate as a body of the second direction. The internal material 115 may include an insulation material. The first sub insulation layer 117_1 may operate as a tunneling insulation layer. The second sub insulation layer 118_1 may operate as a charge storage layer.

The first sub insulation layer 117_1 and the second insulation layer 118_1 as a component of the pillar 113_2 may extend along a direction intersecting the substrate 111 between the substrate 111 and the drain 116. Exemplarily, the first sub insulation layer 117_1 may include the same materials as the first sub insulation layer 117 described with reference to FIG. 20. Exemplarily, the second sub insulation layer 118_1 may include the same materials as the second sub insulation layer 118 described with reference to FIG. 20.

The insulation layer 116_2 may operate as a blocking insulation layer. The insulation layer 116_2 may include the same material as the third sub insulation layer 119 described with reference to FIG. 20.

Configurations of the pillar 113_2 and the insulation layer 116_2 are different from the transistor structure TSa of FIG. 20. However, the insulation layer 116_2 and the first and second sub insulation layers 117_1 and 118_1 are provided between the first conductive material 233 and the channel layer 114. That is, as mentioned with reference to FIG. 20, the first conductive material 233, the insulation layer 116_2, the first and second sub insulation layers 117_1 and 118_1, and the channel layer 114 operate as a transistor (or a memory cell transistor).

Figure 23:
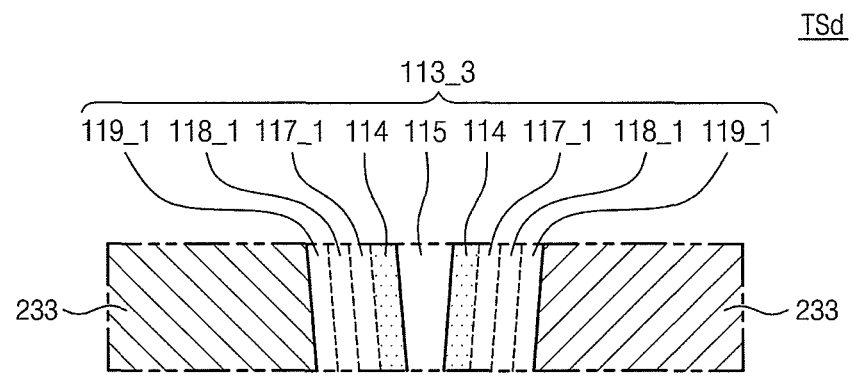
FIG. 23 is a sectional view illustrating a transistor structure according to an embodiment of the inventive concept.

FIG. 23 is a sectional view illustrating a transistor structure TSd according to an embodiment of the inventive concept. Referring to FIGS. 18, 19, and 23, a pillar 113_3 includes a channel layer 114, an internal material 115, a first sub insulation layer 117_1, a second sub insulation layer 118_1, and a third sub insulation layer 119_1. Compared to the transistor structure TSa of FIG. 20, the insulation layer 116 is removed. That is, the first conductive material 233 contacts the pillar 133_3.

The channel layer 114 may operate as a body of the second direction. The internal material 115 may include an insulation material. The first sub insulation layer 117_1 may operate as a tunneling insulation layer. The second sub insulation layer 118_1 may operate as a charge storage layer. The third sub insulation layer 119_1 may operate as a blocking insulation layer.

The first sub insulation layer 117_1, the second sub insulation layer 118_1, and the third sub insulation layer 119_1, as a component of the pillar 113_3, may extend along a direction intersecting the substrate 111 between the substrate 111 and the drain 116. The first sub insulation layer 117_1 may include the same material as the first sub insulation layer 117 described with reference to FIG. 20. The second sub insulation layer 118_1 may include the same material as the second sub insulation layer 118 described with reference to FIG. 20. The third sub insulation layer 119_1 may include the same material as the third sub insulation layer 119 described with reference to FIG. 20.

Configurations of the pillar 113c and the insulation layer 116_3 are different from the transistor structure TSa of FIG. 20. However, the first to third sub insulation layers 117_1, 118_1, and 119_1 are provided between the first conductive material 233 and the channel layer 114. That is, as mentioned with reference to FIG. 20, the first conductive material 233, the first to third sub insulation layers 117_1, 118_1, and 119_1, and the channel layer 114 may operate as a transistor (or a memory cell transistor).

The pillar 113 represents one of the pillars 113, 113_1, 113_2, and 113_3. The insulation layer 116 represents one of the insulation layers 116, 116_2, and 116_3.

Referring to FIGS. 18 through 23, the first conductive materials 211 to 291, 212 to 292, and 213 to 293 are provided in nine layers. However, the conductive materials 211 to 291, 212 to 292, and 213 to 293 are not limited to the nine layers. For example, the first conductive materials may be provided in at least eight layers for forming memory cells and at least two layers for forming selection transistors. The first conductive materials may be provided in at least sixteen layers for forming memory cells and at least two layers for forming selection transistors. The first conductive materials may be provided in a plurality of layers for forming memory cells and at least two layers for forming selection transistors. For example, the first conductive materials may be provided in a layer for forming dummy memory cells.

Referring to FIGS. 18 through 23, three NAND strings NS are connected to one bit line BL. However, the inventive concept is not limited thereto. Exemplarily, the m NAND strings NS may be connected to one bit line BL in the memory block BLKb. At this point, according to the number of NAND strings NS connected to one bit line BL, the number of the first conductive materials 211 to 291, 212 to 292, and 213 to 293 extending along the first direction and the number of the doping regions 311 to 314 operating as the common source line CSL may be adjusted.

As shown in FIG. 18 through 23, a section according to the first and third directions of the pillar 113 may be reduced as being closer to the substrate 111. For example, due to characteristics or errors of manufacturing processes, sections according to the first and third directions of the pillars 113 may vary.

Exemplarily, materials such as a silicon material and an insulation material are provided in holes formed by etching so as to form the pillars 113. As the etching depth is deeper, the areas according to the first and third directions of the holes formed by etching may be reduced. That is, the sections according to the first and third directions of the pillars 113 may be reduced, as being closer to the substrate 111.

Figure 24:
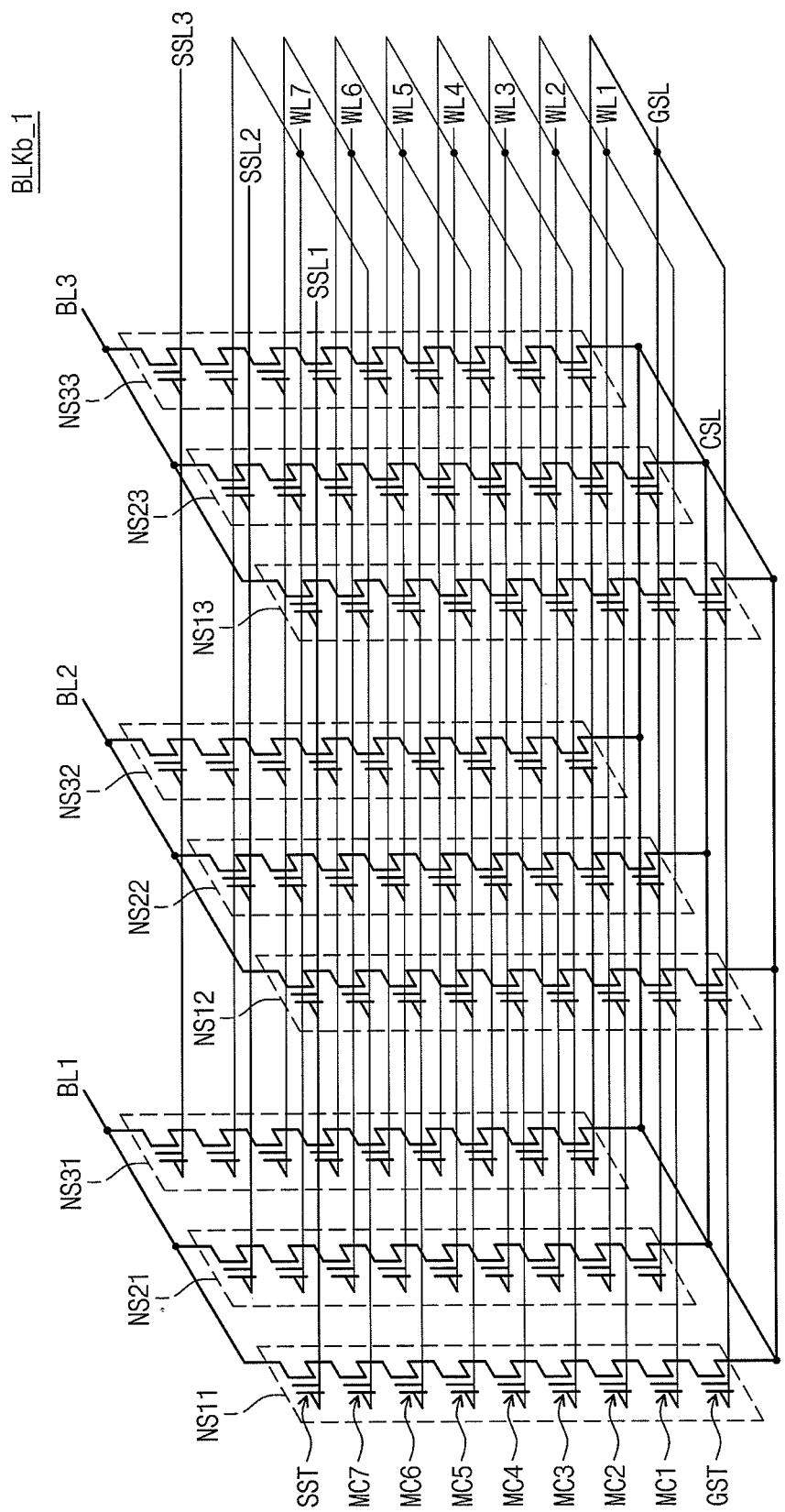
FIG. 24 is a circuit diagram illustrating an equivalent circuit of the memory block of FIG. 18 according to an embodiment of the inventive concept.

FIG. 24 is a circuit diagram illustrating an equivalent circuit BLKb_1 of the memory block BLKb of FIG. 18 according to an embodiment of the inventive concept. Referring to FIGS. 18 through 24, NAND strings NS11 to NS31 are provided between the first bit line BL1 and the common source line CSL. NAND strings NS12, NS22, and NS32 are provided between the second bit line BL2 and the common source line CSL. NAND strings NS13, NS23, and NS33 are provided between the third bit line BL3 and the common source line CSL. The first to third bit lines BL1 to BL3 correspond to the second conductive materials 331 to 333 extending along the third direction.

The string selection transistor SST of each NAND string NS is connected to the corresponding bit line BL. The ground selection transistor GST of each NAND string NS is connected to the common source line CSL. Memory cells MC are provided between the string selection transistor SST and the ground selection transistor GST of each NAND string NS.

Hereinafter, the NAND strings NS are defined by a row and column unit. The NAND strings NS connected to one bit line form one column. For example, the NAND strings NS11 to NS31 connected to the first bit line BL1 correspond to a first column. The NAND strings NS12 to NS32 connected to the second bit line BL2 correspond to a second column. The NAND strings NS13 to NS33 connected to the third bit line BL3 correspond to a third column.

The NAND strings NS connected to one string selection line SSL form one row. For example, the NAND strings NS11 to NS13 connected to the first string selection line SSL1 form a first row. The NAND strings NS21 to NS23 connected to the second string selection line SSL2 form a second row. The NAND strings NS31 to NS33 connected to the third string selection line SSL3 form a third TOW.

In each NAND string NS, a height is defined. Exemplarily, in each NAND string NS, the height of the ground selection transistor GST is defined as 1. The height of the memory cell MC1 adjacent to the ground selection transistor GST is defined as 2. The height of the string selection transistor SST is defined as 9. The height of the memory cell MC7 adjacent to the string selection transistor SST is defined as 8.

As an order from the ground selection transistor GST of the memory cell MC is increased, the height of the memory cell MC is increased. That is, it is defined that the first to seventh memory cells MC1 to MC7 have the second to eighth heights, respectively.

The NAND strings NS of the same row share the ground selection line GSL. NAND strings NS of different rows share the ground selection line GSL. The first conductive materials 211 to 213 having the first eight are connected to each other to form the ground selection line GSL.

The memory cells MC having the same height in the NAND strings NS of the same row share a word line WL. The word lines WL of the NAND strings NS having the same height and corresponding to a different row area commonly connected. That is, the memory cells MC having the same height share a word line WL.

The first conductive materials 221 to 223 having the second height are commonly connected to form a first word line WL1. The first conductive materials 231 to 233 having the third height are commonly connected to form a second word line WL2. The first conductive materials 241 to 243 having the fourth height are commonly connected to form a third word line WL3. The first conductive materials 251 to 253 having the fifth height are commonly connected to form a fourth word line WL4. The first conductive materials 261 to 263 having the sixth height are commonly connected to form a fifth word line WL5. The first conductive materials 271 to 273 having the seventh height are commonly connected to form a sixth word line WL6. The first conductive materials 281 to 283 having the eighth height are commonly connected to form a seventh word line WL7.

The NAND strings NS of the same row share the string selection line SSL. The NAND strings NS of a different row are respectively connected to the different string selection lines SSL1, SSL2, and SSL3. The first to third string selection lines SSL1 to SSL3 correspond to the first conductive materials 291 to 293 having the ninth height, respectively.

Hereinafter, the string selection transistors SST connected to the first string selection line SSL1 are defined as first string selection transistors SST1. The string selection transistors SST connected to the second string selection line SSL2 are defined as second string selection transistors SST2. The string selection transistors SST connected to the third string selection line SSL3 are defined as third string selection transistors SST3.

The common source line CSL is commonly connected to the NAND strings NS. For example, the first to fourth doping regions 311 to 314 are connected to each other to form a common source line CSL.

As shown in FIG. 24, the word lines WL having the same height are commonly connected. Accordingly, when the word line WL having a specific height is selected, all NAND strings NS connected to the selected word line WL are selected.

The NAND strings NS of a different row are connected to a different string selection line SSL. Accordingly, by selecting and non-selecting the string selection lines SSL1 to SSL3, the NAND strings NS of a unselected row among NAND strings NS connected to the same word line WL may be electrically separated from a corresponding bit line and the NAND strings NS of a selected row may be electrically connected to a corresponding bit line.

That is, by selecting and non-selecting the string selection lines SSL1 to SSL3, the row of the NAND strings NS may be selected. Then, by selecting the bit lines BL1 to BL3, a column of the NAND strings NS in the selected row may be selected.

Exemplarily, during program and read operations, one of the string selection lines SSL1 to SSL3 is selected. That is, the program and read operations are performed by a row unit of the NAND strings NS11 to NS13, NS21 to NS23, and NS31 and NS33.

In an embodiment, during program and read operations, a select voltage is applied to the selected word line of the selected row, and a non-select voltage is applied to the unselected word lines. For example, the select voltage may be a program voltage Vpgm or a select read voltage Vrd. That is, the program and read operations may be performed by a unit of respective word line of a selected row of the NAND strings NS11 to NS13, NS21 to NS23, and NS31 to NS33.

The thicknesses of the insulation materials 112 provided between the first conducive materials (e.g., 211, 221, 231, 291, 292, and 293) operating as selection lines among the first conductive materials 211 to 291, 212 to 292, and 213 to 293 and the first conductive materials (e.g., 221 to 281, 222 to 282, and 223 to 283) operating as word lines may be greater than those of other insulation materials 112.

In FIGS. 18 to 24, the first conductive materials 211, 212, and 213 having the first height operate as the ground selection line GSL and the first conductive materials 291, 292, and 293 having the night height operate as the string selection lines SSL1, SSL2, and SSL3.

At this point, the thicknesses of the insulation materials 112 provided between the first conductive materials 211, 212, and 213 having the first height and the second conductive materials 221, 222, and 223 having the second height may be greater than those of the insulation materials 112 provided between the first conductive materials 221, 222, and 223 having the second height and the conductive materials having the eighth height.

The thicknesses of the insulation materials 112 provided between the first conductive materials 281, 282, and 283 having the eighth height and the first conductive materials 291, 292, and 293 having the ninth height may be greater than those of the insulation materials 112 provided between the second conductive materials 221, 222, and 223 having the second height and the conductive materials having the eighth eight.

Figure 25:
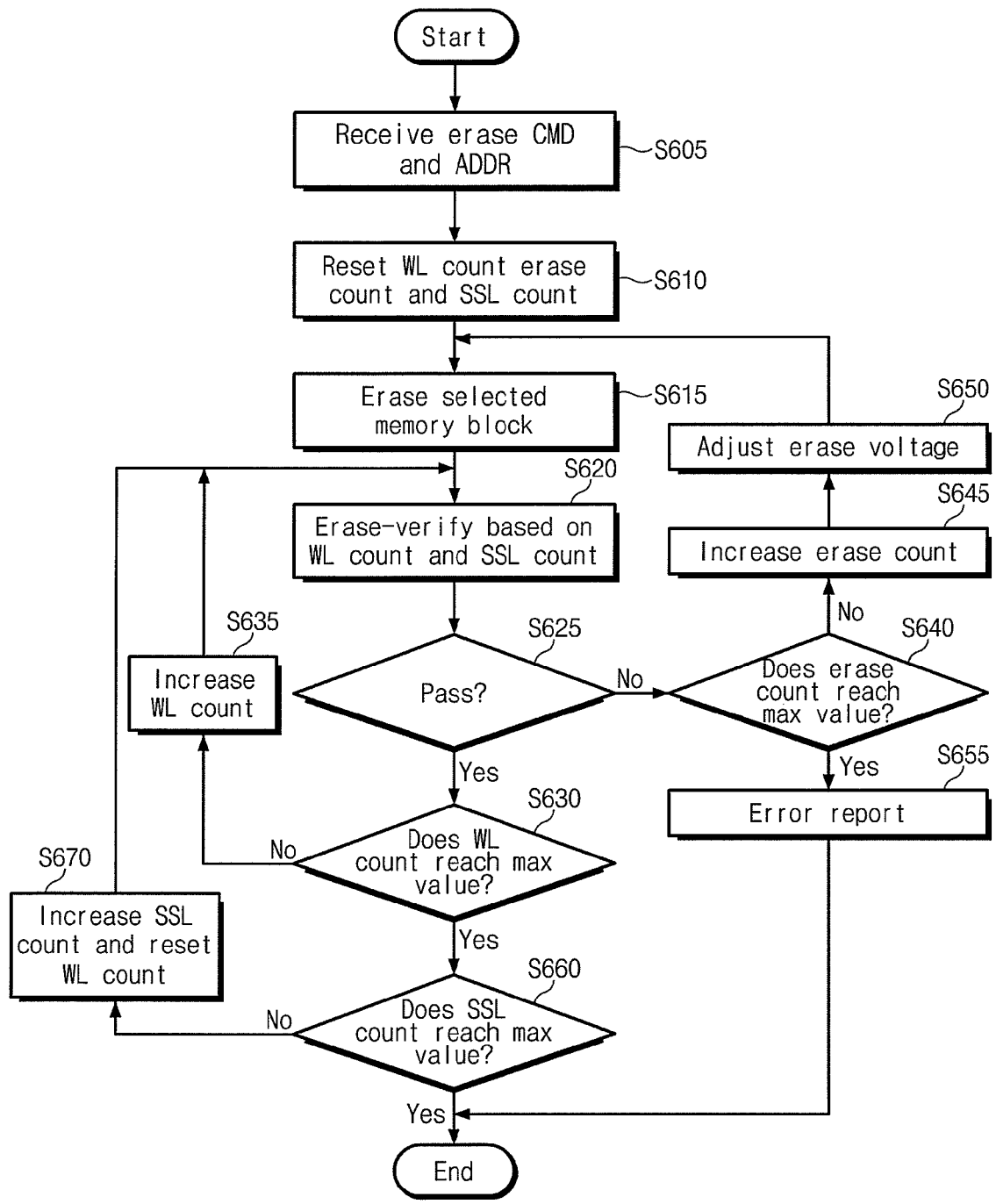
FIG. 25 is a flowchart illustrating a method of operating a nonvolatile memory device according to an embodiment of the inventive concept.

FIG. 25 is a flowchart illustrating a method of operating a nonvolatile memory device according to an embodiment of the inventive concept. Referring to FIGS. 16 through 25, in operation S605, an erase command and an address are received. For example, the received address corresponds to one of a plurality of blocks BLK1 to BLKz of the nonvolatile memory device 100c. A memory block (e.g., BLKb) corresponding to the received address among the plurality of memory blocks BLK1 to BLKz is selected. For example, the received address corresponds to at least two string selection lines SSL.

In operation S610, a word line count, an erase count, and a SSL count are reset. For example, the word line count represents one among word lines corresponding to the received address. For example, the word line count may be reset to represent the first word line WL1 of the selected memory block BLKb. The erase count is reset to 1. The SSL count represents one among the string selection lines SSL corresponding to the received address. For example, the SSL count may be reset to represent the first string selection line SSL1 of the selected memory block BLKb.

In operation S615, the memory cells MC corresponding to the received address may be erased. For example, the selected memory block BLKb is erased. For example, the control logic 170c controls the address decoder 120, the read & write unit 130, and the voltage generating unit 160 to erase the selected memory block.

In operation S620, based on the word line count and the SSL count, an erase-verification is performed. For example, the SSL count is converted into a string selection line address. A string selection line corresponding to the converted string selection line address among the plurality of string selection lines SSL1 to SSL3 of the selected memory block BLKb is selected. The word line count is converted into a word line address. A word line corresponding to the converted word line address among the plurality of word lines WL1 to WL7 of the selected memory block BLKb is selected. Later, a plurality of memory cells MC corresponding to the selected string selection line and the selected word line are erase-verified.

For example, the control logic 170c controls the address decoder 120, the read & write unit 130, and the voltage generating unit 160 to erase-verify the selected word line among the word lines corresponding to the selected string selection line.

In operation S625, it is determined whether an erase-verification result is passed. For example, the control logic 170c determines erase-pass or erase-fail according to whether an output signal of the pass/fail check unit 140 is a pass signal or a fail signal. If the selected word line is determined as being erase-passed, operation S630 is performed.

In operation S630, it is determined whether the word line count reaches the maximum value. If the word line count does not reach the maximum value, the word line count is increased in operation S635. Later, an erase-verification is performed again in operation S620. If the word line count reaches the maximum value, operation S660 is performed.

In operation S625, the selected word line is determined as being erase-failed, operation S640 is performed.

In operation S640, it is determined whether the erase count reaches the maximum value. If the erase count does not reach the maximum value, it is increased in operation S645. Later, the erase voltage Vers is adjusted in operation S650. For example, a level of the erase voltage Vers may be increased. Later, erase (operation S615) of the selected memory block BLKb and an erase-verification (operation S620 and operation S635) from the erase-failed word line are performed again.

In operation S640, when the erase count reaches the maximum value, an error report is generated in operation S655. For example, the control logic 170c may generate an error report representing that an error occurs during an erase operation. The generated error report may be provided to a host of the nonvolatile memory device 100c.

In operation S660, it is determined whether the SSL count reaches the maximum value. For example, the maximum value of the SSL count may correspond to the last string selection line SSL3 of the selected memory block BLKb.

If the SSL count does not reach the maximum value, the SSL count is increased and the word line count is reset in operation S670. For example, the word line count may be reset to represent the first word line WL1 of the selected memory block BLKb. Later, an erase-verification is performed again in operation S620. If the SSL count reaches the maximum value, en erase operation is terminated.

In operations S615 to S650, an erase-verification is repeated from the erase and erase-failed word line in the NAND strings corresponding to a selected string selection line (e.g., a string selection line corresponding to the SSL count) among the NAND strings NS of the selected memory block BLKb. If the word lines are erase-passed in the selected string selection line, the next string selection line is selected in operation S670.

That is, the selected memory block BLKb is erase-verified by an unit of respective word line and an erase-verification resumes from the erase-failed word line.

A criterion of the erase-pass and erase-fail may vary according to electronic devices used with the nonvolatile memory device 100c. For example, when a device with an n-bit error correction function is used with the nonvolatile memory device 100c, fail bits of less than (or below) an n-bit occurring during an erase-verification may be ignored. That is, even if fail bits of less than (or below) an n-bit are detected during an erase-verification, it may be determined as being erase-passed.

Figures 26, 27:
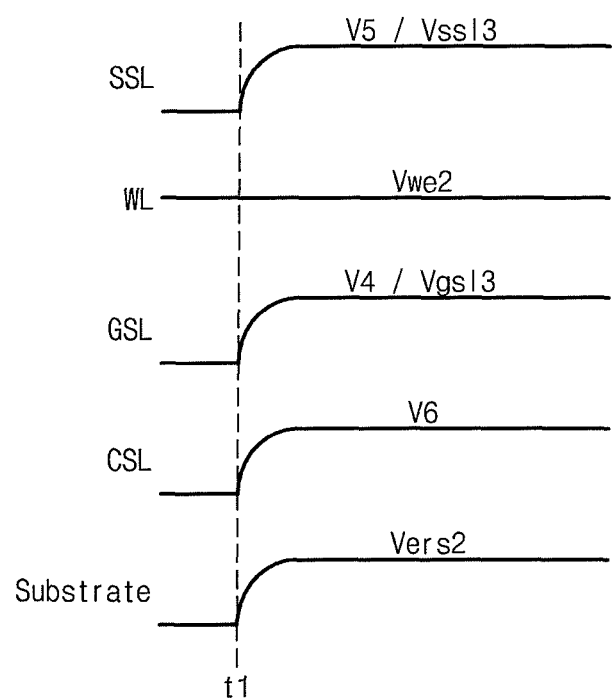
FIG. 26 is a table illustrating voltage conditions during an erase operation of the nonvolatile memory device of FIG. 16 according to an embodiment of the inventive concept.
FIG. 27 is a timing diagram illustrating a voltage change according to voltage conditions of FIG. 26.

FIG. 26 is a table illustrating voltage conditions during an erase operation of the nonvolatile memory device 100c of FIG. 16. Referring to FIGS. 16, 24, and 26, the string selection lines SSL1 to SSL3 may float or may be driven by a third string selection line voltage Vssl3. A second word line erase voltage Vwe2 is applied to the word lines WL1 to WL7. The ground selection line GSL may float or may be driven by a third ground selection line voltage Vgsl3. The common source line CSL may float. A second erase voltage Vers2 is applied to the substrate 111.

Figure 28:
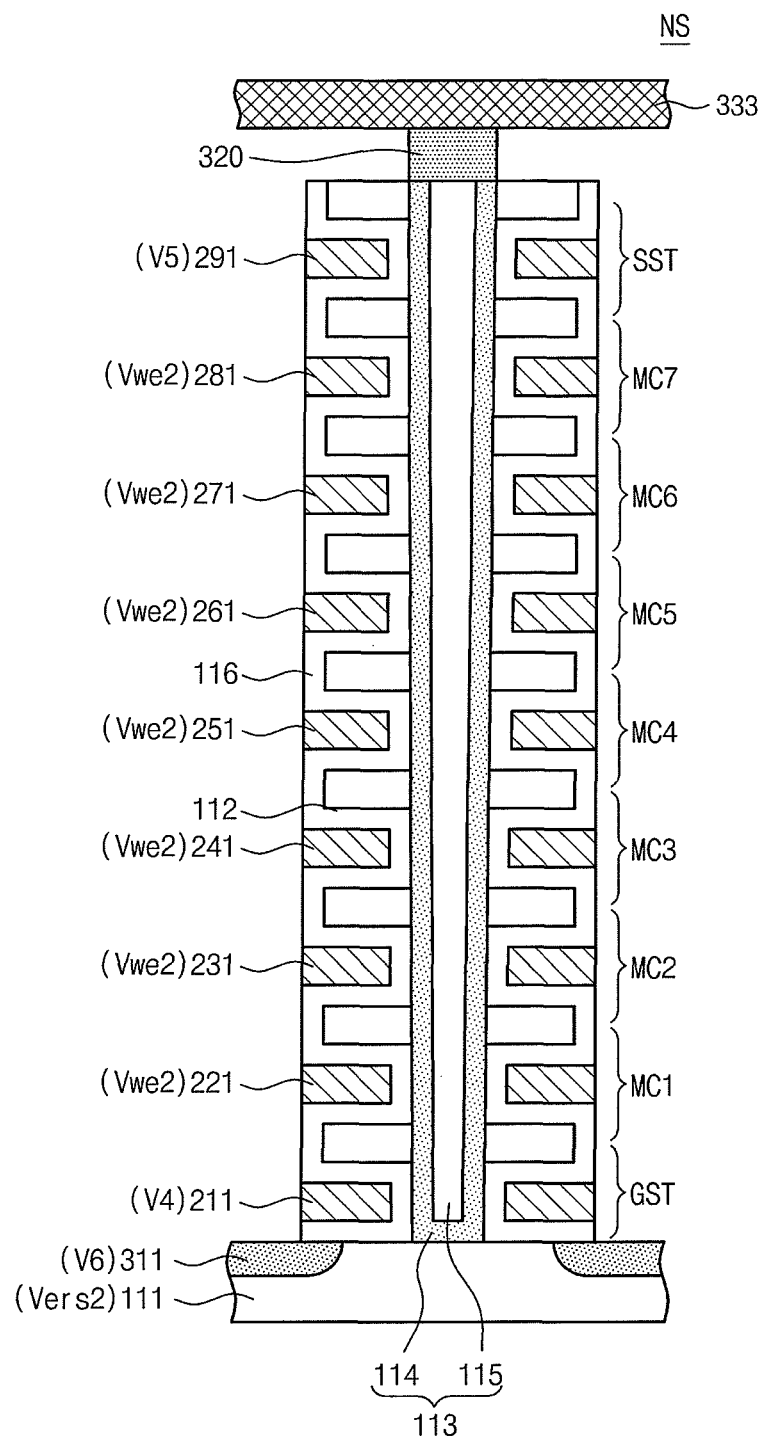
FIG. 28 is a sectional view of one NAND string of the memory block to which voltages according to FIGS. 26 and 27 are applied.

FIG. 27 is a timing diagram illustrating a voltage change according to voltage conditions of FIG. 26. FIG. 28 is a sectional view of one NAND string NS of the memory block BLKb to which voltages according to FIGS. 26 and 27 are applied. The sectional view of FIG. 28 may correspond to the NAND string NS13 of the first row and third column shown in an equivalent circuit BLKb_1 of the memory block BLKb.

Referring to FIGS. 26 through 28, a second erase voltage Vers2 is applied to the substrate 111 at the first timing t1. The second erase voltage Vers2 may be a high voltage.

The substrate 111 may be doped with the same type as the channel layer 114 operating as a body of the second direction. Accordingly, the second erase voltage Vers2 is applied to the channel layer 114 of the NAND string NS.

The first conductive material 211 having the first height operates as the ground selection line GSL, and operates as a gate (or a control gate) of the ground selection transistor GST. At the first timing t1, the ground selection line GSL may float or may be driven by the third round selection line voltage Vgsl3.

The first conductive material 211 is not affected by coupling from the channel layer 113. If the ground selection line GSL floats, as a voltage of the channel layer 114 is increased to the second erase voltage Vers2, a voltage of the first conductive material 211 operating as the ground selection line GSL is increased. A voltage of the ground selection line GSL may be increased to a fourth voltage V4.

A voltage of the channel layer 114 operating as a body of the second direction is a second erase voltage Vers2, and a voltage of the first conductive material 211 operating as a gate (or a control gate) of the ground selection transistor GST is a fifth voltage V5. A difference between the second ease voltage Vers2 and the fifth voltage V5 may not be enough to cause F-N tunneling. Accordingly, the ground selection transistor GST is erase-inhibited.

If the ground selection line GSL is driven by the third ground selection line voltage Vgsl3, the third ground selection line voltage Vgsl3 is set in order to prevent F-N tunneling due to difference between the third ground selection line voltage Vgsl3 and the second erase voltage Vers2. Accordingly, the ground selection transistor GST is erase-inhibited.

For convenience of description, it is described that the fourth voltage V4 and the third ground selection line voltage Vgsl3 have the same level. However, the fourth voltage V4 and the third ground selection line voltage Vgsl3 may be different.

The first conductive materials 221 to 282 having the respective second to eighth heights operate as the first to seventh word lines WL1 to WL7, respectively, and operate as gates (or control gates) of the first to seventh memory cells MC1 to MC7. At the first timing t1, a second word line eraser voltage Vwe2 is applied to the word lines WL1 to WL7. The second word linen erase voltage Vwe2 may be a low voltage. For example, the second word line erase voltage Vwe2 may be a ground voltage Vss.

A voltage of the channel layer 114 operating as a body of the second direction is a second erase voltage Vers2, and a voltage of the first conductive materials 221 to 241 operating as gates (or control gates) of the first to seventh memory cells MC1 to MC7 is a second word line erase voltage Vwe2. A difference between the second erase voltage Vers2 and the second word line erase voltage Vwe2 causes F-N. For example, the second erase voltage Vers2 and the second word line ease voltage Vwe2 are set to cause F-N. Accordingly, the first to seventh memory cells MC1 to MC7 of the memory block BLKb may be erased.

The first conductive material 291 having the ninth height operates as a string selection line SSL and operates as a gate (or a control gate) of the string selection transistor SST. At the first timing t1, the string selection line SSL may float and may be driven by the third string selection line voltage Vssl3.

The first conductive material 291 is affected by coupling from the channel layer 114. If the string selection line SSL floats, as a voltage of the channel layer 114 is increased to the second erase voltage Vers2, a voltage of the first conductive material 291 operating as the string selection line SSL is increased. A voltage of the string selection line SSL may be increased to the fifth voltage V5.

A voltage of the channel layer 114 operating as a body of the second direction is a second erase voltage Vers2, and a voltage of the first conductive material 291 operating as a gate (or a control gate) of the string selection transistor SST is a fifth voltage Vssl1. A difference between the second ease voltage Vers2 and the fifth voltage V5 may not be enough to cause F-N tunneling. Accordingly, the string selection transistor SST is erase-prohibited.

If the string selection line SSL is driven by the third string selection line voltage Vssl3, the third string selection line voltage Vssl3 is set in order not to cause F-N tunneling due to a difference with the second erase voltage Vers2. Accordingly, the string selection transistor SST is erase-prohibited.

For convenience of description, it is illustrated that the fifth voltage V5 and the third string selection line voltage Vssl3 have the same level. However, the fifth voltage V5 and the third string selection line voltage Vssl3 may be different.

The doping regions 311 operating as the common source line CSL form a p-n junction with the substrate 111. Accordingly, when a second erase voltage Vers2 is applied to the substrate 111, a voltage of the doping region 311 operating as a common source line CSL may be increased also. For example, a voltage of the common source line CSL may be increased to the sixth voltage V6.

FIG. 29 is a table illustrating voltage conditions during an erase-verification operation of the nonvolatile memory device 100c of FIG. 16. Referring to FIGS. 16, 24, and 29, a second bit line voltage Vbl2 is applied to the bit lines BL1 to BL3. For example, the second bit line voltage Vbl2 may be a power voltage Vcc.

A fourth string selection line voltage Vssl4 is applied to a selected string selection line among the string selection lines SSL1 to SSL3. For example, the fourth string selection line voltage Vssl4 is a voltage for turning on the selected string selection transistor. For example, the fourth string selection line voltage Vssl4 may be a power voltage Vcc.

A fifth string selection line voltage Vssl5 is applied to an unselected string selection line among the string selection lines SSL1 to SSL3. For example, the fifth string selection line voltage Vssl5 is a voltage for turning off the unselected string selection transistor. For example, the fifth string selection line voltage Vssl5 may be a ground voltage Vss.

A second erase verify voltage Vvfy2 is applied to the selected word line. For example, the second erase verify voltage Vvfy2 may be set to the upper limit of a threshold voltage required for memory cells in an erase state. For example, the second erase verify voltage Vvfy2 may be a ground voltage Vss.

A second non-selection word line voltage Vuwl2 is applied to the unselected word line. The second non-selection word line voltage Vuwl2 may be a voltage for turning on the memory cells MC regardless of a logic state of the memory cells MC. The second non-selection word line voltage Vuwl2 may be a non-selection read voltage Vread applied to unselected word lines during a read operation or a pass voltage Vpass applied to unselected word lines during a program operation. That is, the memory cells MC connected to the unselected word line may be turned on.

A fourth ground selection line voltage Vgsl4 is applied to the ground selection line GSL. The fourth ground selection line voltage Vgsl4 may be a voltage for turning on the ground selection transistor GST. The fourth ground selection line voltage Vgsl4 may be a power voltage Vcc.

A second common source line voltage Vcsl2 is applied to the common source line CSL. For example, the second common source line voltage Vcsl2 may be a ground voltage Vss.

Figure 30:
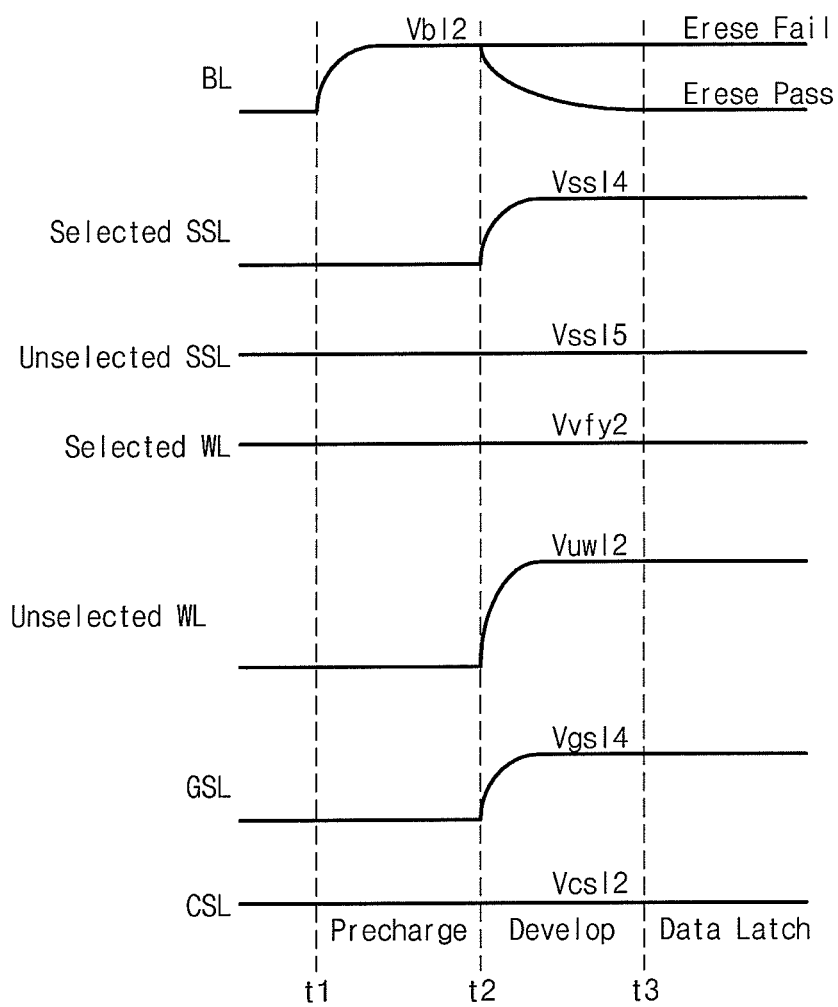
FIG. 30 is a timing diagram illustrating a voltage change according to voltage conditions of FIG. 29.
Figure 31:
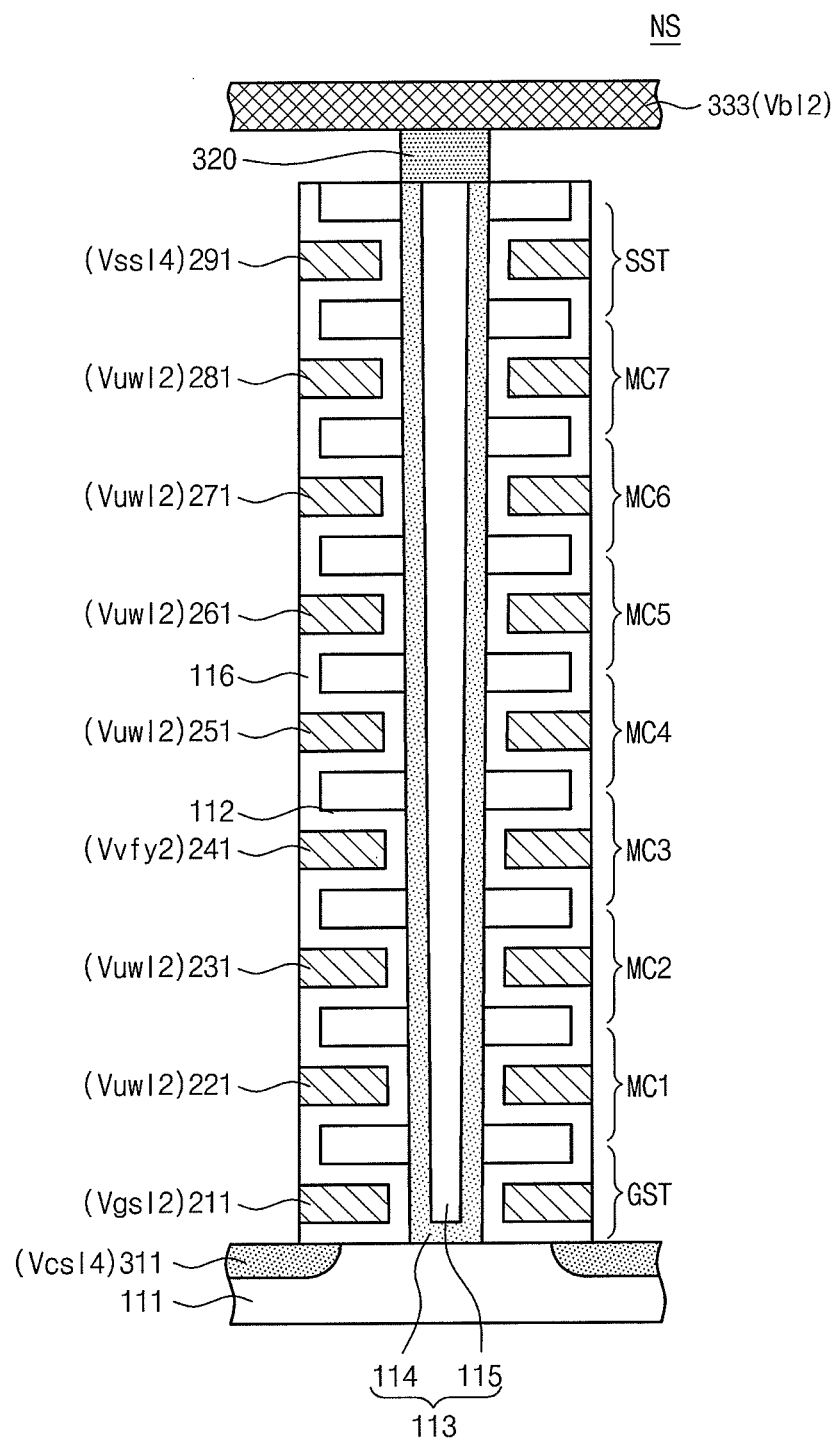
FIG. 31 is a sectional view of one NAND string of the memory block to which voltages according to FIGS. 29 and 30 are applied.

FIG. 30 is a timing diagram illustrating a voltage change according to voltage conditions of FIG. 29. FIG. 31 is a sectional view of one NAND string NS of the memory block BLKb to which voltages according to FIGS. 29 and 30 are applied. The sectional view of FIG. 31 may correspond to the NAND string NS13 of the first row and third column of the memory block BLKb_1.

Referring to FIGS. 16, 29, and 31, pre-charge is performed at the first timing t1. The second bit line voltage Vbl2 is applied to the bit lines BL1 to BL3. That is, a second bit line voltage Vbl2 is pre-charged to the second conductive material 333 operating as the third bit line BL3. Later, the first to third bit lines BL1 to BL3 may float.

At the second timing t2, develop is performed. A fourth string selection line voltage Vssl4 is applied to the selected string selection line (e.g., SSL1). That is, the string selection transistors SST1 corresponding to the selected string selection line SSL1 are turned on. Accordingly, the NAND strings NS11 to NS13 of the first row are electrically connected to the bit lines BL 1 to BL3.

A fifth string selection line voltage Vssl5 is applied to the unselected string selection lines (e.g., SSL2 and SSL3). That is, the string selection transistors SST2 and SST3 corresponding to the unselected string selection lines SSL2 and SSL3 may be turned off. Accordingly, the NAND strings NS21 to NS23 and NS31 to NS33 of the second and third rows are electrically separated from the bit lines BL1 to BL3.

A second non-selection word line voltage Vuwl2 is applied to the unselected word line (e.g., WL1, WL2, and WL4 to WL7). That is, the memory cells MC1, MC2, and MC4 to MC7 connected to the unselected word lines WL1, WL2, and WL4 to WL7 are turned on.

A second erase verify voltage Vvfy2 is applied to the selected word line (e.g., WL3). In the NAND strings NS11 to NS13 of the first row, memory cells having a higher threshold voltage than the second erase verify voltage Vvfy2 among the memory cells MC3 connected to the selected word line WL3 may be turned off. In the NAND strings NS11 to NS13 of the first row, memory cells having a lower threshold voltage than the second erase verify voltage Vvfy2 among the memory cells MC3 connected to the selected word line WL3 may be turned on.

A fourth ground selection line voltage Vgsl4 is applied to the ground selection line GSL. Accordingly, the ground selection transistors GST are turned on and the NAND strings NS11 to NS13, NS21 to NS23, and NS31 to NS33 are electrically connected to the common source line CSL.

In the NAND strings NS11 to NS13 of the first row, when one among the memory cells MC connected to the selected word line WL3 is turned on, a channel is formed between a corresponding bit line BL an a common source line CSL. Accordingly, current flows from the corresponding bit line BL to the common source line, and a voltage of the corresponding bit line BL is decreased from the second bit line voltage Vbl2.

In the NAND strings NS11 to NS13 of the first row, if one among the memory cells MC3 connected to the selected word line WL3 is turned off, a channel is not formed between a corresponding bit line BL and a common source line CSL. Accordingly, no current flows from a corresponding bit line BL to a common source line CSL, and a voltage of a corresponding bit line BL is maintained as a second bit line voltage Vbl2.

A data latch is performed at the third timing t3. For example, according to a voltage of the bit lines BL1 to BL3, erase pass and erase fail may be determined.

For example, when a voltage of the first to third bit lines BL1 to BL3 is lower than the second bit line voltage Vbl2, i.e., when threshold voltages of the memory cells MC3 connected to the selected word line WL3 in the NAND strings NS11 to NS13 of the selected first row are lower than the second erase verify voltage Vvfy2, it is determined as being erase-passed.

When at least one voltage among the first to third bit lines BL1 to BL3 is a second bit line voltage Vbl2, i.e., at least one threshold voltage among the memory cells MC3 connected to the selected word line WL3 in the NAND strings NS11 to NS13 of the selected first row is higher than the second erase verify voltage Vvfy2, it is determined as being erase-failed.

Exemplarily, according to an error correction ability of a host of the nonvolatile memory device 100c or the nonvolatile memory device 100c, a determination criterion of erase pass and erase fail of the selected word line may vary. For example, if an error correction ability of a host of the nonvolatile memory device 100c or the nonvolatile memory device 100c is improved, even if at least one voltage among the bit lines BL is maintained as the second bit line voltage Vbl2, the selected word line may be determined as being erase-passed.

Figure 32:
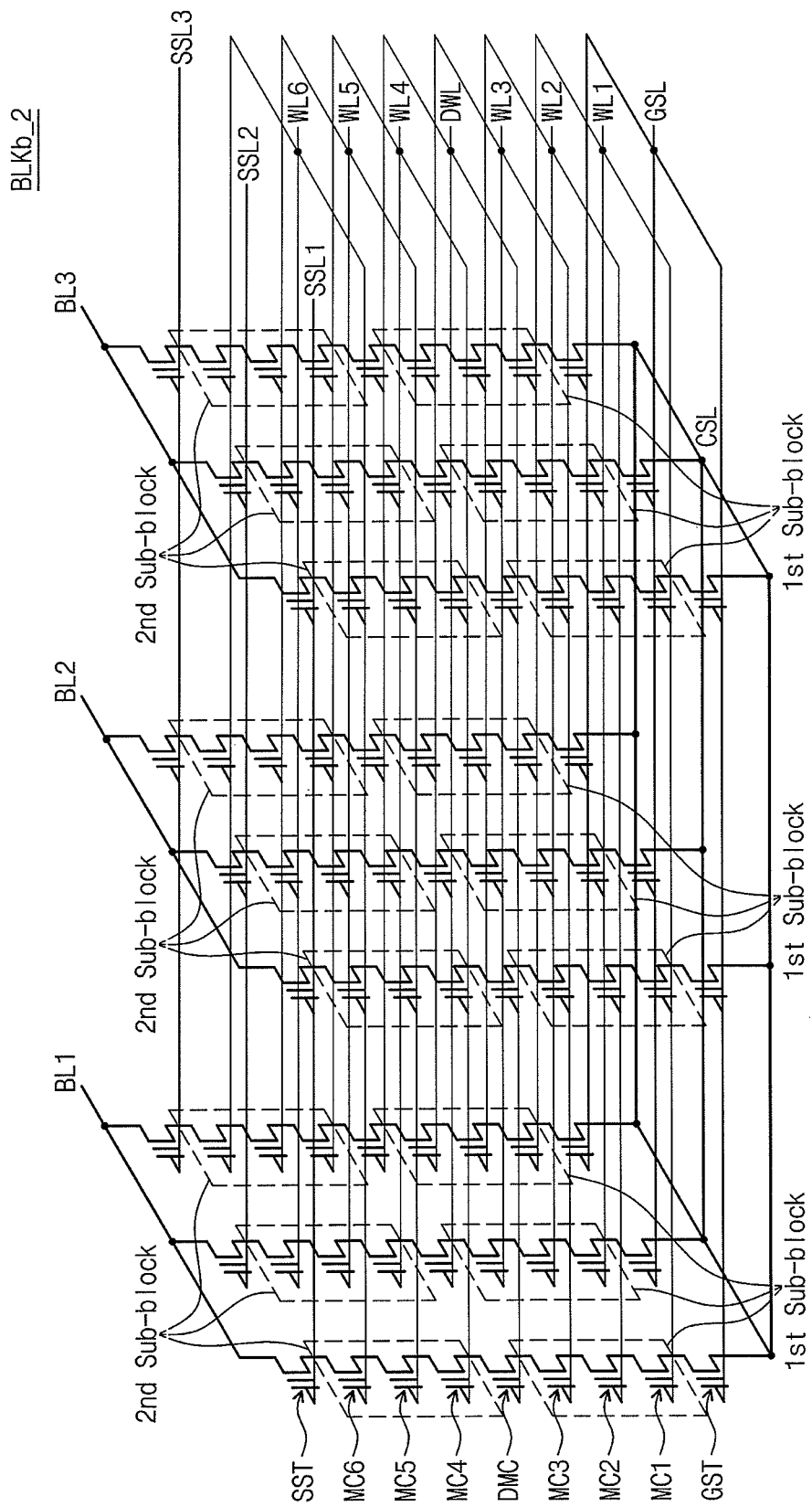
FIG. 32 is a circuit diagram illustrating an equivalent circuit of the memory block of FIG. 18 according to an embodiment of the inventive concept.

FIG. 32 is a circuit diagram illustrating an equivalent circuit BLKb_2 of the memory block BLKb of FIG. 18 according to an embodiment of the inventive concept. Referring to FIGS. 18, 19, and 32, the memory block BLKb_2 is divided into a plurality of sub blocks along the second direction. Moreover, between the sub blocks, dummy memory cells DMC and a dummy word line connected to the dummy memory cells DMC are provided.

First conductive lines 221 to 241, 222 to 242, and 223 to 243 having the second to fourth heights form first to third memory cells MC1 to MC3 to constitute a first sub block. First conductive lines 251, 252, and 253 having the fifth height form dummy memory cells DMC. First conductive lines 261 to 281, 262 to 282, and 263 to 283 having the sixth to eighth heights form forth to sixth memory cells MC4 to MC6 to constitute a second sub block.

The memory block BLKb_2 is erased by a sub block unit. Except for erasing a memory block by a sub block unit, the memory block BLKb_2 is erased and erase-verified as described with reference to FIGS. 17 and 25. For example, after erasing the memory cells MC of a sub block of the memory block BLKb_2, the erased memory cells MC is ease-verified by a word linen unit. If erase-fail occurs, the selected sub block is erased, and an erase-verification resumes from the erase-failed word line. The erase and erase-verification of the selected sub block are sequentially performed on rows of NAND strings.

Exemplarily, it is described that the memory block BLK_2 is divided into two sub blocks. However, the number of sub blocks is not limited. Additionally, it is described that one dummy word line DWL is provided between sub blocks of the memory block BLKb_2. However, the number of dummy word lines DWL between sub blocks is not limited.

FIG. 33 is a table illustrating voltage conditions applies to an equivalent circuit BLKb_2 of the memory block BLK of FIG. 18 during an erase operation according to an embodiment of the inventive concept. Referring to FIGS. 32 and 33, string selection lines SSL1 to SSL3 may float or may be driven by a third string selection line voltage Vssl3 during an erase operation.

The word lines WL of an unselected sub block may float or may be driven by a third non-selection word line voltage Vuwl3. A second word line erase voltage Vwe2 is applied to the word lines WL of a selected sub block. For example, the second word line erase voltage Vwe2 may be a ground voltage Vss. A first dummy word line voltage Vdwl1 is applied to a dummy word line DWL. A ground selection line GSL may float or may be driven by a third ground selection line voltage Vgsl3. A common source line CSL may float. Moreover, a second erase voltage Vers2 is applied to the substrate 111.

Exemplarily, it is assumed that a first sub block is selected. During an erase operation, a second word line erase voltage Vwe2 may be applied to the word lines WL1 to WL3 of a first sub block. Moreover, the word lines WL4 to WL6 of an unselected second sub block may float or may be driven by a third non-selection word line voltage Vuwl3.

Figure 34:
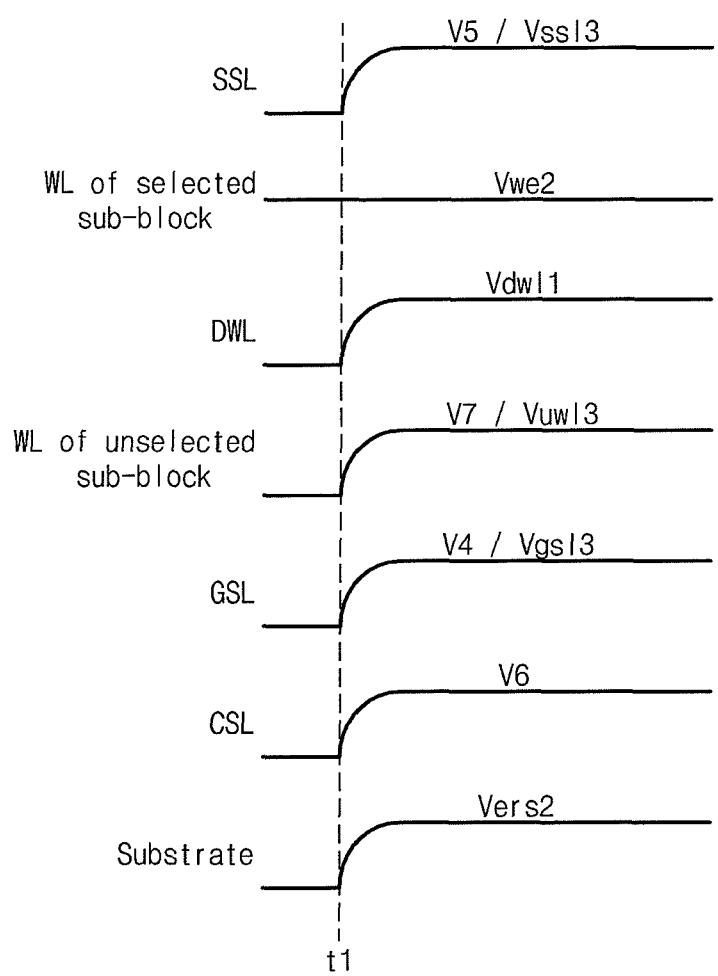
FIG. 34 is a timing diagram illustrating a voltage change according to the voltage conditions of FIG. 33.
Figure 35:
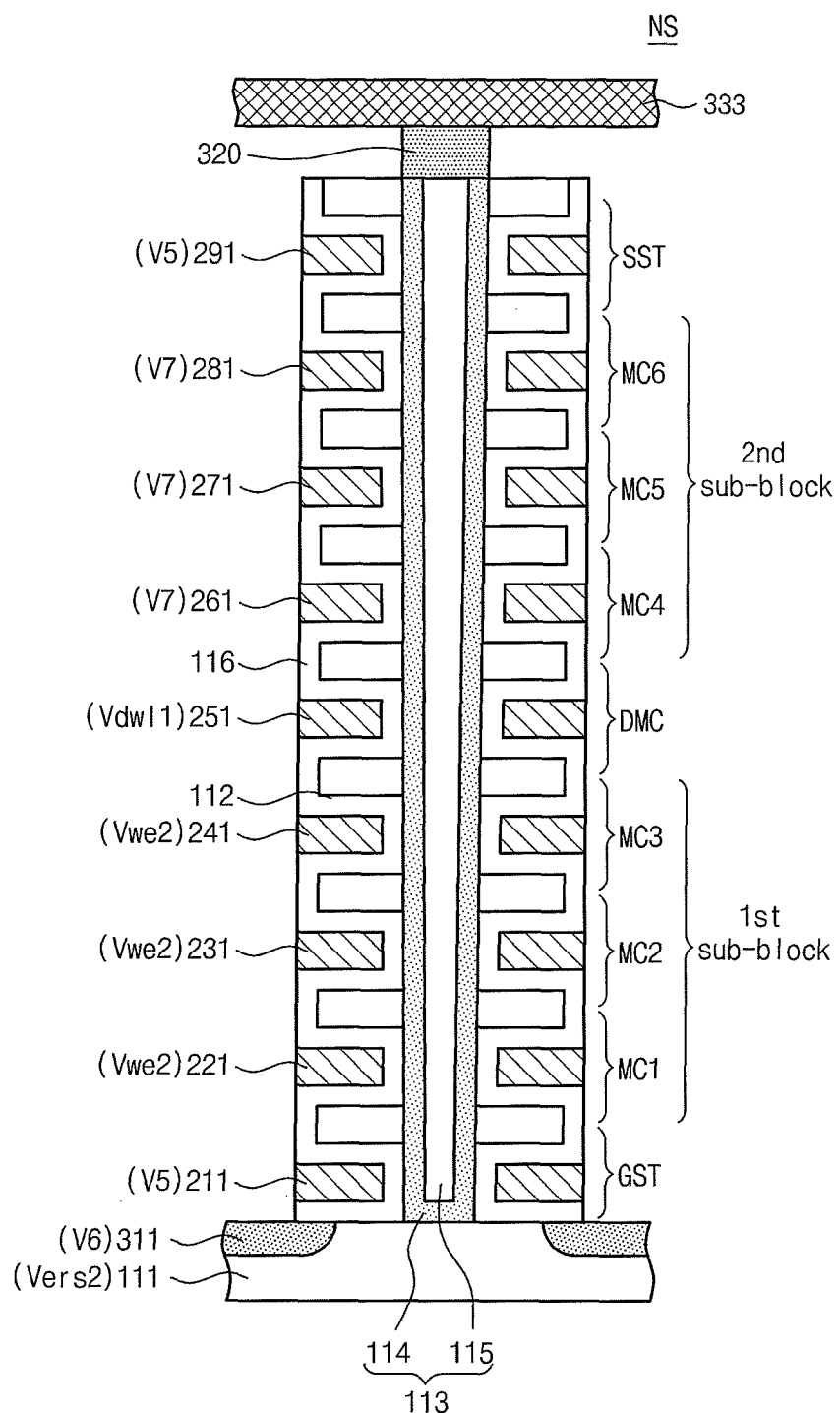
FIG. 35 is a sectional view of one NAND string of the memory block to which voltages according to FIGS. 33 and 34 are applied.

FIG. 34 is a timing diagram illustrating a voltage change according to the voltage conditions of FIG. 33. FIG. 35 is a sectional view of one NAND string NS of the memory block BLKb to which voltages according to FIGS. 33 and 34 are applied. Exemplarily, the sectional view of FIG. 34 may correspond to the NAND string NS13 of the first row and third column shown in the memory block BLKb_1. Exemplarily, it is assumed that a first sub block is erased and a second sub block is erase-inhibited.

Referring to FIGS. 33 through 35, a second erase voltage Vers2 is applied to the substrate 111 at the first timing t1. Exemplarily, the second erase voltage Vers2 may be a high voltage. The second erase voltage Vers2 is delivered to a channel layer 114 of a NAND string NS.

A ground selection line GSL may float or may be driven by a third ground selection line voltage Vgsl3. If the ground selection line GSL floats, a voltage of the ground selection line GSL is increased to a fourth voltage V4. Accordingly, as described with reference to FIGS. 26 through 28, a ground selection transistor GST is erase-inhibited.

A second word line erase voltage Vwe2 is applied to the word lines WL1 to WL3 of a selected sub block. That is, a second word line erase voltage Vwe2 is applied to the first to third word lines WL1 to WL3. Accordingly, as described with reference to FIGS. 26 through 28, the memory cells MC1 to MC3 of a selected sub block are erased.

The word lines WL4 to WL6 of an unselected sub block may float or may be driven by a third non-selection word line voltage Vuwl3. The word lines WL4 to WL6 of an unselected sub block are affected by coupling from the channel layer 14. If the word lines WL4 to WL6 of an unselected sub block float, as a voltage of the channel layer 114 is increased to the second erase voltage Vers2, a voltage of the word lines WL4 to WL6 of an unselected sub block is increased also. For example, a voltage of the word lines WL4 to WL6 of an unselected sub block is increased to a seventh voltage V7.

Exemplarily, a difference between the second ease voltage Vers2 and the seventh voltage V7 may not be enough to cause F-N tunneling. Accordingly, the memory cells MC4 to MC6 of an unselected sub block are erase-inhibited.

A string selection line SSL may float or may be driven by a third string selection line voltage Vssl3. If the string selection line SSL floats, a voltage of the string selection line SSL is increased to a fifth voltage V5. Accordingly, as described with reference to FIGS. 26 through 28, the string selection transistor SST is erase-inhibited.

A first conductive material 251 having the fifth height operates as a dummy word line DWL, and operates as a gate (or a control gate) of a dummy memory cell DMC. A first dummy word line voltage Vdwl1 is applied to the dummy word line DWL. Exemplarily, a level of the first dummy word line voltage Vdwl1 is set in order not to cause F-N tunneling by a voltage difference between the channel layer 114 and a gate (or a gate control) of a dummy memory cell DMC. That is, a dummy memory cell DMC is erase-inhibited.

Exemplarily, the first dummy word line voltage Vdwl1 has a level between a second word line erase voltage Vwe2 and a second erase voltage Vers2. For example, the first dummy word line voltage Vdwl1 has a level between a second word line erase voltage Vwe2 and a seventh voltage V7. Dummy memory cells DMC, a dummy word line DWL, and a first dummy word line voltage Vdwl1 may reduce coupling between sub blocks.

Exemplarily, a dummy word line DWL may float during an erase operation. A voltage of the dummy word line DWL may be increased by coupling due to a voltage rise of the channel layer 114. Accordingly, if the dummy word line DWL floats, dummy memory cells DMC may be erase-inhibited.

FIG. 36 is a table illustrating voltage conditions applied to an equivalent circuit BLKb_2 of the memory block BLKb of FIG. 18 during an erase-verification according to an embodiment of the inventive concept. Referring to FIGS. 18, 32, and 36, a second bit line voltage Vbl2 is applied to bit lines BL1 to BL3. For example, the second bit line voltage Vbl2 may be a power voltage Vcc.

A fourth string selection line voltage Vssl4 is applied to a selected one of string selection lines SSL1 to SSL3. The fourth string selection line voltage Vssl4 is a voltage for turning on selected string selection transistors. For example, the fourth string selection line voltage Vssl4 may be a power voltage Vcc.

A fifth string selection line voltage Vssl5 is applied to an unselected one of the string selection lines SSL1 to SSL3. The fifth string selection line voltage Vssl5 is a voltage for turning off selected string selection transistors. For example, the fifth string selection line voltage Vssl5 may be a ground voltage Vss.

A second erase verify voltage Vvfy2 is applied to a selected word line (e.g., WL3) of a selected sub block. For example, the second erase verify voltage Vvfy2 is set as the upper limit of a threshold voltage required for memory cells in an erase state. For example, the second erase verify voltage Vvfy2 may be a ground voltage Vss.

A second non-selection word line voltage Vuwl2 is applied to unselected word lines (e.g., WL1 and WL2) of a selected sub block. That is, memory cells MC1 and MC2 connected to the unselected word lines WL1 and WL2 of the selected sub block are turned on.

The second non-selection word line voltage Vuwl2 is applied to a dummy word line DWL. That is, dummy memory cells DMC are turned on.

The second non-selection word line voltage Vuwl2 is applied to word lines WL4 to WL6 of an unselected sub block.

For example, the second non-selection word line voltage Vuwl2 may be a voltage for turning on memory cells MC regardless of a logic state of the memory cells MC. For example, the second non-selection word line voltage Vuwl2 may be a non-selection read voltage Vread applied to the unselected word lines during a read operation or a pass voltage Vpass applied to the unselected word lines during a program operation. That is, the memory cells MC4 to MC6 of an unselected sub block may be turned on.

Figure 37:
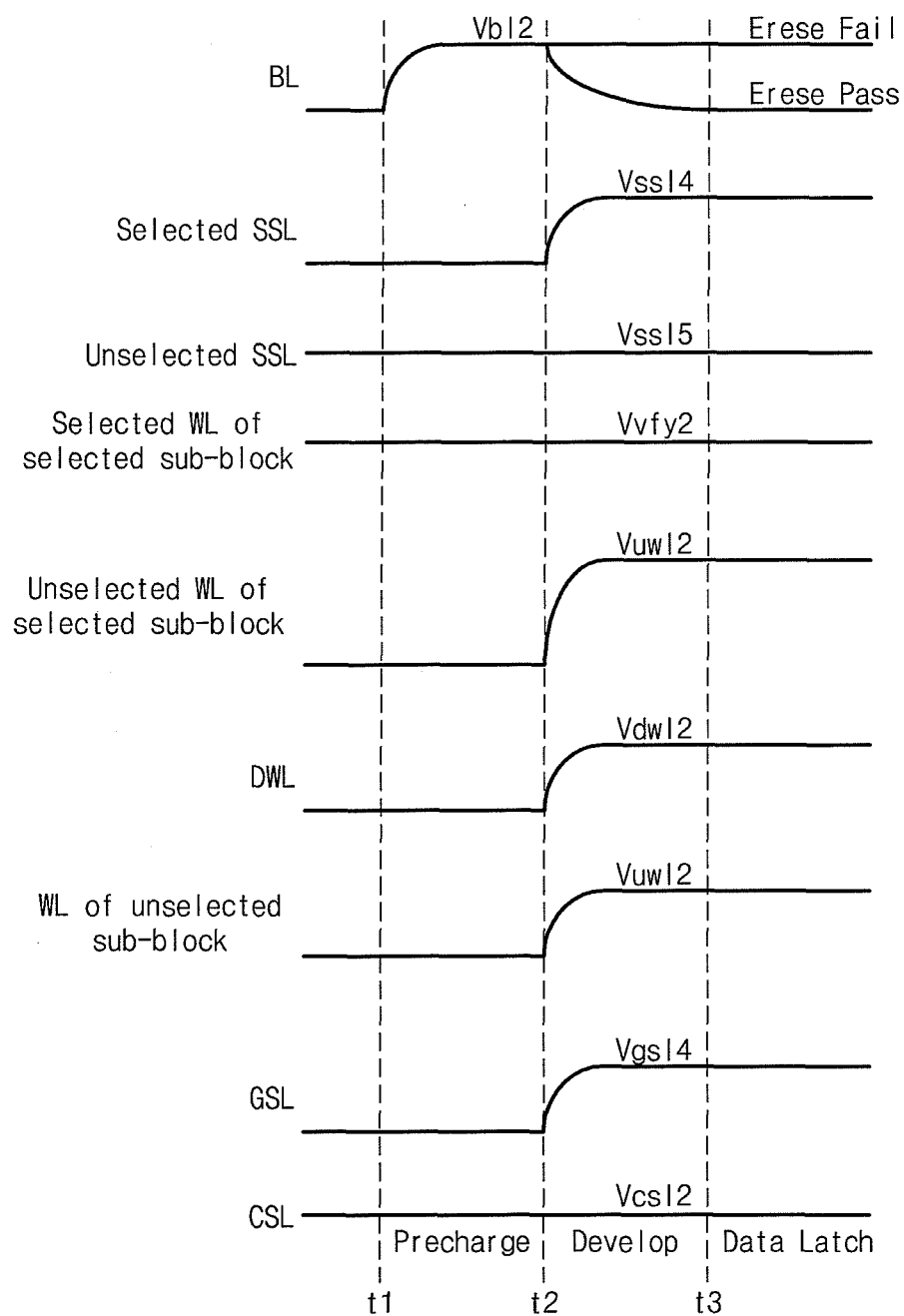
FIG. 37 is a timing diagram illustrating a voltage change according to voltage conditions of FIG. 36.
Figure 38:
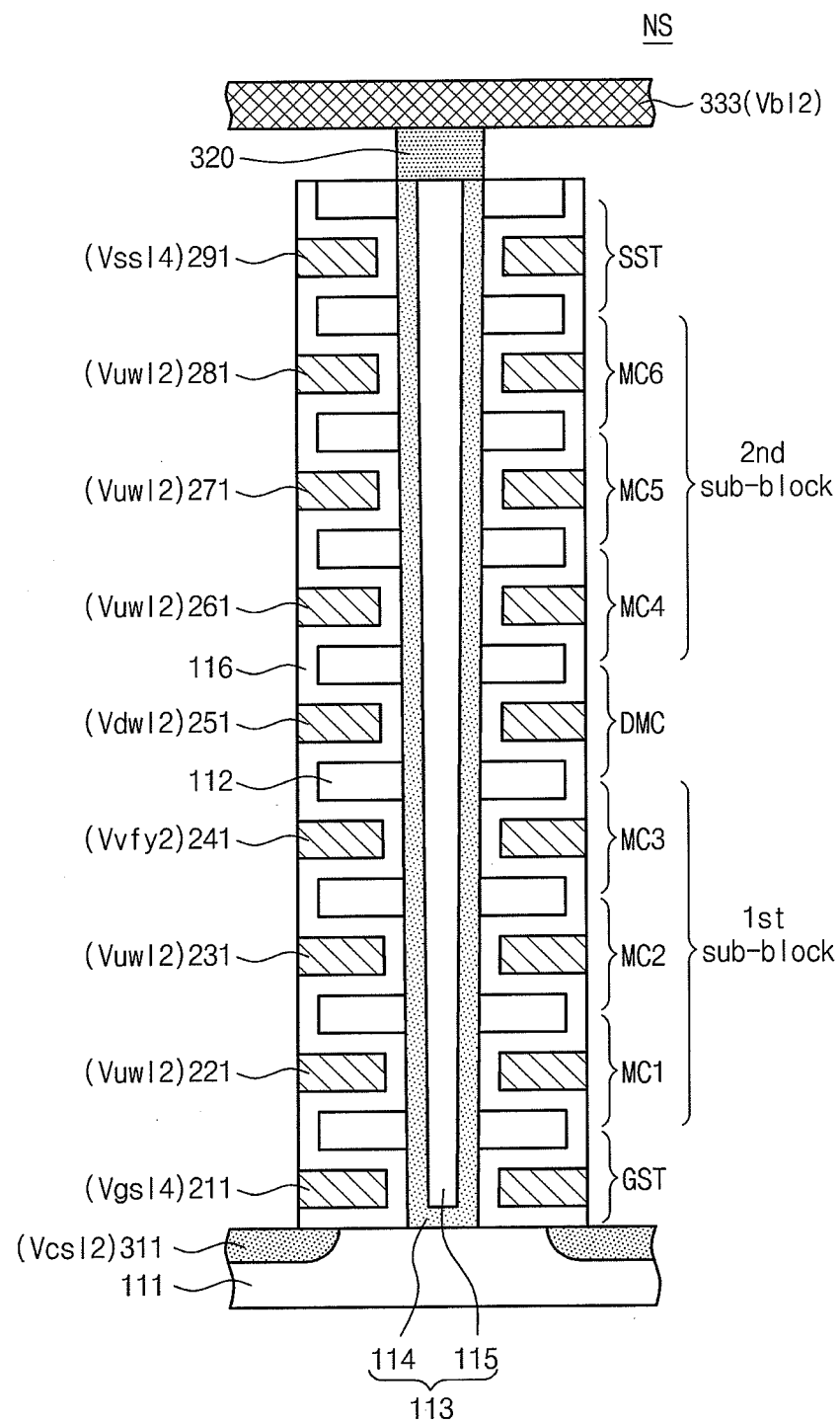
FIG. 38 is a sectional view of one NAND string of the memory block to which voltages according to FIGS. 36 and 37 are applied.

FIG. 37 is a timing diagram illustrating a voltage change according to voltage conditions of FIG. 36. FIG. 38 is a sectional view of one NAND string NS of the memory block BLKb to which voltages according to FIGS. 36 and 37 are applied. Exemplarily, the sectional view of FIG. 37 may correspond to the NAND string NS13 of the first row and third column in the memory block BLKb_2.

Referring to FIGS. 36 through 38, precharge is performed at the first timing t1. A second bit line voltage Vbl2 is applied to bit lines BL1 to BL3. That is, the second bit line voltage Vbl2 is pre charged to a second conductive material 333 operating as a third bit line BL3. Later, the first to third bit lines BL1 to BL3 may float.

Develop is performed at the second timing t2. A fourth string selection line voltage Vssl4 is applied to a selected string selection line (e.g., SSL1). That is, the string selection transistors SSTZ1 corresponding to the selected string selection line SSL1 are turned on. Accordingly, the NAND strings NS11 to NS13 of the first row may be electrically connected to the bit lines BL1 to BL3.

A fifth string selection line voltage Vssl5 is applied to unselected string selection lines (e.g., SSL2 and SSL3). That is, the string selection transistors SST2 and SST3 corresponding to the unselected string selection lines SSL2 and SSL3 are turned off. Accordingly, the NAND strings NS21 to NS23 and NS31 to NS33 of the second third rows are electrically separated from the bit lines BL1 to BL3.

A fourth ground selection line voltage Vgsl4 is applied to a ground selection line GSL. Accordingly, ground selection transistors GST are turned on and NAND strings NS11 to NS13, NS21 to NS23, and NS31 to NS33 are electrically connected to a common source line CSL.

A second non-selection word line voltage Vuwl2 is applied to the word lines WL4 to WL6 of an unselected sub block. That is, the memory cells MC4 to MC6 of an unselected sub block are turned on.

A second non-selection word line voltage Vuwl2 is applied to the unselected word lines WL1 and WL2 of a selected sub block. That is, memory cells MC1 and MC2 connected to the unselected word lines WL1 and WL2 of a selected sub block are turned on.

A second erase verify voltage Vvfy2 is applied to the selected word line WL3 of a selected sub block. That is, memory cells MC connected to the selected word line WL3 of a selected sub block may be turned on or turned off according to a threshold voltage.

In the NAND strings NS11 to NS13 of a selected row, if one of the memory cells MC3 connected to the selected word line WL3 is turned on, a channel is formed between a corresponding bit line BL and a common source line CSL. Accordingly, current flows from a corresponding bit line BL to a common source line CSL, and a voltage of a corresponding bit line BL is lowered from the second bit line voltage Vbl2.

In the NAND strings NS11 to NS13 of a selected row, if one of the memory cells MC3 connected to the selected word line WL3 is turned off, no channel is formed between a corresponding bit line BL and a common source line CSL. Accordingly, current does not flow from a corresponding bit line BL to a common source line CSL, and a voltage of a corresponding bit line BL is maintained as the second bit line voltage Vbl2.

Data latch is performed at the third timing t3. For example, according to a voltage of the bit lines BL1 to BL3, erase-pass and erase-fail may be determined.

For example, if a voltage of the first to third bit lines BL1 to BL3 is lower than the second bit line voltage Vbl2, that is, if threshold voltages of the memory cells MC3 connected to a selected word line WL3 in the NAND strings NS11 to NS13 of the selected first row are lower than the second erase verify voltage Vvfy2, it is determined as being erase-passed.

When at least one voltage in the first to third bit lines BL1 to BL3 is a second bit line voltage Vbl2, that is, at least one threshold voltage in memory cells MC3 connected to the selected word line WL3 in the NAND strings NS11 to NS13 of the selected first row is higher than the second erase verify voltage Vvfy2, it is determined as being erase-failed.

Exemplarily, according to error correction ability of the nonvolatile memory device 100c or a host of the nonvolatile memory device 100c, a determination criterion of the erase-pass and erase-fail about the selected word line may vary. For example, if the error correction ability of the nonvolatile memory device 100c or a host of the nonvolatile memory device 100c is improved, the selected word line may be determined as being erase-passed even if at least one voltage of the bit lines BL maintains the second bit line voltage Vbl2.

Figure 39:
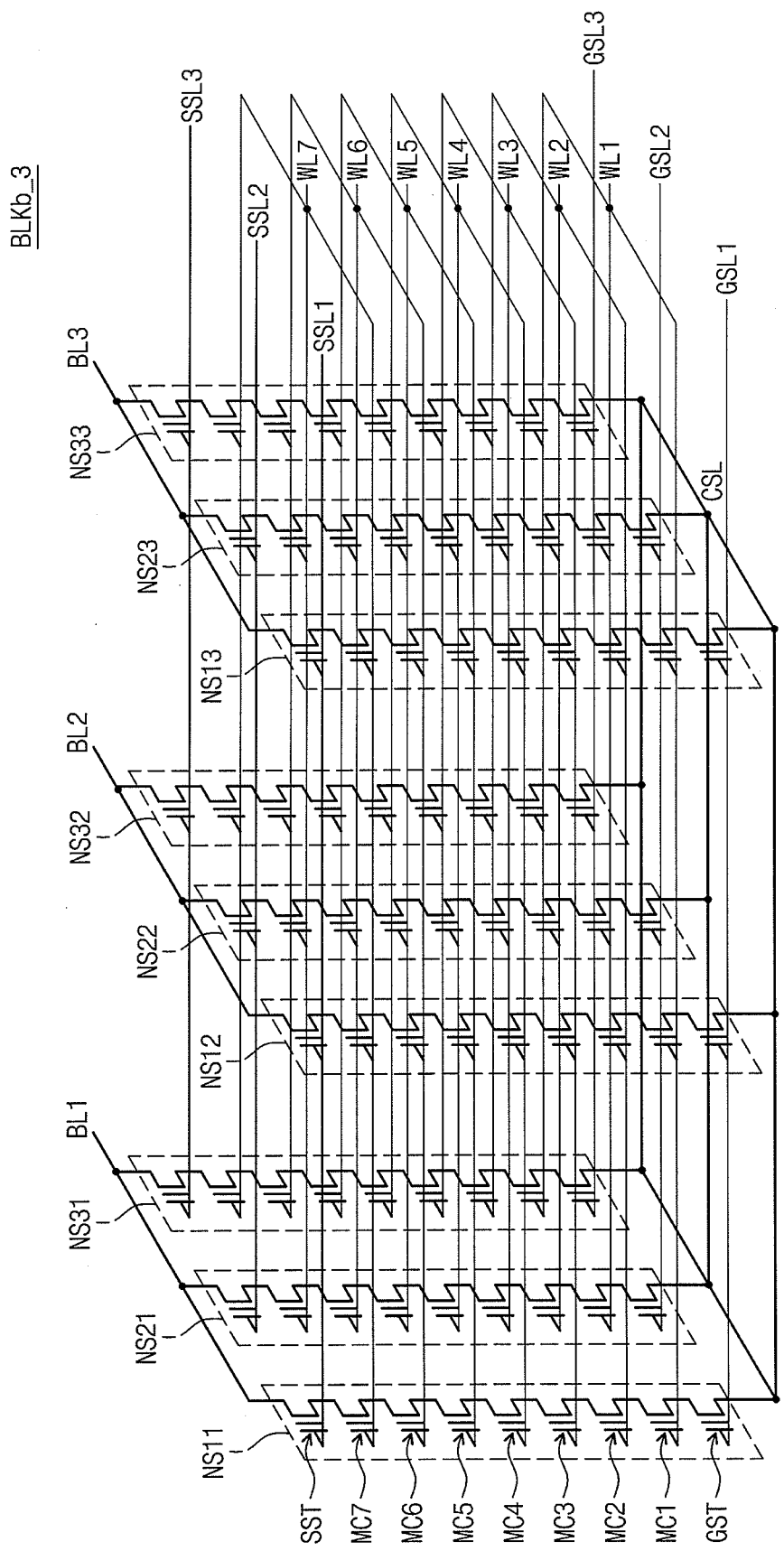
FIG. 39 is a circuit diagram illustrating an equivalent circuit of the memory block of FIG. 18 according to an embodiment of the inventive concept.

FIG. 39 is a circuit diagram illustrating an equivalent circuit BLKb_3 of the memory block BLKb of FIG. 18 according to an embodiment of the inventive concept. Referring to FIGS. 18 and 39, the NAND strings NS of the same row share a ground selection line GSL1, GSL2, or GSL3. The NAND strings NS of a different row are connected to different ground selection lines GSL1, GSL2, and GSL3, respectively.

The memory cells MC having the same height share a word line. The memory cells MC having different heights are connected to different word lines, respectively. That is, the first to seventh memory cells MC1 to MC7 are connected to the first to seventh word lines, respectively.

The NAND string NS of the same row share a string selection line SSL. The NAND strings NS of a different row are connected to different selection lines SSL1, SSL2, and SSL3, respectively.

Except that a plurality of ground selection lines GSL1 to GSL3 are provided, the memory block BLKb_3 is erased and erase-verified as described with reference to FIGS. 17 and 25. For example, after the memory cells MC1 to MC7 of the selected memory block BLKb are erased, the selected memory block is erase-verified by a unit of respective word line. If erase-fail occurs, the selected memory block BLKb is erased again, and an erase-verification resumes from the erase-failed word line. The erase and erase-verification are sequentially performed on the rows of the selected memory block BLKb.

Except that a plurality of ground selection lines GSL1 to GSL3 are provided, the memory block BLKb_3 is erased and erase-verified as described with reference to FIGS. 26 and 28. For example, the string selection lines SSL1 to SSL3 may float or may be driven by a third ground selection line voltage Vgsl3. The ground selection lines GSL1 to GSL3 may float or may be driven by a third ground selection line voltage Vgsl3. A second word linen erase voltage Vwe2 is applied to the word lines WL1 to WL7, and a second erase voltage Vers2 is applied to the substrate 111.

FIG. 40 is a table illustrating voltage conditions applied to an equivalent circuit BLK_3 of the memory block BLKb of FIG. 18 during an erase-verification according to an embodiment of the inventive concept. Except that a fourth ground selection line voltage Vgsl4 is applied to a selected ground selection line among the ground selection lines GSL1 to GSL4 and a fifth ground selection linen voltage Vgsl5 is applied to the unselected ground selection line, voltage conditions during an erase-verification are identical to voltage conditions of FIG. 29.

Exemplarily, a fourth ground selection line voltage Vgsl4 is a voltage for turning on a ground selection transistor GST. For example, the fourth ground selection line voltage Vgsl4 is a power voltage Vcc.

Exemplarily, a fifth ground selection line voltage Vgsl5 is a voltage for turning off a ground selection transistor GST. For example, the fifth ground selection line voltage Vgsl5 is a ground voltage Vss.

Figure 41:
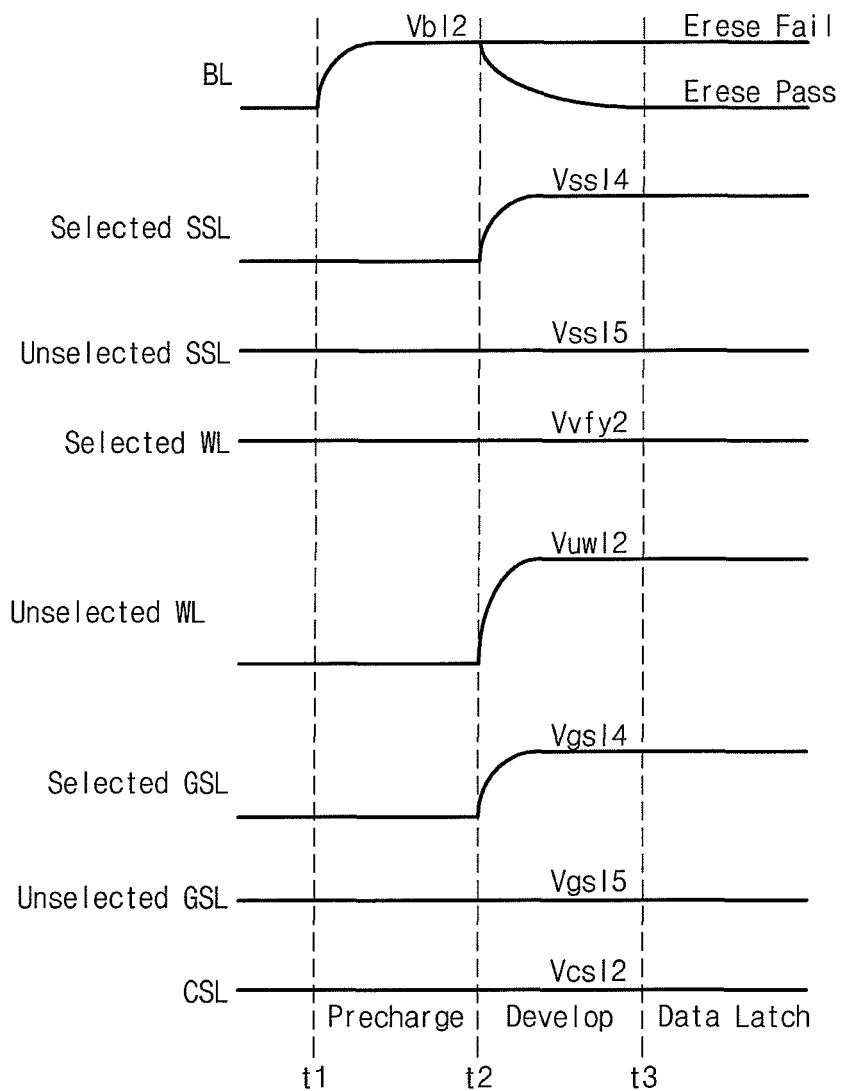
FIG. 41 is a timing diagram illustrating a voltage change according to voltage conditions of FIG. 40.

FIG. 41 is a timing diagram illustrating a voltage change according to voltage conditions of FIG. 40. Compared to the timing diagram described with reference to FIG. 30, during develop at the second timing t2, a fourth ground selection linen voltage Vgsl4 is applied to an unselected ground selection line and a fifth ground selection line voltage Vgsl5 is applied to an unselected ground selection line. That is, a row of the NAND strings NS corresponding to a selected ground selection line is electrically connected to the common source line CSL, and rows of the NAND strings NS corresponding to an unselected ground selection line are electrically separated from the common source line CSL.

Figure 42:
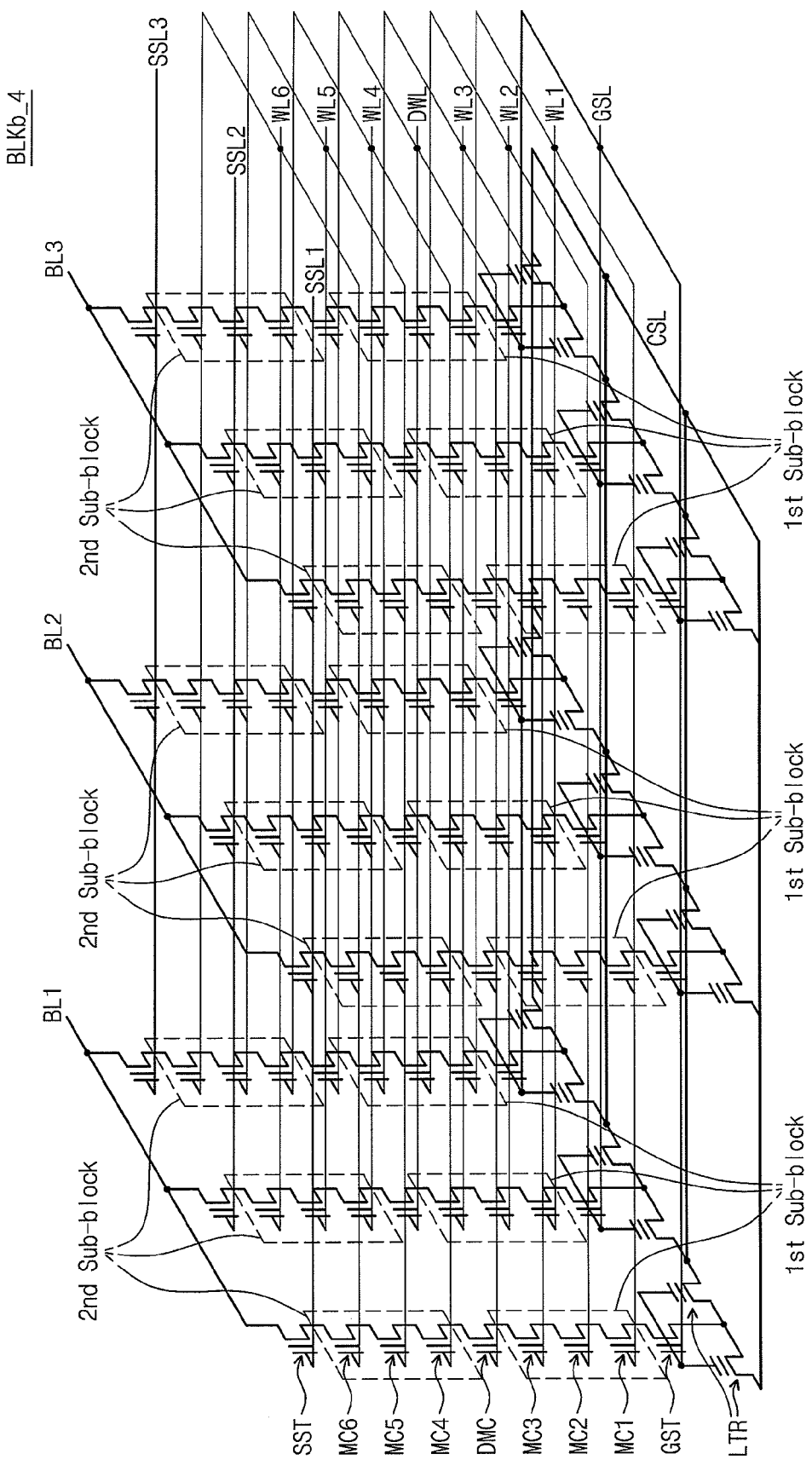
FIG. 42 is a circuit diagram illustrating an equivalent circuit of the memory block BLKb of FIG. 18 according to an embodiment of the inventive concept.

FIG. 42 is a circuit diagram illustrating an equivalent circuit BLKb_4 according to an embodiment of the memory block BLKb of FIG. 18. Compared to the equivalent circuit BLKb_1 of FIG. 24, lateral transistors LTR are additionally provided at each NAND string NS of the memory block BLKb_4.

In each NAND string NS, the lateral transistors LTR are connected between a ground selection transistor GST and a common source line CSL. Gates (or control gates) of the lateral transistors LTR and a gate (or a control gate) of the ground selection transistor GST are connected to the ground selection line GSL.

As described with reference to FIGS. 18 through 23, the first conductive materials 211, 212, and 213 having the first height correspond to the first to third ground selection lines GSL1 to GSL3, respectively.

When a specific voltage is applied to the first conductive materials 211, 212, and 213 having the first height, a channel is formed in a region of the channel layer 114 adjacent to the first conductive materials 211, 212, and 213. That is, a channel is formed in the ground selection transistors GST. Additionally, a specific voltage is applied to the first conductive materials 211, 212, and 213, channels are formed in a region of the substrate 111 adjacent to the first conductive materials 211, 212, and 213. For example, in case of the NAND strings NS21 to NS23 provided between the second third doping regions 312 and 313, channels may be formed between the second third doping regions 312 and 313.

As described with reference to FIGS. 18 through 23, the first to fourth doping regions 311 to 314 are commonly connected to form a common source line CSL. Channels of the common source line CSL and memory cells MC1 to MC7 are electrically connected through channels (e.g., horizontal channels) generated in the substrate 111 by a voltage of the ground selection line GSL and channels (e.g., a vertical channel) generated in the channel layer 114.

That is, between the common source line CSL and the first memory cells MC1, transistors vertical and parallel to a substrate, driven by the ground selection line GSL are provided. The transistors vertical to the substrate may be regarded as a ground selection transistor GST, and the transistors parallel to the substrate may be regarded as lateral transistors LTR.

Figure 43:
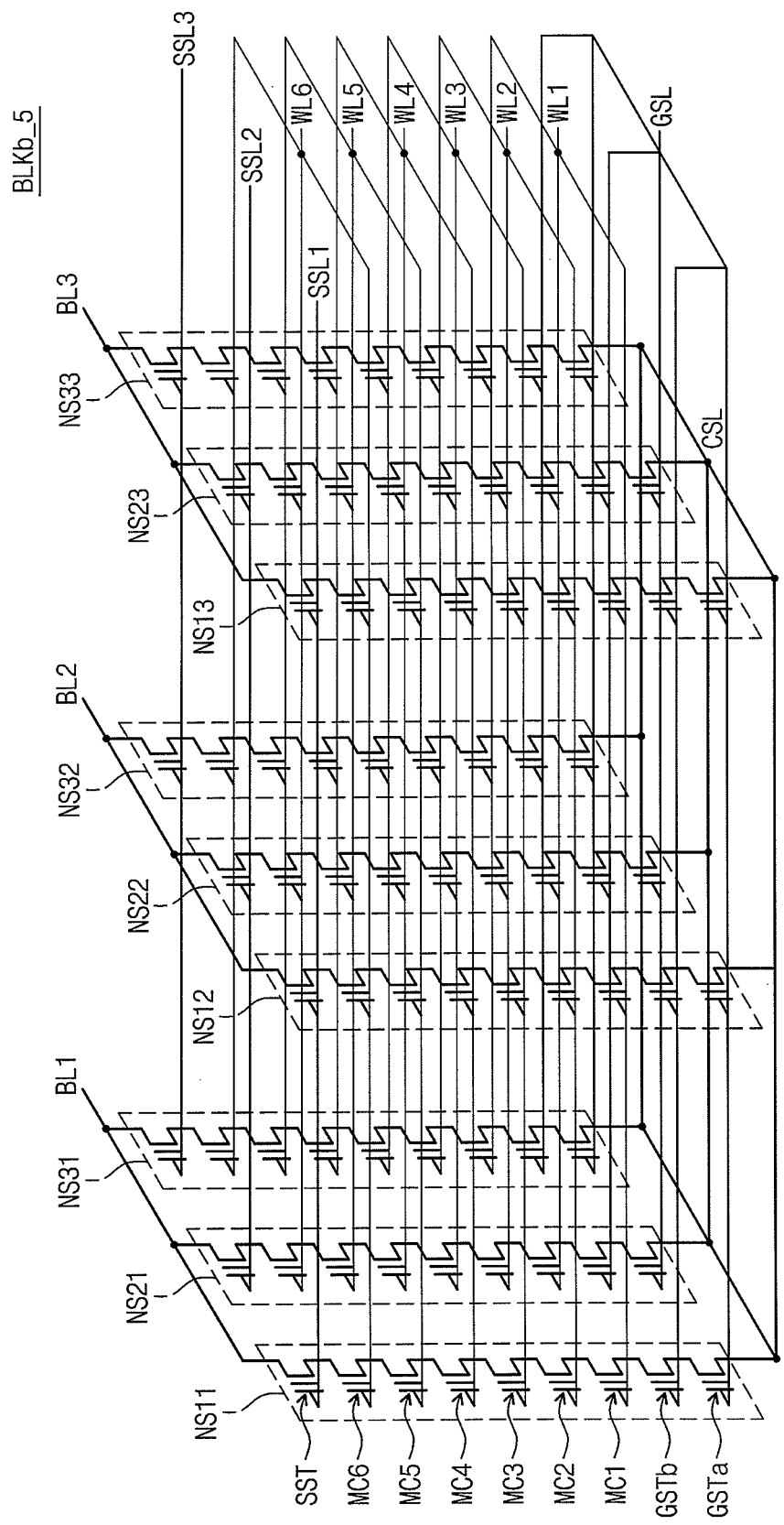
FIG. 43 is a circuit diagram illustrating an equivalent circuit of the memory block BLKb of FIG. 18 according to an embodiment of the inventive concept.

FIG. 43 is a circuit diagram illustrating an equivalent circuit BLKb_5 according to an embodiment of the memory block BLKb of FIG. 18. Compared to the equivalent circuit BLKb_1 of FIG. 24, two ground selection transistors GSTa and GSTb are provided between memory cells MC1 to MC6 and a common source line CSL in each NAND string NS.

First conductive lines 211, 212, and 213 having the first height form a ground selection transistors GSTa and first conductive lines 221, 222, and 223 having the second height form b ground selection transistors GSTb.

In the NAND strings of the same row, the ground selection transistors GSTa and GSTb share one ground selection line GSL. In the NAND strings of different rows, the ground selection transistors GSTa and GSTb share one ground selection line GSL. That is, the ground selection transistors GSTa and GSTb are commonly connected to one ground selection line GSL.

Exemplarily, each NAND string NS provides two ground selection transistors GSTa and GSTb. That is, it is described that first conductive materials of two layers (e.g., first and second heights) among the first conductive materials 211 to 291, 212 to 292, and 213 to 293 form the ground selection transistors GSTa and GSTb. However, the number of the ground selection transistors provided to each NAND string NS is not limited. For example, more than three ground selection transistors may be provided in each NAND string NS.

Figure 44:
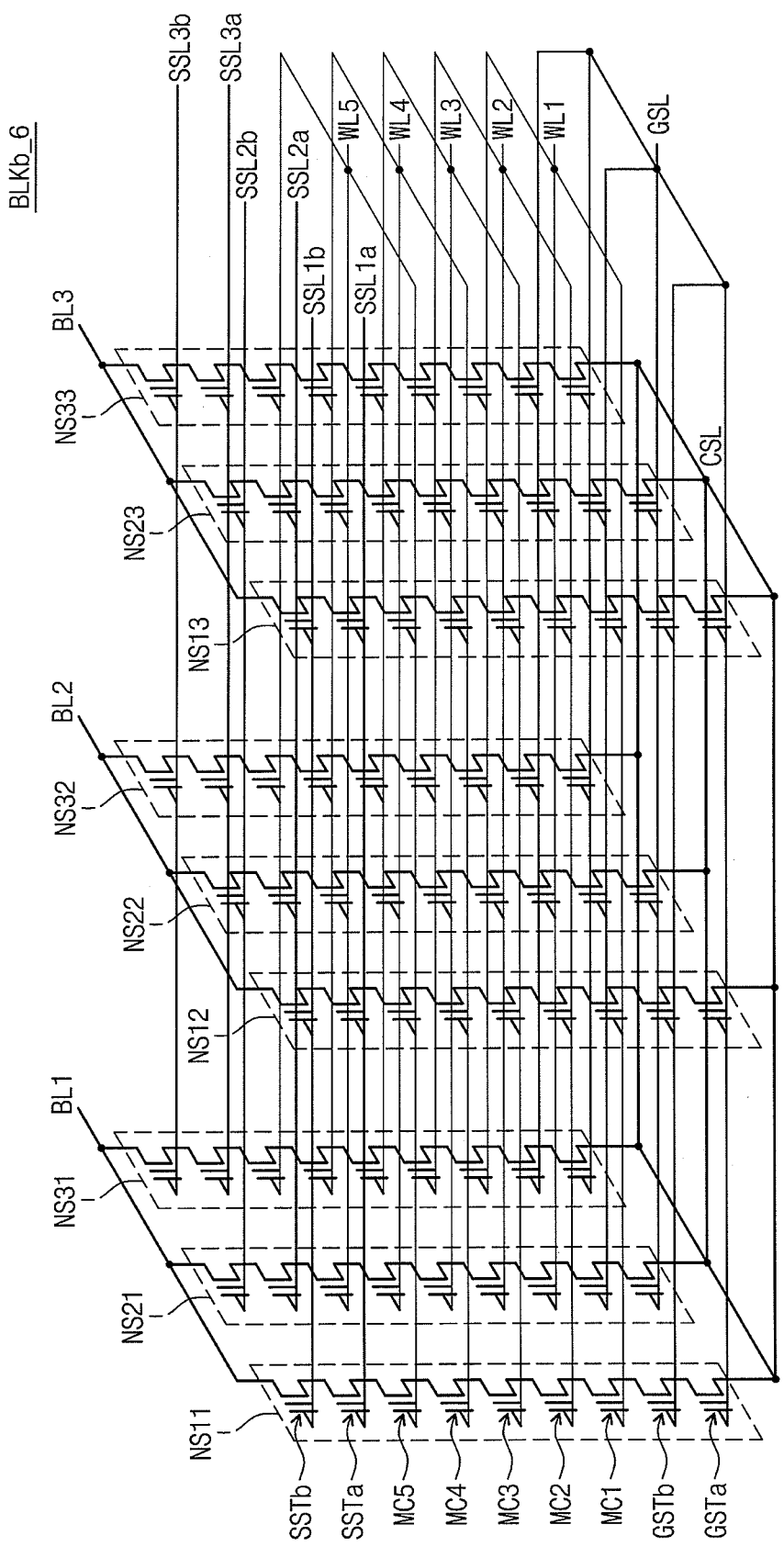
FIG. 44 is a circuit diagram illustrating an equivalent circuit of the memory block of FIG. 18 according to an embodiment of the inventive concept.

FIG. 44 is a circuit diagram illustrating an equivalent circuit BLKb_6 of the memory block BLKb of FIG. 18 according to an embodiment of the inventive concept. Compared to the equivalent circuit BLKb_5 of FIG. 43, two string selection transistors SSTa and SSTb are provided between the memory cells MCa to MC5 and the bit line BL in each NAND string NS.

First conductive lines 281, 282, and 283 having the eighth height form a string selection transistors SSTa and first conductive lines 291, 292, and 293 having the ninth height form b string selection transistors SSTb.

In NAND strings of the same row, the string selection transistors SSTa and SSTb having the same height share one string selection line SSL. The string selection transistors SSTa and SSTb having a different height are connected to different string selection lines, respectively.

In the NAND strings NS11 to NS13 of the first row, the a string selection transistors SSTa share a 1a string selection line SSL1a. The b string selection transistors SSTb share a 1b string selection line SSL1b.

In the NAND strings NS21 to NS23 of the second row, the a string selection transistors SSTa share a 2a string selection line SSL2a. The b string selection transistors SSTb share a 2b string selection line SSL2b.

In the NAND strings NS31 to NS33 of the third row, the a string selection transistors SSTa share a 3a string selection line SSL3a. The b string selection transistors SSTb share a 3b string selection line SSL3b.

Exemplarily, each NAND string NS provides two string selection transistors SSTa and SSTb. That is, it is described that first conductive materials of two layers (e.g., eighth and ninth heights) among the first conductive materials 211 to 291, 212 to 292, and 213 to 293 form the string selection transistors SSTa and SSTb. However, the number of the string selection transistors provided to each NAND string NS is not limited. For example, more than three string selection transistors may be provided in each NAND string NS.

Figure 45:
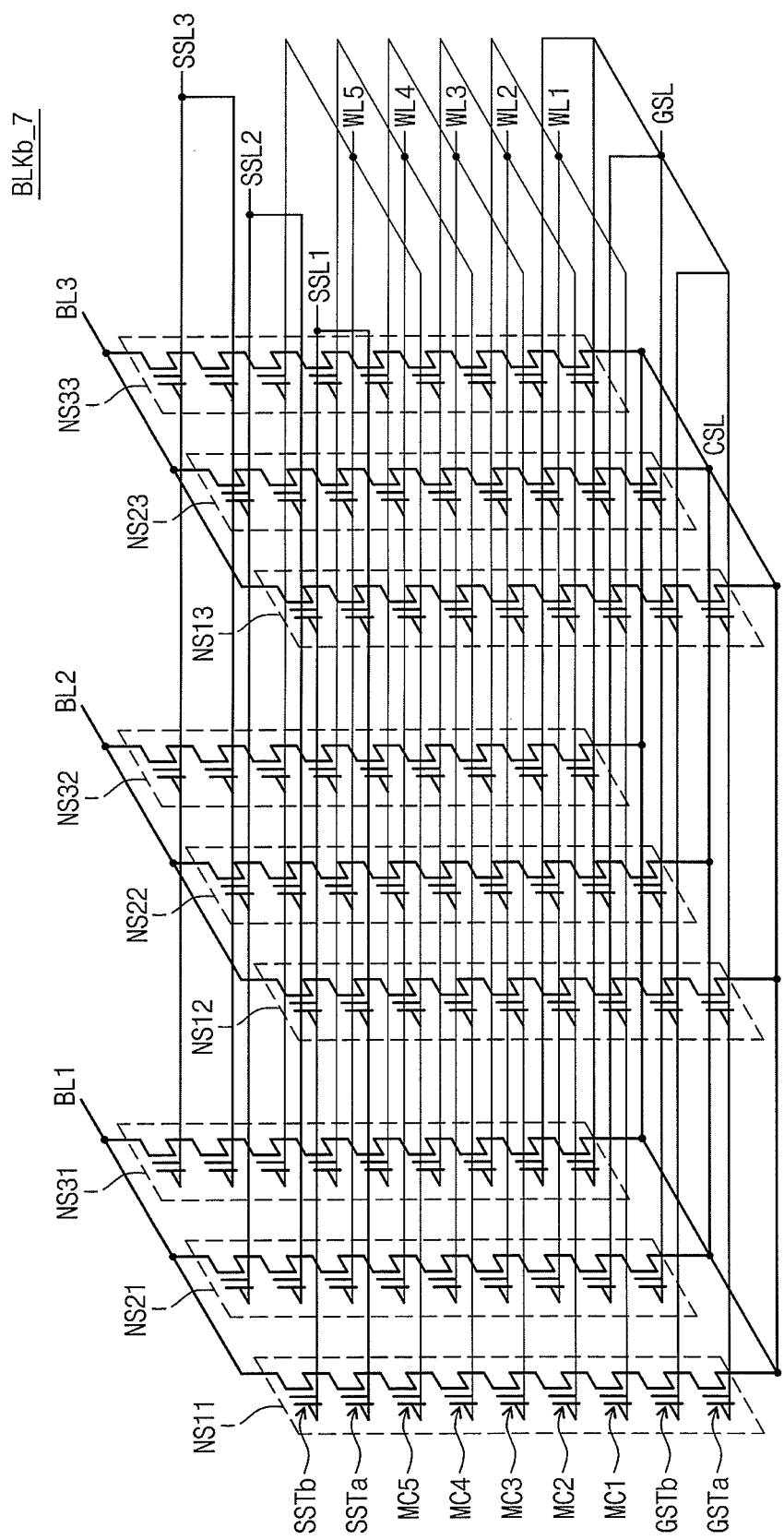
FIG. 45 is a circuit diagram illustrating an equivalent circuit of the memory block of FIG. 18 according to an embodiment of the inventive concept.

FIG. 45 is a circuit diagram illustrating an equivalent circuit BLKb_7 according to an embodiment of the memory block BLKb of FIG. 18. Compared to the equivalent circuit BLKb_6 of FIG. 44, the string selection transistors SSTa and SSTb of the NAND strings NS of the same row share a string selection line SSL.

As described with reference to FIG. 44, the number of string selection transistors provided in each NAND string NS is not limited.

Figure 46:
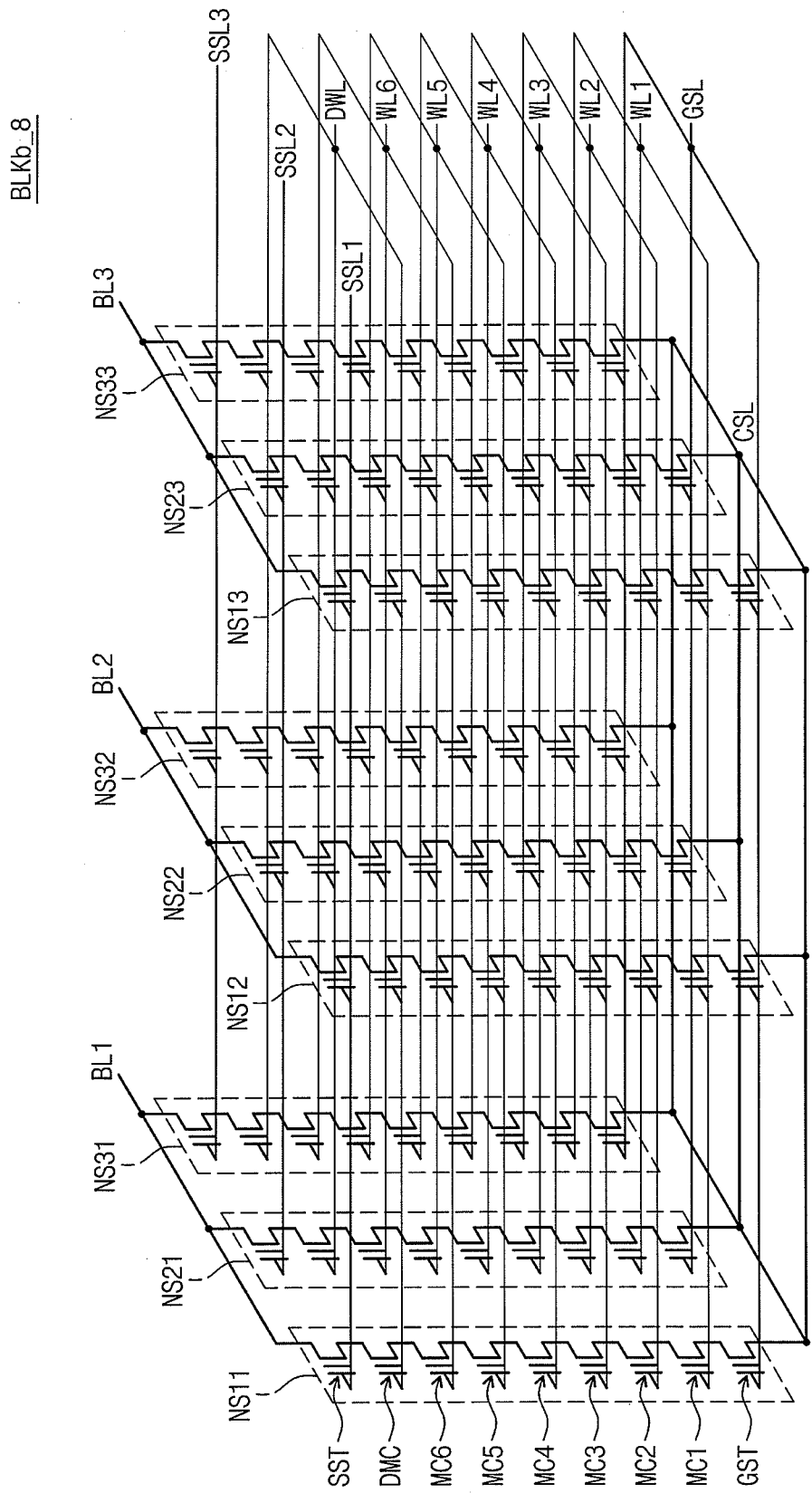
FIG. 46 is a circuit diagram illustrating an equivalent circuit of the memory block of FIG. 18 according to an embodiment of the inventive concept.

FIG. 46 is a circuit diagram illustrating an equivalent circuit BLKb_8 of the memory block BLKb of FIG. 18 according to an embodiment of the inventive concept. Compared to the equivalent circuit BLKb_1 of FIG. 24, a dummy memory cell DMC is provided between the string selection transistor SST and the memory cells MC1 to MC6 in each NAND string.

First conductive lines 281, 282, and 283 having the eighth height form dummy memory cells DMC. The dummy memory cells DMC are commonly connected to a dummy word line DWL. A dummy word line DWL is provided between the string selection lines SSL1 to SSL3 and the word lines WL1 to WL6.

In an embodiment, one dummy memory cell DMC is provided between the memory cells MC1 to MC6 and the string selection transistors SST in each NAND string NS. However, the number of dummy memory cell MC provided between the memory cells MC1 to MC6 and the string selection transistor SST in each NAND string NS is not limited. For example, in each NAND string NS, more than two dummy memory cells may be provided between the memory cells MC1 to MC6 and the string selection transistor SST in each NAND string NS.

Figure 47:
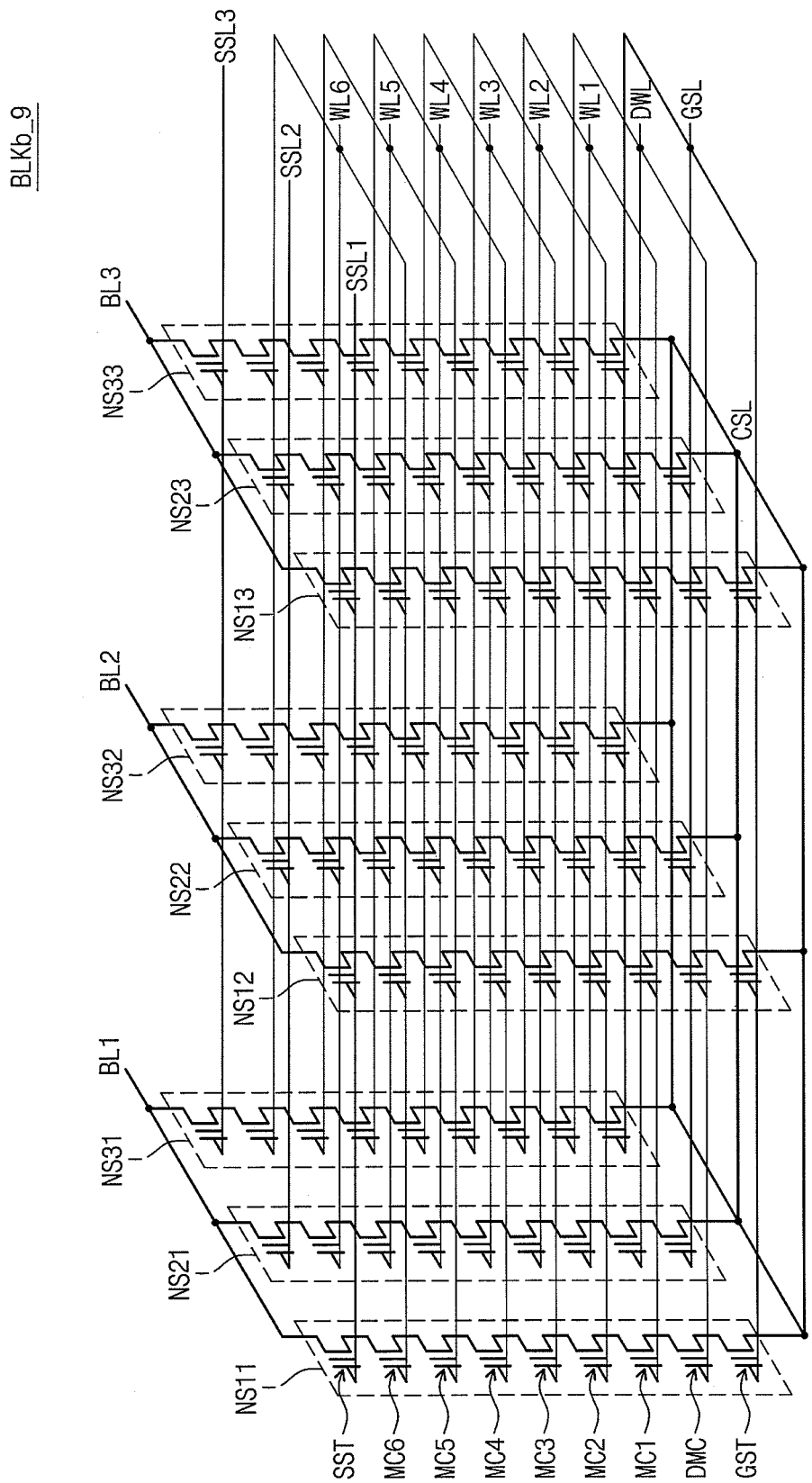
FIG. 47 is a circuit diagram illustrating an equivalent circuit of the memory block of FIG. 18 according to an embodiment of the inventive concept.

FIG. 47 is a circuit diagram illustrating an equivalent circuit BLKb 9 of the memory block BLKb of FIG. 18 according to an embodiment of the inventive concept. Compared to the equivalent circuit BLK_1 of FIG. 24, a dummy memory cell DMC is provided between the ground selection transistor GST and the memory cells MC1 to MC6 in each NAND string.

The first conducive lines 221, 222, and 223 having the second height form dummy memory cells DMC. The dummy memory cells DMC are commonly connected to the dummy word line DWL. That is, a dummy word line DWL is provided between the ground selection line GSL and the word lines WL1 to WL6.

In an embodiment, one dummy memory cell DMC is provided between the memory cells MC1 to MC6 and the string selection transistor GST in each NAND string NS. However, the number of dummy memory cells MC provided between the memory cells MC1 to MC6 and the ground selection transistor GST in each NAND string NS is not limited. For example, in each NAND string NS, more than two dummy memory cells may be provided between the memory cells MC1 to MC6 and the ground selection transistor GST in each NAND string NS.

Figure 48:
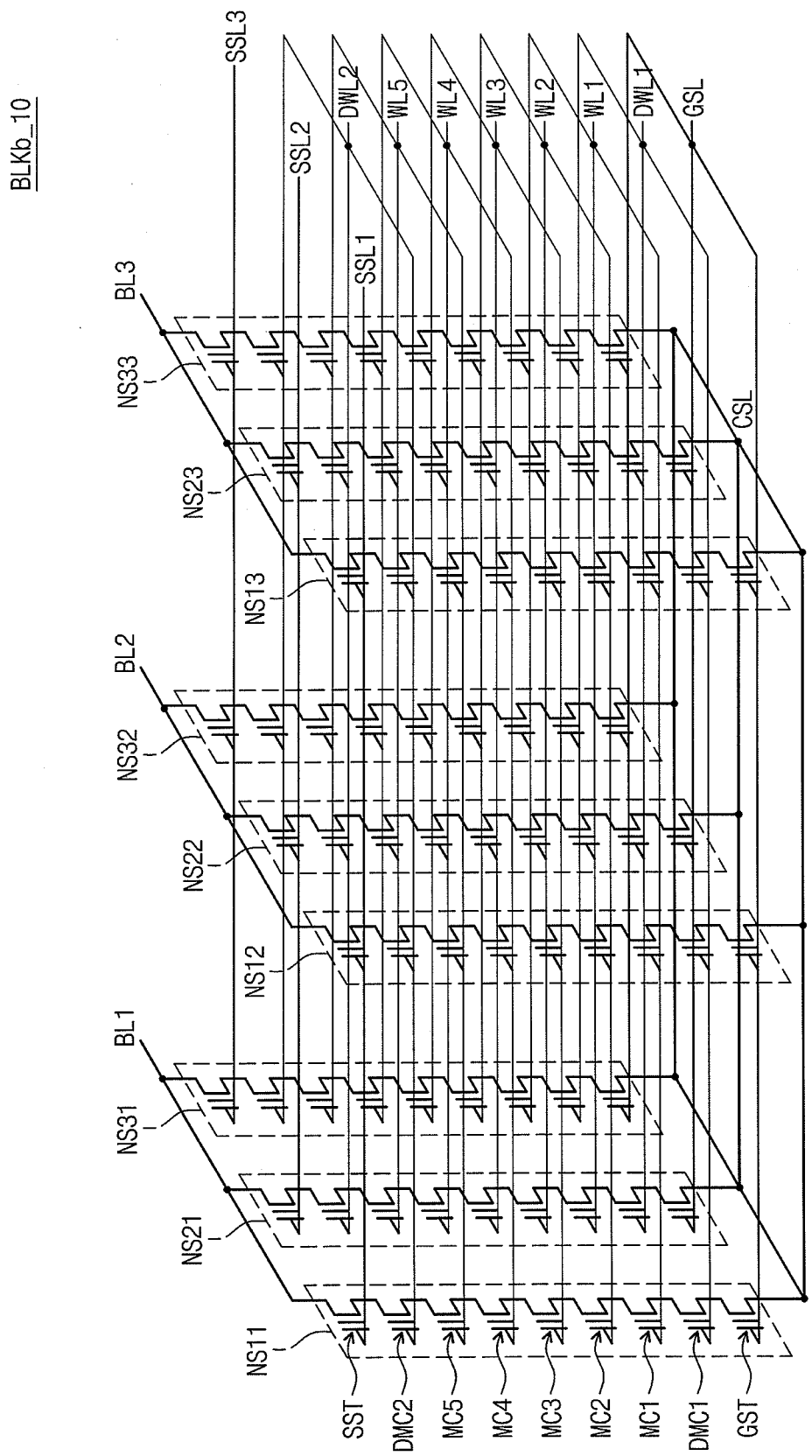
FIG. 48 is a circuit diagram illustrating an equivalent circuit of the memory block of FIG. 18 according to an embodiment of the inventive concept.

FIG. 48 is a circuit diagram illustrating an equivalent circuit BLKb_10 of the memory block BLKb of FIG. 18 according to an embodiment of the inventive concept. Compared to the equivalent circuit BLKb_1 of FIG. 24, a first dummy memory cell DMC1 is provided between the ground selection transistor GST and the memory cells MC1 to MC5 in each NAND string.

The first conducive lines 221, 222, and 223 having the second height form first dummy memory cells DMC1. The first dummy memory cells DMC1 are commonly connected to a first dummy word line DWL1. That is, the first dummy word line DWL1 is provided between the ground selection line GSL and the word lines WL1 to WL5.

A second dummy memory cell DMC2 is provided between the string selection transistor SST and the memory cells MC1 to MC5 in each NAND string NS.

The first conducive lines 281, 282, and 283 having the eighth height form second dummy memory cells DMC2. The second dummy memory cells DMC2 are commonly connected to a second dummy word line DWL2. That is, the first dummy word line DWL1 is provided between the string selection lines SSL1 to SSL3 and the word lines WL1 to WL5.

In an embodiment, each one dummy memory cell DMC is provided between the memory cells MC1 to MC5 and between the memory cells MC1 to MC5 and the string selection transistor SST in each NAND string NS. However, the number of dummy memory cells MC provided between the memory cells MC1 to MC5 and the ground selection transistor GST in each NAND string NS is not limited. In each NAND string NS, the number of dummy memory cells DMC provided between the memory cells MC1 to MC5 and the string selection transistor SST is not limited.

For example, in each NAND string NS, more than two dummy memory cells may be provided between the memory cells MC1 to MC5 and the ground selection transistor GST. In each NAND string NS, more than two dummy memory cells may be provided between the memory cells MC1 to MC5 and the string selection transistor SST.

Referring to FIGS. 24 through 48, exemplary equivalent circuits of the memory block BLKb are described. In the equivalent circuits according to embodiments of the memory block BLKb, the memory block BLKb is erased, and then erase-verified by a unit of respective word line. If erase fail occurs, the memory block BLKb is erased again, then an erase-verification resumes from the erase-failed word line. The erase and erase-verification are performed by a row unit of the NAND strings NS.

Exemplarily, at least two among the equivalent circuits according to the first to tenth embodiments of the memory block BLKb may be combined.

Figure 49:
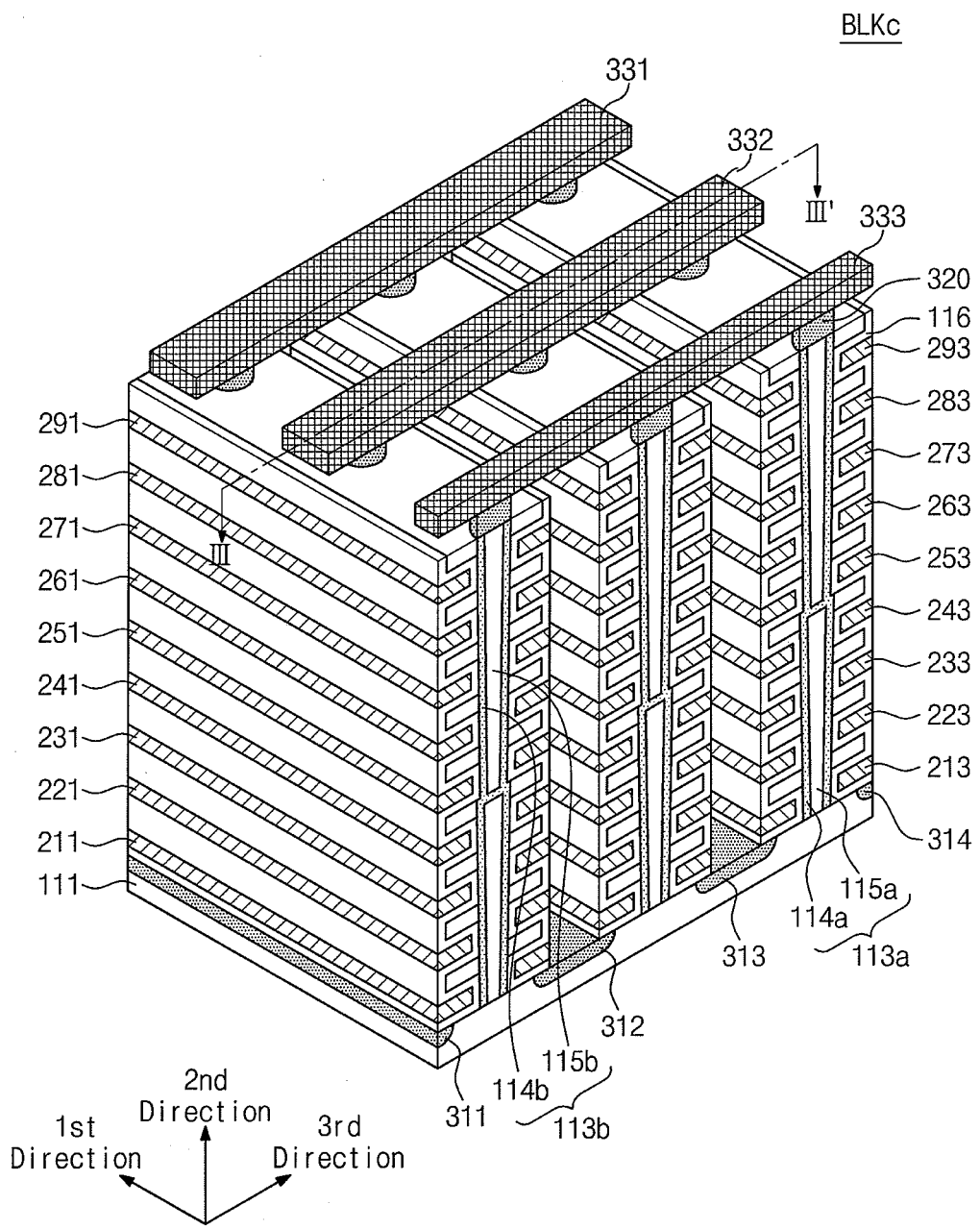
FIG. 49 is a perspective view illustrating one of the memory blocks in the nonvolatile memory device of FIG. 16 according to an embodiment of the inventive concept.
Figure 50:
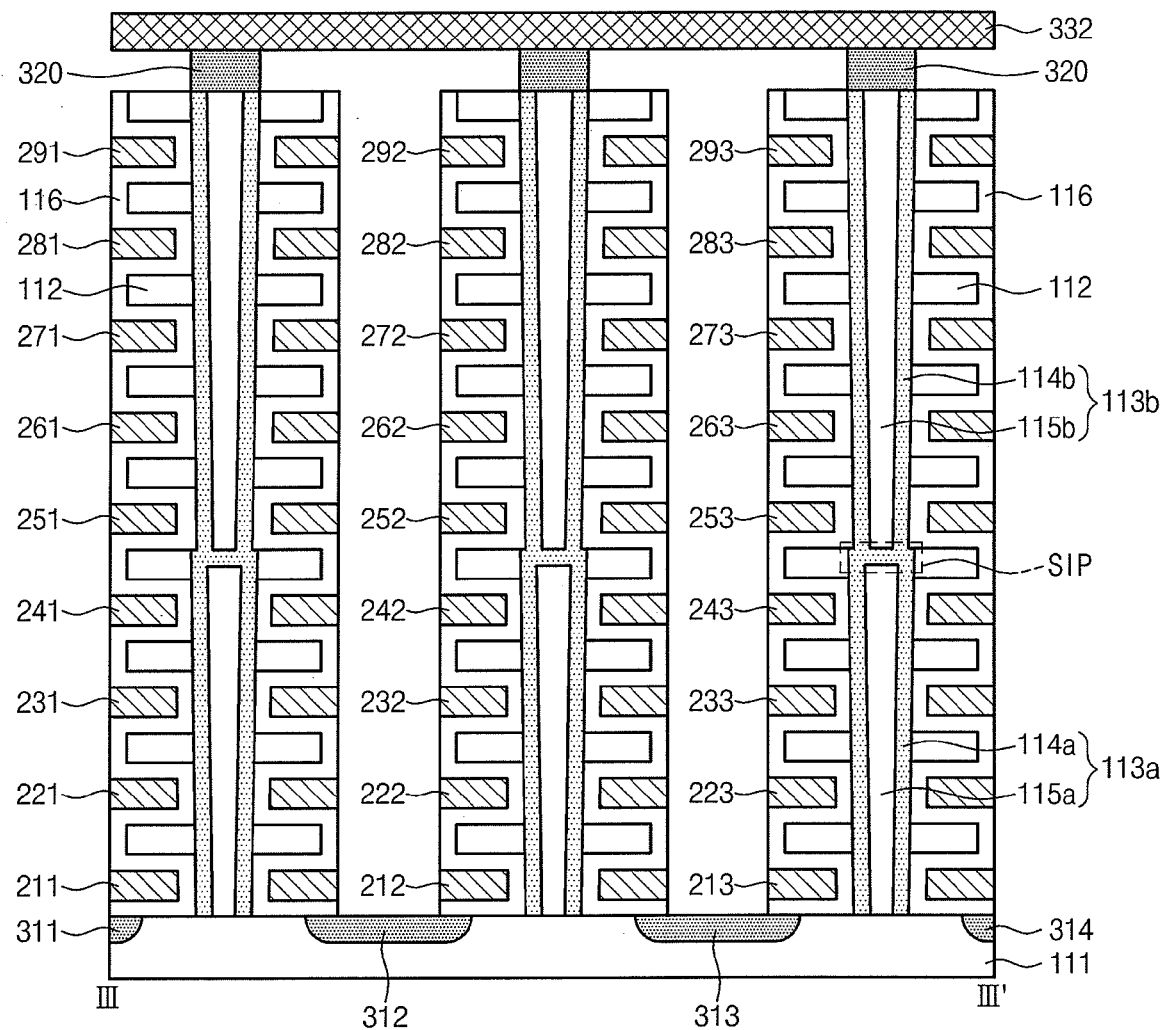
FIG. 50 is a sectional view taken along the line of the memory block of FIG. 49 according to an embodiment of the inventive concept.

FIG. 49 is a perspective view illustrating an embodiment of one of the memory blocks BLK1 to BLKz in the nonvolatile memory device 100c of FIG. 16. FIG. 50 is a sectional view taken along the line of the memory block BLKc of FIG. 49.

Compared to the memory block BLKb described with reference to FIGS. 18 and 19, one pillar of the memory block BLKc includes a first sub pillar 113a and a second sub pillar 113b. Except that the pillar 113 of the memory block BLKb is replaced with the first and second sub pillars 113a and 113b, the memory block BLKc has the same structure as the memory block BLKb. Accordingly, overlapping description will be omitted.

Referring to FIGS. 49 and 50, the first sub pillar 113a is provided on the substrate 111. Exemplarily, a channel layer 114a of the first sub pillar 113a includes a silicon material having a p-type. The channel layer 114a of the first sub pillar 113a operates a body of the second direction. An internal material 115a of the first sub pillar 113a includes an internal material 115b.

The second sub pillar 113b is provided on the first sub pillar 113a. Exemplarily, a channel layer 114b of the second sub pillar 113b includes a silicon material having a p-type. The channel layer 114b of the second sub pillar 113b operates a body of the second direction. An internal material 115b of the second sub pillar 113b includes an internal material 115b.

Exemplarily, the channel layer 114a of the first sub pillar 113a is connected to the channel layer 114b of the second sub pillar 113b. For example, as shown in FIGS. 32 and 33, the channel layer 114a of the first sub pillar 113a is connected to the channel layer 114b of the second sub pillar 113b through a silicon pad SIP.

In an embodiment, first conductive materials 251, 252, and 253 having the height corresponding to the silicon pad SIP (i.e., the fifth height) may form a dummy word line DWL and a dummy memory cell DMC. For example, if the memory block BLKb is divided into a plurality of sub blocks along the second direction, it may be divided into sub blocks based on the height corresponding to the silicon pad SIP.

In an embodiment, an equivalent circuit of the memory block BLKc may correspond to one of the equivalent circuits BLKb_1, BLKb_2, and BLKb_3 described with reference to FIGS. 24, 32, and 39. Exemplarily, an equivalent circuit of the memory block BLKc may correspond to one of the equivalent circuits BLKb_4 to BLKb_10 described with reference to FIGS. 42 through 48.

Figure 51:
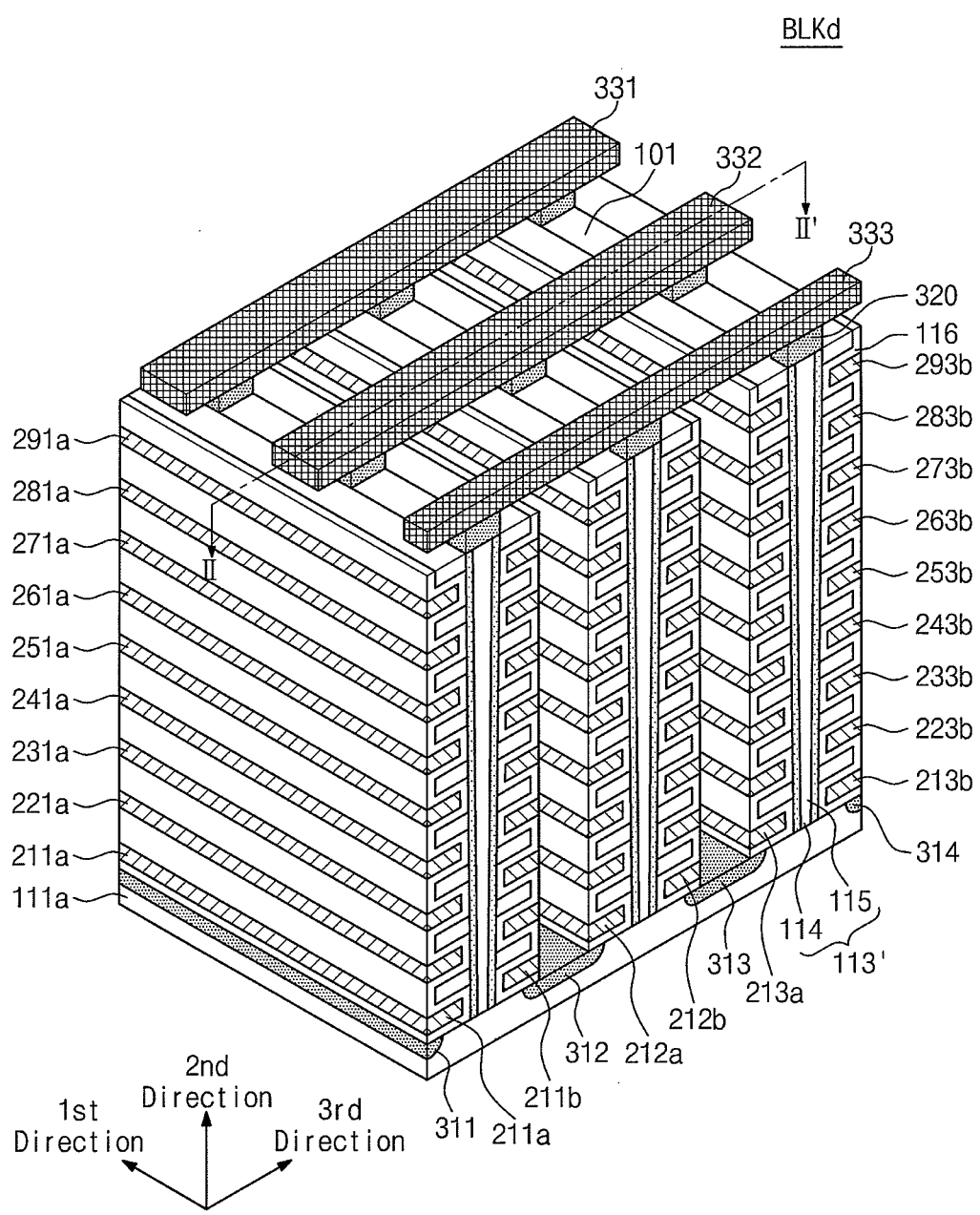
FIG. 51 is a perspective view illustrating one of the memory blocks of the nonvolatile memory device of FIG. 16 according to an embodiment of the inventive concept.

FIG. 51 is a perspective view one of the memory blocks BLK1 to BLKz of the nonvolatile memory device 100c of FIG. 16 according to an embodiment of the inventive concept. The sectional view taken along the line II-II' of the memory block BLKd is substantially identical to the sectional view of FIG. 19.

Compared to the memory block BLKb described with reference to FIGS. 18 and 19, pillars 113' are provided in a square column in the memory block BLKd. Insulation materials 101 are provided between the pillars 113' spaced along the first direction by a specific distance. Exemplarily, the insulation materials 101 extend along the second direction to contact the substrate 111.

The first conductive materials 211 to 291, 212 to 292, and 213 to 293 described with FIG. 18 are separated into first portions 211a to 291a, 212a to 292a, and 213a to 293a and second portions 211b to 291b, 212b to 292b, and 213b to 293b in a region having the insulation materials 101.

In a region on the first and second doping regions 311 and 312, each pillar 133' forms the first potions 211a to 291a of the first conductive materials, the insulation layer 116, and one NAND string NS, and also the second portions 211b to 291b of the first conductive materials, the insulation layer 116, and another NAND string NS.

In a region on the second and third doping regions 312 and 313, each pillar 133' forms the first potions 212a to 292a of the first conductive materials, the insulation layer 116, and one NAND string NS, and also the second portions 212b to 292b of the first conductive materials, the insulation layer 116, and another NAND string NS.

In a region on the third and fourth doping regions 313 and 314, each pillar 133' forms the first potions 213a to 293a of the first conductive materials, the insulation layer 116, and one NAND string NS, and also the second portions 213b to 293b of the first conductive materials, the insulation layer 116, and another NAND string NS.

That is, by separating the first and second portions 211a to 291a and 211b to 291b of the first conductive materials provided at both sides of each pillar 113' using the insulation material 101, each pillar 113' may form two NAND strings NS.

As described with reference to FIGS. 18 and 19, the first portions 211a to 291a and the second portions 211b to 291b, 212b to 292b, and 213b to 293b of the first conductive materials may correspond to the ground selection lines GSL, word lines WL, and string selection lines SST. The word lines WL having the same height may be commonly connected.

Exemplarily, except for the number of rows in the NAND strings NS, an equivalent circuit of the memory block BLKd may correspond to one of the equivalent circuits BLKb_1, BLKb_2, and BLKb_3 described with reference to FIGS. 24, 32, and 39. For example, the number of rows in the NAND strings NS of an equivalent circuit of the memory block BLKd may be two times that in the NAND strings NS of the equivalent circuits BLKb_1, BLKb_2, and BLKb_3 described with reference to FIGS. 24, 32, and 39.

Exemplarily, except for the number of rows in the NAND strings NS, an equivalent circuit of the memory block BLKd may correspond to one of the equivalent circuits BLKb_4 to BLKb_10 described with reference to FIGS. 42 through 48. For example, the number of rows in the NAND strings NS of an equivalent circuit of the memory block BLKd may be two times that in the NAND strings NS of the equivalent circuits BLKb_4 to BLKb_10 described with reference to FIGS. 42 through 48.

Figure 52:
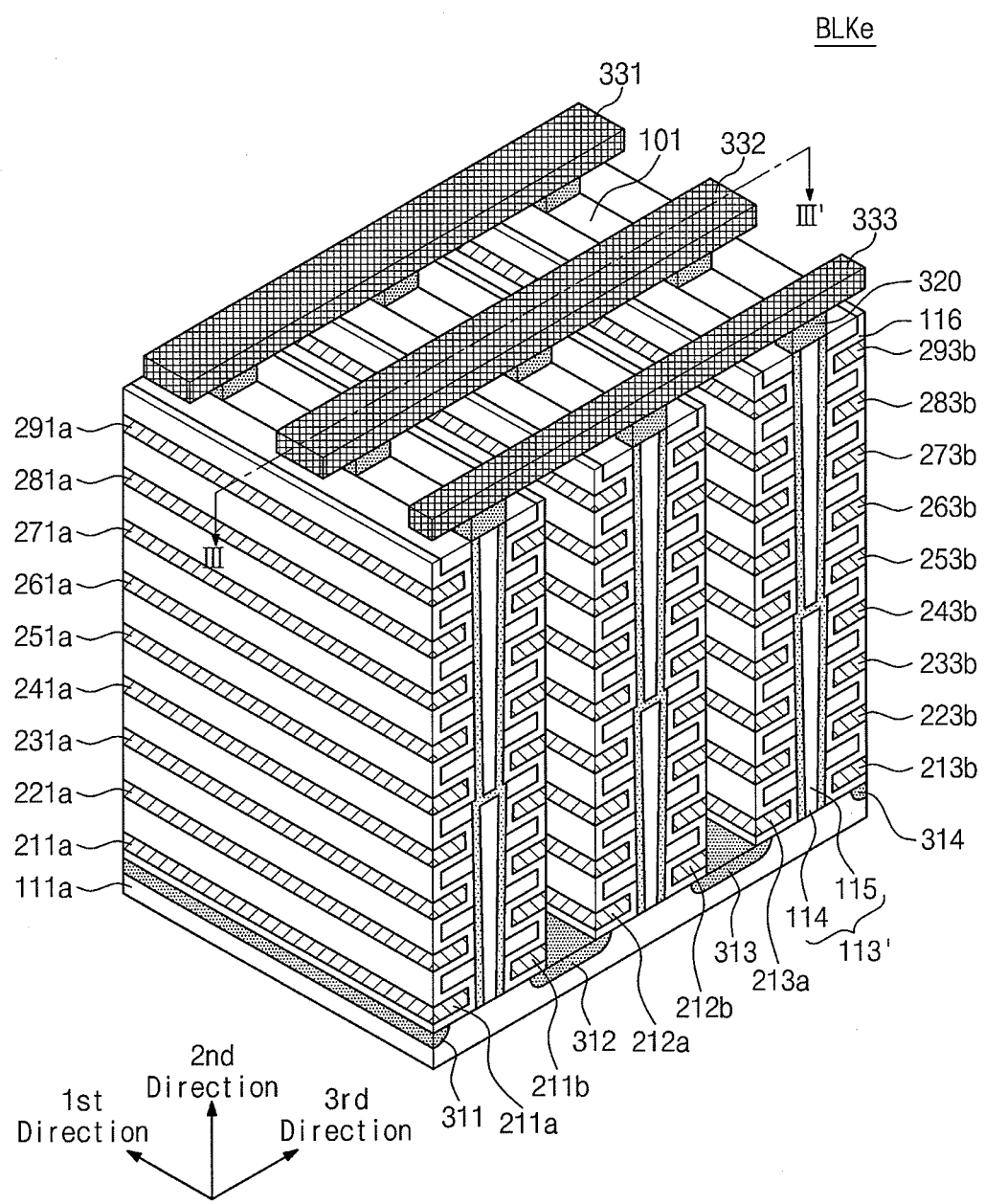
FIG. 52 is a perspective view illustrating one of the memory blocks in the nonvolatile memory device of FIG. 16 according to an embodiment of the inventive concept.

FIG. 52 is a perspective view of one of the memory blocks BLK1 to BLKz in the nonvolatile memory device 100c of FIG. 16 according to an embodiment of the inventive concept. The sectional view taken along the line of the memory block BLKe is identical to that of FIG. 50. Except that one pillar of the memory block BLKe includes a first sub pillar 113a and a second sub pillar 113b, the memory block BLKe is identical to the memory block BLKd described with reference to FIG. 51.

As mentioned with reference to FIGS. 49 and 50, one pillar includes the first sub pillar 113a and the second sub pillar 113b in the memory block BLKe. Except that the one pillar has a rectangular pillar, the first and second sub pillars 113a and 113b have the same structure as the first and second sub pillars 113a and 113b described with reference to FIGS. 49 and 50.

As mentioned with reference to FIG. 51, one pillar 113' forms two NAND stings NS. The first portions 211a to 291a and the second portions 211b to 291b, 212b to 292b, and 213b to 293b of the first conductive materials may correspond to the ground selection lines GSL, word lines WL, and string selection lines SST. The word lines WL having the same height may be commonly connected.

Exemplarily, except for the number of rows in the NAND strings NS, an equivalent circuit of the memory block BLKe may correspond to one of the equivalent circuits BLKb_1, BLKb_2, and BLKb_3 described with reference to FIGS. 24, 32, and 39. For example, the number of rows in the NAND strings NS of an equivalent circuit of the memory block BLKe may be two times that in the NAND strings NS of the equivalent circuits BLKb_1, BLKb_2, and BLKb_3 described with reference to FIGS. 24, 32, and 39.

Exemplarily, except for the number of rows in the NAND strings NS, an equivalent circuit of the memory block BLKe may correspond to one of the equivalent circuits BLKb_4 to BLKb_10 described with reference to FIGS. 42 through 48. For example, the number of rows in the NAND strings NS of an equivalent circuit of the memory block BLKe may be two times that in the NAND strings NS of the equivalent circuits BLKb_4 to BLKb_10 described with reference to FIGS. 42 through 48.

Figure 53:
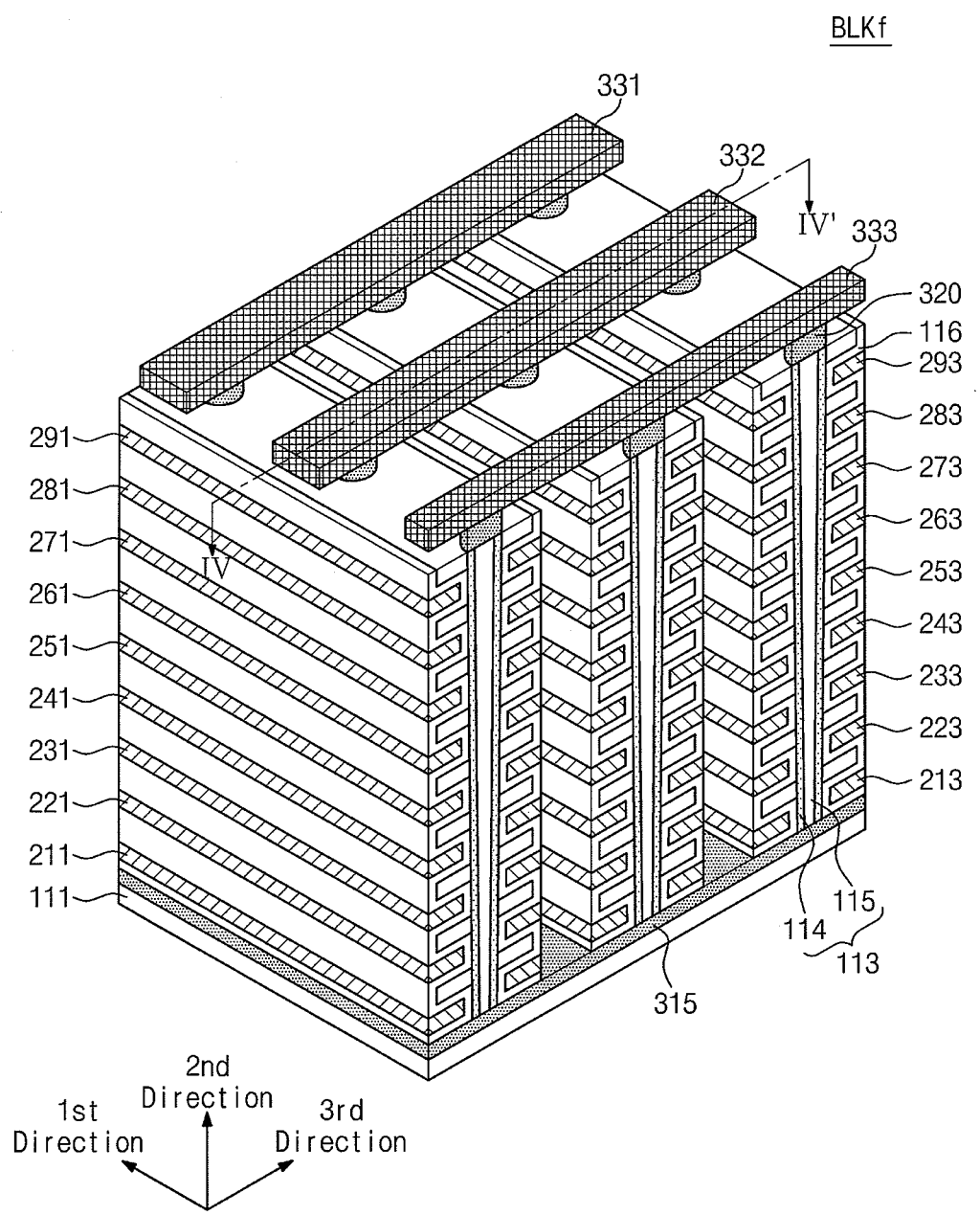
FIG. 53 is a perspective view illustrating one of the memory blocks in the nonvolatile memory device of FIG. 16 according to an embodiment of the inventive concept.
Figure 54:
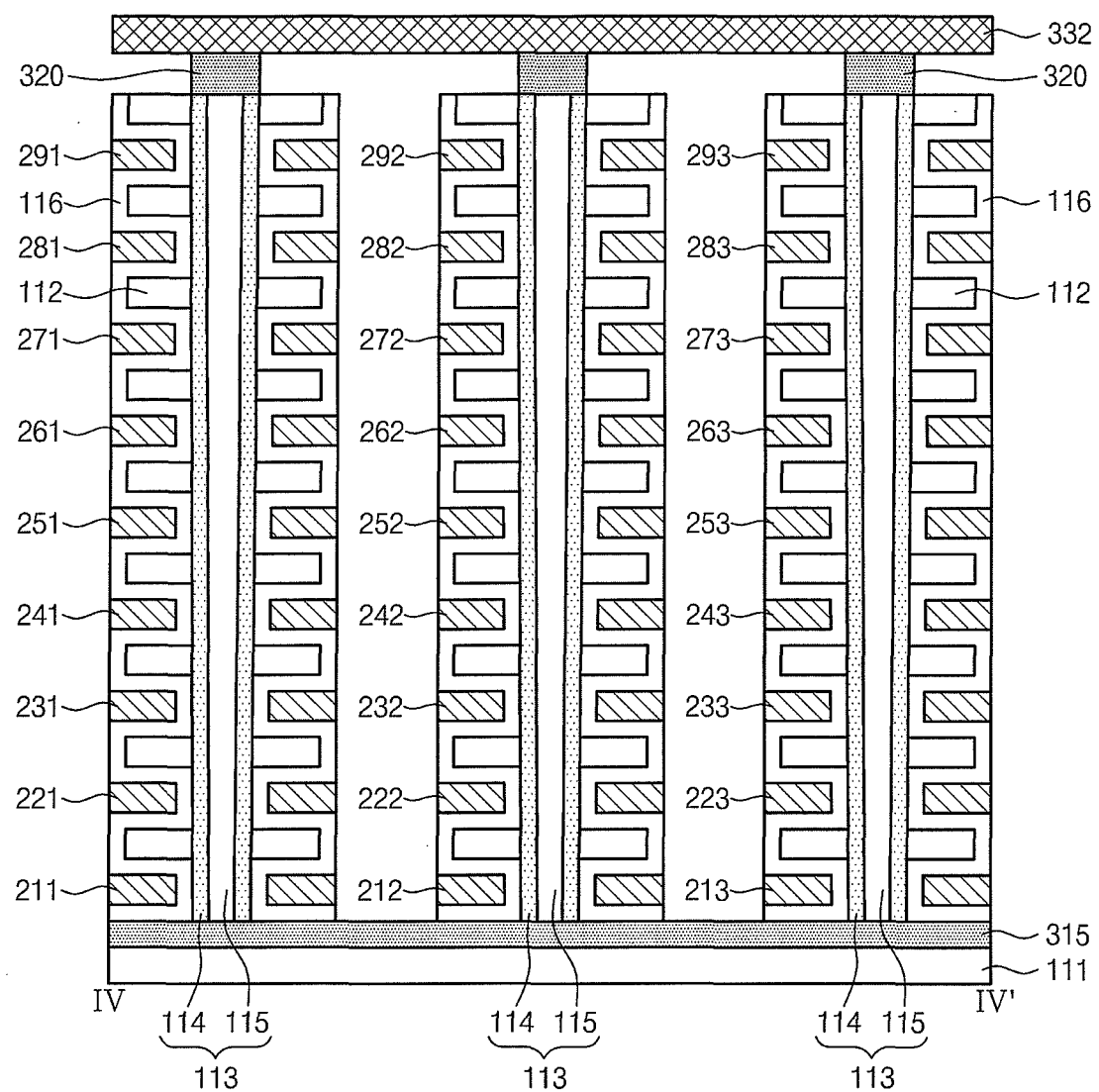
FIG. 54 is a sectional view taken along the line IV-IV' of FIG. 53 according to an embodiment of the inventive concept.

FIG. 53 is a perspective view of one of the memory blocks BLK1 to BLKz in the nonvolatile memory device 100c of FIG. 16 according to an embodiment of the inventive concept. FIG. 54 is a sectional view taken along the line IV-IV' of FIG. 53. Except that an n-type doping region 315 forming a common source line CSL is provided in a plate shape, the memory block BLKf may have the same structure as the memory block BLKa described with reference to FIGS. 18 and 19. Exemplarily, the n-type doping region 315 may be provided as an n-type well.

As described with reference to FIGS. 18 and 19, the first conductive materials 211 to 291, 212 to 292, and 213 to 293 may correspond to the ground selection lines GSL, word lines WL, and string selection lines SST. The word lines WL having the same height may be commonly connected.

Exemplarily, an equivalent circuit of the memory block BLKf may correspond to one of the equivalent circuits BLKb_1, BLKb_2, and BLKb_3 described with reference to FIGS. 24, 32, and 39. Exemplarily, an equivalent circuit of the memory block BLKc may correspond to one of the equivalent circuits BLKb_4 to BLKb_10 described with reference to FIGS. 42 through 48.

FIG. 55 is a table illustrating voltage conditions during an erase operation of the memory block BLKf of FIGS. 53 and 54 according to an embodiment of the inventive concept. Exemplarily, the table of FIG. 55 may illustrate voltage conditions when an equivalent circuit of the memory block BLKf corresponds to the equivalent circuit BLK_1 described with reference to FIG. 24.

Referring to FIGS. 24, and 53 through 55, the string selection lines SSL1 to SSL3 float during an erase operation. After the word lines WL1 to WL7 float, they are driven by the third word line erase voltage Vwe3. After the ground selection line GSL is driven by a ground voltage Vss, they float. The common source line CSL floats. Then, the substrate 111 is driven by a pre voltage Vpr and then is driven by a third erase voltage Vers3.

Figure 56:
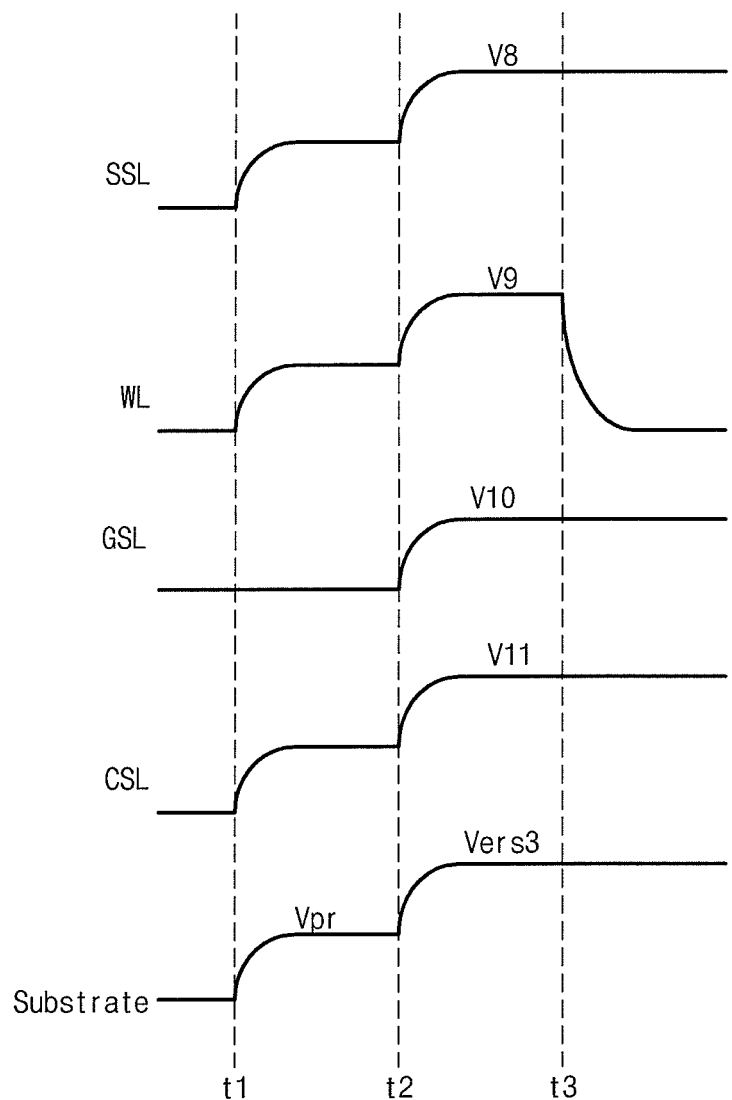
FIG. 56 is a timing diagram illustrating a voltage change of the memory block of FIGS. 53 and 54 according to the voltage conditions of FIG. 55.
Figure 57:
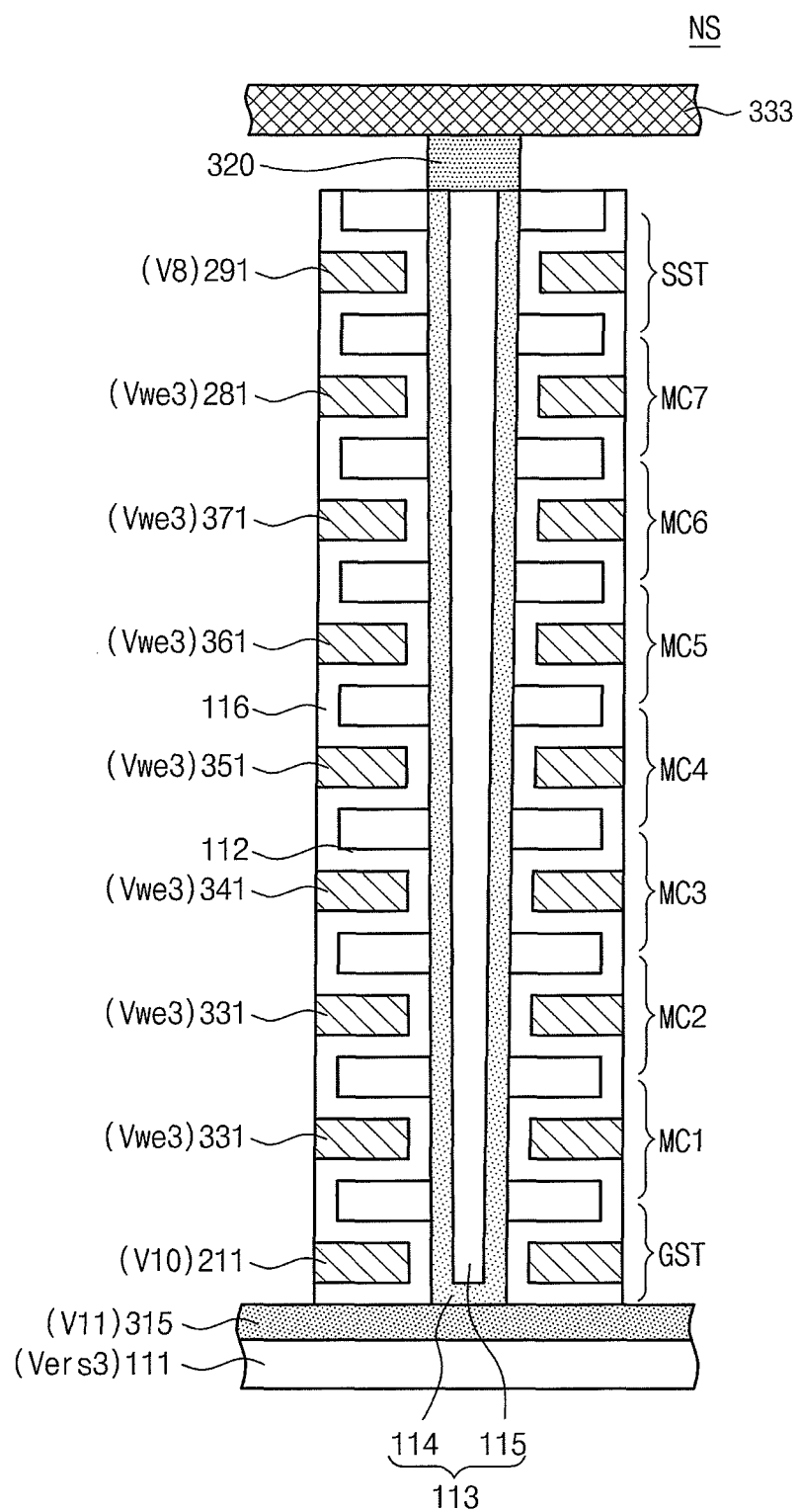
FIG. 57 is a sectional view of one NAND string in the memory block to which the voltages according to FIGS. 55 and 56 are applied.

FIG. 56 is a timing diagram illustrating a voltage change of the memory block BLKf of FIGS. 53 and 54 according to the voltage conditions of FIG. 55. FIG. 57 is a sectional view of one NAND string NS in the memory block BLKf to which the voltages according to FIGS. 55 and 56 are applied. Exemplarily, a sectional view corresponding to the NAND string NS13 of the first row and third column in the memory block BLKf is shown.

Referring to FIGS. 24, and 53 through 57, a pre voltage Vpr is applied to the substrate 111 at the first timing t1. Exemplarily, the substrate 111 includes a p-type silicon material, and the doping region 315 includes an n-type silicon material. Since the substrate 111 and the doping region 315 form a forward bias condition, the pre voltage Vpr is delivered to the doping region 315 through the substrate 111. For example, the pre voltage Vpr may be a high voltage.

A ground voltage Vss is applied to the ground selection line GSL. A ground voltage is applied to a gate (or a control gate) of the ground selection transistor GST and a pre voltage Vpr is applied to its source. Since the pre voltage Vpr is a high voltage, thermal electrons occur in the ground selection transistor GST. For example, thermal electrons are generated by a gate induced drain leakage (GIDL) in the ground selection transistor GST. The generated thermal electrons are delivered from the doping region 315 to the channel layer 114 operating as a body of the second direction. Accordingly, a voltage of the channel layer 114 is increased.

The word lines WL1 to WL7 float. Therefore, a voltage of the word lines WL1 to WL7 is increased by coupling due to a voltage rise of the channel layer 114.

The string selection lines SSL1 to SSL3 float. Therefore, a voltage of the string selection lines SSL1 to SSL3 is increased by coupling due to a voltage rise of the channel layer 114.

At the timing t2, a third erase voltage Vers3 is applied to the substrate 111. The third erase voltage Vers3 is delivered to the doping region 315. For example, a voltage of the doping region 315 (i.e., the common source line CSL) is increased to the eleventh voltage V11.

The ground selection line GSL floats. Therefore, due to coupling according to a voltage rise of the channel layer 114, a voltage of the ground selection line GSL is increased. For example, a voltage of the ground selection line GSL is increased to the tenth voltage V10.

Due to a difference between the third erase voltage Vers3 and the tenth voltage V10, thermal electrons occur in the ground selection transistor GST. For example, thermal electrons may occur by the GIDL in the ground selection transistor GST. By implanting the generated thermal electrons in the channel layer 114, a voltage of the channel layer 114 is increased.

The word lines WL1 to WL7 may float. Accordingly, a voltage of the word lines WL1 to WL7 is increased by coupling according to a voltage rise of the channel layer 114. For example, a voltage of the word lines WL 1 to WL7 is increased to the ninth voltage V9.

The string selection lines SSL1 to SSL3 float. Accordingly, a voltage of the string selection lines SSL1 to SSL3 is increased by coupling according to a voltage rise of the channel layer 114. For example, a voltage of the string selection lines SSL1 to SSL3 is increased to the eighth voltage V8.

At the third timing t3, a third word line erase voltage Vwe3 is applied to the word lines WL1 to WL7. For example, the third word line erase voltage Vwe3 is a low voltage. For example, the second word line erase voltage Vwe3 is a ground voltage Vss. At this point, a voltage of the channel layer 114 is a high voltage. Accordingly, F-N tunneling occurs in memory cells in the selected sub block. By the F-N tunneling, the memory cells MC1 to MC7 of the memory block BLKf are erased.

A voltage of the ground selection line GSL has a level of the tenth voltage V10. Exemplarily, the tenth voltage V10 may be a voltage generated by coupling according to a voltage rise of the channel layer 114. For example, the tenth voltage V10 is a high voltage. Exemplarily, in order to prevent F-N tunneling in the ground selection transistors GST, a level of the tenth voltage V10 is set. For example, by adjusting the timing of when the ground selection line GSL, a level of the tenth voltage V10 may be adjusted. Accordingly, the ground selection transistor GST is erase-inhibited.

A voltage of the string selection lines SSL1 to SSL3 has a level of the eighth voltage V8. Exemplarily, the eighth voltage V8 may be a voltage generated by coupling according to a voltage rise of the channel layer 114. For example, the eighth voltage V8 is a high voltage. Exemplarily, the eighth voltage V8 prevents F-N tunneling in the string selection transistor SST. Accordingly, the string selection transistor SST is erase-inhibited.

When an equivalent circuit of the memory block BLKf corresponds to the equivalent circuit BLKb_1 described with reference to FIG. 24, an erase-verification of the memory block BLKf is performed in the same manner as that described with reference to FIGS. 29 through 31. Accordingly, description for an erase-verification of the memory block BLKf will be omitted.

FIG. 58 is a table illustrating voltage conditions during an erase operation of the memory block BLKf of FIGS. 53 and 54 according to an embodiment of the inventive concept. Exemplarily, the table of FIG. 58 may illustrate voltage conditions when an equivalent circuit of the memory block BLKf corresponds to the equivalent circuit BLKb_2 described with reference to FIG. 32. Exemplarily, it is assumed that a first sub block is selected and a second sub block is unselected.

Referring to FIGS. 32, 53, 54, and 58, the string selection lines SSL1 to SSL3 float during an erase operation. The word lines WL4 to WL6 of the unselected sub block float. The word lines WL1 to WL3 of a selected sub block float and then are driven by the third word line erase voltage Vwe3. The second dummy word line voltage Vdwl2 is applied to the dummy word line DWL. The ground selection line GSL is driven by a ground voltage Vss and then floats. The common source line CSL floats. Then, the substrate 111 is driven by a pre voltage Vpr and then is driven by a second erase voltage Vers2.

Figure 59:
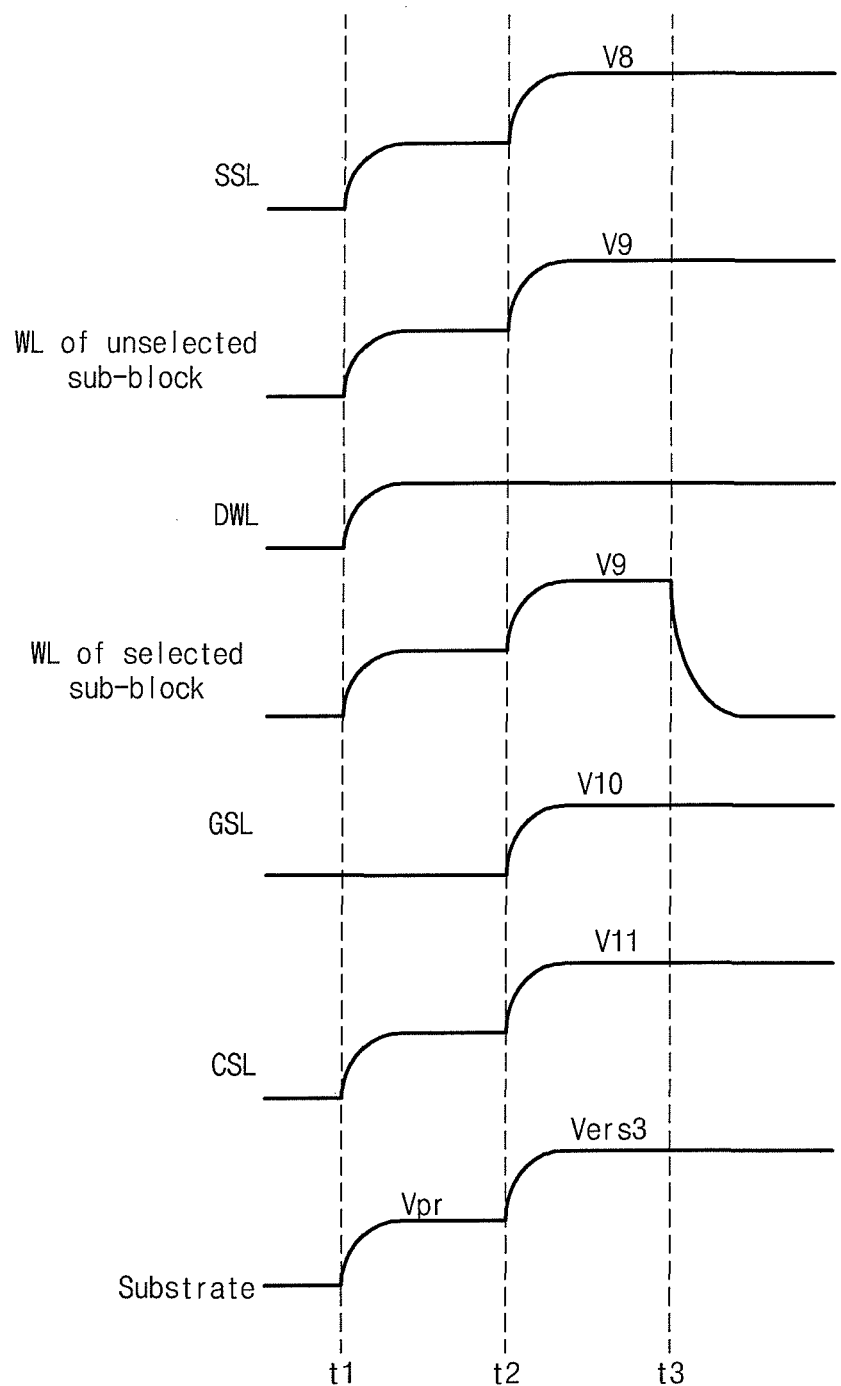
FIG. 59 is a timing diagram illustrating a voltage change of the memory block of FIGS. 53 and 54 according to voltage conditions of FIG. 58.
Figure 60:
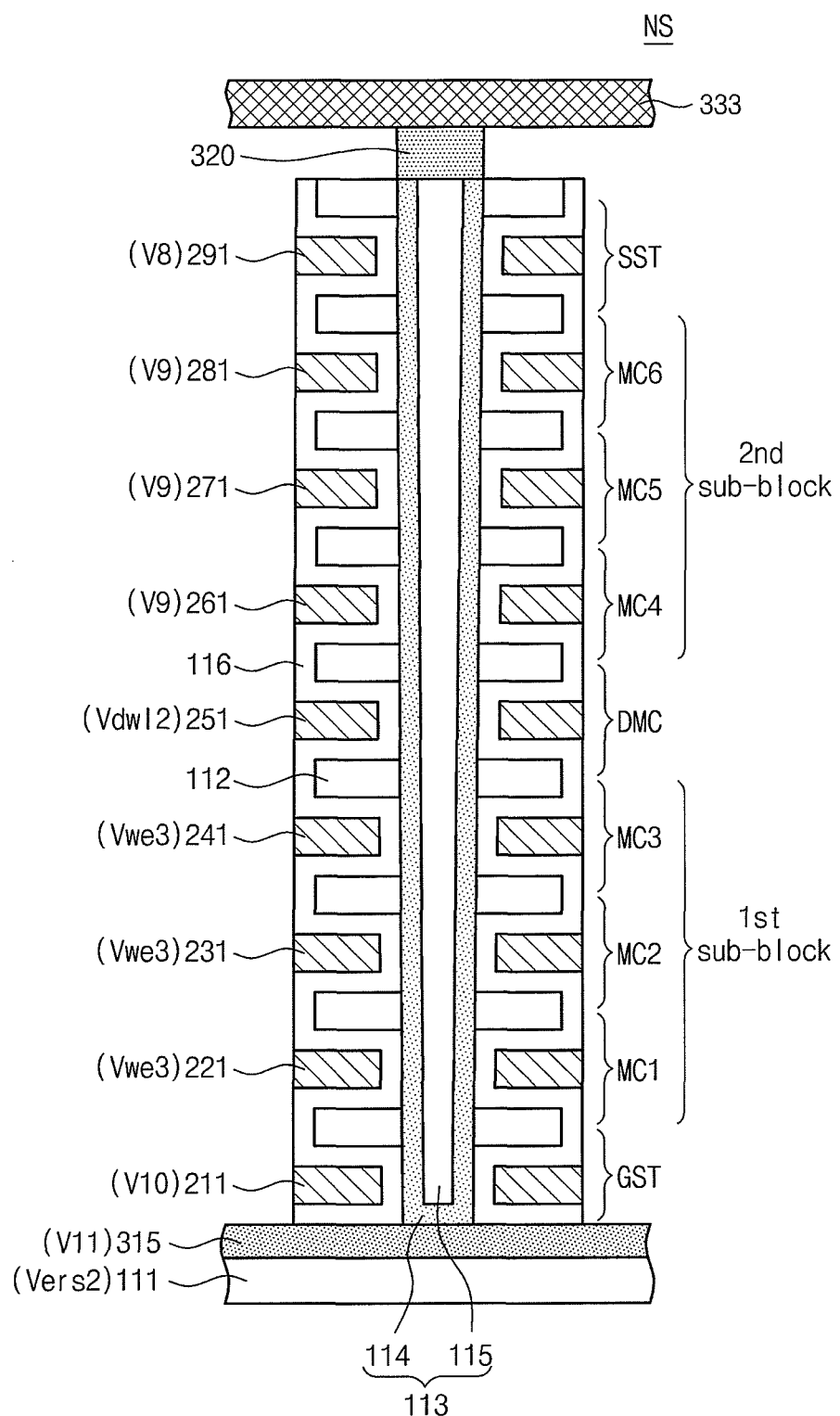
FIG. 60 is a sectional view of one NAND string of the memory block to which voltages according to FIGS. 58 and 59 are applied.

FIG. 59 is a timing diagram illustrating a voltage change of the memory block BLKf of FIGS. 53 and 54 according to voltage conditions of FIG. 58. FIG. 60 is a sectional view of one NAND string NS of the memory block BLKf to which voltages according to FIGS. 58 and 59 are applied. Exemplarily, a sectional view corresponding to the first row and third column of the memory block BLKf is shown.

Referring to FIGS. 32, 53, 54, and 58 through 60, a pre voltage Vpr is applied to the substrate 111 at the first timing t1. The pre voltage Vpr is delivered to the doping region 315 through the substrate 111. For example, the pre voltage Vpr may be a high voltage.

A ground voltage Vss is applied to the ground selection line GSL. Due to a voltage difference between a pre voltage Vpr and a ground voltage Vss, thermal electrons occur from the ground selection transistor GST. The generated thermal electrons are delivered from the doping region 315 to the channel layer 114. Accordingly, a voltage of the channel layer 114 is increased.

The word lines WL1 to WL3 of the selected sub block and the word lines WL4 to WL6 of the unselected sub block float. Accordingly, voltages of the word lines WL1 to WL3 of the selected sub block and the word lines WL4 to WL6 of the unselected sub block are increased by coupling according to a voltage rise of the channel layer 114.

A second dummy word line voltage Vdwl2 is applied to the dummy word line DWL.

The string selection lines SSL1 to SSL3 float. Accordingly, voltages of the string selection lines SSL1 to SSL3 are increased by coupling according to a voltage rise of the channel layer 114.

At the second timing t2, a third erase voltage Vers3 is applied to the substrate 111. The third erase voltage Vers3 is delivered to the doping region 315. For example, a voltage of the doping region 315 (i.e., the common source line CSL) is increased to the eleventh voltage V11.

The ground selection line GSL floats. Accordingly, due to coupling according to a voltage rise, a voltage of the ground selection line GSL may be increased. For example, a voltage of the ground selection line GSL is increased to the tenth voltage V10.

Due to a difference between the third erase voltage Vers3 and the tenth voltage V10, thermal electrons are generated in the ground selection transistor GST. By implanting the generated thermal electrons into the channel layer 114, a voltage of the channel layer 114 is increased.

The word lines WL1 to WL3 of a selected sub block and the word lines WL4 to WL6 of an unselected sub block float. Accordingly, voltages of the word lines WL1 to WL3 of a selected sub block and the word lines WL4 to WL6 of an unselected sub block are increased by coupling according to a voltage rise of the channel layer 114. For example, voltages of the word lines WL1 to WL3 of a selected sub block and the word lines WL4 to WL6 of an unselected sub block are increased to the ninth voltage V9.

The string selection lines SSL1 to SSL3 float. Accordingly, voltages of the string selection lines SSL1 to SSL3 are increased by coupling according to a voltage rise of the channel layer 114. For example, voltages of the string selection lines SSL1 to SSL3 are increased to the eighth voltage V8.

At the third timing t3, a third word line erase voltage Vwe3 is applied to the word lines WL1 to WL3 of a selected sub block. For example, the third word line erase voltage Vwe3 is a low voltage. For example, the third word line erase voltage Vwe3 is a ground voltage. At this point, a voltage of the channel layer 114 is a high voltage. Accordingly, F-N tunneling occurs in memory cells of the selected sub block. Due to the F-N tunneling, the memory cells MC1 to MC3 of a selected sub block are erased.

Voltages of the word lines WL4 to WL6 of an unselected sub block have a level of the ninth voltage V9. Exemplarily, the ninth voltage V9 is a voltage generated by coupling according to a voltage rise of the channel layer 114. For example, the ninth voltage V9 is a high voltage. Exemplarily, the ninth voltage V9 prevents F-N tunneling in the memory cells MC4 to MC6 of an unselected sub block. Accordingly, the memory cells MC4 to MC6 of an unselected sub block are erase-inhibited.

A voltage of the ground selection line GSL has a level of the tenth voltage V10. Accordingly, the ground selection transistor GST is erase-inhibited.

A voltage of the string selection line SSL has a level of the eighth voltage. Accordingly, the string selection transistor SST is erase-inhibited.

At the second to third timings t2 to t3, a voltage of the dummy word line DWL is maintained as a second dummy word line voltage Vdwl2. Exemplarily, a level of the second dummy word line voltage Vdwl2 is set to prevent F-N tunneling in a dummy memory cell DMC. Accordingly, the dummy memory cell DMC is erase-inhibited.

Exemplarily, the second dummy word line voltage Vdwl2 has a level between the third erase voltage Vers3 and the third word line erase voltage Vwe3. For example, the second dummy word line voltage Vdwl2 has a level between the ninth voltage V9 and the third word line erase voltage Vwe3.

Exemplarily, the dummy word line DWL may float during an erase operation. A voltage of the dummy word line DWL may be increased by coupling due to a voltage rise of the channel layer 114. Accordingly, if the dummy word line DWL floats, the dummy memory cells DMC is erase-inhibited.

In the above-mentioned embodiment, it is described that the word lines WL4 to WL6 of an unselected sub block. However, an erase inhibit voltage may be applied to the word lines WL4 to WL6 of an unselected sub block. A level of an erase inhibit voltage may be set to prevent F-N tunneling in the memory cells MC4 to MC6 in an unselected sub block.

If an equivalent circuit of the memory block BLKf corresponds to the equivalent circuit BLKb_2 described with reference to FIG. 32, an erase-verification of the memory block BLKf is performed in the same manner described with reference to FIGS. 36 to 38. Accordingly, description about an erase-verification of the memory block BLKf is omitted.

Figure 61:
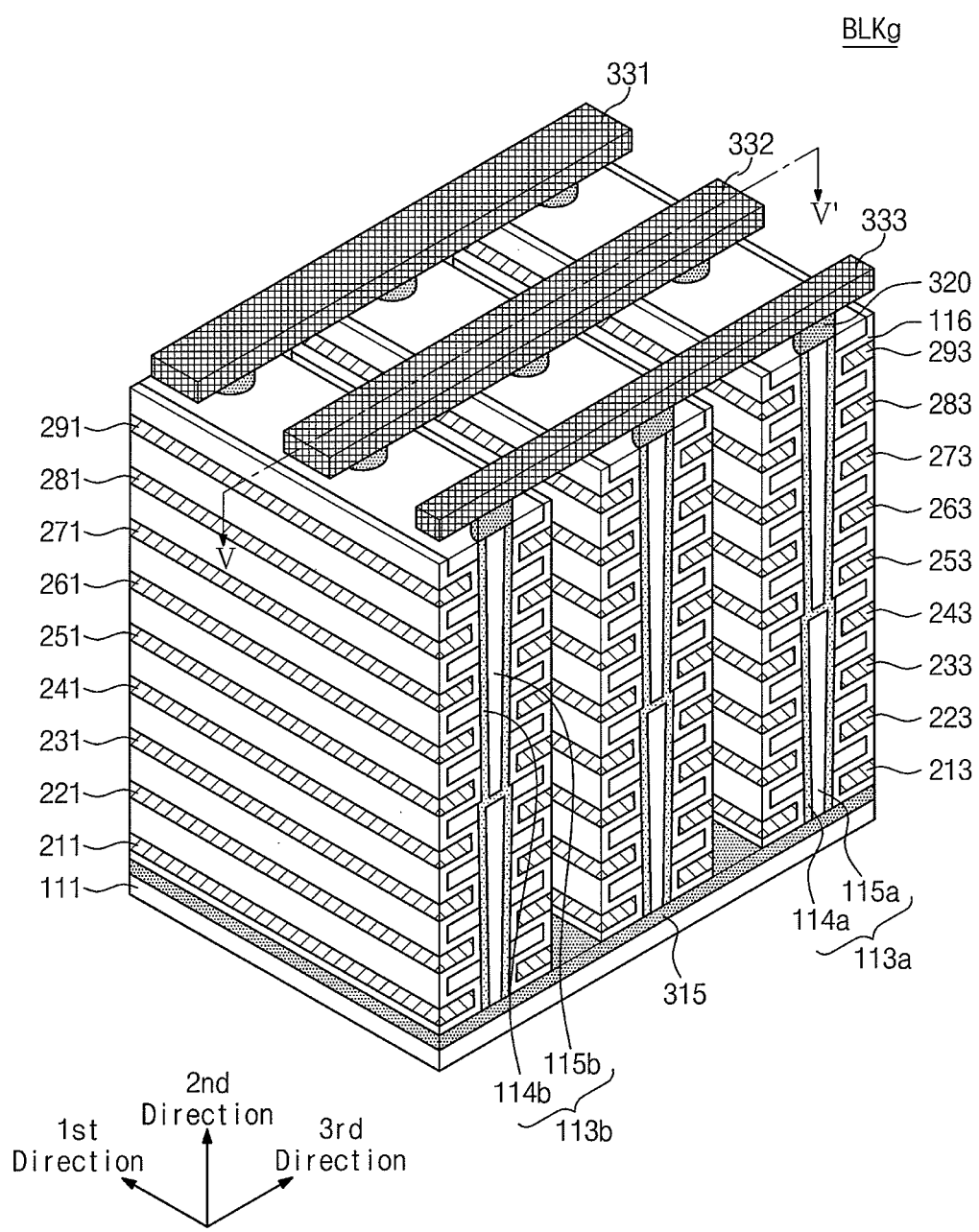
FIG. 61 is a perspective view illustrating one of the memory blocks in the nonvolatile memory device of FIG. 16 according to an embodiment of the inventive concept.
Figure 62:
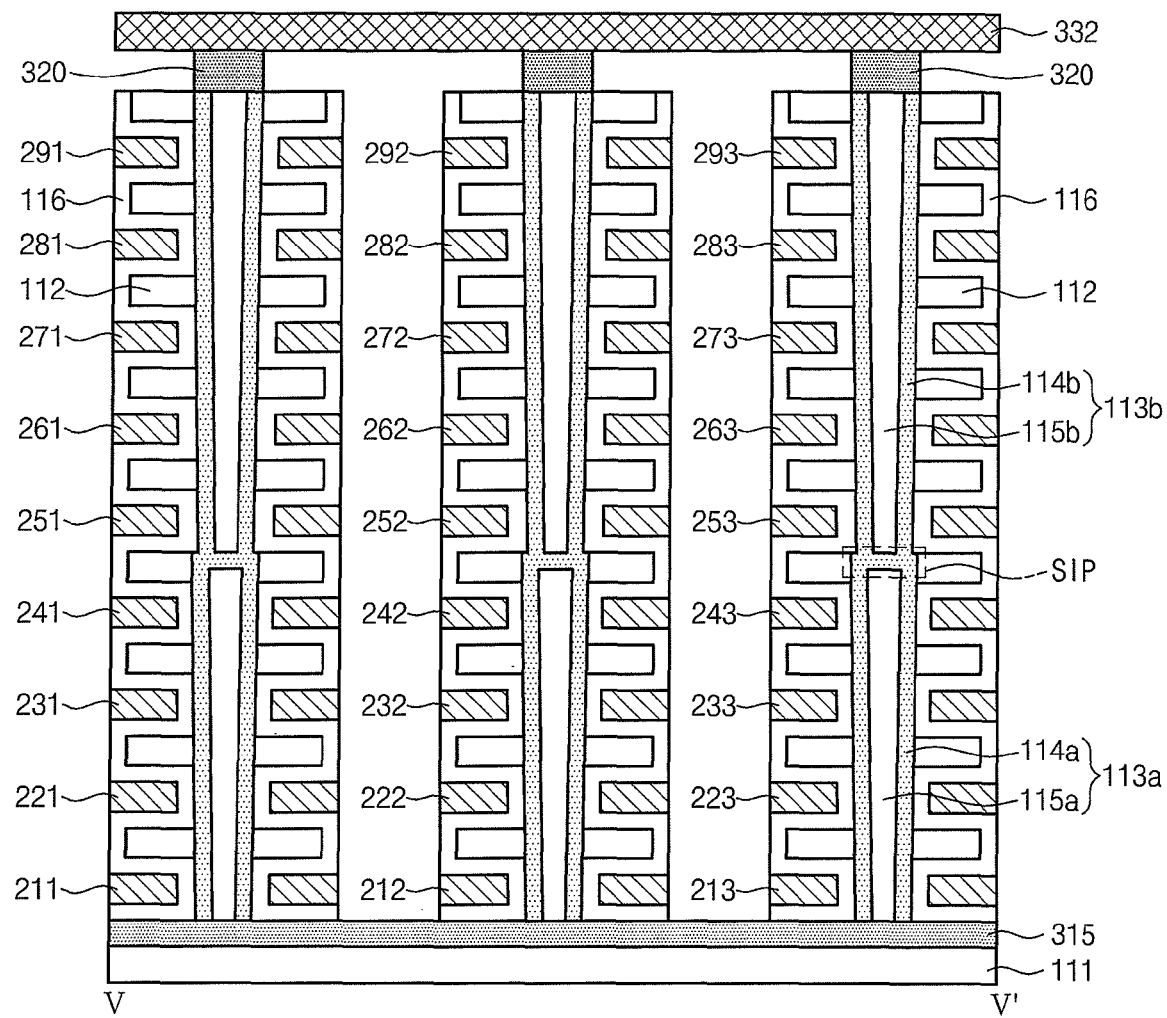
FIG. 62 is a sectional view taken along the line V-V' of FIG. 61 according to an embodiment of the inventive concept.

FIG. 61 is a perspective view of one of the memory blocks BLK1 to BLKz in the nonvolatile memory device 100c of FIG. 16 according to an embodiment of the inventive concept. FIG. 62 is a sectional view taken along the line V-V' of FIG. 61. Except that one pillar of a memory block BLKg includes a first sub pillar 113a and a second sub pillar 113b, the memory block BLKg may have the same structure as the memory block BLKf described with reference to FIGS. 53 and 54.

As described with reference to FIGS. 49 and 50, one pillar of the memory block BLKg includes a first sub pillar 113a and a second sub pillar 113b. The first sub pillar 113a and the second sub pillar 113b may have the same structure as the first sub pillar 113a and the second sub pillar 113b described with reference to FIGS. 49 and 50.

As described with reference to FIGS. 53 and 54, an n-type doping region 315 forming a common source line CSL is provided in a plate shape.

Exemplarily, an equivalent circuit of the memory block BLKg may correspond to one of the equivalent circuits BLKb_1, BLKb_2, and BLKb_3 described with reference to FIGS. 24, 32, and 39. Exemplarily, an equivalent circuit of the memory block BLKg may correspond to one of the equivalent circuits BLKb_4 to BLKb_10 described with reference to FIGS. 42 through 48.

Exemplarily, in the memory blocks BLKb to BLKg described with reference to FIGS. 18, 19, 49 through 54, 61, and 62, after the forming of the pillars 113 or 113a and 113b, the first conductive materials 211 to 291, 212 to 292, and 213 to 293 may be formed. That is, the first conductive materials 211 to 291, 212 to 292, and 213 to 293 may include an un-etchable metal material.

Figure 63:
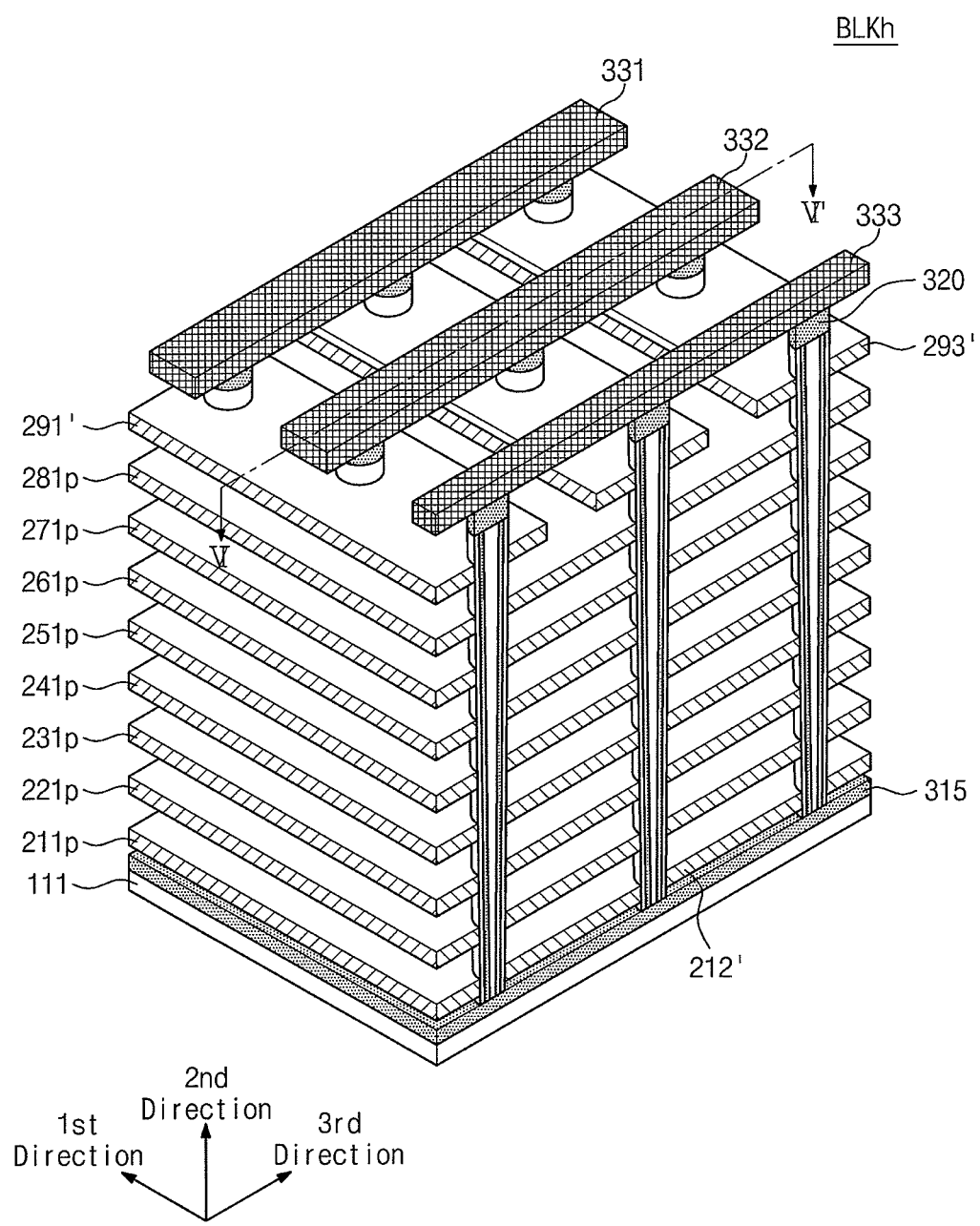
FIG. 63 is a perspective view illustrating one of the memory blocks in the nonvolatile memory device of FIG. 16 according to an embodiment of the inventive concept.
Figure 64:
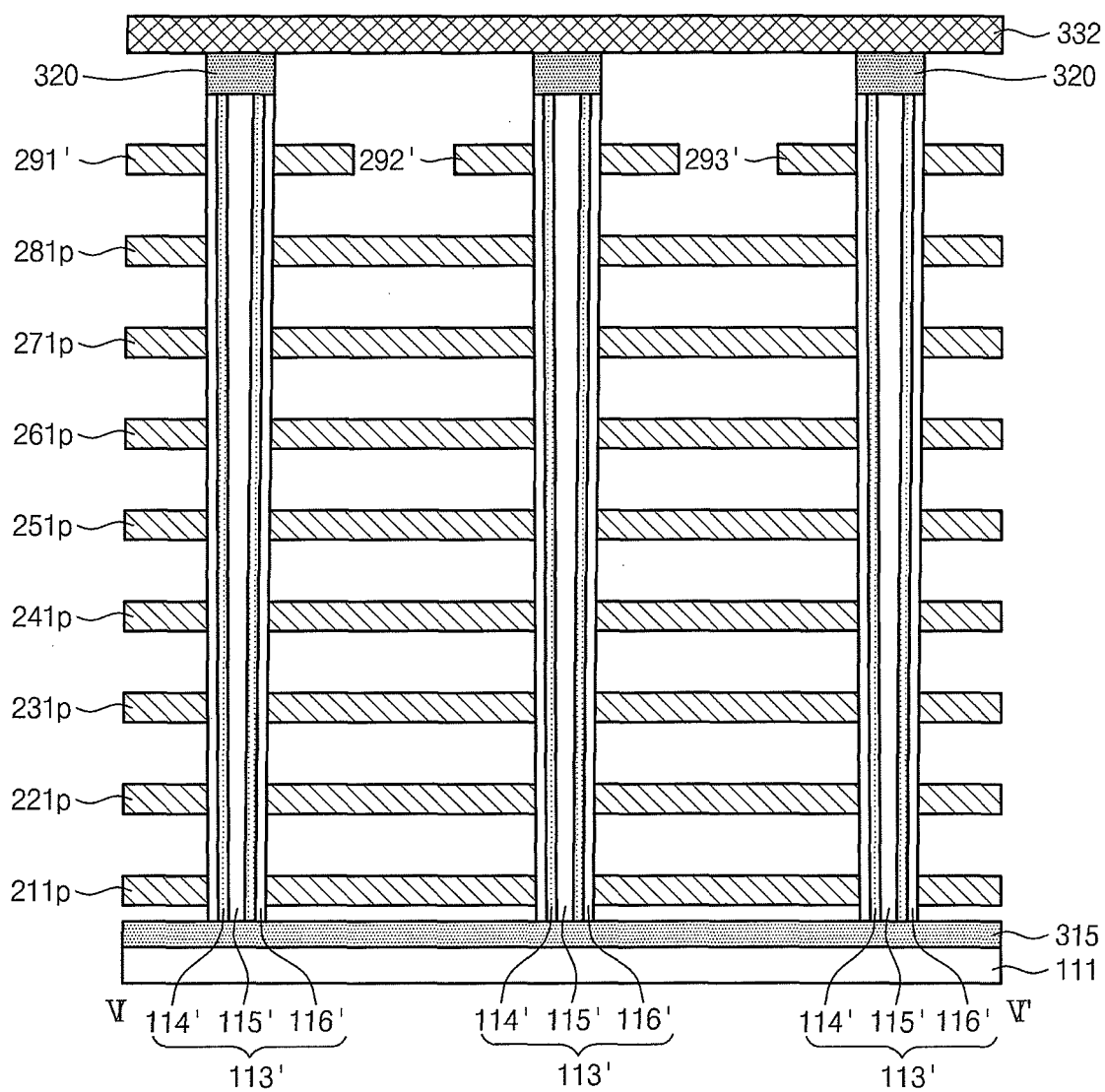
FIG. 64 is a sectional view taken along the line VI-VI' of FIG. 63 according to an embodiment of the inventive concept.

FIG. 63 is a perspective view of one of the memory blocks BLK1 to BLKz in the nonvolatile memory device 100c of FIG. 16 according to an embodiment of the inventive concept. FIG. 64 is a sectional view taken along the line VI-VI' of FIG. 63. Referring to FIGS. 63 and 64, an n-type doping region 315 forming a common source line CSL is provided in a plate form as described with reference to FIGS. 53 and 54.

Compared to the memory block BLKb described with reference to FIGS. 18 and 19, the first conductive materials 211p to 281p having the first to eighth heights are provided in a plate form. The first conductive materials 291' to 293' having the ninth height extend along the first direction and are spaced by a specific distance along the third direction.

The pillar 113' includes an insulation layer 116', a channel layer 114', and an internal material 115'.

The insulation layer 116' of each pillar 113' is configured to store data like the insulation layer 116 described with reference to FIGS. 20 through 23. For example, the insulation layer 116' may include a tunneling insulation layer, a charge storage layer, and a blocking insulation layer. A channel layer 114' of the pillar 113' includes a p-type silicon. The channel layer 114' of the pillar 113' operates as a body of the second direction. The internal material 115' of the pillar 113' includes an insulation material.

Exemplarily, an equivalent circuit of the memory block BLKh may correspond to one of the equivalent circuits BLKb_1, BLKb_2, and BLKb_3 described with reference to FIGS. 24 and 32. Exemplarily, an equivalent circuit of the memory block BLKh may correspond to one of the equivalent circuits BLKb_4 to BLKb_10 described with reference to FIGS. 42 through 48.

Exemplarily, it is described that an internal material 115' is provided in a channel layer 114' of a pillar 116'. However, the internal material 115' may not be provided in the internal material 115'. At this point, a space provided in the internal material 115' may be filled by the channel layer 114'.

Figure 65:
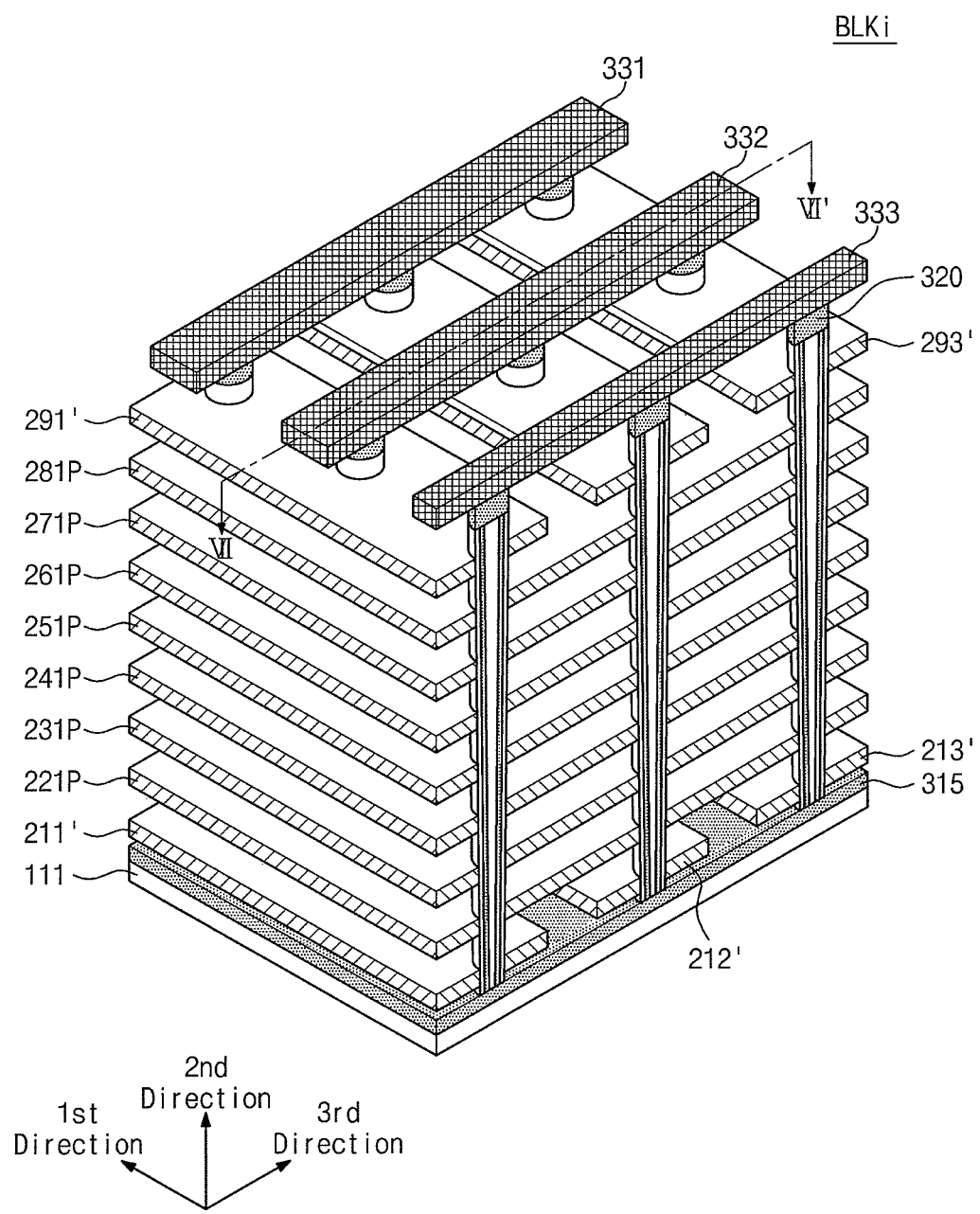
FIG. 65 is a perspective view illustrating one of the memory blocks in the nonvolatile memory device of FIG. 16 according to an embodiment of the inventive concept.
Figure 66:
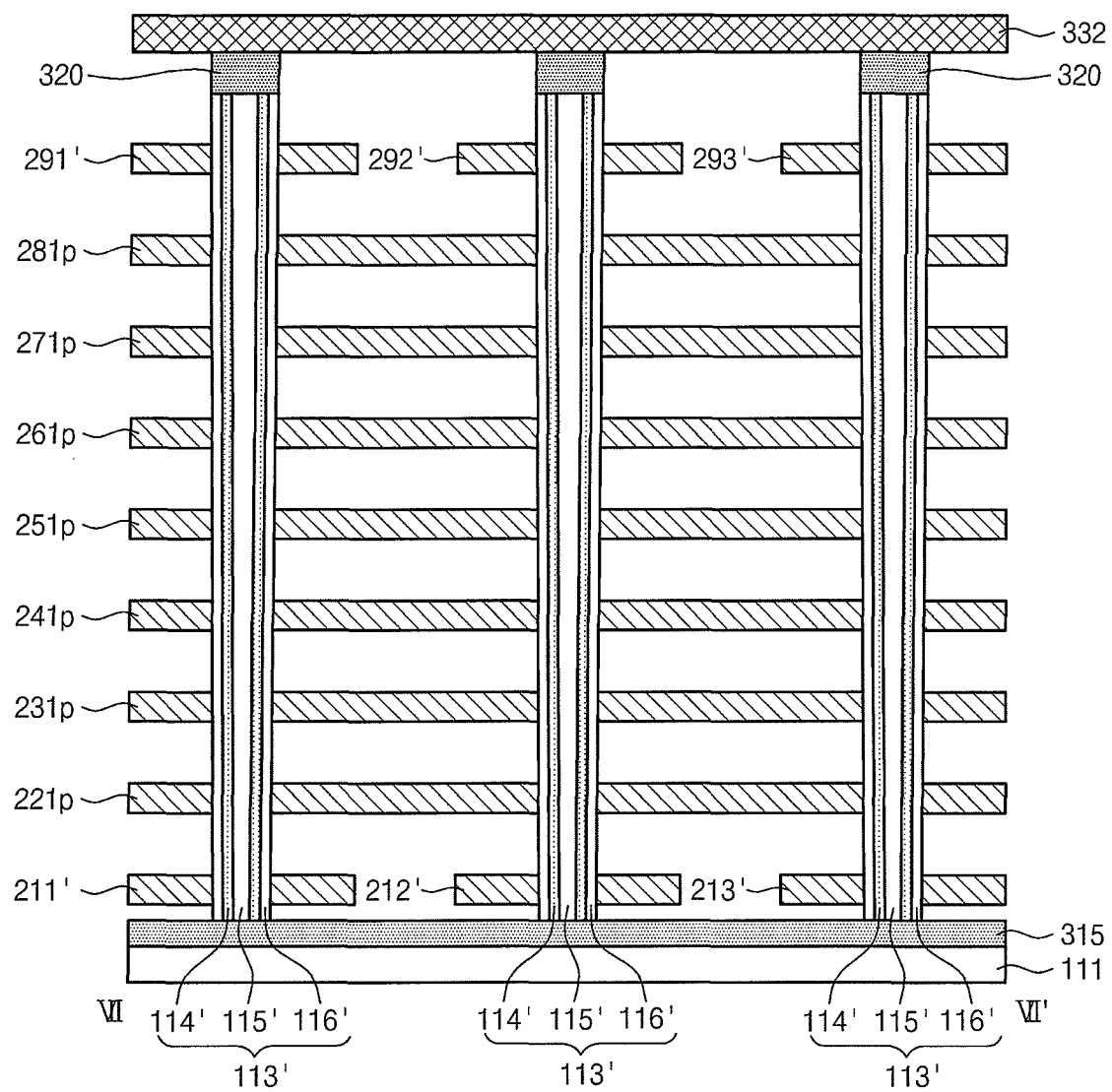
FIG. 66 is a sectional view taken along the line VII-VII' of FIG. 65.

FIG. 65 is a perspective view of one of the memory blocks BLK1 to BLKz in the nonvolatile memory device 100c of FIG. 16 according to an embodiment of the inventive concept. FIG. 66 is a sectional view taken along the line VII-VII' of FIG. 65. Compared to the memory block BLKh described with reference to FIGS. 63 and 64, first conductive materials 211' to 213' having the first height of the memory block BLKi are spaced by a specific distance along the third direction. Exemplarily, an equivalent circuit of the memory block BLKi corresponds to the equivalent circuit BLKb_3 described with reference to FIG. 39.

Figure 67:
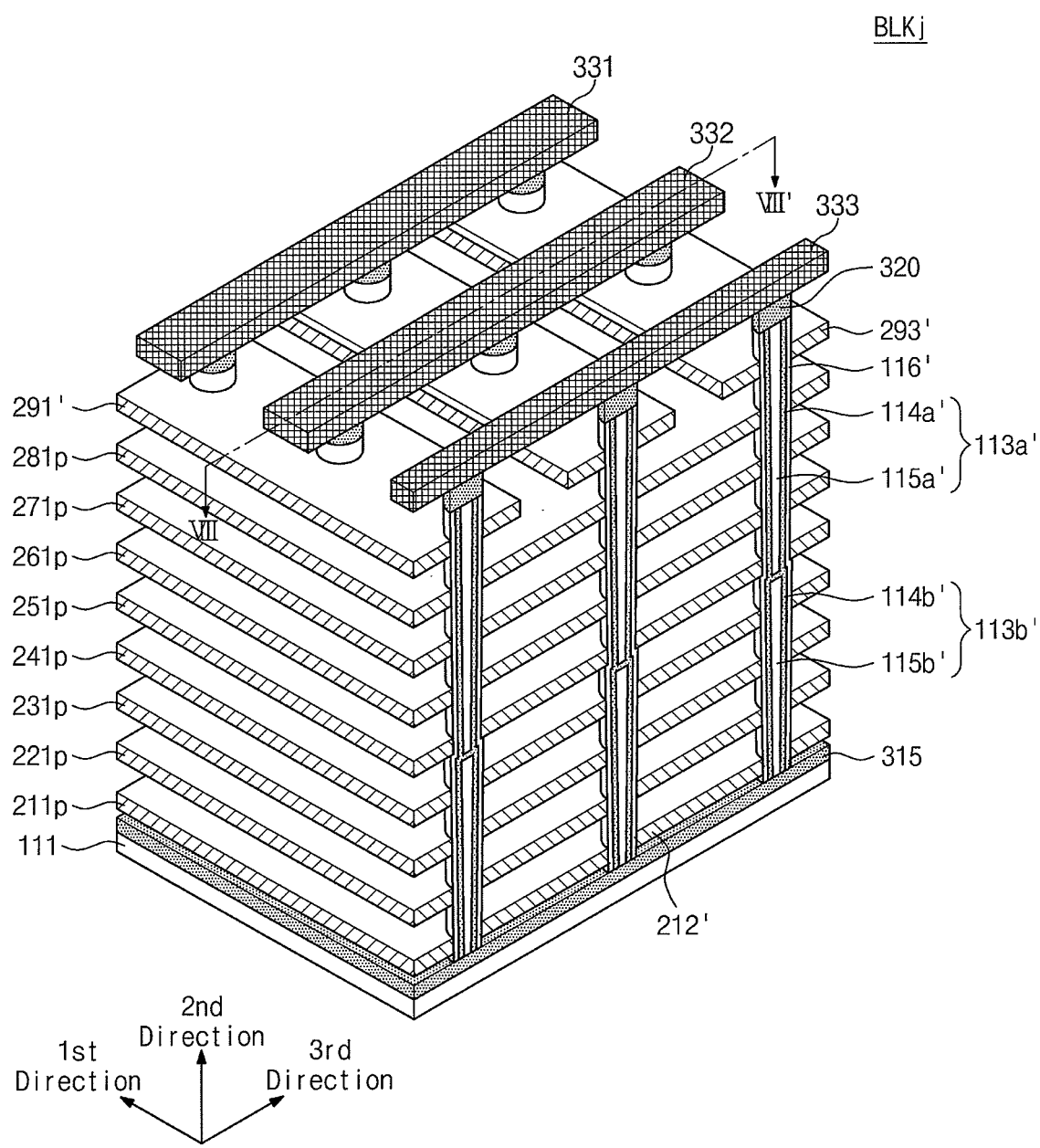
FIG. 67 is a perspective view illustrating one of the memory blocks in the nonvolatile memory device of FIG. 16 according to an embodiment of the inventive concept.
Figure 68:
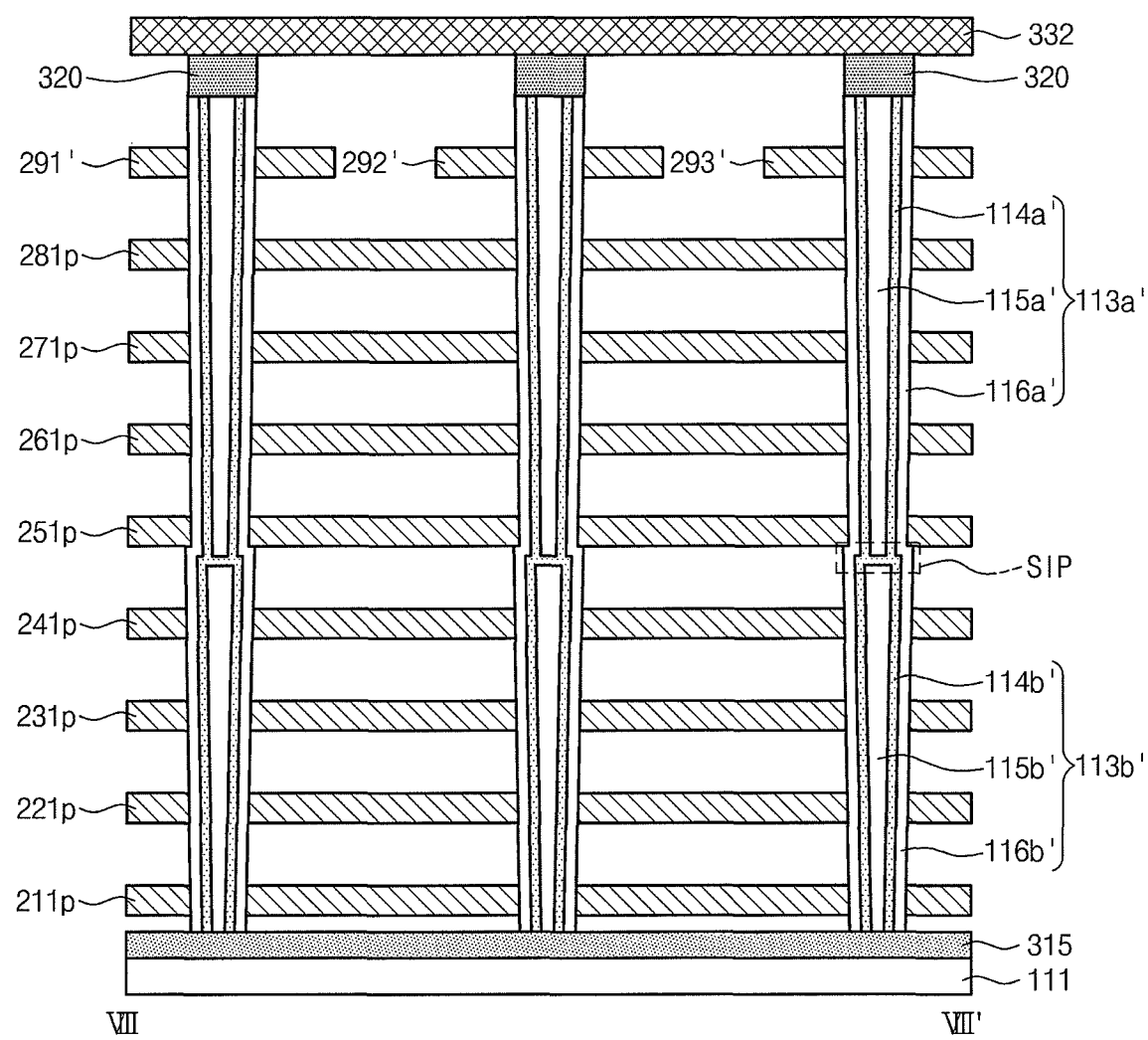
FIG. 68 is a sectional view taken along the line VIII-VIII' of FIG. 67.

FIG. 67 is a perspective view of one of the memory blocks BLK1 to BLKz in the nonvolatile memory device 100c of FIG. 16 according to an embodiment of the inventive concept. FIG. 68 is a sectional view taken along the line VIII-VIII' of FIG. 67. Except that one pillar of a memory block BLKj includes a first sub pillar 113a and a second sub pillar 113b, the memory block BLKj may have the same structure as the memory block BLKh described with reference to FIGS. 63 and 64.

One pillar of the memory block BLKj includes a first sub pillar 113a', and a second sub pillar 113b'. The first sub pillar 113a' includes an insulation layer 116a', a channel layer 114a', and an internal material 115a'. The second sub pillar 113b' includes an insulation layer 116b', a channel layer 114b', and an internal material 115b'.

Exemplarily, the channel layer 114a' of the first sub pillar 113a' is connected to the channel layer 114b' of the second sub pillar 113b'. For example, as shown in FIGS. 50 and 51, the channel layer 114a' of the first sub pillar 113a' and the channel layer 114b' of the second sub pillar 113b' are connected through a silicon pad SIP having a p-type.

Exemplarily, the first conductive material having a height corresponding to the silicon pad SIP (i.e., the fifth height) may form a dummy word line DWL and dummy memory cells DMC.

Exemplarily, an equivalent circuit of the memory block BLKj may correspond to one of the equivalent circuits BLKb_1, BLKb_2, and BLKb_3 described with reference to FIGS. 24 and 32. Exemplarily, an equivalent circuit of the memory block BLKj may correspond to one of the equivalent circuits BLKb_4 to BLKb_10 described with reference to FIGS. 42 through 48.

In an embodiment, the internal materials 115a' and 115b' are provided in channel layers 114a' and 114b' of the first sub pillar 113a' and the second sub pillar 113b', respectively. However, the internal materials 115a' and 115b' may not be provided in the first sub pillar 113a' and the second sub pillar 113b'. At this point, spaces provided in the internal materials 115a' and 115b' may be filled by the channel layers 114a' and 114b'.

Figure 69:
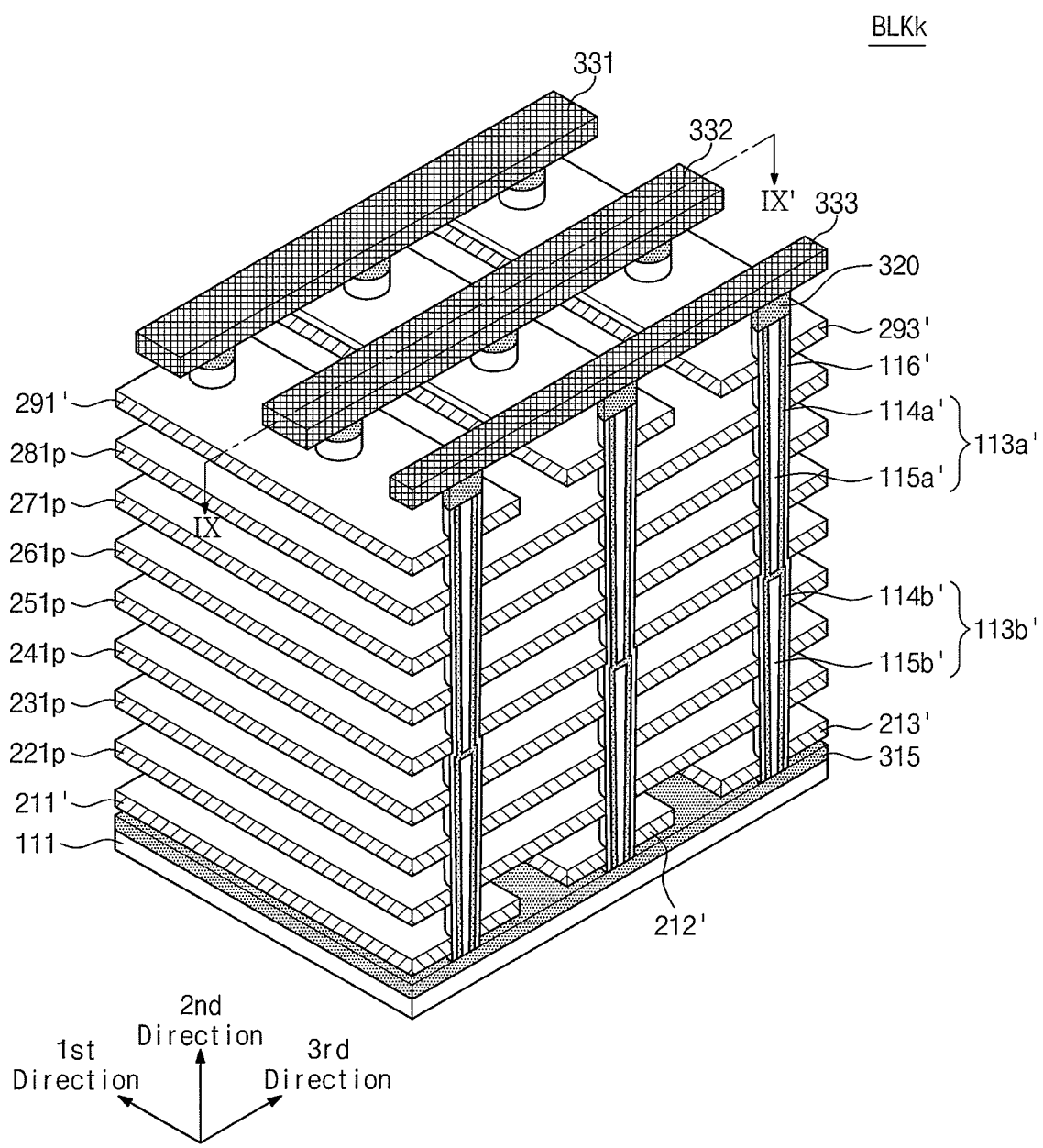
FIG. 69 is a perspective view illustrating one of the memory blocks in the nonvolatile memory device of FIG. 16 according to an embodiment of the inventive concept.
Figure 70:
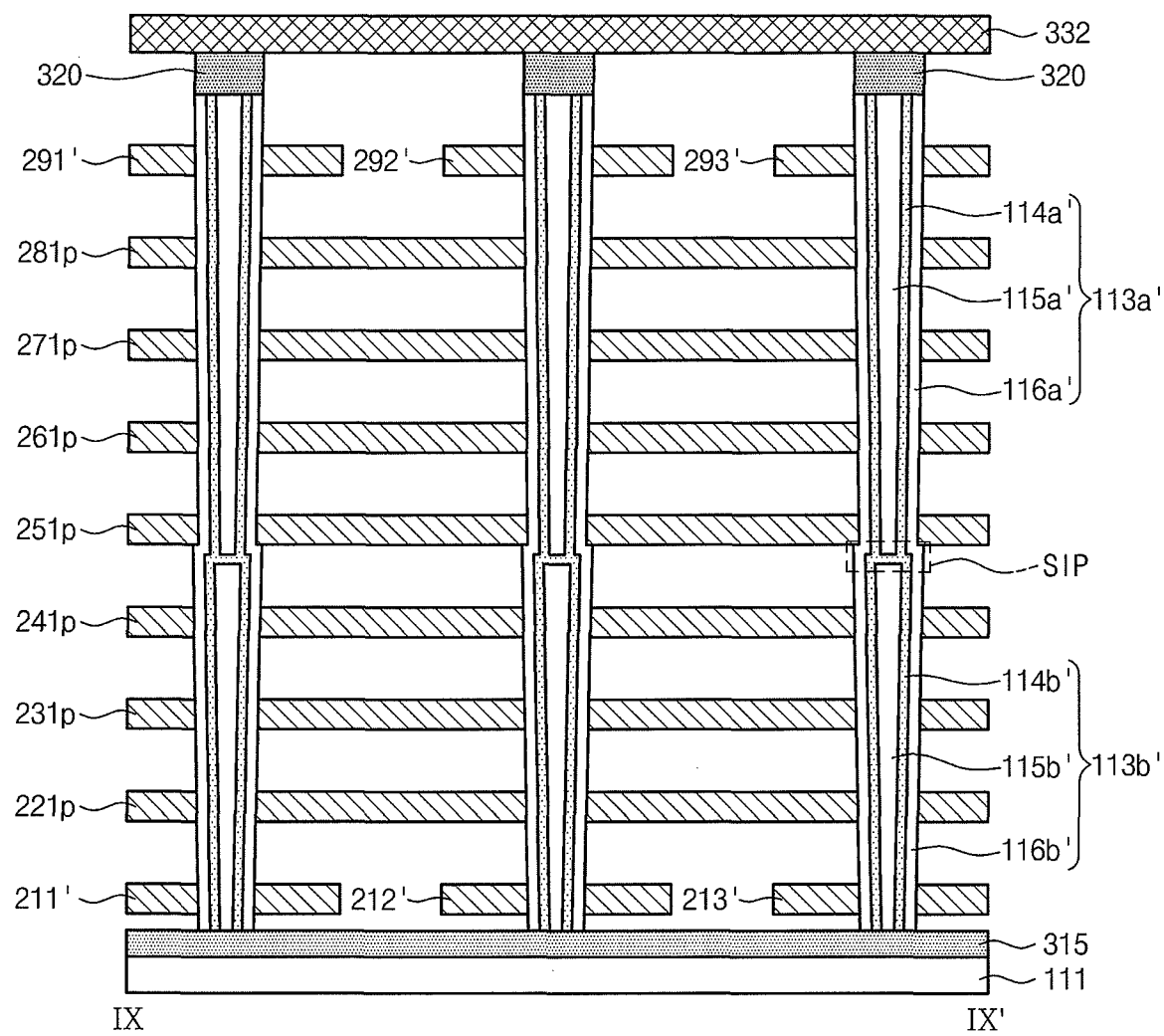
FIG. 70 is a sectional view taken along the line IX-IX' of FIG. 69.

FIG. 69 is a perspective view of one of the memory blocks BLK1 to BLKz in the nonvolatile memory device 100c of FIG. 16 according to an embodiment of the inventive concept. FIG. 70 is a sectional view taken along the line IX-IX' of FIG. 69. Compared to the memory block BLKj described with reference to FIGS. 67 and 68, first conductive materials 211' to 213' having the first height of the memory block BLKk are spaced by a specific distance along the third direction. Exemplarily, an equivalent circuit of the memory block BLKk corresponds to the equivalent circuit BLKb_3 described with reference to FIG. 39.

Figure 71:
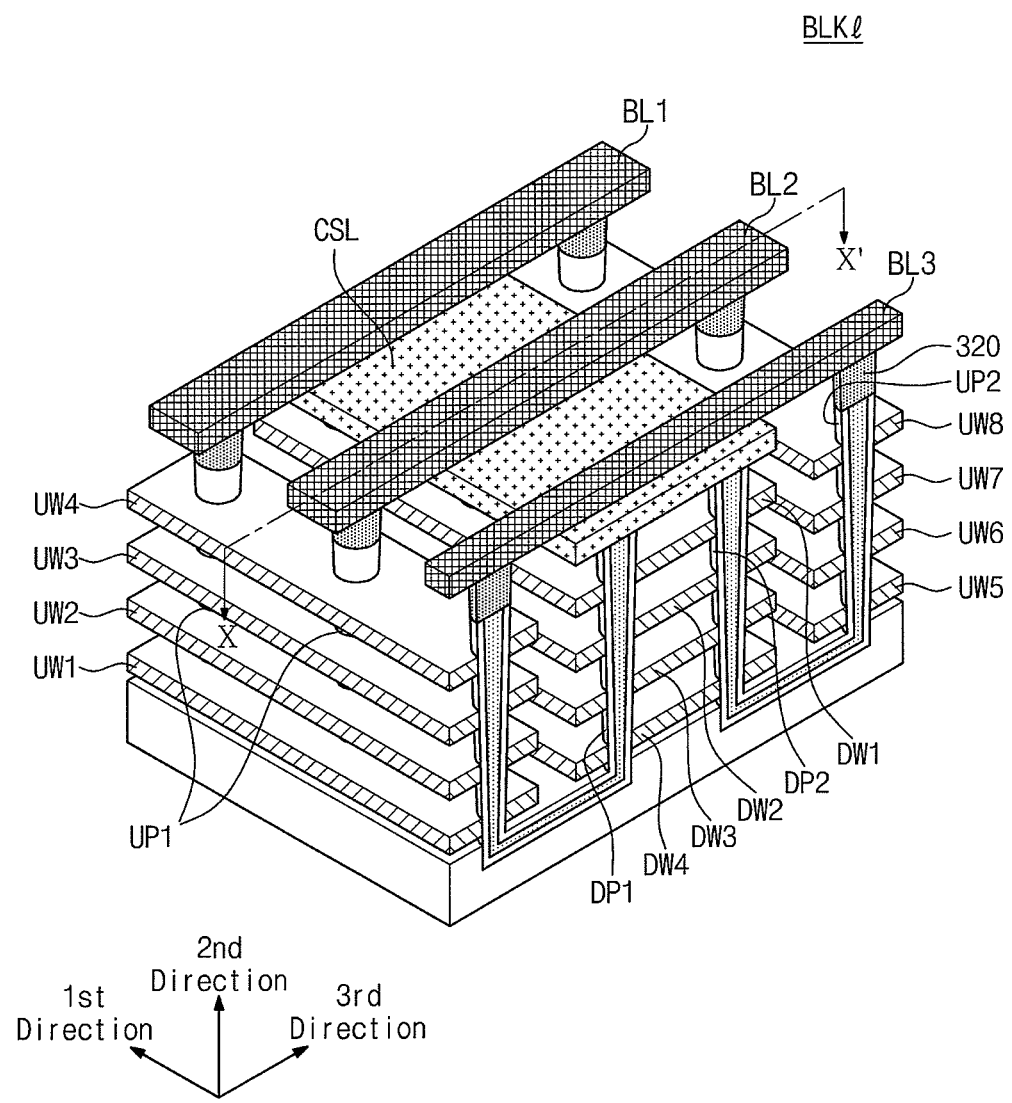
FIG. 71 is a perspective view illustrating one of the memory blocks in the nonvolatile memory device of FIG. 16 according to an embodiment of the inventive concept.
Figure 72:
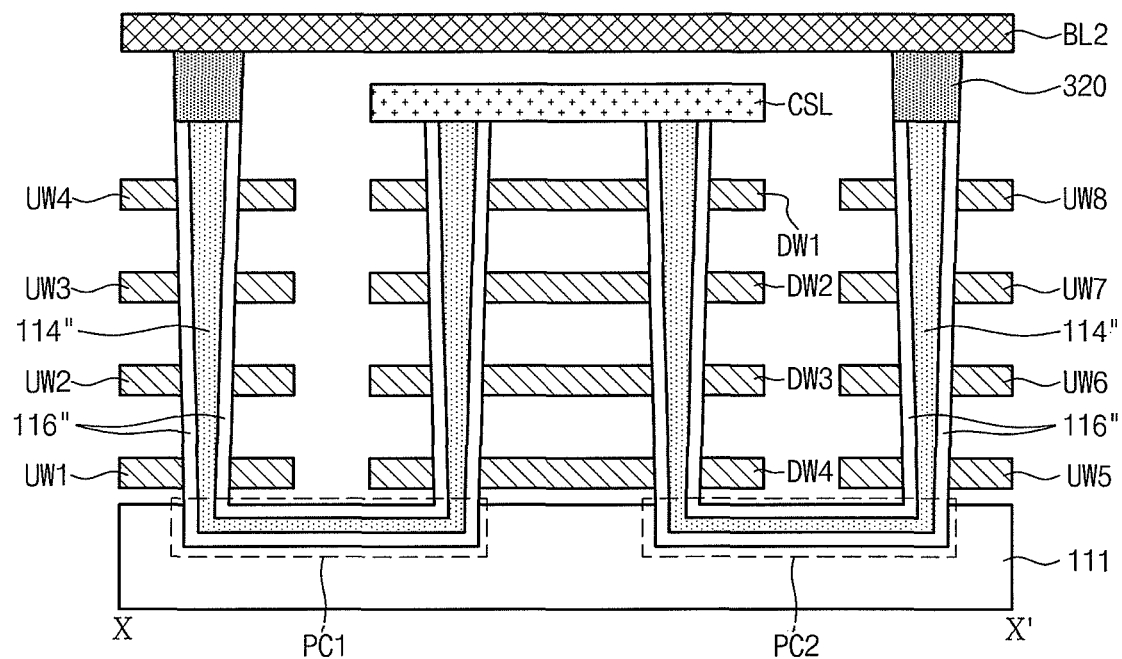
FIG. 72 is a sectional view taken along the line X-X' of FIG. 71.

FIG. 71 is a perspective view of one of the memory blocks BLK1 to BLKz in the nonvolatile memory device 100c of FIG. 16 according to an embodiment of the inventive concept. FIG. 72 is a sectional view taken along the line X-X' of FIG. 71. Referring to FIGS. 71 and 72, first to fourth upper word lines UW1 to UW4 extending along the first direction are provided on the substrate 111. First to fourth upper word lines UW1 to UW4 are spaced along the second direction by a specific distance. First upper pillars UP1 spaced along the first direction by a specific distance and penetrating the first to fourth upper word lines UW1 to UW4 along the second direction are provided.

On the substrate 111, first to fourth lower word lines DW1 to DW4 extending along the first direction are provided. The first to fourth lower word lines DW1 to DW4 are spaced along the second direction by a specific distance. The first to fourth lower word lines DW1 to DW4 are spaced along the third direction by a specific distance apart from the first to fourth upper word lines UW1 to UW4.

First lower pillars DP1 spaced along the first direction by a specific distance and penetrating the first to fourth lower word lines DW1 to DW4 along the second direction are provided. Moreover, second lower pillars DP2 spaced along the first direction by a specific distance and penetrating the first to fourth lower word lines DW1 to DW4 along the second direction are provided. Exemplarily, the first lower pillars DP1 and the second lower pillars DP2 are disposed in parallel along the second direction. The first lower pillars DP1 and the second lower pillars DP2 are spaced along the third direction by a specific distance.

On the substrate 111, fifth to eighth upper word lines UW5 to UW8 extending along the first direction are provided. The fifth to eighth upper word lines UW5 to UW8 are spaced along the second direction by a specific distance. The fifth to eighth upper word lines UW5 to UW8 are spaced along the third direction by a specific distance apart from the first to fourth lower word lines DW1 to DW4. Second upper pillars UP2 spaced along the first direction by a specific distance and penetrating the fifth to eighth upper word lines UW5 to UW8 along the second direction are provided.

A common source line CSL extending along the first direction is provided on the first and second lower pillars DP1 and DP2. Exemplarily, the common source line CSL may include an n-type silicon material. Exemplarily, if the common source line CSL includes a conductive material having no conductive type such as an n-type or a p-type, n-type sources may be additionally provided between the common source line CSL and the first and second lower pillars DP1 and DP2. For example, a region adjacent to the common source line CSL among regions of the first and second lower pillars DP1 and DP2 is doped with an n-type and thus may operate as a source. Exemplarily, the common source line CSL and the first and second lower pillars DP1 and DP2 may be connected through the contact plugs. At this point, the contact plugs may be doped with an n-type and thus may operate as a source.

Drains 320 are provided on the tops of the first and second pillars UP1 and UP2, respectively. Exemplarily, the drains 320 include an n-type silicon material. A plurality of bit lines BL1 to BL3 extending along the third direction may be provided on the tops of the drains 320. For example, the bit lines BL1 to BL3 are spaced along the first direction by a specific distance. The upper pillars UP1 and UP2 provided along the third direction are connected to the same bit line. Exemplarily, the bit lines BL1 to BL3 comprises metal. Exemplarily, the bit lines BL1 to BL3 and the drains 320 may be connected through contact plugs (not shown).

Each of the first and second upper pillars UP1 and UP2 includes an insulation layer 116" and a channel layer 114". Each of the first and second lower pillars DP1 and DP2 includes an insulation layer 116" and a channel layer 114". As mentioned described with reference to FIGS. 63 and 64, the insulation layer 116" of the first and second upper pillars UP1 and UP2 and the first and second lower pillars DP1 and DP2 may include a blocking insulation layer, a charge storage layer, and a tunneling insulation layer.

Exemplarily, the tunneling insulation layer includes a thermal oxide layer. The charge storage layer includes a nitride layer or a metal oxide layer (e.g., an aluminum oxide layer, a hafnium oxide layer, and so on). The blocking insulation layer may be formed of a single layer or a multi layer. The blocking insulation layer may be a high dielectric layer (e.g., an aluminum oxide layer, a hafnium oxide layer, and so on) having a higher dielectric constant than a tunneling insulation layer and a charge storage layer. Exemplarily, the tunneling insulation layer, the charge storage layer, and the blocking insulation layer may constitute an oxide-nitride-oxide (ONO).

The channel layers 114" of the first and second upper pillars UP1 and UP2 and the first and second lower pillars DP1 and DP2 may include a p-type silicon material. The channel layer 114" of the first and second upper pillars UP1 and UP2 and the first and second lower pillars DP1 and DP2 operates as a body of the second direction.

The first upper pillars UP1 and the first lower pillars DP1 are connected through the first pipeline contacts PC1. Exemplarily, insulation layers 116" of the first upper pillars UP1 and first lower pillars DP1 are connected through insulation layers of the first pipeline contacts PC1. The insulation layers of the first pipeline contacts PC1 may be formed of the same materials as the insulation layers 116" of the first upper pillars UP1 and the first lower pillars DP1.

The channel layers 114" of the first upper pillars UP1 and the first lower pillars DP1 are connected through the channel layers of the first pipeline contacts PC1. The channel layers of the first pipeline contacts PC1 may be formed of the same materials as the channel layers 114" of the first upper pillars UP1 and the first lower pillars DP1.

That is, the first upper pillars UP1 and the first to fourth upper word lines UW1 to UW4 form first upper strings, and first lower pillars DP1 and first to fourth lower word lines DW1 to DW4 form first lower strings. The first upper strings and the first lower strings are connected through first pipeline contacts PC1, respectively. Drains 320 and bit lines BL1 to BL3 are connected to one end of the first upper strings. A common source line CSL is connected to one end of the first lower strings. That is, the first upper strings and the first lower strings form a plurality of NAND strings NS connected between the bit lines BL1 to BL3 and the common source line CSL.

Likewise, the second upper pillars UP2 and the fifth to eighth upper word lines UW5 to UW8 form second upper strings, and second lower pillars DP2 and first to fourth lower word lines DW1 to DW4 form second lower strings. The second upper strings and the second lower strings are connected through second pipeline contacts PC2, respectively. Drains 320 and bit lines BL1 to BL3 are connected to one end of the second upper strings. A common source line CSL is connected to one end of the second lower strings. That is, the second upper strings and the second lower strings form a plurality of NAND strings NS connected between the bit lines BL1 to BL3 and the common source line CSL.

Exemplarily, to form channels in the channel layers 114" of the first and second pipeline contacts PC1 and PC2, first and second pipeline contact gates (not shown) may be provided. Exemplarily, the first and second pipeline contact gates (not shown) may be provided on the surfaces of the first and second pipeline contacts PC1 and PC2. For example, the first and second pipeline contact gates (not shown) may correspond to dummy memory cells DMC.

Exemplarily, except that eight transistors are provided in one string and two strings are connected to each of the first to third bit lines BL1 to BL3, an equivalent circuit of the memory block may correspond to one of the equivalent circuit BLKb_1, BLKb_2, and BLKb_4 to BLKb_10 described with reference to FIGS. 24, 32, and 42 through 48.

Figure 73:
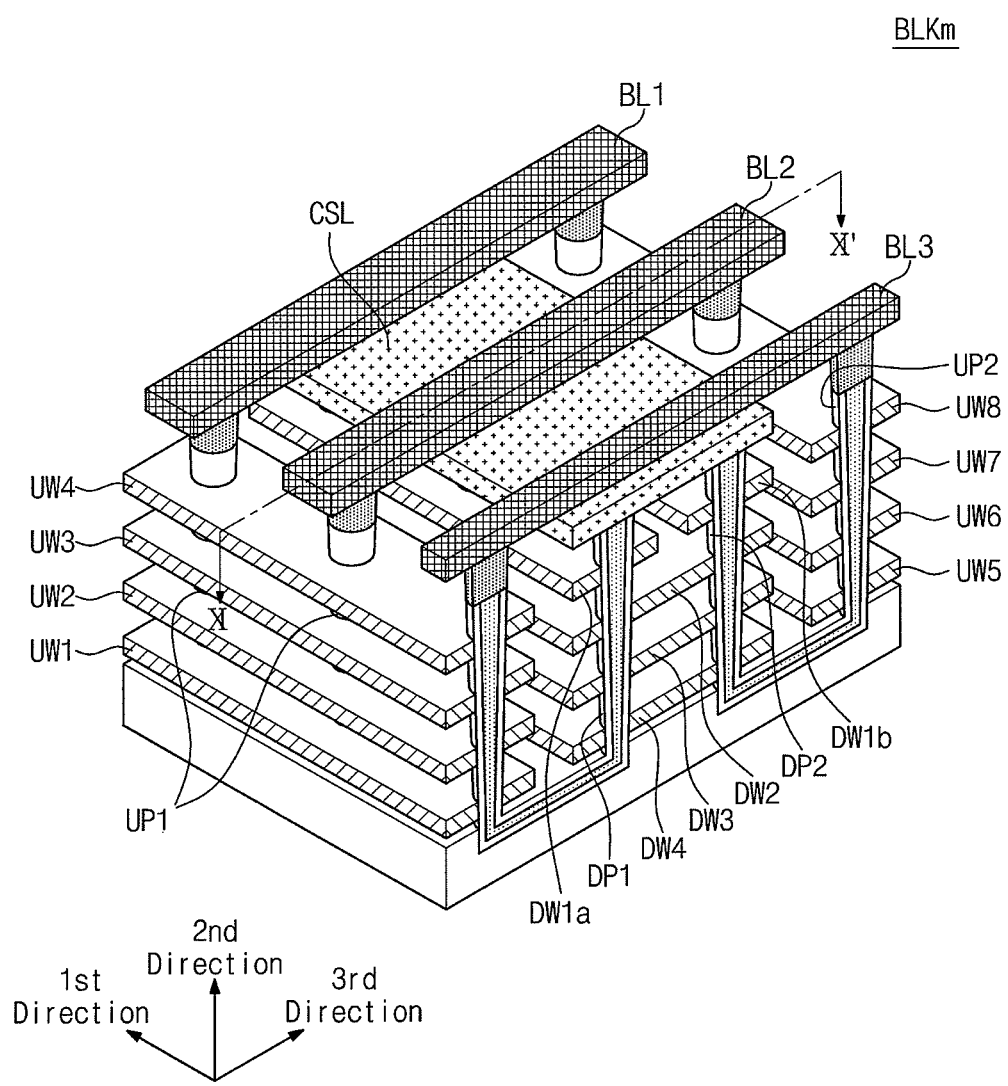
FIG. 73 is a perspective view illustrating one of the memory blocks in the nonvolatile memory device of FIG. 16 according to an embodiment of the inventive concept.
Figure 74:
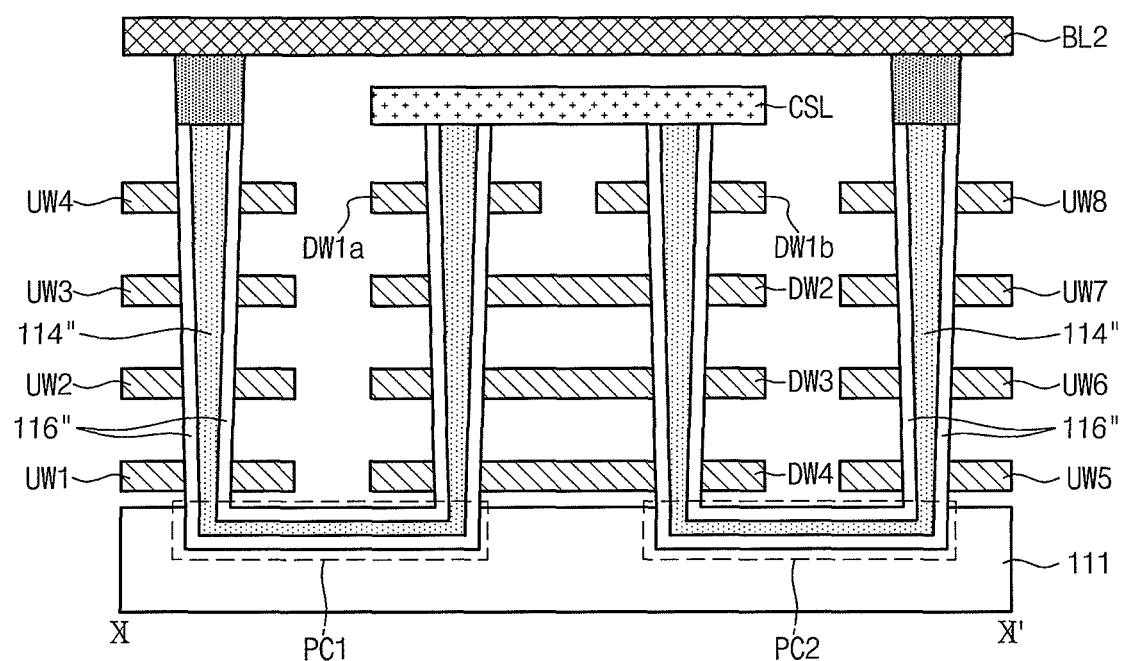
FIG. 74 is a sectional view taken along the line X-X' of FIG. 73.

FIG. 73 is a perspective view of one of the memory blocks BLK1 to BLKz in the nonvolatile memory device 100c of FIG. 16 according to an embodiment of the inventive concept. FIG. 74 is a sectional view taken along the line X-X' of FIG. 73. Compared to the memory block BLK1 described with reference to FIGS. 71 and 72, a first lower word line is divided into a first portion DW1a and a second portion DW1b in the memory block BLKm. The first portion DW1a and the second portion DW1b are spaced along the third direction by a specific distance.

The first lower pillars DP1 constituting NAND strings NS in company with the first upper pillars UP1 penetrate the first portion DW1a of the first lower word line. The second lower pillars DP2 constituting NAND strings NS in company with the second upper pillars UP2 penetrate the second portion DW1b of the first lower word line.

Exemplarily, except that eight transistors are provided to one string and two strings are connected to each of the first to third bit lines BL1 to BL3, an equivalent circuit of the memory block BLKm may correspond to the equivalent circuit BLKb_3 described with reference to FIG. 39.

Exemplarily, in the memory blocks BLKg to BLK1 described with reference to FIGS. 63 through 74, the pillars 113', or 113a' and 113b' are formed after the first conductive materials 211p to 281p and 291' to 293', or 211' to 213' and 211p to 281 and 291' to 293' are formed. That is, the first conductive materials 211p to 281p and 291' to 293', or 211' to 213' and 211p to 281 and 291' to 293'.

Figure 75:
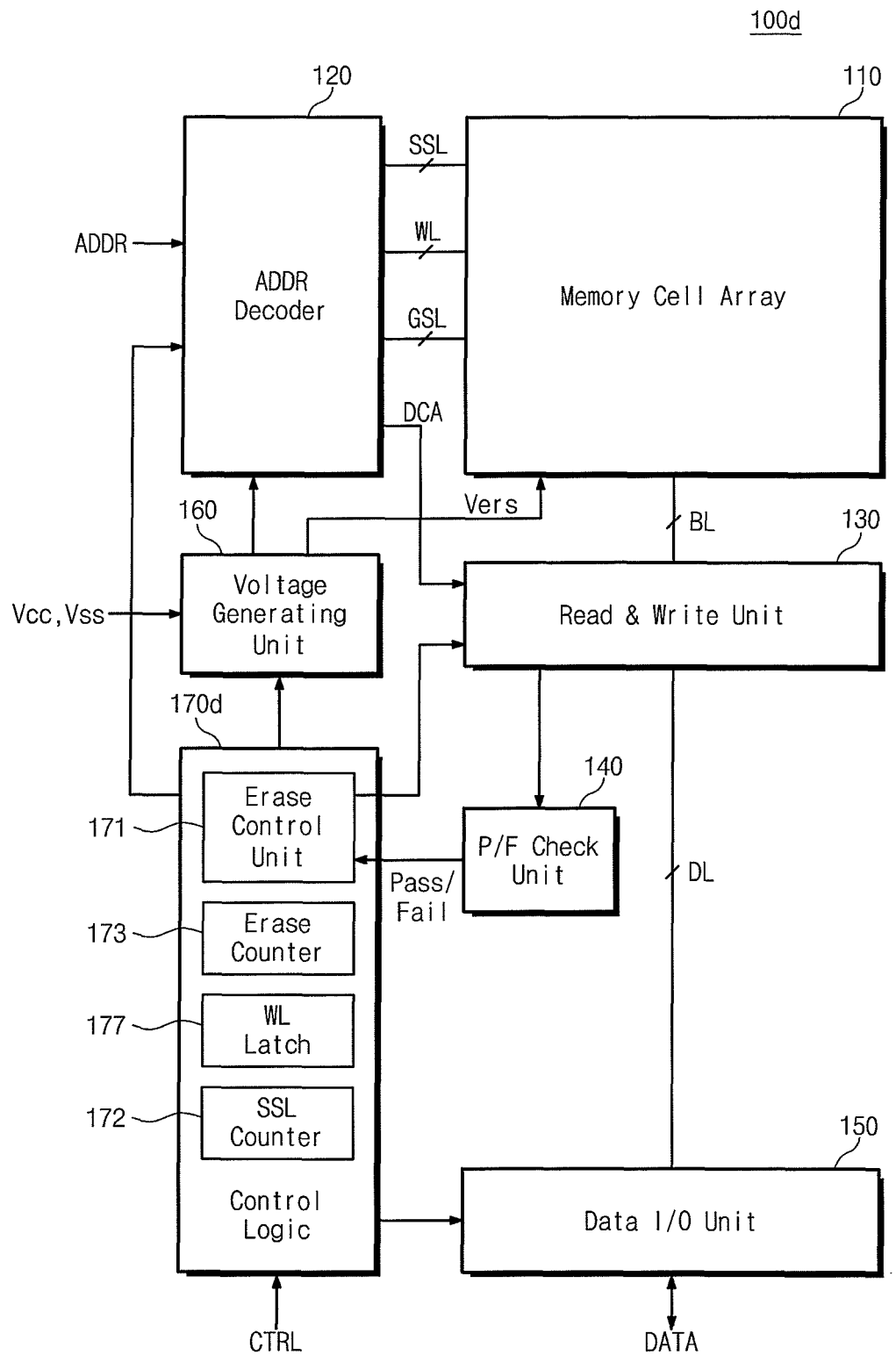
FIG. 75 is a block diagram illustrating a nonvolatile memory device according to an embodiment of the inventive concept.

FIG. 75 is a block diagram illustrating a nonvolatile memory device 100d according to an embodiment of the inventive concept. Referring to FIG. 75, the nonvolatile memory device 100d includes a memory cell array 110b, an address decoder 120, a read & write unit 130, a pass/fail check unit 140, a data I/O unit 150, a voltage generating unit 160, and a control logic 170d. Except for the control logic 170d, the nonvolatile memory device 100d has the same structure of the nonvolatile memory device 100c described with reference to FIG. 16. Accordingly, overlapping descriptions will be omitted.

Compared to the nonvolatile memory device 100c described with reference to FIG. 16, a word line address latch 177 instead of the word line counter 175 is provided in the control logic 170d. As described with reference to FIG. 12, the word line address latch 177 is configured to store addresses of word lines in a selected memory block BLK.

The nonvolatile memory device 100d operates as described with reference to FIG. 17. For example, after a selected memory block of the nonvolatile memory device 100d is erased, it is erase-verified by a unit of respective word line. If erase-fail occurs, the selected memory block is erased and an erase-verification resumes from an erase-failed word line. An erase and erase-verification may be performed by a row of the NAND strings NS. For example, after a specific row of the NAND strings NS is ease-passed, an erase-verification is performed on another TOW.

Figure 76:
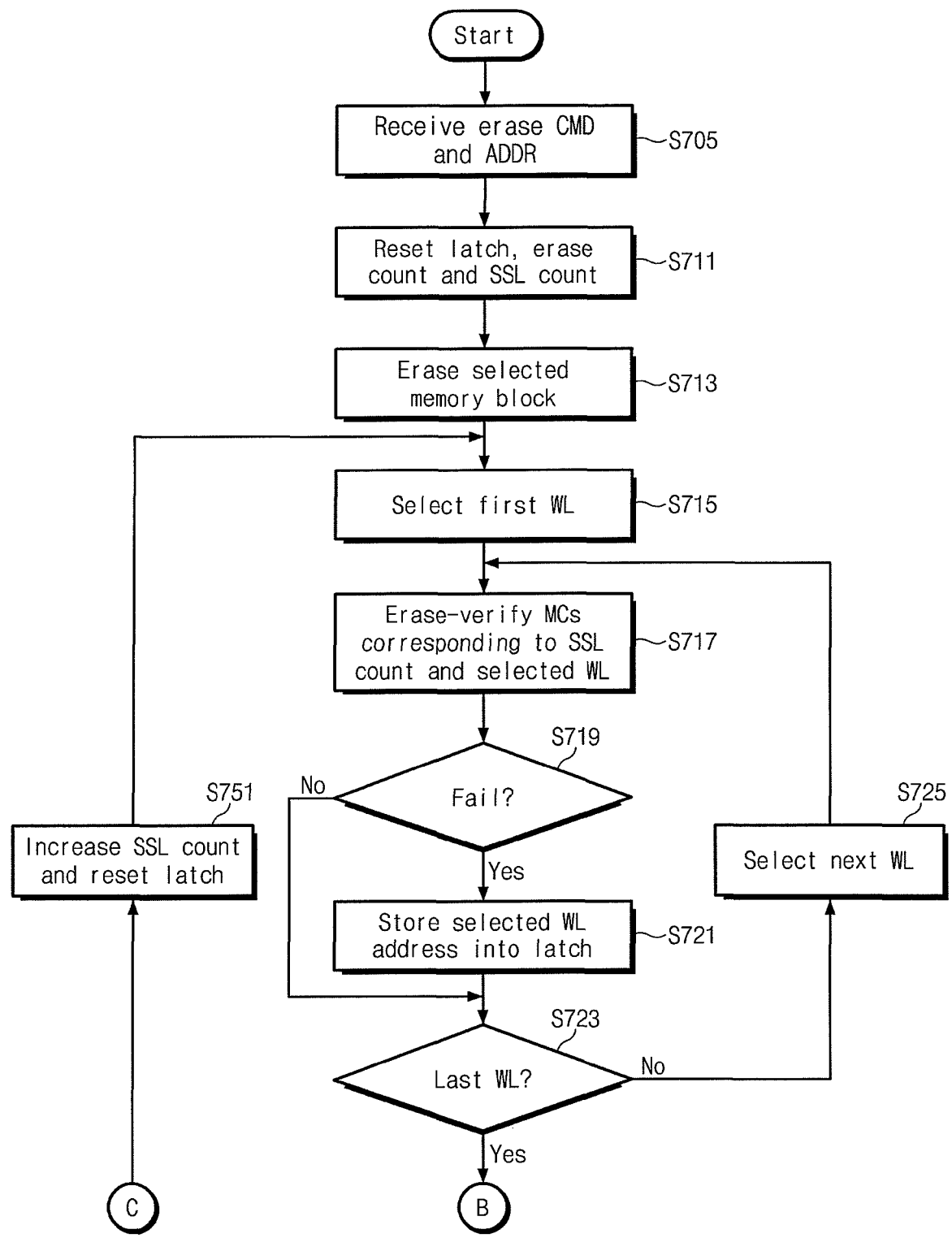
FIGS. 76 and 77 are flowcharts illustrating a method of operating the nonvolatile memory device of FIG. 75 according to an embodiment of the inventive concept.
Figure 77:
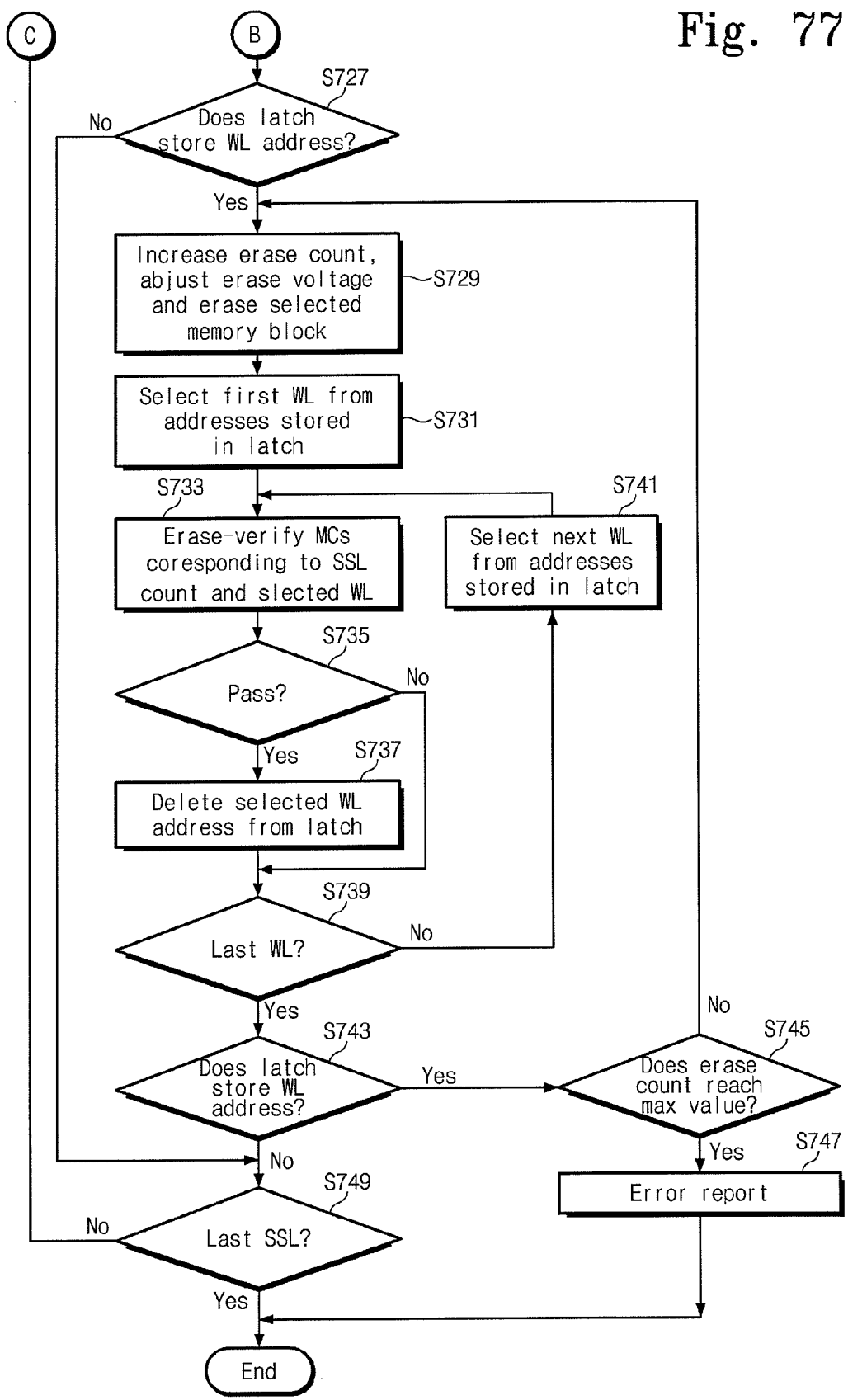

FIGS. 76 and 77 are flowcharts illustrating a method of operating the nonvolatile memory device 100d of FIG. 75 according to an embodiment of the inventive concept. Referring to FIGS. 75 through 77, in operation S705, an erase command and an address are received. For example, the received address corresponds to one of a plurality of memory blocks BLK1 to BLKz of the nonvolatile memory device 100a. Among the plurality of memory blocks BLK1 to BLKz, a memory block (e.g., BLKa) corresponding to the received address is selected. Exemplarily, the received address corresponds to at least one string selection line SSL.

In operation S711, the word line address latch 177, the erase count, and the SSL count are reset. For example, the word line address latch 177 is reset in order not to store an address. The erase count is reset to 1. The SSL count represents one of the string selection lines SSL corresponding to the received address. For example, the SSL count may be reset to represent the first string selection line (e.g., SSL1) of the selected memory block BLK. That is, the first row is selected from the rows of the NAND strings NS of the selected memory block BLK.

In operation S713, memory cells MC corresponding to the received address are erased. For example, the selected memory block is erased. For example, the control logic 170d controls the address decoder 120, the read & write unit 130, and the voltage generating unit 160 to erase the selected memory block.

In operation S715, the first word line is selected. For example, the first word line is selected from the word lines corresponding to the received address.

In operation S717, a plurality of memory cells corresponding to the SSL count and the selected word line are erase-verified. Exemplarily, the SSL count is converted into a string selection line address. A string selection line corresponding to the converted address is selected from the plurality of string selection lines of the selected memory block BLK. Later, a plurality of memory cells corresponding to the selected string selection line and the selected word line are erase-verified. For example, the control logic 170d controls the address decoder 120, the read & write unit 130, and the voltage generating unit 160 to erase-verify the selected word line.

In operation S719, it is determined whether an erase-verification result is failed. If the selected word line is determined as being erase-failed, an address of the selected word line is stored in the word line address latch 177 in operation S721. Later, operation S723 is performed. If the selected word line is erase-passed, operation S721 is omitted and operation S723 is performed.

In operation S723, it is determined whether the selected word line is the last word line. For example, it is determined whether the selected word line is the last word line among word lines of the selected memory block BLK. If the selected word line is not the last word line, the next word line is selected in operation S725. Later, an erase-verification is performed again in operations S717 to S723.

That is, after the selected memory block BLK is erased in operation 5713, word lines of the selected memory block BLK are sequentially erase—verified by an unit of respective word line in operation S717 to 725. At this point, an address of the ease-failed word line is stored in the word line address 177. That is, when operation S727 is performed, the word line address latch 177 stores addresses of the erase-failed word lines among word lines of the selected memory block BLK.

In operation S727, it is determined whether the word line address latch 177 stores a word line address. If the word line address latch 177 stores at least one address, it means that at least one word line is erase-failed in the selected row of the NAND strings NS of the selected memory block BLK. At this point, operation S729 is performed.

If the word line address latch 177 does not store an address, it means that memory cells of the selected rows in the NAND strings NS of the selected memory block BLK are erase-passed. At this point, operation S749 is performed.

In operation S729, the erase count is increased, and the erase voltage Vers is adjusted, and the selected memory block BLK is erased. For example, a level of the erase voltage Vers is increased and the selected memory block BLK is erased.

In operation S731, the first word line is selected from the addresses stored in the word linen address latch 177. For example, the first word line is selected from the word lines corresponding to the addresses stored in the word line address latch 177.

In operation S733, memory cells corresponding to the SSL count and the selected word line are erase-verified. Exemplarily, the SSL count is converted into a string selection line address. A string selection line corresponding to the converted address is selected from the plurality of string selection lines of the selected memory block BLK. Later, a plurality of memory cells corresponding to the selected string selection line and the selected word line are erase-verified. For example, the control logic 170d controls the address decoder 120, the read & write unit 130, and the voltage generating unit 160 to erase-verify the selected word line.

In operations S731 and S733, the first word line is selected from the erase-failed word lines and the selected word line is erase-verified. That is, an erase-verification resumes from the erase-failed word line.

In operation S735, it is determined whether an erase-verification result is erase-passed. If the selected word line is determined as being erase-passed, the address of the selected word line is erased from the word line address latch 177 in operation S737. Later, operation S739 is performed. If the selected word linen is determined as being erase-failed, operation S737 is omitted and operation S739 is performed.

In operation S739, it is determined whether the selected word line is the last word line. For example, it is determined whether the selected word line is the last word line among word lines corresponding to addresses stored in the word line address latch 177. If the selected word line is the last word line, operation S743 is performed. If the selected word line is not the last word line, the next word line is selected from the addresses stored in the word line address latch 177 in operation S741.

That is, after the selected memory block BLK is erased again in operation S729, word lines corresponding to addresses stored in the word line address latch 177 among the word lines WL1 to WLm of the selected memory block BLKa are erase-verified by an unit of respective word line in operations S733 through S741. An address of the erase-passed word line is erased from the word line address latch 177. That is, the word line address latch 177 is updated to store addresses of the erase-failed word lines.

In operation S743, it is determined whether the word line address latch 177 stores an address. If the word line address latch 177 stores an address, operation S745 is performed.

In operation S745, it is determined whether an erase count reaches the maximum value. If the erase count does not reach the maximum value, the erase count is increased in operation S729, the erase voltage Vers is adjusted, and the selected memory block BLK is erased. For example, the erase voltage Vers is increased. Later, in operations S731 to S735, an erase-verification resumes from the erase-failed word line.

If the erase counter reaches the maximum value, an error report is generated in operation S747. For example, the control logic 170d generates an error report representing that an error occurs during an erase operation. The generated error report may be provided to a host of the nonvolatile memory device 100d.

In operation S743, if the word line address latch 177 does not store an address, it means that memory cells MC of the selected row of the NAND strings NS of the selected memory block BLK are erase-passed. At this point, operation S749 is performed.

In operation S749, it is determined whether the selected word line is the last word line. That is, it is determined whether an erase-verification is completed in all rows of the NAND strings NS of the selected memory block BLK. If the selected string selection line (i.e., a row of the NAND strings) is not the last string selection line, the SSL count is increased in operation S751. Then, the word line address latch 177 is reset. Later, operation S715 is performed.

If the selected string selection line is the last string selection line, it means that the memory cells MC of the selected memory block BLK are erase-passed. Accordingly, an erase operation is terminated.

As mentioned above, after the selected memory block BLK is erased, the selected memory block BLK is erase-verified by an unit of respective word line. If erase-fail occurs, the selected memory block BLK is erased again, and an erase-verification resumes from the erase-failed word line. The erase and erase-verification are performed by a row unit of the selected memory block BLK.

Exemplarily, determining of the erase-pass or erase-fail may vary according to electronic devices used with the nonvolatile memory device 100d. For example, if a device with an n-bit error correction function is used with the nonvolatile memory device 100d, fail bits of less than (or below) an n-bit occurring during an erase-verification may be ignored. That is, even when fail bits of less than (or below) an n-bit during an erase-verification are detected, it may be determined as being erase-passed.

Figure 78:
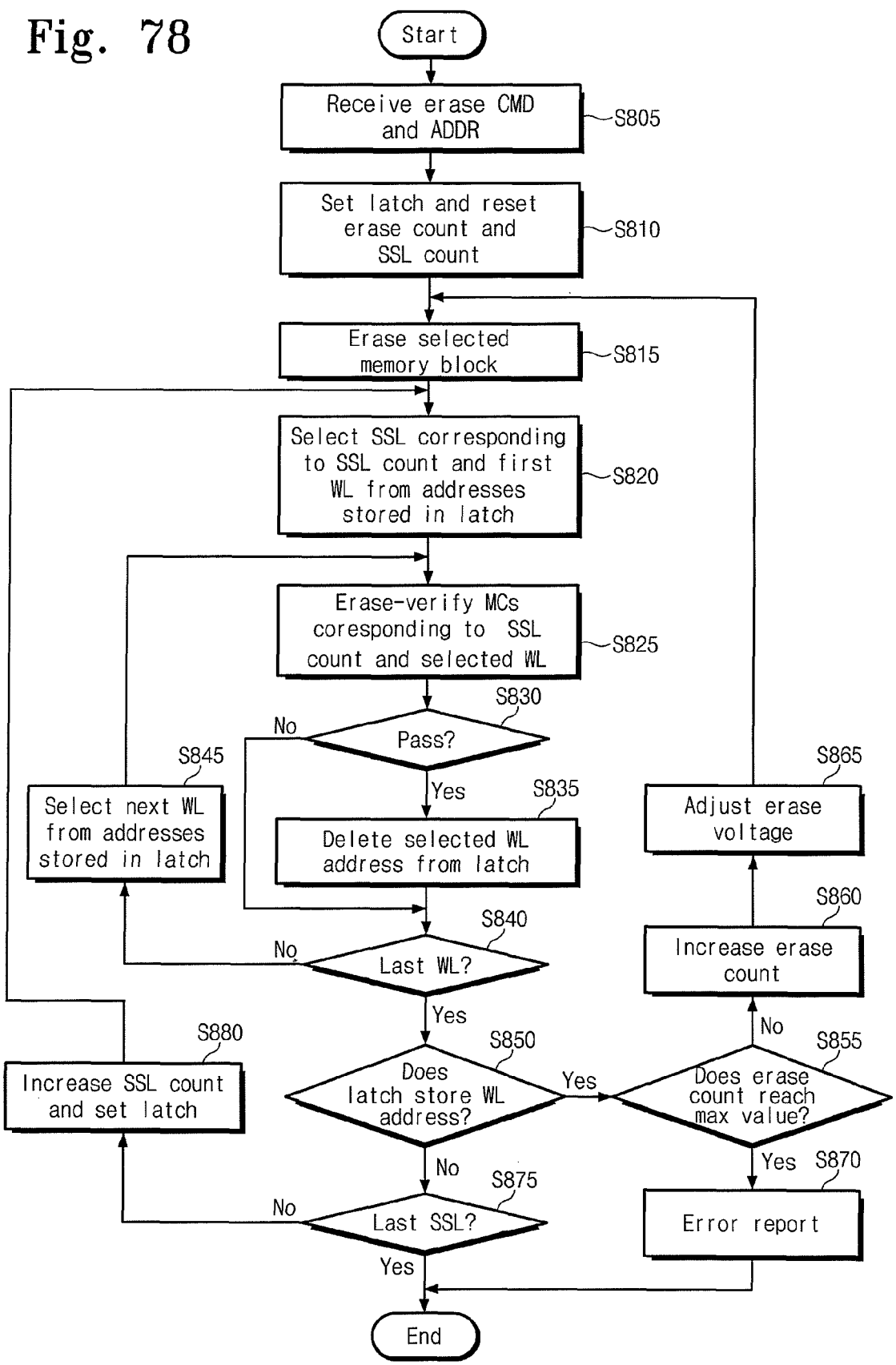
FIG. 78 is a flowchart illustrating a method of operating the nonvolatile memory device of FIG. 75 according to an embodiment of the inventive concept.

FIG. 78 is a flowchart of a method of operating the nonvolatile memory device 100d of FIG. 75 according to an embodiment of the inventive concept. Referring to FIGS. 75 and 78, in operation S805, an erase command and an address are received. For example, the received address corresponds to one of a plurality of memory blocks BLK1 to BLKz of the nonvolatile memory device 100a. Among the plurality of memory blocks BLK1 to BLKz, a memory block (e.g., BLKa) corresponding to the received address is selected. Exemplarily, the received address corresponds to at least one string selection line SSL.

In operation S810, the word line address latch 177 is set and the erase count and the SSL count are reset. For example, the word line address latch 177 is reset in order to store addresses of word lines WL corresponding to the received address. For example, the word line address latch 177 is set to store addresses of word lines of the selected memory block BLK. The erase count is reset to 1. The SSL count represents one of the string selection lines SSL corresponding to the received address. For example, the SSL count may be reset to represent the first string selection line (e.g., SSL1) of the selected memory block BLK.

In operation S815, memory cells MC corresponding to the received address are erased. For example, the selected memory block BLK is erased.

In operation S820, a string selection line corresponding to the SSL count is selected and the first word line is selected from the addresses stored in the word line address latch 177. For example, the first word line is selected from the word lines corresponding to the addresses stored in the word line address latch 177.

In operation S825, memory cells corresponding to the SSL count and the selected word line are erase-verified. Exemplarily, the SSL count is converted into a string selection line address. A string selection line corresponding to the converted address is selected from the plurality of string selection lines of the selected memory block BLK. Later, memory cells corresponding to the selected string selection line and the selected word line are erase-verified.

In operation S830, it is determined whether an erase-verification result is erase-passed. If the selected word line is determined as being erase-passed, an address of the selected word line is erased from the word line address latch 177 in operation S825. Later, operation S840 is performed. If the selected word line is determined as being erase-failed, operation S835 is omitted and operation S840 is performed.

In operation S840, it is determined whether the selected word line is the last word line. For example, it is determined whether the selected word line is the last word line among word lines corresponding to the addresses stored in the word line address latch 177. If the selected word line is not the last word line, the next word line is selected from the addresses stored in the word line address latch 177. If the selected word line is the last word line, operation S850 is performed.

In operations S825 through S845, word lines corresponding to the addresses stored in the word line address latch 177 are erase-verified by an unit of respective word line among the word lines of the selected memory block BLKa. At this point, an address of the erase-passed word line is erased from the word line address latch 177.

In operation S850, it is determined whether the word line address latch 177 stores an address. If the word line address latch 177 stores at least one address, it means that at least one word line is erase-failed in the selected row of the NAND strings NS in the selected memory block BLK. At this point, operation S855 is performed.

In operation S855, it is determined whether an erase count reaches the maximum value. If the erase count does not reach the maximum value, the erase count is increased in operation S860. The erase voltage Vers is adjusted in operation S865. For example, a level of the erase voltage Vers is increased. Later, operation S815 is performed. That is, an erase-verification resumes from the erase-failed word line.

If the erase counter reaches the maximum value, an error report is generated in operation S870. For example, the control logic 170d generates an error report representing that an error occurs during an erase operation. The generated error report may be provided to a host of the nonvolatile memory device 100d.

In operation S850, If the word line address latch 177 does not store an address, it means that memory cells MC of the selected row of the NAND strings NS of the selected memory block BLK are erase-passed. At this point, operation S875 is performed.

In operation S875, it is determined whether the selected string selection line is the last string selection line. That is, it is determined whether an erase-verification is completed in all rows of the NAND strings NS of the selected memory block BLK. If the selected string selection line (i.e., a row of the NAND strings) is not the last string selection line, the SSL count is increased in operation S880. Then, the word line address latch 177 is set. Later, operation S830 is performed.

If the selected string selection line is the last string selection line, it means that the memory cells MC of the selected memory block BLK are erase-passed. Accordingly, an erase operation is terminated.

As mentioned above, after the selected memory block BLK is erased, the selected memory block BLK is erase-verified by an unit of respective word line. If erase-fail occurs, the selected memory block BLK is erased again, and an erase-verification resumes from the erase-failed word line. The erase and erase-verification are performed by a row unit of the selected memory block BLK.

Exemplarily, determining of the erase-pass or erase-fail may vary according to electronic devices used with the nonvolatile memory device 100d. For example, if a device with an n-bit error correction function is used with the nonvolatile memory device 100d, fail bits of less than (or below) an n-bit occurring during an erase-verification may be ignored. That is, even when fail bits of less than (or below) an n-bit during an erase-verification are detected, it may be determined as being erase-passed.

Figure 79:
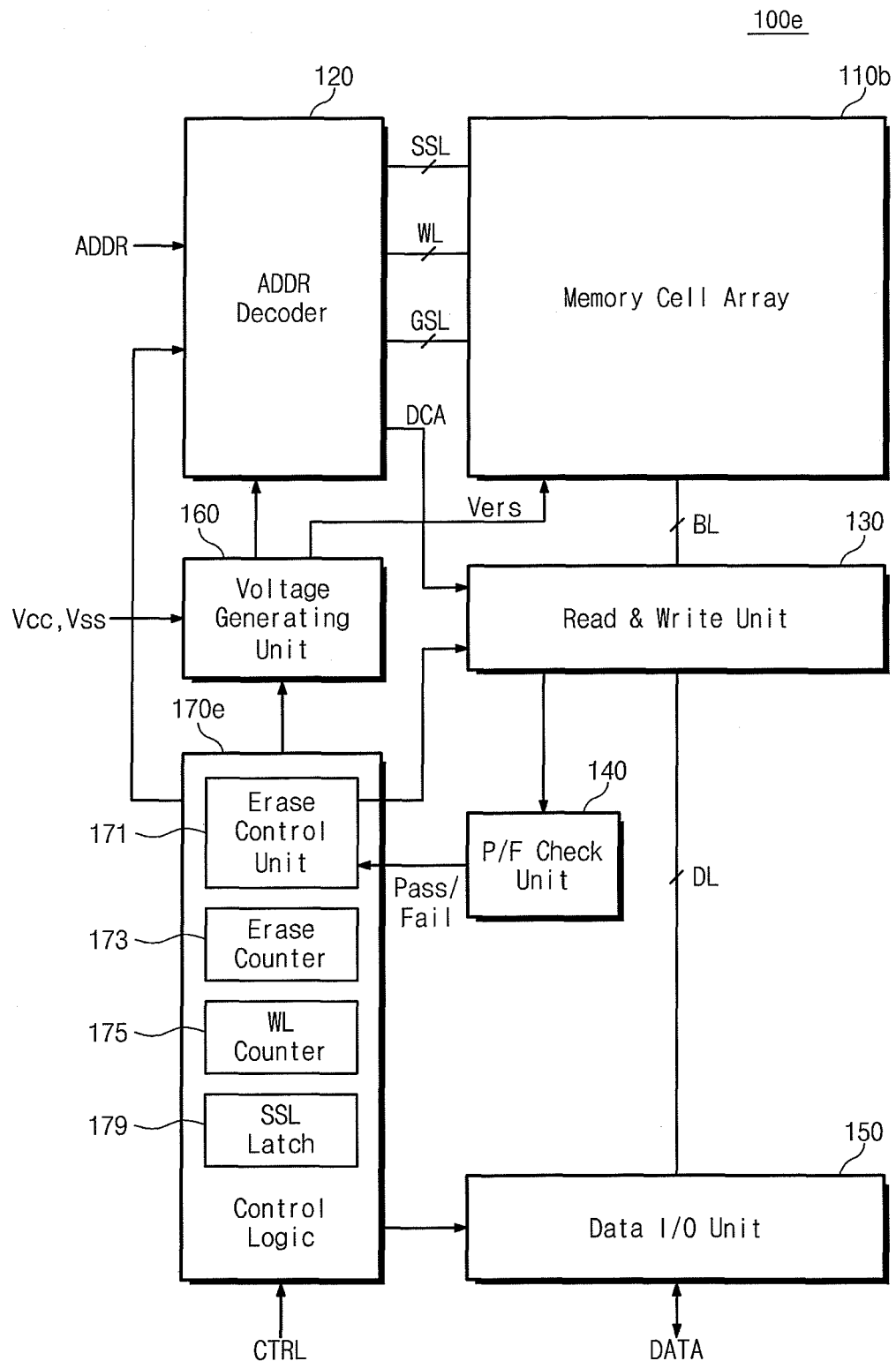
FIG. 79 is a block diagram illustrating a nonvolatile memory device according to an embodiment of the inventive concept.

FIG. 79 is a block diagram illustrating the nonvolatile memory device 100e according to an embodiment of the inventive concept. Referring to FIG. 79, the nonvolatile memory device 100e includes a memory cell array 110b, an address decoder 120, a read & write unit 130, a pass/fail check unit 140, a data I/O unit 150, a voltage generating unit 160, and a control logic 170e. Except for the control logic 170b, the nonvolatile memory device 100e has the same structure as the nonvolatile memory device 100a of FIG. 16. Accordingly, overlapping descriptions will be omitted.

Except that a string selection line latch (hereinafter, referred to as a SSL latch) 179 is added in the control logic 170e, the control logic 170e has the same structure as the control logic 170c of FIG. 6. Accordingly, overlapping descriptions will be omitted.

The SSL latch 179 is configured to store addresses of a part of string selection lines corresponding to the received address during an erase operation. For example, the SSL latch 179 is configured to store addresses of a part of string selection lines of the selected memory block BLK.

Figure 80:
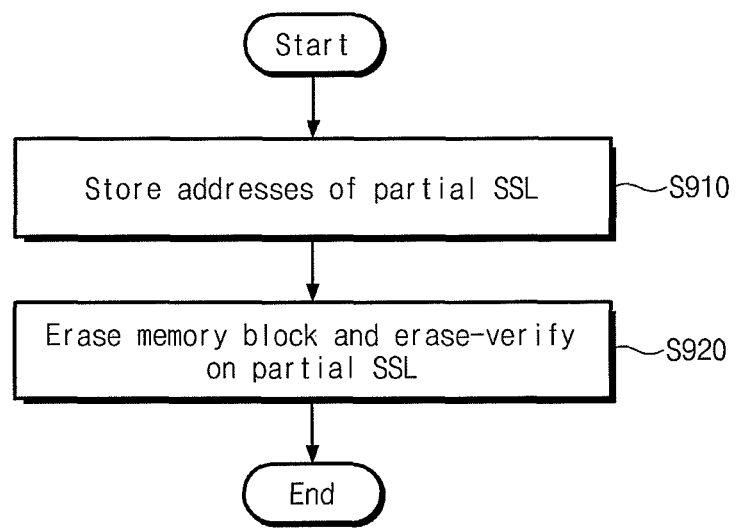
FIG. 80 is a flowchart illustrating an operating method of the nonvolatile memory device of FIG. 79 according to an embodiment of the inventive concept.

FIG. 80 is a flowchart illustrating an operating method of the nonvolatile memory device 100e of FIG. 79. Referring to FIG. 80, addresses of the some string selection lines are stored in operation S910. In operation S920, a memory block is erased and an erase-verification is performed on some word lines.

Exemplarily, in the erase-verification method described with reference to FIG. 17, all string selection lines SSL are sequentially selected. On the contrary, during an erase-verification of the nonvolatile memory device 100e, some string selection lines SSL corresponding to the string selection line address stored in the SSL latch are sequentially selected. Moreover, if erase-pass is detected in the some string selection lines SSL, the selected memory block BLK is determined as being erase-passed.

In another aspect, it may be understood that although an erase-verification is performed in the string selection lines of the selected memory block BLK, an erase-verification is prohibited in some string selection lines of the selected memory block BLK . . . .

Since an erase-verification is performed on only some string selection lines among a plurality of string selection lines, an operating speed of the nonvolatile memory device 100e may be improved.

Exemplarily, addresses of the some string selection lines may be programmed by a user. That is, string selection lines to be erase-verified among the string selection lines of the selected memory block may be selected by a user.

Figure 81:
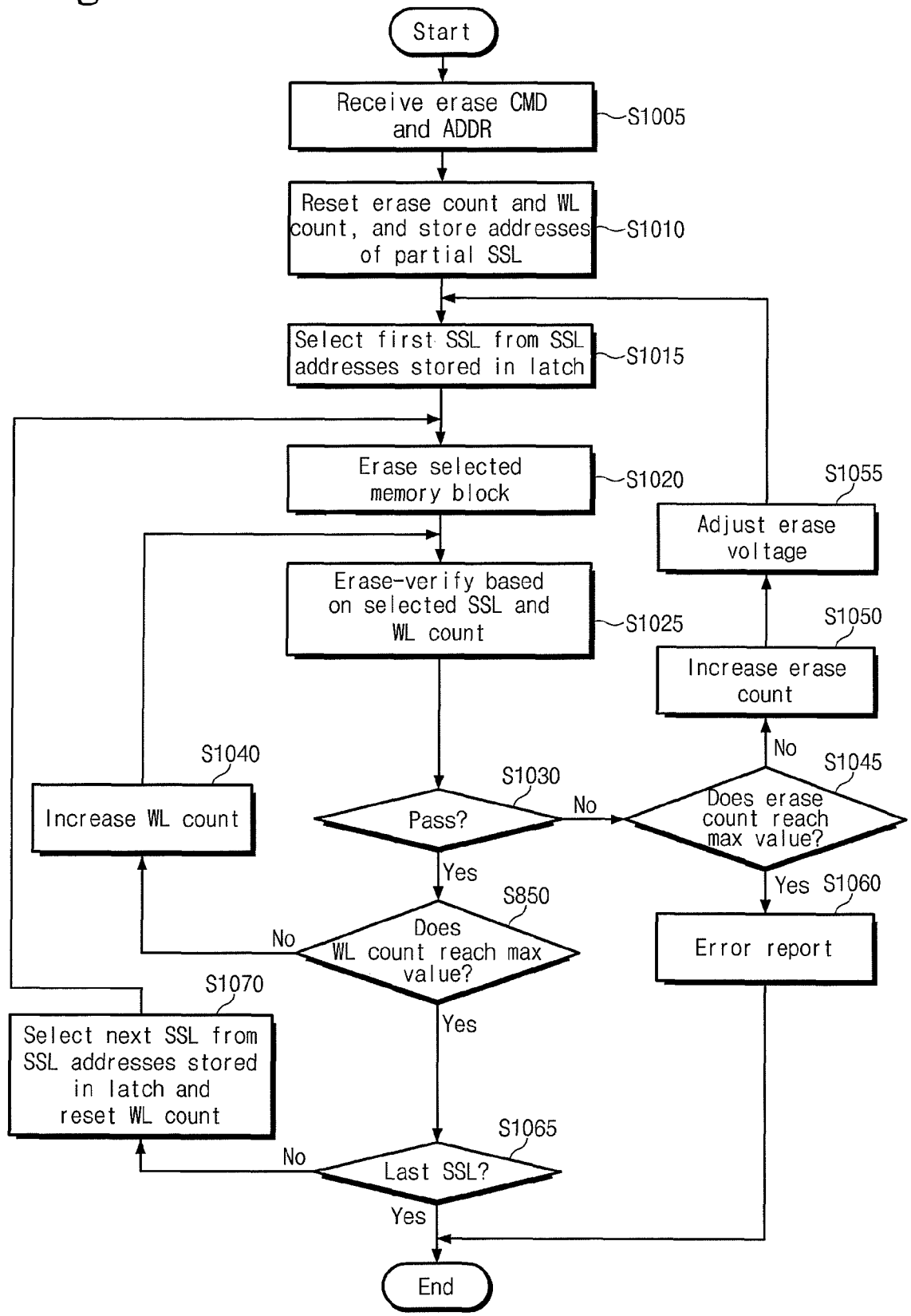
FIG. 81 is a flowchart illustrating a method of operating the nonvolatile memory device of FIG. 79 according to an embodiment of the inventive concept.

FIG. 81 is a flowchart illustrating a method of operating the nonvolatile memory device 100e of FIG. 79 according to an embodiment of the inventive concept. As described with reference to FIG. 80, a plurality of memory cells corresponding to some string selection lines among a plurality of string selection lines in the selected memory block of the nonvolatile memory device 100e are erase-verified.

Referring to FIGS. 79 and 81, an erase command and an address are received in operation S1005. For example, the received address corresponds to one of the plurality of memory blocks BLK1 to BLKz of the nonvolatile memory device 100b. A memory block (e.g., BLKa) corresponding to the received address among the plurality of memory blocks BLK1 to BLKz is selected. For example, the received address corresponds to at least two string selection lines SSL.

In operation S1010, an erase counter is reset, a word line counter is reset, and addresses of some string selection lines among a plurality of string selection lines of the selected memory block are stored. For example, the erase counter is reset to 1. The word line counter is reset to indicate the first word line WL among the plurality of word lines of the selected memory block. Addresses of some string selection lines are stored in the string selection line latch (hereinafter, referred to as a SSL latch) 179.

In operation S1015, the first string selection line is selected from the stored string selection line addresses. For example, the first string selection line is selected from the string selection lines (i.e., some string selection lines) corresponding to the string selection line addresses stored in the string selection line latch 179.

In operation S1020, the selected memory block BLK is erased. For example, the control logic 170e controls the address decoder 120 and the voltage generating unit 160 to erase memory cells of the selected memory block BLK.

In operation S1025, based on the selected string selection line and word line counter, an erase-verification is performed. Exemplarily, the word line count is converted into a word line address. A word line corresponding to the converted word line address is selected from the plurality of word lines of the selected memory block BLKb. Later, a plurality of memory cells corresponding to the selected string selection line and the selected word line are erase-verified.

In operation S1030, it is determined whether the memory cells are erase-passed. If the plurality of memory cells corresponding to the selected string selection line and the selected word line are erase-passed, operation S1035 is performed.

In operation S1035, it is determined whether the word line count reaches the maximum value. That is, it is determined whether the word line counter indicates the last word line among the word lines of the selected memory block BLK. If the word line count does not reach the maximum value, the word line count is increased in operation S1040. Later, an erase-verification is performed in operations S1030 and 1035.

In operation S1030, if the plurality of memory cells corresponding to the selected string selection line and the selected word line are erase-failed, it is determined whether the erase counter reaches the maximum value in operation S1045. If the erase count does not reach the maximum value, it is increased in operation S1050. Later, the erase voltage Vers is adjusted in operation S1055. For example, a level of the erase voltage Vers is increased. Later, an erase operation (operation S1020) of the selected memory block BLK and an erase-verification operation (operations S1025 and S1030) from the erase failed word line are performed again.

In operation S1045, if the erase counter reaches the maximum value, an error report is generated in operation S1060. For example, the control logic 170e may generate an error report representing that an error occurs during an erase operation. The generated error report may be provided to a host of the nonvolatile memory device 100e.

That is, among the plurality of memory cells MC corresponding to the selected string selection line, a plurality of memory cells corresponding to the selected string selection line and selected word line are erase-verified. If erase-pass is detected, the next word line is selected and an erase-verification resumes. If erase-fail is detected, an erase and erase-verification are performed again. That is, an erase-verification resumes from the erase-failed word line.

If a plurality of memory cells corresponding to the selected string selection line are erase-passed, it is determined that the word line counter has the maximum value in operation S1035. Later, operation S1065 is performed.

In operation S1065, it is determined whether the selected string selection line is the last string selection line. For example, it is determined whether the selected string selection line is the last string selection line among string selection lines corresponding to the string selection line addresses stored in the SSL latch 179.

If the selected string selection line is not the last string selection line, the next string selection line is selected from the string selection line addresses stored in the SSL latch 179 and the word line counter is reset in operation S1070. Later, an erase-verification is performed again in operations S1025 and S1030.

If the selected string selection line is the last string selection line, an erase operation is terminated.

Exemplarily, addresses of the string selection lines corresponding to memory cells having a lower erase property than other memory cells among the plurality of memory cells of the selected memory block BLK may be stored in the SSL latch 179. That is, if the plurality of memory cells corresponding to the stored string selection line addresses are erase-passed, a plurality of memory cells of the selected memory block BLK may be erase-passed.

Exemplarily, addresses of the string selection lines corresponding to memory cells disposed at the outline among the plurality of memory cells of the selected memory block BLK may be stored in the SSL latch 179.

Figure 82:
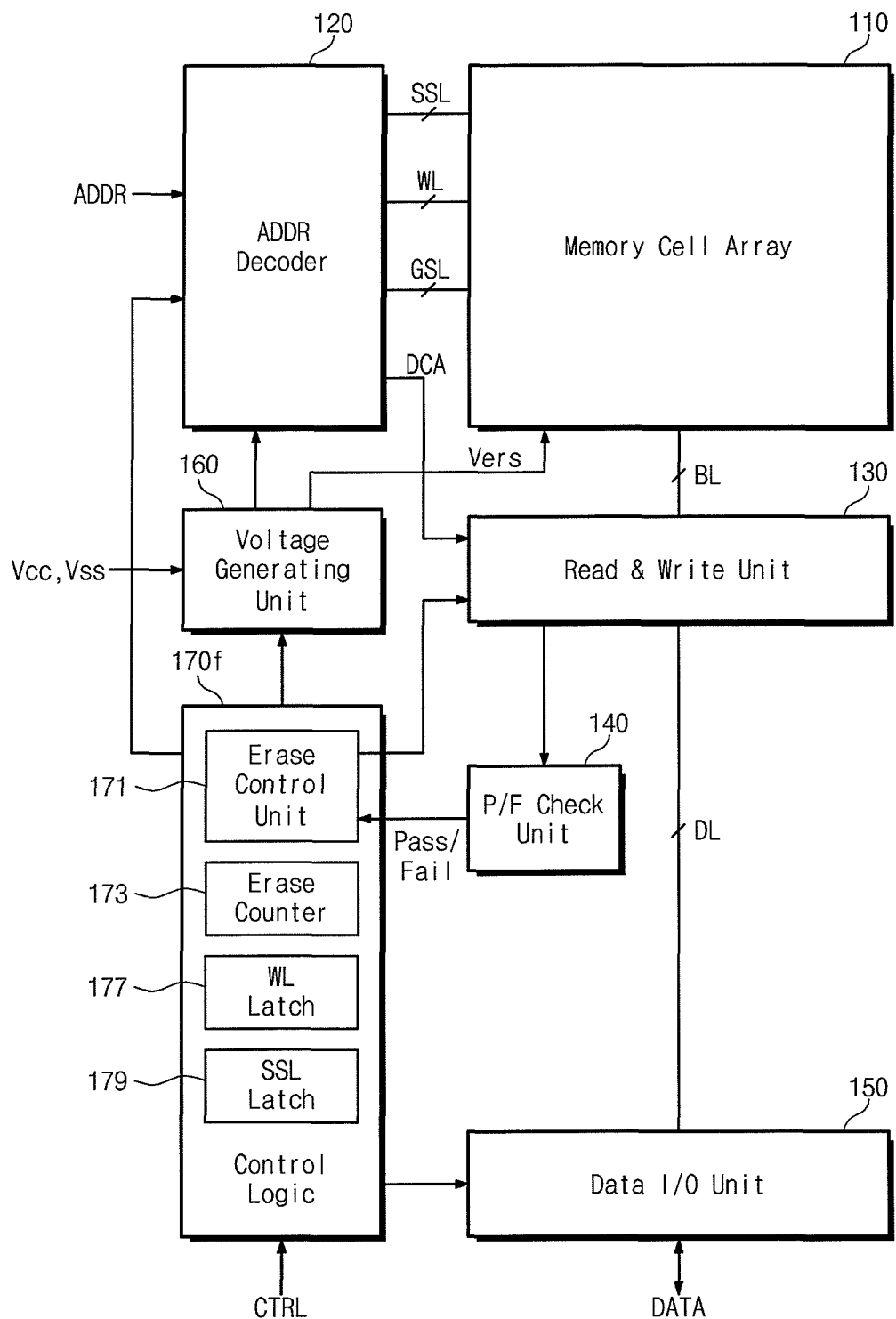
FIG. 82 is a block diagram illustrating a nonvolatile memory device according to an embodiment of the inventive concept.

FIG. 82 is a block diagram illustrating the nonvolatile memory device 100f according to an embodiment of the inventive concept. Referring to FIG. 82, the nonvolatile memory device 100f includes a memory cell array 110b, an address decoder 120, a read & write unit 130, a pass/fail check unit 140, a data I/O unit 150, a voltage generating unit 160, and a control logic 170f. Except for the control logic 170e, the nonvolatile memory device 100e has the same structure as the nonvolatile memory device 100d of FIG. 75.

Except that a SSL latch 179 is added in the control logic 170f, the control logic 170f has the same structure as the control logic 170d of FIG. 75.

As described with reference to FIG. 80, an erase-verification is performed on some string selection lines corresponding to string selection line addresses stored in the SSL latch 179 among the string selection lines of the selected memory block BLK in the nonvolatile memory device 100f.

Figure 83:
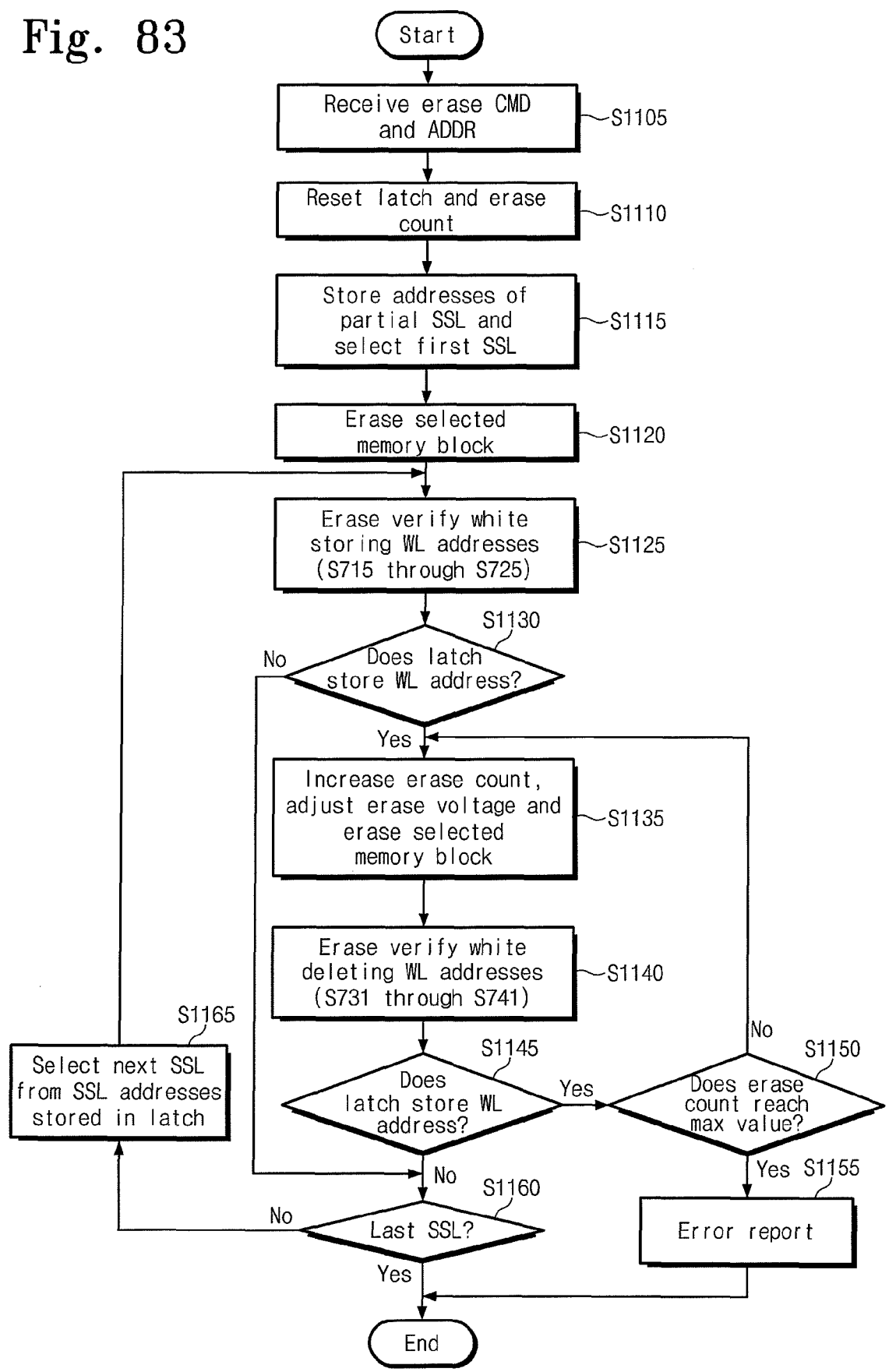
FIG. 83 is a flowchart illustrating a method of operating the nonvolatile memory device of FIG. 82 according to an embodiment of the inventive concept.

FIG. 83 is a flowchart of a method of operating the nonvolatile memory device 100f of FIG. 82 according to an embodiment of the inventive concept. Referring to FIGS. 82 and 83, an erase command and an address are received in operation S1105. For example, the received address corresponds to one of the plurality of memory blocks BLK1 to BLKz of the nonvolatile memory device 100b. A memory block (e.g., BLK) corresponding to the received address among the plurality of memory blocks BLK1 to BLKz is selected. For example, the received address corresponds to at least two string selection lines SSL.

In operation S1110, the word line address latch 177 and the erase counter are reset. For example, the word line address latch 177 is reset in order not to store a word line address. The erase counter is reset to 1.

In operation S1115, addresses of some string selection lines among a plurality of string selection lines of the selected memory block BLK are stored in the SSL latch 179. Then, the first string selection line is selected from the string selection lines corresponding to the string selection line addresses stored in the SSL latch 179.

In operation S1120, the selected memory BLK is erased. For example, a plurality of memory cells of the selected memory block BLK are erased.

In operation S1125, a word line address is stored in the word line address latch 177, and an erase-verification is performed. Exemplarily, operations S715 through S725 described with reference to FIG. 76 are performed. That is, addresses of the word lines corresponding to erase-failed memory cells are stored and a plurality of memory cells corresponding to the selected string selection line are erase-verified by a unit of each word line. Once operation S1125 is performed, addresses of the word lines corresponding to the erase-failed memory cells are stored in the word line address latch 177.

In operation S1130, it is determined whether there are addresses stored in the word line address latch 177. If there are addresses stored in the word line address latch 177, the erase counter is increased, the erase voltage Vers is adjusted, and the selected memory block BLK is erased in operation S1135. For example, the erase voltage Vers is increased.

In operation S1140, a word line address is erased and an erase-verification is performed. Exemplarily, operations S731 through S741 described with reference to FIG. 76 are performed. That is, addresses of the word lines corresponding to the erase-passed memory cells are stored, and memory cells corresponding to the string selection line and corresponding to addresses stored in the word line address latch 177 are erase-verified by a unit of each word line. Once operation S1140 is performed, addresses of the word lines corresponding to the erase-failed memory cells remain in the word line address latch 177.

In operation S1145, it is determined whether there are addresses stored in the word line address latch 177. If there are addresses stored in the word line address latch 177, operation S1150 is performed.

In operation S1150, it is determined whether the erase counter reaches the maximum value. If the erase counter does not reach the maximum value, operation S1135 is performed again. If the erase counter reaches the maximum value, an error report is generated in operation S1155. For example, the control logic 170f may generate an error report representing that an error occurs during an erase operation. The generated error report may be provided to a host of the nonvolatile memory device 100f.

If a plurality of memory cells corresponding to the selected string selection line are erase-passed, the word line address latch 177 does not store a word line address. At this point, operation S1160 is performed. In operation S1160, it is determined whether the selected string selection line is the last string selection line. For example, it is determined whether the selected string selection line is the last string selection line among string selection lines corresponding to the string selection line addresses stored in the SSL latch 179.

If the selected string selection line is not the last string selection line, the erase operation is terminated. If the selected string selection line is not the last string selection line, the next string selection line is selected from the string selection line corresponding to the string selection line addresses stored in the SSL latch 179 in operation S1165. Later, operation S1125 is performed again.

Exemplarily, addresses of the string selection lines corresponding to memory cells having a lower erase property than other memory cells among the plurality of memory cells of the selected memory block BLK may be stored in the SSL latch 179. That is, if the plurality of memory cells corresponding to the stored string selection line addresses are erase-passed, a plurality of memory cells of the selected memory block BLK may be erase-passed.

Exemplarily, addresses of the string selection lines corresponding to memory cells disposed at the outline among the plurality of memory cells of the selected memory block BLK may be stored in the SSL latch 179.

Figure 84:
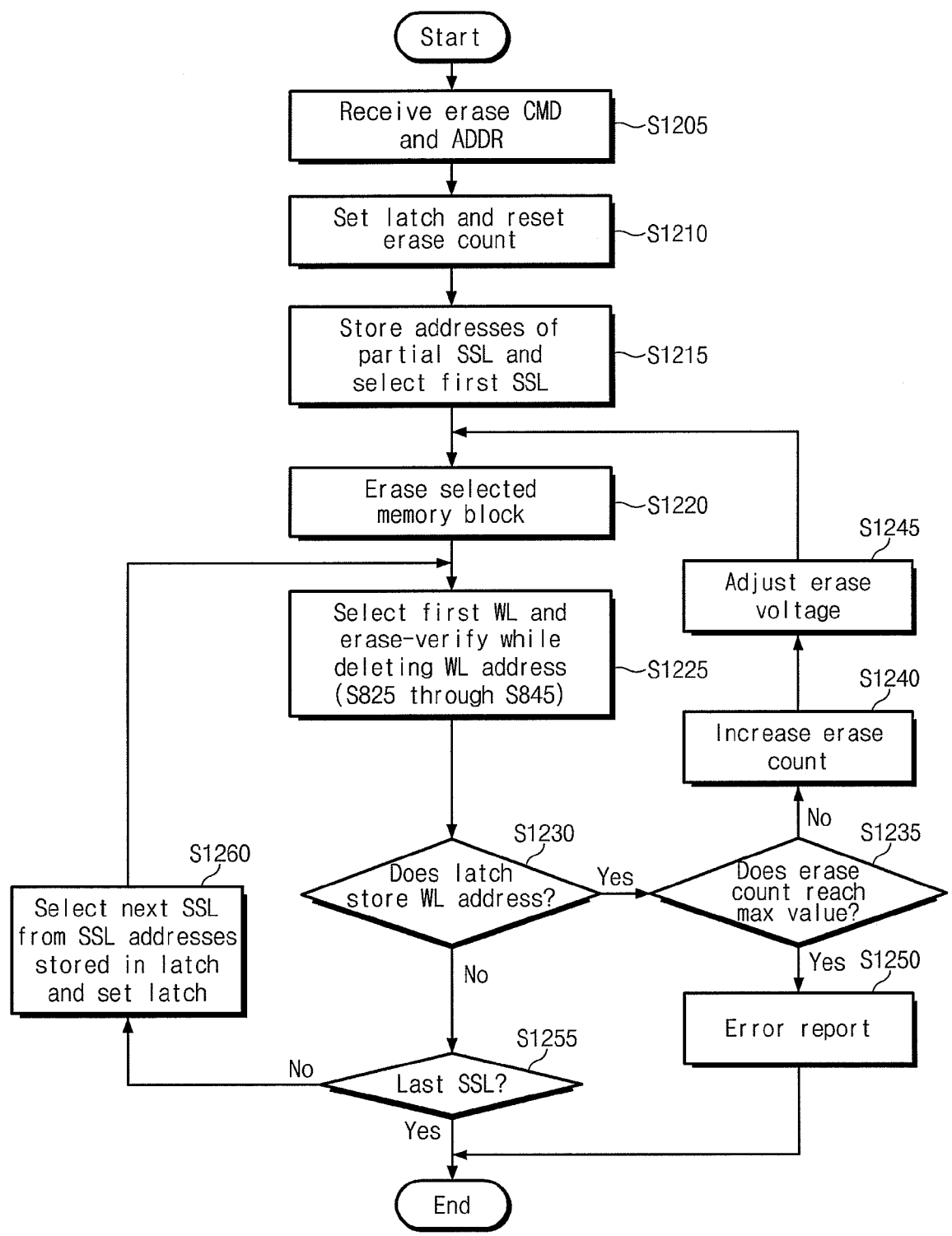
FIG. 84 is a flowchart illustrating a method of operating the nonvolatile memory device of FIG. 82 according to an embodiment of the inventive concept.

FIG. 84 is a flowchart illustrating a method of operating the nonvolatile memory device 100f of FIG. 82 according to an embodiment of the inventive concept. Referring to FIGS. 82 and 84, an erase command and an address are received in operation S1205. For example, the received address corresponds to one of the plurality of memory blocks BLK1 to BLKz of the nonvolatile memory device 100b. A memory block (e.g., BLK) corresponding to the received address among the plurality of memory blocks BLK1 to BLKz is selected. For example, the received address corresponds to at least two string selection lines SSL.

In operation S1210, the word line address latch 177 is set and the erase counter is reset. For example, the word line address latch 177 is reset in order to store addresses of a plurality of word lines (e.g., all word lines) of the selected memory block BLK. The erase counter is reset to 1.

In operation S1215, addresses of some string selection lines among a plurality of string selection lines of the selected memory block BLK are stored in the SSL latch 179.

In operation S1220, the selected memory block BLK is erased.

In operation S1225, the first word line is selected, a word line addresses is erased, and an erase-verification is performed. For example, the first word line is selected from word lines corresponding to addresses stored in the word line address latch 177. Then, like operations S825 through S845 described with reference to FIG. 78, addresses of the word lines corresponding to erase-passed memory cells are erased from the word line address latch 177, and a plurality of memory cells corresponding to the selected string selection line and the addresses stored in the word line address latch 177 are erase-verified by a unit of each word line. That is, once operation S1225 is performed, addresses of the word lines corresponding to the erase-failed memory cells remain in the word line address latch 177.

In operation S1230, it is determined whether there are addresses stored in the word line address latch 177. If there are addresses stored in the word line address latch, operation S1235 is performed.

In operation S1235, it is determined whether the erase counter reaches the maximum value. If the erase counter does not reach the maximum value, it is increased in operation S1240 and the erase voltage Vers is adjusted in operation S1245. For example, the erase voltage Vers is increased. Later, the erasing of operation S1220 is performed again.

If the erase counter reaches the maximum value, an error report is generated in operation S1250. For example, the control logic 170f may generate an error report representing that an error occurs during an erase operation. The generated error report may be provided to a host of the nonvolatile memory device 100f.

If a plurality of memory cells corresponding to the selected string selection line are erase-passed, the word line address latch 177 does not store a word line address. At this point, operation S1255 is performed.

In operation S1255, it is determined whether the selected string selection line is the last string selection line. For example, it is determined whether the selected string selection line is the last string selection line among string selection lines corresponding to the string selection line addresses stored in the SSL latch 179.

If the selected string selection line is not the last string selection line, the erase operation is terminated. If the selected string selection line is not the last string selection line, operation S1260 is performed.

In operation S1260, the next string selection line is selected from the string selection lines corresponding to the string selection line addresses stored in the SSL latch 179. Then, the word line address latch 177 is set in order to store addresses of a plurality of word lines of the selected memory block BLK. Then, operation S1225 is performed again.

Exemplarily, addresses of the string selection lines corresponding to memory cells having a lower erase property than other memory cells among the plurality of memory cells of the selected memory block BLK may be stored in the SSL latch 179. That is, if the plurality of memory cells corresponding to the stored string selection line addresses are erase-passed, a plurality of memory cells of the selected memory block BLK may be erase-passed.

Exemplarily, addresses of the string selection lines corresponding to memory cells disposed at the outline among the plurality of memory cells of the selected memory block BLK may be stored in the SSL latch 179.

Figure 85:
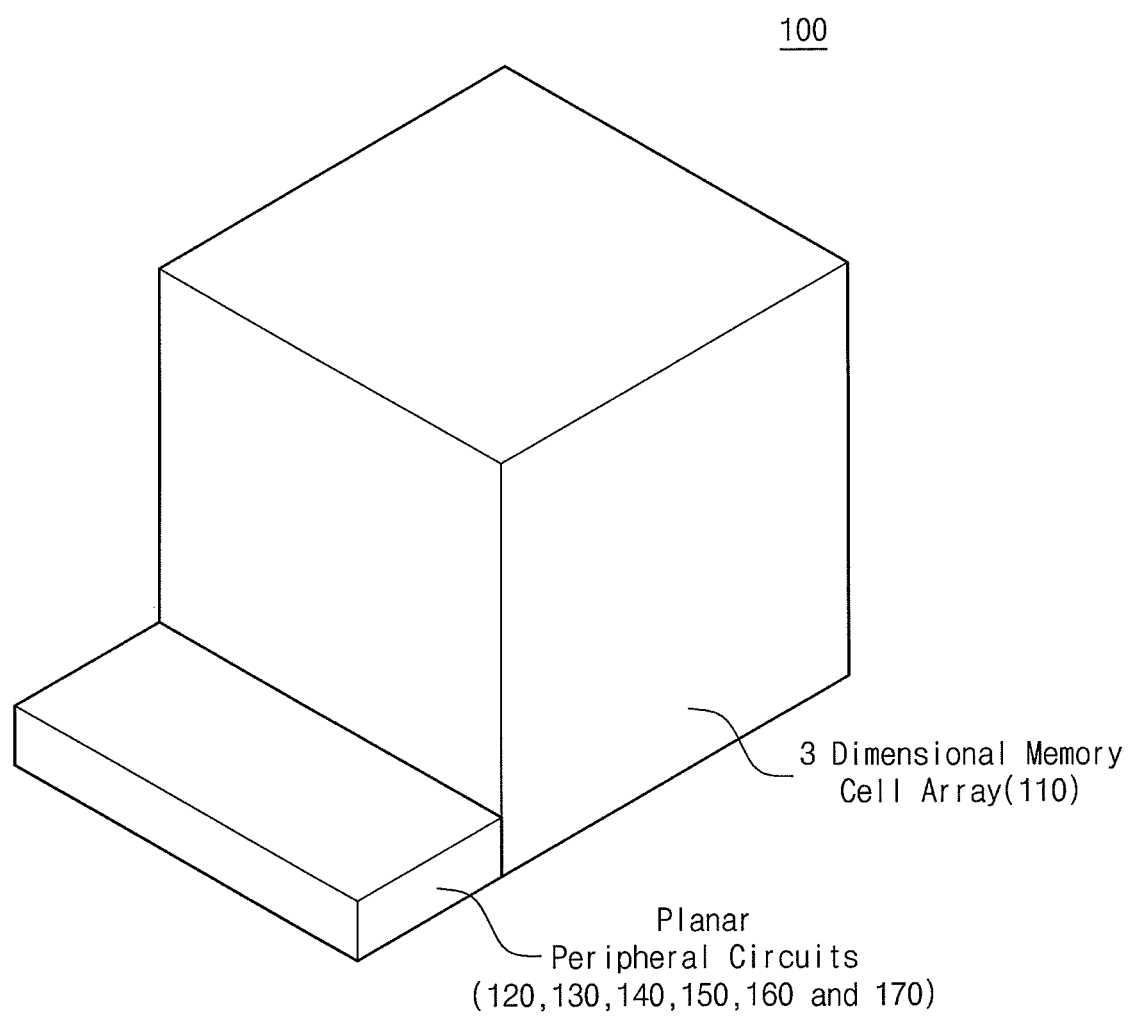
FIG. 85 is a perspective view illustrating a structure of the nonvolatile memory device described with reference to FIG. 75, 79, or 82 according to an embodiment of the inventive concept.

FIG. 85 is a perspective view illustrating a structure of the nonvolatile memory device (100c, 100d, 100e, or 1000 described with reference to FIG. 75, 79, or 82. Hereinafter, it is defined that the nonvolatile memory device 100 represents one of the nonvolatile memory devices 100c to 100f described with reference to FIGS. 16, 75, 79, and 82.

Referring to FIG. 82, the nonvolatile memory device 100 includes a three-dimensional memory cell array 110 and plane peripheral circuits 120, 130, 140, 150, 160, and 170.

As described with reference to FIGS. 18 through 74, the memory cell array 110 includes memory cells stacked in a direction intersecting the substrate 111. That is, the memory cell array 110 has a three-dimensional structure in which memory cells are three-dimensionally arranged.

The peripheral circuits 120, 130, 140, 150, 160, and 170 include devices provided on the substrate 111 in a single layer. That is, the peripheral circuits 120, 130, 140, 150, 160, and 170 include devices having a plane structure.

Exemplarily, it is illustrated that the peripheral circuits 120, 130, 140, 150, 160, and 170 are provided at one side of the three-dimensional memory cell array 110. However, the position relationship of the peripheral circuits 120, 130, 140, 150, 160, and 170 and their number are not limited.

For example, the peripheral circuits 120, 130, 140, 150, 160, and 170 may be provided on at least two sides of the three-dimensional memory cell array 110. Additionally, at least two three-dimensional memory cell arrays 110 are provided and the plane peripheral circuits 120, 130, 140, 150, 160, and 170 may be provided on at least one side of each of at least two three-dimensional memory cell arrays 110.

Figure 86:
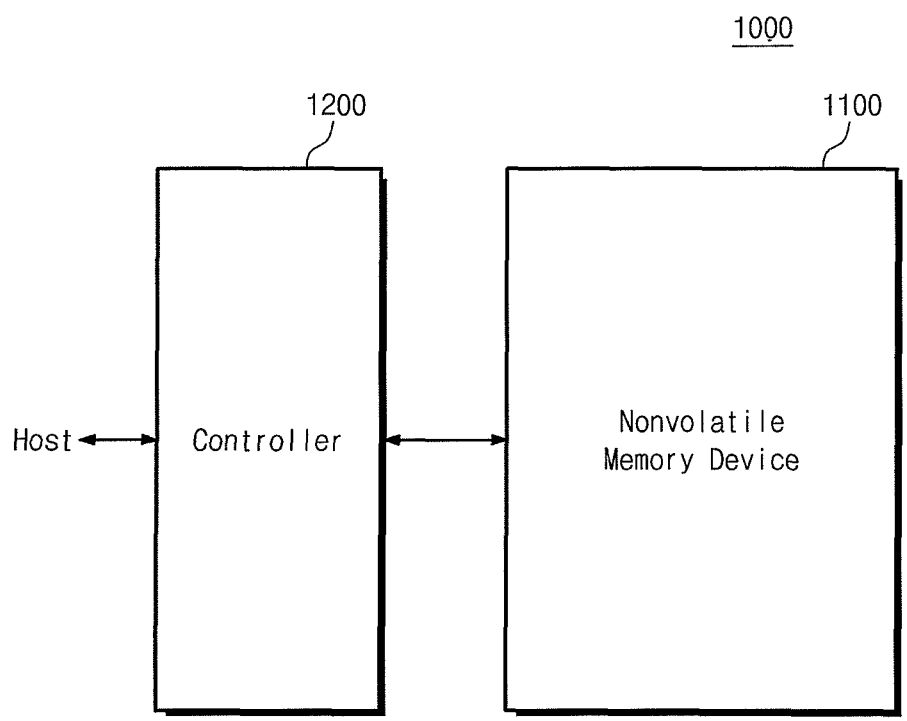
FIG. 86 is a block diagram illustrating a memory system according to an embodiment of the inventive concept.

FIG. 86 is a block diagram illustrating a memory system 1000 according to an embodiment of the inventive concept. Referring to FIG. 86, the memory system 1000 includes a nonvolatile memory device 1100 and a controller 1200.

The nonvolatile memory device 1100 has the same structure as one of the nonvolatile memory devices 100a, 100b, 100c, 100d, 100e, and 100f described with reference to FIGS. 1, 12, 16, 75, 79, and 82. That is, the nonvolatile memory device 1100 erases the selected memory block BLK and erase-verifies the erased memory block by a unit of respective word line. If erase-fail occurs, the selected memory block BLK is erased again and an erase-verification resumes from the erase-failed word line.

The controller 1200 is connected to a host and the nonvolatile memory device 1100. In response to a request of the host, the controller 1200 is configured to access the nonvolatile memory device 1100. For example, the controller 1200 is configured to control read, write, erase, and background operations of the nonvolatile memory device 1100. The controller 1200 is configured to provide an interface between the nonvolatile memory device 1100 and the host. The controller 1200 is configured to drive a firmware so as to control the nonvolatile memory device 1100.

Exemplarily, the controller 1200 is configured to provide a control signal CTRL and an address ADDR to the nonvolatile memory device 1100. Additionally, the controller 1200 is configured to exchange data with the nonvolatile memory device 1100.

Exemplarily, the controller 1200 provides an erase command and an address to the nonvolatile memory device 1100. The nonvolatile memory device 1100 performs an erase and erase-verification according to an operating method of the inventive concept in response to the erase command and the address provided from the controller 1200.

For example, the nonvolatile memory device 1100 is configured to erase the memory cells MC corresponding to the received address and erase-verify the erased memory cells by a unit of respective word line. If erase fail occurs, the memory cells MC are erased again, and an erase-verification resumes from the erase-failed word line. If the received address corresponds to at least two string selection lines SSL, an erase-verification is performed by a unit of the string selection line SSL. Exemplarily, an erase-verification may be performed by a unit of each string selection line SSL in some of the string selection lines SSL corresponding to the received address.

The nonvolatile memory device 1100 is configured to transmit a result of an erase operation to the controller 1200. For example, if memory cells MC corresponding to the received address are erase-passed, the nonvolatile memory device 1100 provides to the controller 1200 a signal notifying erase-pass. If the erase counter reaches the maximum value before memory cells MC corresponding to the received address are erase-passed, the nonvolatile memory device 1100 provides an error report to the controller 1200.

Exemplarily, the controller 1200 further includes typical components such as random access memory (RAM), a processing unit, a host interface, and a memory interface. The RAM may be used as one of a cache memory and a buffer memory between the nonvolatile memory device 1100 and the host. The processing unit controls a general operation of the controller 1200.

The host interface includes a protocol for performing data exchange between the host and the controller 1200. Exemplarily, the controller 1200 is configured to communicate with the outside (host) through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface interfaces with the nonvolatile memory device 1100. For example, the memory interface includes a NAND interface or a NOR interface.

The memory system 1000 may be configured to additionally include an error correction block. The error correction block is configured to detect and correct an error of data read from the nonvolatile memory device 1100 using an error correction code (ECC). Exemplarily, the error correction block is provided as a component of the controller 1200. The error correction block may be provided as a component of the nonvolatile memory device 1100.

The controller 1200 and the nonvolatile memory device 1100 may be integrated into a single semiconductor device. Exemplarily, the controller 1200 and the nonvolatile memory device 1100 are integrated into a single semiconductor device, so as form a memory card. For instance, the controller 500 and the nonvolatile memory device 100 are integrated into a single semiconductor device to thereby form a memory card such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

The controller 1200 and the nonvolatile memory device 1100 are integrated into a single semiconductor device to thereby form a semiconductor drive such as solid state drive (SSD). The SSD includes a storage unit configured to store data in a semiconductor memory. In the case where the memory system 1000 is used as the SSD, the operating speed of the host connected to the memory system 1000 is remarkably improved.

As another example, the memory system 1000 may be provided as one of various components of an electronic device such as a computer, a ultra mobile personal computer (UMPC), a workstation, a net-book, a personal digital assistance (PDA), a portable computer (PC), a web tablet, a wireless phone, a mobile phone, a smart phone, an e-book, a portable multimedia player (PMP), a portable game console, a navigation, a black box, a digital camera, a digital multimedia broadcasting (DMB) player, a digital audio recorder, a digital audio player, a digital picture recorder, a digital picture player, a digital video recorder, a digital video player, a device for transmitting and receiving information under wireless environment, one of various electronic devices constituting a home network, one of various electronic devices constituting a computer network, one of various electronic devices constituting a telematics network, a radio frequency identification (RFID) device, and one of various components constituting a computing system.

Exemplarily, the nonvolatile memory device 1100 or the memory system 1000 may be implemented using various kinds of packages. For instance, the nonvolatile memory device 100 or the memory system 1000 may be implemented with packages such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 87:
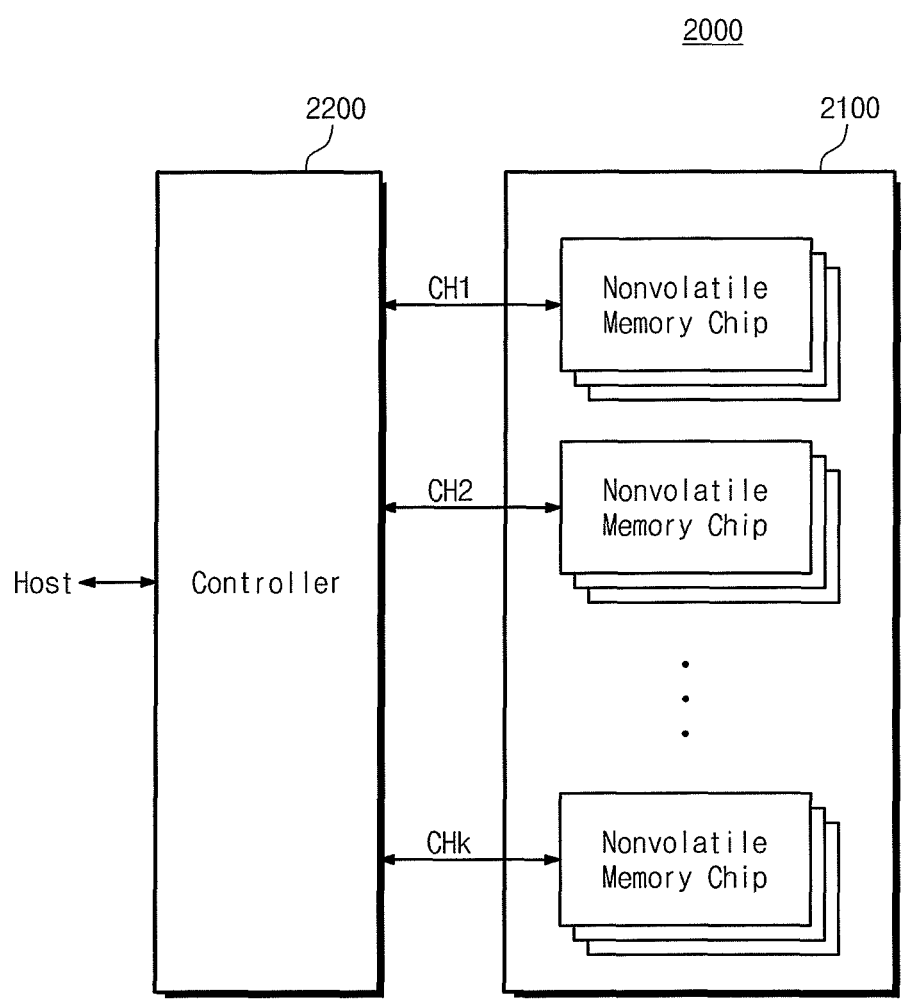
FIG. 87 is a block diagram illustrating a memory system according to an embodiment of the inventive concept.

FIG. 87 is a block diagram illustrating an application example of the memory system 1000 of FIG. 86. Referring to FIG. 87, the memory system 2000 includes a nonvolatile memory device 2100 and a controller 2200. The nonvolatile memory device 2100 includes a plurality of nonvolatile memory chips. The plurality of nonvolatile memory chips are divided into a plurality of groups. Each group of the plurality of nonvolatile memory chips is configured to communicate with the controller 2200 through one common channel. Exemplarily, it is illustrated that the plurality of nonvolatile memory chips communicate with the controller 2200 through the first to $k^{th}$ channels CH1 to CHk.

Each nonvolatile memory chip has the same structure as one of the nonvolatile memory devices 100a, 100b, 100c, 100d, 100e, and 100f described with reference to FIGS. 1, 12, 16, 75, 79, and 82. That is, each memory chip erases the selected memory block BLK and erase-verifies the erased memory block by an unit of respective word line. If erase-fail occurs, the selected memory block BLK is erased again and an erase and erase-verification are performed by a row unit of the selected memory block BLK.

In FIG. 87, it is illustrated that a plurality of nonvolatile memory chips are connected to one channel. In an embodiment, the memory system 2000 may be modified so that one nonvolatile memory chip is connected to one channel.

Figure 88:
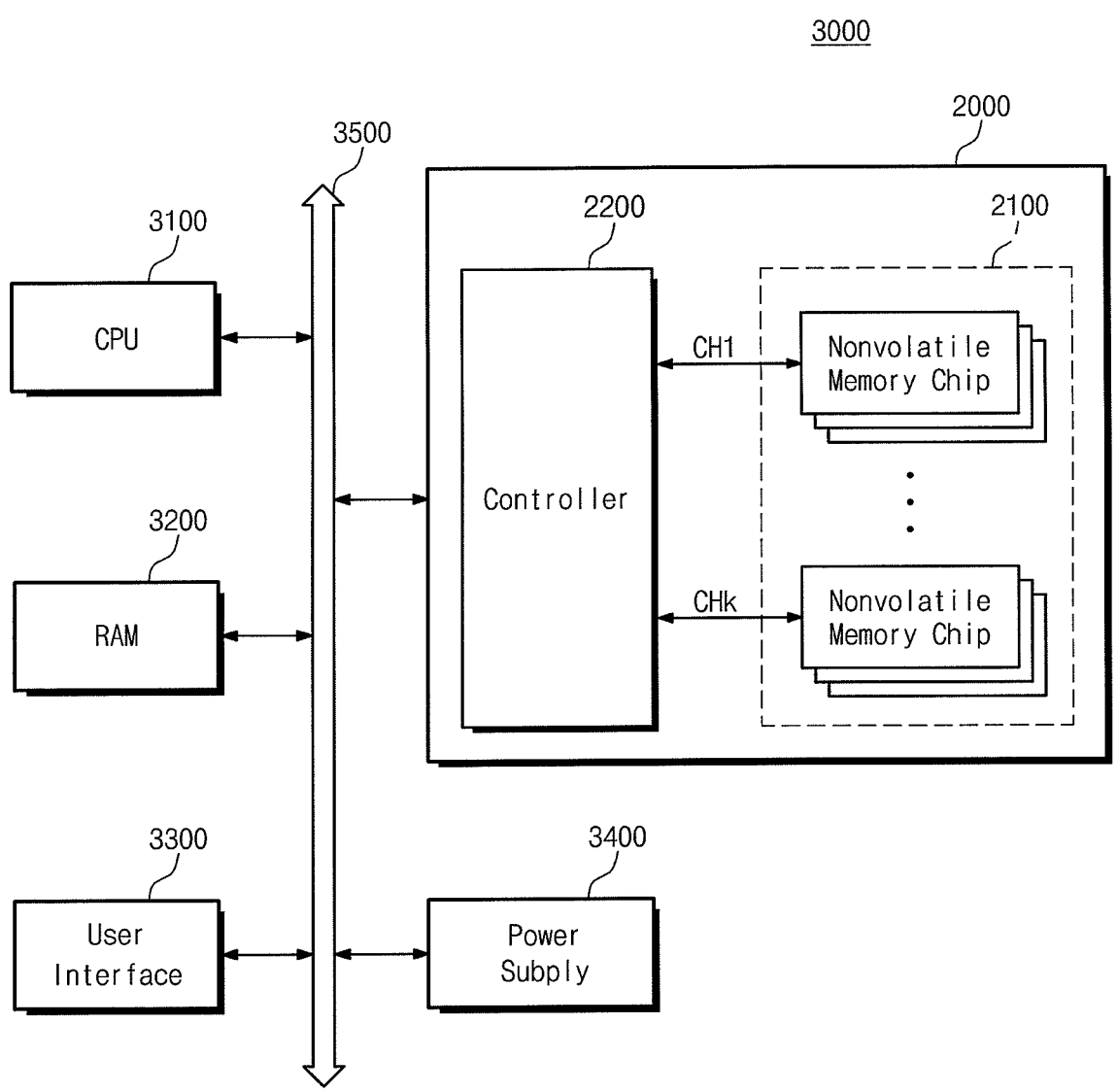
FIG. 88 is a block diagram illustrating a computing system according to an embodiment of the inventive concept.

FIG. 88 is a block diagram illustrating a computing system 3000 according to an embodiment of the inventive concept. Referring to FIG. 88, the computing system 3000 includes a central processing unit (CPU) 3100, a random access memory (RAM) 3200, a user interface 3300, a power 3400, and the memory system 2000.

In the memory system 2000, the CPU 3100, the RAM 3200, and the power 3400 are electrically connected through a system bus 3500. Data provided through a user interface 3300 or processed by the CPU 3100 are stored in the memory system 2000. The memory system 2000 includes a controller 2200 and a nonvolatile memory device 2100.

In FIG. 88, it is illustrated that the nonvolatile memory device 2100 is connected to the system bus 3500 through the controller 2200. However, the nonvolatile memory device 2100 may be directly connected to the system bus 3500.

In FIG. 88, it is described that the memory system 2000 described with FIG. 87 is provided. However, the memory system 2000 may be replaced with the memory system 1000 described with FIG. 86.

Exemplarily, the computing system 3000 may be configured to include all the memory systems 1000 and 2000 described with reference to FIGS. 86 and 87.

Exemplarily, an operation for selecting a memory block may be performed after an erase command and an address are received and before a memory block is selected, and is not limited by former or latter operations of other operations.

Similarly, an operation for selecting a word line for the first time may be performed after an erase command and an address are received and before an erased memory block is erase-verified, and is not limited by former or latter operations of other operations. An operation for selecting a word line later may be performed after a memory block is erased or memory cells connected to a previously-selected word line are erase-verified, and before a memory block is erase-verified, and is not limited by former or latter operations of other operations.

Exemplarily, an operation for selecting a word line may include an operation for converting a word line address into a string selection line address and an operation for selecting a word line corresponding to the converted word line address. Also, the operation for selecting a word line may further include an operation for initializing or adjusting the word line count. Another operation may be performed between sub-operations of the operation for selecting a word line.

An operation for selecting a string selection line for the first time may be performed after an erase command and an address are received and before an erased memory block is erase-verified, and is not limited by former or latter operations of other operations. An operation for selecting a string selection line later may be performed after memory cells connected to a previously-selected string selection line are erase-passed, and before a memory block is erase-verified, and is not limited by former or latter operations of other operations.

Exemplarily, an operation for selecting a string selection line may include an operation for converting an SSL count into a string selection line address and an operation for selecting a string selection line corresponding to the converted string selection line address. Also, the operation for selecting a string selection line may further include an operation for initializing or adjusting the SSL count. Another operation may be performed between sub-operations of the operation for selecting a string selection line.

Initial storing of addresses of some word lines may be performed after an erase command and an address are received and before a word line to be erase-verified is selected, and is not limited by former or latter operations of other operations.

Storing of addresses of some string selection lines may be performed after an erase command and an address are received and before a string selection line is selected, and is not limited by former or latter operations of other operations.

In the above-described embodiments, an operation for resetting a latch configured to store an address and an operation for erasing the address stored in the latch have been described with reference to a string selection line and a word line. The reset latch is not limited to have a specific logic value. Exemplarily, as long as the reset latch is dealt not to store an address, the reset latch may be applied to have various logic values. Similarly, when a specific address is erased from the latch, a logic value of a storage region corresponding to the erased address is not limited.

According to an embodiment of the inventive concept, an erase-verification is performed by a unit of respective word line during an erase operation. Accordingly, since a target value of a threshold voltage of erased memory cells is controlled, a nonvolatile memory device according to an embodiment of the inventive concept can have improved reliability.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of operating a non-volatile memory device, the method comprising:
resetting a WL count and an erase count prior to a first erasing operation;
performing the first erasing operation with a first erase voltage to memory cells associated with a string selection line (SSL), the memory cells associated with the SSL constituting a memory block; and
verifying the first erasing operation to first memory cells associated with a first word line address, wherein when the verifying the first erasing operation to the first memory cells fails, storing the first word line address, and when verifying the first erasing operation to the first memory cells passes, counting up the WL count and verifying the first erasing operation to second memory cells associated with a second word line address based on the WL count.

2. The method of claim 1, further comprising: when the verifying the first erasing operation to the first memory cells fails,
counting up the erase count;
adjusting the first erase voltage to a second erase voltage; and
performing a second erasing operation to the memory block with the second erase voltage,
wherein the storing the first word line address is performed by preserving the WL count during the performing the second erasing operation.

3. The method of claim 2, further comprising performing an error report when the erase count reaches a preset value.

4. The method of claim 1, wherein the memory block includes a plurality of NAND strings connected to one bit line.

5. A method of operating a non-volatile memory device, the method comprising:
resetting a WL latch and an erase count prior to a first erasing operation;
performing the first erasing operation with a first erase voltage to memory cells associated with a string selection line (SSL), the memory cells associated with the SSL constituting a memory block;
verifying the first erasing operation to first memory cells associated with a first word line address, wherein when the verifying the first erasing operation to the first memory cells fails, storing the first word line address into the WL latch, and when verifying the first erasing operation to the first memory cells passes, verifying the first erasing operation to second memory cells associated with a second word line address;
after verifying the first erasing operation to memory cells associated with the SSL and while the WL latch stores the first word line address, counting up the erase count and adjusting the first erase voltage to a second erase voltage to perform a second erasing operation to the memory block;
performing a second erasing operation with the second erase voltage;
verifying the second erasing operation to the first memory cells associated with the first word line address stored in the WL latch; and
deleting the first word line address from the WL latch when verifying the second erasing operation to the first memory cells passes.

6. A method of operating a non-volatile memory device, the method comprising:
performing an erasing operation to a memory block, wherein the memory block includes memory cells associated with a string selection line (SSL) and a plurality of word lines;
verifying the erasing operation to second memory cells associated with a second word line (WL) of the plurality of word lines after verifying the erasing operation to first memory cells associated with a first word line (WL) of the plurality of word lines;
setting a WL latch by storing a plurality of word line address of the plurality of word lines and resetting an erase count prior to the erasing operation; and
deleting a first WL address of the plurality of word line address from the WL latch when verifying the erasing operation to first memory cells associated with the first WL passes.

7. The method of claim 6, further comprising counting up the erase count when the WL latch stores the address of the second WL remaining in the WL latch after verifying the erasing operation to entire memory cells associated with the SSL, and adjusting an erase voltage to erase the memory block.

8. A non-volatile memory device comprising:
a memory cell array partitioned into a plurality of memory blocks, each including memory cells associated with at least two string selection lines (SSLs);

a voltage generating unit configured to generate an erase voltage for performing an erasing operation to a memory block including the memory cells associated with at least two string selection lines (SSLs); and a control logic configured to verify the erasing operation to memory cells associated with a second SSL of the memory block after verifying the erasing operation to memory cells associated with a first SSL of the memory block, wherein verifying the erasing operation to memory cells associated with a first SSL comprises verifying the erasing operation to memory cells associated with a second word line after verifying the erasing operation to memory cells associated with a first word line, and wherein verifying the erasing operation to memory cells associated with a second SSL comprises verifying the erasing operation to memory cells associated with the second word line after verifying the erasing operation to memory cells associated with the first word line.

9. The non-volatile memory device of claim 8, further comprising an address decoder connected to the memory cell array through SSLs, word lines, and at least one ground selection line (GSL).

10. The non-volatile memory device of claim 9, further comprising a read/write circuit connected to the memory cell array through bit lines.

11. The non-volatile memory device of claim 10, further comprising a pass/fail check unit for determining whether the verification of the erasing operation to memory cells has failed or passed.

12. The non-volatile memory device of claim 11, wherein the control logic comprises an erase control unit, a WL counter, and an erase counter, the erase control unit receiving a pass/fail data from the pass/fail check unit.

13. The non-volatile memory device of claim 11, wherein the control logic comprises an erase control unit, a WL address latch, and an erase counter, the erase control unit receiving a pass/fail data from the pass/fail check unit.

14. The non-volatile memory device of claim 8, wherein the non-volatile memory device is configured to receive a signal from a controller.

15. The non-volatile memory device of claim 14, wherein the controller includes a RAM, a processing unit, a host interface, and a memory interface.

16. The non-volatile memory device of claim 8, wherein the non-volatile memory device is configured to transmit an error signal to an error correction block.

17. A method of operating a non-volatile memory device, the method comprising:

performing an erasing operation to a memory block including memory cells associated with at least two string selection lines (SSLs); and verifying the erasing operation to memory cells associated with a second SSL of the memory block after verifying the erasing operation to memory cells associated with a first SSL of the memory block, wherein verifying the erasing operation to memory cells associated with a first SSL comprises verifying the erasing operation to memory cells associated with a second word line after verifying the erasing operation to memory cells associated with a first word line, and wherein verifying the erasing operation to memory cells associated with a second SSL comprises verifying the erasing operation to memory cells associated with the second word line after verifying the erasing operation to memory cells associated with the first word line.

18. The method of claim 17, further comprising resetting a WL count, an SSL count and an erase count prior to the erasing operation.

19. The method of claim 18, further comprising counting up the WL count when verifying the erasing operation to memory cells associated with the first WL passes prior to verifying the erasing operation to memory cells associated with the second WL.

20. The method of claim 19, further comprising counting up the SSL count when verifying the erasing operation to memory cells associated with the first SSL passes and resetting the WL counter prior to verifying the erasing operation to memory cells associated with the second SSL.

21. The method of claim 18, further comprising counting up the erase count when verifying the erasing operation to memory cells associated with the first WL fails, and adjusting an erase voltage to erase the memory block.

22. The method of claim 21, further comprising performing an error report when the erase count reaches a preset value.

23. The method of claim 17, wherein the memory cells of the non-volatile memory device are stacked in a direction perpendicular with respect to a major axis of a substrate where the memory cells are disposed.

* * * * *